US012069938B2

(12) United States Patent
Helander et al.

(10) Patent No.: US 12,069,938 B2
(45) Date of Patent: Aug. 20, 2024

(54) MATERIALS FOR FORMING A NUCLEATION-INHIBITING COATING AND DEVICES INCORPORATING SAME

(71) Applicant: OTI Lumionics Inc., Mississauga (CA)

(72) Inventors: Michael Helander, Toronto (CA); Scott Nicholas Genin, Unionville (CA)

(73) Assignee: OTI Lumionics Inc., Mississauga (CA)

( * ) Notice: Subject to any disclaimer, the term of this patent is extended or adjusted under 35 U.S.C. 154(b) by 451 days.

(21) Appl. No.: 17/609,385

(22) PCT Filed: May 7, 2020

(86) PCT No.: PCT/IB2020/054359
§ 371 (c)(1),
(2) Date: Nov. 8, 2021

(87) PCT Pub. No.: WO2020/225778
PCT Pub. Date: Nov. 12, 2020

(65) Prior Publication Data

US 2022/0221619 A1 Jul. 14, 2022

(51) Int. Cl.
*H10K 71/00* (2023.01)

(52) U.S. Cl.
CPC .................................. *H10K 71/621* (2023.02)

(58) Field of Classification Search
CPC ............. H10K 50/824; H10K 59/1201; H10K 59/122; H10K 59/80522; H10K 71/621
See application file for complete search history.

(56) References Cited

U.S. PATENT DOCUMENTS

| | | | |
|---|---|---|---|
| 2,876,247 | A | 3/1959 | Ratz et al. |
| 3,094,536 | A | 6/1963 | Kenney et al. |
| 3,169,933 | A | 2/1965 | Kenney |
| 3,597,457 | A | 8/1971 | Robinson et al. |
| 3,928,480 | A | 12/1975 | Tabushi et al. |
| 3,978,030 | A | 8/1976 | Resnick |

(Continued)

FOREIGN PATENT DOCUMENTS

| | | | |
|---|---|---|---|
| CA | 2074331 | A1 | 1/1993 |
| CA | 2544380 | C | 1/2014 |

(Continued)

OTHER PUBLICATIONS

Abroshan, H. et al. "66-3: Active Learning for the Design of Novel OLED Materials." SID Symposium Digest of Technical Papers. 53.1 (2022).

(Continued)

*Primary Examiner* — Daniel P Shook
(74) *Attorney, Agent, or Firm* — Foley & Lardner LLP

(57) ABSTRACT

An opto-electronic device includes a nucleating inhibiting coating (NIC) disposed on a first layer surface of the device in a first portion of a lateral aspect thereof; and a conductive coating disposed on a second layer surface of the device in a second portion of the lateral aspect thereof; wherein an initial sticking probability for forming the conductive coating onto a surface of the NIC in the first portion, is substantially less than the initial sticking probability for forming the conductive coating onto the surface in the second portion, such that the surface of the NIC in the first portion is substantially devoid of the conductive coating.

48 Claims, 84 Drawing Sheets

(56) References Cited

U.S. PATENT DOCUMENTS 4,022,928 A 5/1977 Piwcyzk
4,119,635 A 10/1978 Omodei-Sale et al.
4,188,486 A 2/1980 Tsukamoto et al.
4,379,155 A 4/1983 Omodei-Sale et al.
4,431,786 A 2/1984 Squire
4,512,997 A 4/1985 Meier et al.
4,594,399 A 6/1986 Anderson et al.
4,622,179 A 11/1986 Eda
4,749,637 A 6/1988 Hayashida et al.
4,803,005 A 2/1989 Juhlke et al.
4,832,983 A 5/1989 Nagatomi et al.
4,927,735 A 5/1990 Era et al.
4,960,538 A 10/1990 Itoh et al.
5,009,986 A 4/1991 Kawaguchi et al.
5,015,758 A 5/1991 Pilgrim et al.
5,034,309 A 7/1991 Tai et al.
5,061,596 A 10/1991 Albert et al.
5,075,203 A 12/1991 Katayose et al.
5,219,706 A 6/1993 Tai et al.
5,232,635 A 8/1993 Van Moer et al.
5,260,435 A 11/1993 Sawada et al.
5,378,589 A 1/1995 Sawada et al.
5,399,936 A 3/1995 Namiki et al.
5,420,301 A 5/1995 Ackermann et al.
5,428,152 A 6/1995 Hayashida et al.
5,446,142 A 8/1995 Itoh et al.
5,512,095 A 4/1996 Sens et al.
5,484,685 A 6/1996 Tai et al.
5,550,290 A 8/1996 Mizuta et al.
5,652,285 A 7/1997 Coggio et al.
5,824,799 A 10/1998 Buechler et al.
5,834,130 A 11/1998 Kido
5,883,177 A 3/1999 Colaianna et al.
5,895,228 A 4/1999 Biebuyck et al.
5,916,481 A 6/1999 Willey
5,935,721 A 8/1999 Shi et al.
6,016,033 A 1/2000 Jones et al.
6,171,715 B1 1/2001 Sato et al.
6,251,687 B1 6/2001 Buechler et al.
6,285,039 B1 9/2001 Kobori et al.
6,329,490 B1 12/2001 Yamashita et al.
6,361,886 B2 3/2002 Shi et al.
6,407,408 B1 6/2002 Zhou et al.
6,465,115 B2 10/2002 Shi et al.
6,468,590 B2 10/2002 Biebuyck et al.
6,472,468 B1 10/2002 Omura
6,517,958 B1 2/2003 Sellinger et al.
6,538,374 B2 3/2003 Hosokawa
6,608,009 B2 8/2003 Akada et al.
6,635,364 B1 10/2003 Igarashi
6,787,468 B2 9/2004 Kim et al.
6,835,950 B2 12/2004 Brown et al.
6,852,429 B1 2/2005 Li et al.
6,878,469 B2 4/2005 Yoon et al.
6,899,963 B1 5/2005 Zheng et al.
6,900,470 B2 5/2005 Kobayashi et al.
6,927,270 B2 8/2005 Lichtenhan et al.
6,953,653 B2 10/2005 Smith et al.
6,995,035 B2 2/2006 Cok et al.
7,018,713 B2 3/2006 Padiyath
7,056,601 B2 6/2006 Cosimbescu et al.
7,099,299 B2 8/2006 Liang et al.
7,105,298 B2 9/2006 Liu et al.
7,166,240 B2 1/2007 Ishida et al.
7,169,482 B2 1/2007 Aziz
7,173,276 B2 2/2007 Choi et al.
7,175,815 B2 2/2007 Yamasaki et al.
7,192,659 B2 3/2007 Ricks et al.
7,193,015 B1 3/2007 Mabry et al.
7,217,683 B1 5/2007 Blanski et al.
7,252,893 B2 8/2007 Ricks et al.
7,259,267 B2 8/2007 Pleschke et al.
7,280,731 B2 10/2007 Rantala
7,319,129 B2 1/2008 Yoshida et al.
7,326,371 B2 2/2008 Conley et al.
7,361,796 B2 4/2008 Ikeda et al.
7,363,308 B2 4/2008 Dillon et al.
7,373,060 B2 5/2008 Satake et al.
7,402,948 B2 7/2008 Yamazaki et al.
7,427,783 B2 9/2008 Lee et al.
7,449,509 B2 11/2008 Marks et al.
7,449,539 B2 11/2008 Morimoto et al.
7,470,315 B2 12/2008 Vonwiller et al.
7,479,462 B2 1/2009 Rantala et al.
7,491,975 B2 2/2009 Kubota
7,495,389 B2 2/2009 Noguchi et al.
7,504,526 B2 3/2009 Kubota et al.
7,532,389 B2 5/2009 Li et al.
7,579,304 B2 8/2009 Liu et al.
7,651,787 B2 1/2010 Seo et al.
7,670,695 B2 3/2010 Wakabayashi et al.
7,674,914 B2 3/2010 Egawa et al.
7,701,132 B2 4/2010 Oh
7,728,510 B2 6/2010 Oh
7,733,009 B2 6/2010 Kondakov et al.
7,776,457 B2 8/2010 Lee et al.
7,790,892 B2 9/2010 Ikeda et al.
7,816,667 B2 10/2010 Park et al.
7,816,861 B2 10/2010 Choi et al.
7,833,632 B2 11/2010 Kawamura et al.
7,839,074 B2 11/2010 Ikeda et al.
7,839,083 B2 11/2010 Kubota
7,851,071 B2 12/2010 Yamamoto et al.
7,867,629 B2 1/2011 Yamamoto et al.
7,887,931 B2 2/2011 Cosimbescu
7,897,667 B2 3/2011 Mabry et al.
7,910,687 B2 3/2011 Busing et al.
7,919,196 B2 4/2011 Kim et al.
7,947,519 B2 5/2011 Lee et al.
7,956,351 B2 6/2011 Choi
7,973,306 B2 7/2011 Kim et al.
7,986,672 B2 7/2011 Tiedemann et al.
7,998,540 B2 8/2011 Goulding et al.
7,999,459 B2 8/2011 Chun et al.
8,004,180 B2 8/2011 Seo
8,025,815 B2 9/2011 Kawamura et al.
8,030,838 B2 10/2011 Kwak et al.
8,044,580 B2 10/2011 Yamazaki et al.
8,071,226 B2 12/2011 Je et al.
8,076,839 B2 12/2011 Kuma et al.
8,089,066 B2 1/2012 Yamazaki et al.
8,097,349 B2 1/2012 Yamamoto et al.
8,101,771 B2 1/2012 Nomura et al.
8,115,376 B2 2/2012 Fujioka et al.
8,174,185 B2 5/2012 Park et al.
8,217,570 B2 7/2012 Kawamura et al.
8,222,634 B2 7/2012 Lee
8,232,350 B2 7/2012 Fujita et al.
8,237,351 B2 8/2012 Sung et al.
8,257,620 B2 9/2012 Cranor et al.
8,278,378 B2 10/2012 Jung et al.
8,310,149 B2 11/2012 Lifka et al.
8,318,878 B2 11/2012 Sudo et al.
8,318,995 B2 11/2012 Kubota et al.
8,319,095 B2 11/2012 Sharma
8,343,637 B2 1/2013 Parham et al.
8,346,024 B2 1/2013 Vonwiller et al.
8,362,469 B2 1/2013 Suh
8,383,932 B2 2/2013 Jung et al.
8,530,596 B2 9/2013 Sano et al.
8,541,113 B2 9/2013 Je et al.
8,568,902 B2 10/2013 Kubota et al.
8,568,965 B2 10/2013 Kitamura et al.
8,586,202 B2 11/2013 Imai et al.
8,586,689 B2 11/2013 Jung et al.
8,586,703 B2 11/2013 Yang et al.
8,592,053 B2 11/2013 Kawakami
8,629,222 B2 1/2014 Takizawa et al.
8,679,647 B2 3/2014 Pflumm et al.
8,679,656 B2 3/2014 Kobayashi et al.
8,703,303 B2 4/2014 Yamamoto et al.
8,729,530 B2 5/2014 Nagao et al.
8,759,818 B2 6/2014 Lecloux
8,766,306 B2 7/2014 Lifka et al.

(56) References Cited

U.S. PATENT DOCUMENTS

| | | | |
|---|---|---|---|
| 8,779,655 | B2 | 7/2014 | Nishimura |
| 8,795,422 | B2 | 8/2014 | Ganapathiappan et al. |
| 8,795,847 | B2 | 8/2014 | Heil et al. |
| 8,795,855 | B2 | 8/2014 | Klubek et al. |
| 8,809,838 | B2 | 8/2014 | Jeong et al. |
| 8,816,117 | B2 | 8/2014 | Marciniec et al. |
| 8,852,756 | B2 | 10/2014 | Vestweber et al. |
| 8,853,675 | B2 | 10/2014 | Kubota et al. |
| 8,859,111 | B2 | 10/2014 | Parham et al. |
| 8,872,206 | B2 | 10/2014 | Chung et al. |
| 8,877,356 | B2 | 11/2014 | Spindler et al. |
| 8,883,324 | B2 | 11/2014 | Yabunouchi et al. |
| 8,895,972 | B2 | 11/2014 | Chung et al. |
| 8,940,568 | B2 | 1/2015 | Mohan et al. |
| 8,957,413 | B2 | 2/2015 | Song et al. |
| 8,963,137 | B2 | 2/2015 | Lee et al. |
| 8,963,414 | B2 | 2/2015 | Sawabe |
| 8,986,852 | B2 | 3/2015 | Stoessel et al. |
| 8,987,516 | B2 | 3/2015 | Umemoto |
| 8,993,123 | B2 | 3/2015 | Buesing et al. |
| 8,994,010 | B2 | 3/2015 | Choi et al. |
| 8,999,534 | B2 | 4/2015 | Shimokawa et al. |
| 9,006,565 | B2 | 4/2015 | Abusleme et al. |
| 9,018,621 | B2 | 4/2015 | Park et al. |
| 9,024,301 | B2 | 5/2015 | Kawamura et al. |
| 9,024,307 | B2 | 5/2015 | Lee |
| 9,040,962 | B2 | 5/2015 | Adamovich et al. |
| 9,051,344 | B2 | 6/2015 | Lin et al. |
| 9,064,755 | B2 | 6/2015 | Park et al. |
| 9,076,993 | B2 | 7/2015 | Kim et al. |
| 9,088,004 | B2 | 7/2015 | Chung et al. |
| 9,093,403 | B2 | 7/2015 | Kim et al. |
| 9,093,669 | B2 | 7/2015 | Park et al. |
| 9,105,865 | B2 | 8/2015 | Chung et al. |
| 9,105,867 | B2 | 8/2015 | Verschuuren et al. |
| 9,113,536 | B2 | 8/2015 | Oka et al. |
| 9,126,970 | B2 | 9/2015 | Pflumm |
| 9,169,274 | B2 | 10/2015 | Mizuki et al. |
| 9,214,636 | B2 | 12/2015 | Takashima et al. |
| 9,219,234 | B2 | 12/2015 | Kubota et al. |
| 9,231,030 | B2 | 1/2016 | Choi et al. |
| 9,245,934 | B2 | 1/2016 | Chung et al. |
| 9,246,105 | B2 | 1/2016 | Sun |
| 9,257,654 | B2 | 2/2016 | Kawakami |
| 9,276,220 | B2 | 3/2016 | Kim et al. |
| 9,287,339 | B2 | 3/2016 | Lee et al. |
| 9,293,515 | B2 | 3/2016 | Choi |
| 9,331,308 | B2 | 5/2016 | Choi et al. |
| 9,353,027 | B2 | 5/2016 | Kawamura et al. |
| 9,444,064 | B2 | 9/2016 | Kaiser et al. |
| 9,450,027 | B2 | 9/2016 | Pang et al. |
| 9,471,172 | B2 | 10/2016 | Sirois |
| 9,478,591 | B2 | 10/2016 | Nam et al. |
| 9,487,724 | B2 | 11/2016 | Xu et al. |
| 9,515,280 | B2 | 12/2016 | Yun |
| 9,548,456 | B2 | 1/2017 | Lee et al. |
| 9,570,471 | B2 | 2/2017 | Heo et al. |
| 9,583,716 | B2 | 2/2017 | Ikeda |
| 9,595,681 | B2 | 3/2017 | Mujica-Fernaud |
| 9,608,207 | B2 | 3/2017 | Takaku et al. |
| 9,624,193 | B2 | 4/2017 | Aihara |
| 9,660,195 | B2 | 5/2017 | Kawamura et al. |
| 9,666,812 | B2 | 5/2017 | Lee et al. |
| 9,680,108 | B2 | 6/2017 | Ito et al. |
| 9,711,734 | B2 | 7/2017 | Kim |
| 9,711,751 | B2 | 7/2017 | Prushinskiy et al. |
| 9,728,726 | B2 | 8/2017 | Takaku |
| 9,748,318 | B2 | 8/2017 | Shim et al. |
| 9,755,165 | B2 | 9/2017 | Nishide et al. |
| 9,776,983 | B2 | 10/2017 | Marchionni et al. |
| 9,786,846 | B2 | 10/2017 | Kubota |
| 9,793,491 | B2 | 10/2017 | Hwang et al. |
| 9,831,457 | B2 | 11/2017 | Kang et al. |
| 9,859,520 | B2 | 1/2018 | Kim |
| 9,882,140 | B2 | 1/2018 | Han et al. |
| 9,890,181 | B2 | 2/2018 | Jiang et al. |
| 9,896,621 | B2 | 2/2018 | Kim et al. |
| 9,954,039 | B2 | 4/2018 | Im et al. |
| 9,960,216 | B2 | 5/2018 | Lee et al. |
| 9,966,554 | B2 | 5/2018 | Lee et al. |
| 10,026,906 | B2 | 7/2018 | Jung et al. |
| 10,032,843 | B2 | 7/2018 | Lee et al. |
| 10,062,850 | B2 | 8/2018 | Jung et al. |
| 10,084,019 | B2 | 9/2018 | Shim et al. |
| 10,084,150 | B1 | 9/2018 | Lou |
| 10,090,370 | B2 | 10/2018 | Lee et al. |
| 10,147,769 | B2 | 12/2018 | Lee et al. |
| 10,153,450 | B2 | 12/2018 | Kawamura |
| 10,174,059 | B2 | 1/2019 | Warner et al. |
| 10,177,206 | B2 | 1/2019 | Jung et al. |
| 10,181,573 | B2 | 1/2019 | Im |
| 10,186,568 | B2 | 1/2019 | Kim et al. |
| 10,205,101 | B2 | 2/2019 | Kubota et al. |
| 10,224,386 | B2 | 3/2019 | Rieutort-Louis et al. |
| 10,240,084 | B2 | 3/2019 | Molaire |
| 10,263,185 | B2 | 4/2019 | Matsueda et al. |
| 10,269,879 | B2 | 4/2019 | Shim et al. |
| 10,276,641 | B2 | 4/2019 | Lou |
| 10,297,762 | B2 | 5/2019 | Zeng et al. |
| 10,361,375 | B2 | 7/2019 | Zeng et al. |
| 10,442,823 | B2 | 10/2019 | Warner et al. |
| 10,501,583 | B2 | 12/2019 | Song et al. |
| 10,683,313 | B2 | 1/2020 | Choi et al. |
| 10,584,137 | B2 | 3/2020 | Warner |
| 10,700,304 | B2 | 6/2020 | Helander et al. |
| 11,008,350 | B2 | 5/2021 | Diao et al. |
| 11,046,885 | B2 | 6/2021 | Kim et al. |
| 11,634,578 | B2 | 4/2023 | Eckel et al. |
| 2002/0090811 | A1 | 7/2002 | Kim et al. |
| 2002/0189392 | A1 | 12/2002 | Molstad |
| 2003/0196987 | A1 | 10/2003 | Kung et al. |
| 2003/0219625 | A1 | 11/2003 | Wolk et al. |
| 2004/0018383 | A1 | 1/2004 | Aziz et al. |
| 2004/0058193 | A1 | 3/2004 | Hatwar |
| 2004/0152910 | A1 | 8/2004 | Fukuoka et al. |
| 2004/0249027 | A1 | 12/2004 | Lim et al. |
| 2004/0249070 | A1 | 12/2004 | Lim et al. |
| 2005/0070196 | A1 | 3/2005 | Colombo et al. |
| 2005/0181232 | A1 | 8/2005 | Ricks et al. |
| 2005/0211958 | A1 | 9/2005 | Conley et al. |
| 2005/0245648 | A1 | 11/2005 | Lim et al. |
| 2005/0271899 | A1 | 12/2005 | Brown et al. |
| 2006/0019116 | A1 | 1/2006 | Conley et al. |
| 2006/0043858 | A1 | 3/2006 | Ikeda et al. |
| 2006/0078757 | A1 | 4/2006 | Boerner |
| 2006/0125390 | A1 | 6/2006 | Oh |
| 2006/0147747 | A1 | 7/2006 | Yamamoto et al. |
| 2006/0154105 | A1 | 7/2006 | Yamamoto et al. |
| 2006/0182993 | A1 | 8/2006 | Ogata et al. |
| 2006/0210830 | A1 | 9/2006 | Funahashi et al. |
| 2006/0246315 | A1 | 11/2006 | Begley et al. |
| 2007/0003785 | A1 | 1/2007 | Slusarek et al. |
| 2007/0077349 | A1 | 4/2007 | Newman et al. |
| 2007/0178405 | A1 | 8/2007 | Kanda et al. |
| 2007/0252517 | A1 | 11/2007 | Owczarczyk et al. |
| 2007/0252521 | A1 | 11/2007 | Kondakov et al. |
| 2008/0001123 | A1 | 1/2008 | Inoue et al. |
| 2008/0012475 | A1 | 1/2008 | Oyamada et al. |
| 2008/0093986 | A1 | 4/2008 | Inoue et al. |
| 2008/0103315 | A1 | 5/2008 | Egawa et al. |
| 2008/0105865 | A1 | 5/2008 | Oyamada et al. |
| 2008/0166593 | A1 | 7/2008 | Stoessel et al. |
| 2008/0203905 | A1 | 8/2008 | Je et al. |
| 2008/0265216 | A1 | 10/2008 | Hartmann et al. |
| 2008/0286607 | A1 | 11/2008 | Nomura et al. |
| 2008/0286610 | A1 | 11/2008 | Deaton et al. |
| 2008/0303422 | A1 | 12/2008 | Vestweber et al. |
| 2009/0033208 | A1 | 2/2009 | Nagayama et al. |
| 2009/0066239 | A1 | 3/2009 | Yabunouchi |
| 2009/0145483 | A1 | 6/2009 | Kim et al. |
| 2009/0153037 | A1 | 6/2009 | Kim et al. |
| 2009/0153039 | A1 | 6/2009 | Kim et al. |
| 2009/0153040 | A1 | 6/2009 | Kim et al. |
| 2009/0159130 | A1 | 6/2009 | Eum et al. |

(56) References Cited

U.S. PATENT DOCUMENTS

2009/0165860 A1 7/2009 Kim et al.
2009/0174316 A1 7/2009 Kim et al.
2009/0179196 A1 7/2009 Adachi et al.
2009/0179555 A1 7/2009 Kim et al.
2009/0184631 A1 7/2009 Kim et al.
2009/0199903 A1 8/2009 Oyamada et al.
2009/0200926 A1 8/2009 Lee et al.
2009/0233125 A1 9/2009 Choi et al.
2009/0236973 A1 9/2009 Yabe et al.
2009/0239986 A1 9/2009 Kim et al.
2009/0252990 A1 10/2009 Kim et al.
2010/0019657 A1 1/2010 Eum et al.
2010/0052526 A1 3/2010 Je et al.
2010/0078628 A1 4/2010 Chi et al.
2010/0080903 A1 4/2010 Tamitsuji et al.
2010/0108997 A1 5/2010 Kim et al.
2010/0113767 A1 5/2010 Gessner et al.
2010/0117028 A1 5/2010 Takeshima et al.
2010/0151180 A1 6/2010 Bravet et al.
2010/0193768 A1 8/2010 Habib
2010/0244197 A1 9/2010 Arena et al.
2010/0286407 A1 11/2010 Kimura et al.
2010/0314615 A1 12/2010 Mizuki et al.
2010/0327240 A1 12/2010 Cranor et al.
2011/0006289 A1 1/2011 Mizuki et al.
2011/0091508 A1 4/2011 Esfand et al.
2011/0094889 A1 4/2011 Shin et al.
2011/0156016 A1 6/2011 Kawamura et al.
2011/0175031 A1 7/2011 Matsunami et al.
2011/0186820 A1 8/2011 Kim et al.
2011/0198582 A1 8/2011 Horiuchi et al.
2011/0204772 A1 8/2011 Egawa
2011/0220886 A1 9/2011 Takeshima et al.
2011/0285276 A1 11/2011 Kadoma et al.
2011/0297923 A1 12/2011 Mizuki et al.
2011/0309307 A1 12/2011 Zeika et al.
2012/0003484 A1 1/2012 Roehrig et al.
2012/0018770 A1 1/2012 Lu et al.
2012/0023556 A1 1/2012 Schultz et al.
2012/0043533 A1 2/2012 Mizuki et al.
2012/0056165 A1 3/2012 Kawamura et al.
2012/0091885 A1 4/2012 Kim et al.
2012/0104422 A1 5/2012 Lee et al.
2012/0112169 A1 5/2012 Mizuki et al.
2012/0146030 A1 6/2012 You et al.
2012/0181520 A1 7/2012 Kim et al.
2012/0181922 A1 7/2012 Kawamura et al.
2012/0187541 A1 7/2012 Arena et al.
2013/0020561 A1 1/2013 Suzuki et al.
2013/0026526 A1 1/2013 Lahijani
2013/0049024 A1 2/2013 Choi et al.
2013/0056784 A1 3/2013 Lee et al.
2013/0112952 A1 5/2013 Adamovich et al.
2013/0153878 A1 6/2013 Mizuki et al.
2013/0175509 A1 7/2013 Kim et al.
2013/0187143 A1 7/2013 Nishimura et al.
2013/0221338 A1 8/2013 Kawamura et al.
2014/0014925 A1 1/2014 Jung et al.
2014/0070236 A1 3/2014 Chen et al.
2014/0103306 A1 4/2014 Moon et al.
2014/0110680 A1 4/2014 Choe
2014/0148877 A1 5/2014 Pan et al.
2014/0159011 A1 6/2014 Suzuki et al.
2014/0183500 A1 7/2014 Ikeda et al.
2014/0186983 A1 7/2014 Kim et al.
2014/0225085 A1 8/2014 Hayashi et al.
2014/0231761 A1 8/2014 Kim et al.
2014/0239273 A1 8/2014 Mizutani et al.
2014/0246657 A1 9/2014 Kim et al.
2014/0291653 A1 10/2014 Ikeda et al.
2014/0299866 A1 10/2014 Ruske et al.
2014/0319511 A1 10/2014 Mizuki et al.
2014/0326985 A1 11/2014 Mizuki et al.
2014/0332772 A1 11/2014 Han et al.
2014/0346406 A1 11/2014 Lee et al.
2014/0346482 A1 11/2014 Mizuki et al.
2014/0353601 A1 12/2014 Cho et al.
2014/0367654 A1 12/2014 Kim et al.
2015/0090989 A1 4/2015 Matsumoto et al.
2015/0097171 A1 4/2015 Kim et al.
2015/0144902 A1 5/2015 Do et al.
2015/0171337 A1 6/2015 Jung et al.
2015/0184104 A1 7/2015 Xu et al.
2015/0284580 A1 10/2015 Kawakami et al.
2015/0287846 A1 10/2015 Helander et al.
2015/0303336 A1 10/2015 Lefebvre et al.
2015/0333266 A1 11/2015 Ito et al.
2015/0376768 A1 12/2015 Veres et al.
2016/0005976 A1 1/2016 Mizuki et al.
2016/0013438 A1 1/2016 Im et al.
2016/0043325 A1 2/2016 Gorohmaru et al.
2016/0043341 A1 2/2016 Heo et al.
2016/0079543 A1 3/2016 Park et al.
2016/0099411 A1 4/2016 Kim et al.
2016/0104859 A1 4/2016 Kim et al.
2016/0133846 A1 5/2016 Ishii et al.
2016/0149155 A1 5/2016 Kim
2016/0149156 A1 5/2016 Kim et al.
2016/0155952 A1 6/2016 Hwang et al.
2016/0180763 A1 6/2016 Park et al.
2016/0181527 A1 6/2016 Mizuki et al.
2016/0181543 A1 6/2016 Ito et al.
2016/0211454 A1 7/2016 Kim et al.
2016/0211458 A1 7/2016 Ito et al.
2016/0211459 A1 7/2016 Ito et al.
2016/0222295 A1 8/2016 Lo et al.
2016/0225992 A1 8/2016 Ito et al.
2016/0233437 A1 8/2016 Suzuki et al.
2016/0260901 A1 9/2016 Kim et al.
2016/0268520 A1 9/2016 Mizuki et al.
2016/0284998 A1 9/2016 Kawamura et al.
2016/0293888 A1 10/2016 Shim et al.
2016/0308137 A1 10/2016 Park et al.
2016/0333137 A1 11/2016 Pan
2016/0351638 A1 12/2016 Im et al.
2016/0351818 A1 12/2016 Kim et al.
2016/0372524 A1 12/2016 Yun et al.
2016/0380198 A1 12/2016 Mizuki et al.
2017/0012221 A1 1/2017 Buesing et al.
2017/0018733 A1 1/2017 Jin et al.
2017/0033166 A1 2/2017 Shim et al.
2017/0062755 A1 3/2017 Im et al.
2017/0100607 A1 4/2017 Pan et al.
2017/0104166 A1 4/2017 Jeong et al.
2017/0117469 A1 4/2017 Ito et al.
2017/0125495 A1 5/2017 Lee et al.
2017/0125506 A1 5/2017 Kim
2017/0125687 A1 5/2017 Ikeda et al.
2017/0125703 A1 5/2017 Suzuki et al.
2017/0155078 A1 6/2017 Lee
2017/0170246 A1 6/2017 Im et al.
2017/0179397 A1 6/2017 Kim et al.
2017/0179402 A1 6/2017 Kim et al.
2017/0183291 A1 6/2017 Ito et al.
2017/0186831 A1 6/2017 Nam et al.
2017/0197998 A1 7/2017 Pan
2017/0222155 A1 8/2017 Cha et al.
2017/0237023 A1 8/2017 Kim et al.
2017/0256722 A1 9/2017 Shim et al.
2017/0309822 A1 10/2017 Mizuki et al.
2017/0313650 A1 11/2017 Stoessel et al.
2017/0317154 A1 11/2017 Heo
2017/0317284 A1 11/2017 Mizuki et al.
2017/0324045 A1 11/2017 Takahashi et al.
2017/0338438 A1 11/2017 Kwon et al.
2017/0342318 A1 11/2017 Kim et al.
2018/0006239 A1 1/2018 Yokoyama et al.
2018/0006264 A1 1/2018 Lee et al.
2018/0019398 A1 1/2018 Mizuki et al.
2018/0019408 A1 1/2018 Ko
2018/0040685 A1 2/2018 Yeo et al.
2018/0061323 A1 3/2018 Kwon et al.
2018/0062088 A1 3/2018 Cho et al.
2018/0083217 A1 3/2018 Chung et al.

(56) References Cited

U.S. PATENT DOCUMENTS

| | | | |
|---|---|---|---|
| 2018/0090063 | A1 | 3/2018 | Ying et al. |
| 2018/0102499 | A1 | 4/2018 | Pyo et al. |
| 2018/0123054 | A1 | 5/2018 | Gorohmaru et al. |
| 2018/0123055 | A1 | 5/2018 | Park et al. |
| 2018/0123078 | A1 | 5/2018 | Byun et al. |
| 2018/0127385 | A1 | 5/2018 | Jung et al. |
| 2018/0130949 | A1 | 5/2018 | Kim et al. |
| 2018/0145262 | A1 | 5/2018 | Zeng et al. |
| 2018/0148586 | A1 | 5/2018 | Reichert et al. |
| 2018/0158881 | A1 | 6/2018 | Lim et al. |
| 2018/0190934 | A1 | 7/2018 | Choi et al. |
| 2018/0197927 | A1 | 7/2018 | Tan et al. |
| 2018/0198076 | A1 | 7/2018 | Takahashi et al. |
| 2018/0198080 | A1 | 7/2018 | Noh et al. |
| 2018/0212060 | A1 | 7/2018 | Kang et al. |
| 2018/0219058 | A1 | 8/2018 | Xiang et al. |
| 2018/0226455 | A1 | 8/2018 | Kim et al. |
| 2018/0226581 | A1* | 8/2018 | Chang .................. H10K 50/828 |
| 2018/0240990 | A1 | 8/2018 | Choi et al. |
| 2018/0261797 | A1 | 9/2018 | Lee |
| 2018/0273563 | A1 | 9/2018 | Choi et al. |
| 2018/0294436 | A1 | 10/2018 | Choi et al. |
| 2018/0309058 | A1 | 10/2018 | Mizuki et al. |
| 2018/0309064 | A1 | 10/2018 | Aldred et al. |
| 2018/0309071 | A1 | 10/2018 | Jeon et al. |
| 2018/0309085 | A1 | 10/2018 | Park et al. |
| 2018/0315934 | A1 | 11/2018 | Nakata et al. |
| 2018/0315936 | A1 | 11/2018 | Hirade et al. |
| 2018/0323377 | A1 | 11/2018 | Mizuki et al. |
| 2018/0337219 | A1 | 11/2018 | Rhee et al. |
| 2018/0340032 | A1 | 11/2018 | Campbell et al. |
| 2018/0342682 | A1 | 11/2018 | Park et al. |
| 2018/0366678 | A1 | 12/2018 | Chi et al. |
| 2019/0013342 | A1 | 1/2019 | Kato et al. |
| 2019/0036032 | A1 | 1/2019 | Denker et al. |
| 2019/0081111 | A1 | 3/2019 | Lee et al. |
| 2019/0088204 | A1 | 3/2019 | Zhang et al. |
| 2019/0127328 | A1 | 5/2019 | Orimoto et al. |
| 2019/0130822 | A1 | 5/2019 | Jung et al. |
| 2019/0135827 | A1 | 5/2019 | Altenbach et al. |
| 2019/0237517 | A1 | 8/2019 | Hack |
| 2019/0250450 | A1 | 8/2019 | Li |
| 2019/0253591 | A1 | 8/2019 | Chen et al. |
| 2019/0273125 | A1 | 9/2019 | Takechi |
| 2019/0305246 | A1 | 10/2019 | Helander et al. |
| 2019/0317629 | A1 | 10/2019 | Jung et al. |
| 2019/0325805 | A1 | 10/2019 | Moon et al. |
| 2019/0340980 | A1 | 11/2019 | Yum et al. |
| 2019/0341435 | A1 | 11/2019 | Chang et al. |
| 2019/0341575 | A1 | 11/2019 | Chung et al. |
| 2019/0348627 | A1 | 11/2019 | Lee et al. |
| 2020/0035951 | A1 | 1/2020 | Cheon et al. |
| 2020/0044197 | A1 | 2/2020 | Shedletsky et al. |
| 2020/0064968 | A1 | 2/2020 | Kim et al. |
| 2020/0075683 | A1 | 3/2020 | Polyakov et al. |
| 2020/0075693 | A1 | 3/2020 | Polyakov et al. |
| 2020/0075864 | A1 | 3/2020 | Helander et al. |
| 2020/0099836 | A1 | 3/2020 | Chao |
| 2020/0105843 | A1 | 4/2020 | Baek et al. |
| 2020/0111401 | A1 | 4/2020 | Zhao et al. |
| 2020/0136077 | A1 | 4/2020 | Lee et al. |
| 2020/0159284 | A1 | 5/2020 | Mathew et al. |
| 2020/0194676 | A1 | 6/2020 | Chang et al. |
| 2020/0194730 | A1 | 6/2020 | Park et al. |
| 2020/0212130 | A1 | 7/2020 | Kim et al. |
| 2020/0357871 | A1 | 11/2020 | Chung et al. |
| 2020/0409412 | A1 | 12/2020 | Kim et al. |
| 2021/0134901 | A1 | 5/2021 | Sung et al. |
| 2021/0371967 | A1* | 12/2021 | Varagnolo ............. C23C 14/584 |
| 2022/0025134 | A1 | 1/2022 | Wehrmann et al. |
| 2022/0398759 | A1 | 12/2022 | Schindler et al. |

FOREIGN PATENT DOCUMENTS

| | | | |
|---|---|---|---|
| CA | 2890253 | A1 | 5/2014 |
| CN | 1284508 | A | 2/2001 |
| CN | 1460682 | A | 12/2003 |
| CN | 101299419 | A | 11/2008 |
| CN | 100526288 | C | 8/2009 |
| CN | 101617064 | A | 12/2009 |
| CN | 101730938 | A | 6/2010 |
| CN | 101932618 | A | 12/2010 |
| CN | 1625552 | B | 9/2011 |
| CN | 1696124 | B | 2/2012 |
| CN | 1784388 | B | 2/2012 |
| CN | 101812021 | B | 12/2012 |
| CN | 103467396 | A | 12/2013 |
| CN | 101267022 | B | 8/2014 |
| CN | 103992481 | A | 8/2014 |
| CN | 104037359 | A | 9/2014 |
| CN | 104769149 | A | 7/2015 |
| CN | 101503393 | B | 8/2015 |
| CN | 105094451 | A | 11/2015 |
| CN | 105097877 | A | 11/2015 |
| CN | 105206650 | A | 12/2015 |
| CN | 105206753 | A | 12/2015 |
| CN | 106206995 | A | 12/2016 |
| CN | 106317025 | A | 1/2017 |
| CN | 103788087 | B | 5/2017 |
| CN | 104558016 | B | 6/2017 |
| CN | 106992267 | A | 7/2017 |
| CN | 107021986 | A | 8/2017 |
| CN | 107522744 | A | 12/2017 |
| CN | 107564945 | A | 1/2018 |
| CN | 107573485 | A | 1/2018 |
| CN | 107573582 | A | 1/2018 |
| CN | 107808895 | A | 3/2018 |
| CN | 105849930 | B | 6/2018 |
| CN | 108376019 | A | 8/2018 |
| CN | 108389878 | A | 8/2018 |
| CN | 108418928 | A | 8/2018 |
| CN | 105359289 | B | 9/2018 |
| CN | 108630830 | A | 10/2018 |
| CN | 108767136 | A | 11/2018 |
| CN | 108881531 | A | 11/2018 |
| CN | 108900659 | A | 11/2018 |
| CN | 106189093 | B | 12/2018 |
| CN | 109299631 | A | 2/2019 |
| CN | 106046688 | B | 3/2019 |
| CN | 109461758 | A | 3/2019 |
| CN | 109599030 | A | 4/2019 |
| CN | 109742132 | A | 5/2019 |
| CN | 109817672 | A | 5/2019 |
| CN | 109817694 | A | 5/2019 |
| CN | 109830495 | A | 5/2019 |
| CN | 109920931 | A | 6/2019 |
| CN | 109950293 | A | 6/2019 |
| CN | 106432200 | B | 7/2019 |
| CN | 110112182 | A | 8/2019 |
| CN | 110144551 | A | 8/2019 |
| CN | 110265474 | A | 9/2019 |
| CN | 110391348 | A | 10/2019 |
| CN | 110416269 | A | 11/2019 |
| CN | 110429117 | A | 11/2019 |
| CN | 110444125 | A | 11/2019 |
| CN | 110459175 | A | 11/2019 |
| CN | 110473898 | A | 11/2019 |
| CN | 110473988 | A | 11/2019 |
| CN | 110491917 | A | 11/2019 |
| CN | 110491918 | A | 11/2019 |
| CN | 110492018 | A | 11/2019 |
| CN | 110518034 | A | 11/2019 |
| CN | 110570774 | A | 12/2019 |
| CN | 110718580 | A | 1/2020 |
| CN | 110727142 | A | 1/2020 |
| CN | 110752249 | A | 2/2020 |
| CN | 110767662 | A | 2/2020 |
| CN | 110767682 | A | 2/2020 |
| CN | 110767708 | A | 2/2020 |
| CN | 110767709 | A | 2/2020 |
| CN | 110767713 | A | 2/2020 |

(56) References Cited

FOREIGN PATENT DOCUMENTS

| | | | |
|---|---|---|---|
| CN | 110767736 | A | 2/2020 |
| CN | 110767830 | A | 2/2020 |
| CN | 110767844 | A | 2/2020 |
| CN | 110780375 | A | 2/2020 |
| CN | 110783484 | A | 2/2020 |
| CN | 110783485 | A | 2/2020 |
| CN | 110783486 | A | 2/2020 |
| CN | 110828699 | A | 2/2020 |
| CN | 110867527 | A | 3/2020 |
| CN | 110914891 | A | 3/2020 |
| CN | 110923625 | A | 3/2020 |
| CN | 110956925 | A | 4/2020 |
| CN | 110989861 | A | 4/2020 |
| CN | 111009619 | A | 4/2020 |
| CN | 111020489 | A | 4/2020 |
| CN | 111029381 | A | 4/2020 |
| CN | 111029382 | A | 4/2020 |
| CN | 111046599 | A | 4/2020 |
| CN | 111048564 | A | 4/2020 |
| CN | 111142180 | A | 5/2020 |
| CN | 111155055 | A | 5/2020 |
| CN | 111180490 | A | 5/2020 |
| CN | 111223908 | A | 6/2020 |
| CN | 111261641 | A | 6/2020 |
| CN | 111292617 | A | 6/2020 |
| CN | 111293235 | A | 6/2020 |
| CN | 111293236 | A | 6/2020 |
| CN | 111312795 | A | 6/2020 |
| CN | 111341936 | A | 6/2020 |
| CN | 210668382 | U | 6/2020 |
| CN | 111403621 | A | 7/2020 |
| CN | 111524460 | A | 8/2020 |
| CN | 111524469 | A | 8/2020 |
| CN | 111584725 | A | 8/2020 |
| CN | 111584748 | A | 8/2020 |
| CN | 111640882 | A | 9/2020 |
| CN | 111668240 | A | 9/2020 |
| CN | 111682055 | A | 9/2020 |
| CN | 111682120 | A | 9/2020 |
| CN | 111725288 | A | 9/2020 |
| CN | 111739921 | A | 10/2020 |
| CN | 111739924 | A | 10/2020 |
| CN | 111755493 | A | 10/2020 |
| CN | 111755623 | A | 10/2020 |
| CN | 111799374 | A | 10/2020 |
| CN | 111834547 | A | 10/2020 |
| CN | 111862875 | A | 10/2020 |
| CN | 111863900 | A | 10/2020 |
| CN | 109970981 | B | 4/2022 |
| CN | 110265702 | B | 6/2022 |
| DE | 19748109.6 | A1 | 5/1999 |
| EP | 0 375 967 | B1 | 3/1994 |
| EP | 0 357 360 | B1 | 6/1994 |
| EP | 0 444 822 | B1 | 9/1994 |
| EP | 1 299 913 | B | 4/2003 |
| EP | 1 465 874 | A2 | 10/2004 |
| EP | 1 551 206 | A1 | 7/2005 |
| EP | 1 213 337 | B1 | 11/2005 |
| EP | 1 816 114 | A1 | 8/2007 |
| EP | 1 850 368 | A1 | 10/2007 |
| EP | 1 873 162 | A1 | 1/2008 |
| EP | 2 055 709 | A2 | 5/2009 |
| EP | 2 055 710 | A1 | 5/2009 |
| EP | 2 067 766 | A1 | 6/2009 |
| EP | 2 067 767 | A1 | 6/2009 |
| EP | 2 075 309 | A2 | 7/2009 |
| EP | 2 080 795 | A1 | 7/2009 |
| EP | 2 175 005 | A1 | 4/2010 |
| EP | 2 180 029 | A2 | 4/2010 |
| EP | 2 066 150 | B1 | 5/2010 |
| EP | 2 182 040 | A2 | 5/2010 |
| EP | 2 202 283 | A1 | 6/2010 |
| EP | 2 062 958 | B1 | 7/2010 |
| EP | 1 602 648 | B1 | 4/2013 |
| EP | 2 028 249 | B1 | 5/2013 |
| EP | 1 621 597 | B1 | 9/2013 |
| EP | 2 722 350 | A1 | 4/2014 |
| EP | 2 270 897 | B1 | 12/2014 |
| EP | 1 009 044 | B1 | 7/2015 |
| EP | 2 473 564 | B1 | 2/2016 |
| EP | 2 462 203 | B1 | 3/2016 |
| EP | 2 998 997 | A1 | 3/2016 |
| EP | 3 089 232 | A1 | 11/2016 |
| EP | 2 197 979 | B1 | 12/2016 |
| EP | 3 182 477 | A1 | 6/2017 |
| EP | 3 185 325 | A1 | 6/2017 |
| EP | 2 248 849 | B1 | 7/2017 |
| EP | 3 240 036 | A1 | 11/2017 |
| EP | 3 316 311 | A1 | 5/2018 |
| EP | 3 331 045 | A1 | 6/2018 |
| EP | 3 336 899 | A1 | 6/2018 |
| EP | 2 434 558 | B1 | 7/2018 |
| EP | 3 396 728 | A1 | 10/2018 |
| EP | 3 406 752 | A1 | 11/2018 |
| EP | 3 499 576 | A1 | 6/2019 |
| EP | 3 149 012 | B1 | 10/2020 |
| GB | 1 096 600 | A | 12/1967 |
| GB | 1 188 212 | A | 4/1970 |
| IN | 229083 | B | 8/2007 |
| JP | 2002-212163 | A | 7/2002 |
| JP | 3588978 | B2 | 11/2004 |
| JP | 2004-352815 | A | 12/2004 |
| JP | 2005-041843 | A | 2/2005 |
| JP | 2007-188854 | A | 7/2007 |
| JP | 4025111 | B2 | 12/2007 |
| JP | 4025136 | B2 | 12/2007 |
| JP | 4025137 | B2 | 12/2007 |
| JP | 2008-133263 | A | 6/2008 |
| JP | 4185097 | B2 | 11/2008 |
| JP | 2008-291006 | A | 12/2008 |
| JP | 4308663 | B2 | 8/2009 |
| JP | 2009-535813 | A | 10/2009 |
| JP | 2009-266803 | | 11/2009 |
| JP | 2010-258410 | A | 11/2010 |
| JP | 4655790 | B2 | 3/2011 |
| JP | 2011-173972 | A | 9/2011 |
| JP | 4846982 | B2 | 12/2011 |
| JP | 2012-044125 | A | 3/2012 |
| JP | 4970934 | B2 | 7/2012 |
| JP | 4972844 | B2 | 7/2012 |
| JP | 2012-531426 | A | 12/2012 |
| JP | 5093879 | B2 | 12/2012 |
| JP | 5166961 | B2 | 3/2013 |
| JP | 5198657 | B2 | 5/2013 |
| JP | 5233074 | B2 | 7/2013 |
| JP | 2013-173771 | A | 9/2013 |
| JP | 2013-219278 | A | 10/2013 |
| JP | 5381748 | B2 | 1/2014 |
| JP | 5572134 | B2 | 8/2014 |
| JP | 2014-240374 | | 12/2014 |
| JP | 5645849 | B2 | 12/2014 |
| JP | 2017-503317 | A | 1/2017 |
| JP | 2018-533183 | A | 11/2018 |
| JP | 6786081 | B2 | 11/2020 |
| KR | 100691543 | B1 | 3/2007 |
| KR | 100826364 | B1 | 5/2008 |
| KR | 100858816 | B1 | 9/2008 |
| KR | 1020090128427 | A | 12/2009 |
| KR | 1020100041043 | A | 4/2010 |
| KR | 1020100054630 | A | 5/2010 |
| KR | 1020100066424 | A | 6/2010 |
| KR | 1020100123735 | A | 11/2010 |
| KR | 100998838 | B1 | 12/2010 |
| KR | 101020350 | B1 | 3/2011 |
| KR | 1020110123701 | A | 11/2011 |
| KR | 1020130077276 | A | 7/2013 |
| KR | 101317511 | B1 | 10/2013 |
| KR | 1020140062258 | A | 5/2014 |
| KR | 1020140126108 | A | 10/2014 |
| KR | 101530266 | B1 | 6/2015 |
| KR | 1020150103510 | A | 9/2015 |
| KR | 101561479 | B1 | 10/2015 |
| KR | 1020150120906 | A | 10/2015 |
| KR | 1020150127368 | A | 11/2015 |

(56) References Cited

FOREIGN PATENT DOCUMENTS

| | | | |
|---|---|---|---|
| KR | 101640772 | B1 | 7/2016 |
| KR | 101661925 | B1 | 10/2016 |
| KR | 1020170030168 | A | 3/2017 |
| KR | 1020170075865 | A | 7/2017 |
| KR | 1020180115655 | A | 10/2018 |
| KR | 1020180121304 | A | 11/2018 |
| KR | 1020190020930 | A | 3/2019 |
| TW | 227655 | B | 2/2005 |
| TW | 201105775 | A | 2/2011 |
| TW | 363054 | B | 5/2012 |
| TW | 485137 | B | 5/2015 |
| TW | 499653 | B | 9/2015 |
| TW | 201929219 | A | 7/2019 |
| WO | WO-95/33732 | A1 | 12/1995 |
| WO | WO-98/18804 | A1 | 5/1998 |
| WO | WO-02/096913 | A1 | 12/2002 |
| WO | WO-2006/070711 | A1 | 7/2006 |
| WO | WO-2006/070712 | A1 | 7/2006 |
| WO | WO-2008/010377 | A1 | 1/2008 |
| WO | WO-2008/069586 | A1 | 6/2008 |
| WO | WO-2009/099133 | A1 | 8/2009 |
| WO | WO-2009/102054 | A1 | 8/2009 |
| WO | WO-2010/050778 | A1 | 5/2010 |
| WO | WO-2010/064871 | A1 | 6/2010 |
| WO | WO-2010/094378 | A1 | 8/2010 |
| WO | WO-2010/114256 | A2 | 10/2010 |
| WO | WO-2010/114263 | A2 | 10/2010 |
| WO | WO-2010/122810 | A1 | 10/2010 |
| WO | WO-2010/134350 | A1 | 11/2010 |
| WO | WO-2010/151006 | A1 | 12/2010 |
| WO | WO-2011/012212 | A1 | 2/2011 |
| WO | WO-2011/049284 | A1 | 4/2011 |
| WO | WO-2011/074252 | A1 | 6/2011 |
| WO | WO-2011/074253 | A1 | 6/2011 |
| WO | WO-2011/115378 | A1 | 9/2011 |
| WO | WO-2011/129096 | A1 | 10/2011 |
| WO | WO-2012/070535 | A1 | 5/2012 |
| WO | WO-2013/109030 | A1 | 7/2013 |
| WO | WO-2013/100724 | A4 | 10/2013 |
| WO | WO-2013/180456 | A1 | 12/2013 |
| WO | WO-2013/183851 | A1 | 12/2013 |
| WO | WO-2013/187007 | A1 | 12/2013 |
| WO | WO-2014/024880 | A1 | 2/2014 |
| WO | WO-2014/025317 | A1 | 2/2014 |
| WO | WO-2014/104144 | A1 | 7/2014 |
| WO | WO-2014/163228 | A1 | 10/2014 |
| WO | WO-2015/005440 | A1 | 1/2015 |
| WO | WO-2015/033559 | A1 | 3/2015 |
| WO | WO-2015/041352 | A1 | 3/2015 |
| WO | WO-2016/042781 | A1 | 3/2016 |
| WO | WO-2016/056364 | A1 | 4/2016 |
| WO | WO-2017/072678 | A1 | 5/2017 |
| WO | WO-2018/100559 | A1 | 6/2018 |
| WO | WO-2018/103747 | A1 | 6/2018 |
| WO | WO-2018/198052 | A1 | 11/2018 |
| WO | WO-2018/206575 | A1 | 11/2018 |
| WO | WO-2018/211460 | A1 | 11/2018 |
| WO | WO-2019/002198 | A1 | 1/2019 |
| WO | WO-2019/006749 | A1 | 1/2019 |
| WO | WO-2019/047126 | A1 | 3/2019 |
| WO | WO-2019/062221 | A1 | 4/2019 |
| WO | WO-2019/062236 | A1 | 4/2019 |
| WO | WO-2019/088594 | A2 | 5/2019 |
| WO | WO-2019/141198 | A1 | 7/2019 |
| WO | WO-2019/147012 | A1 | 8/2019 |
| WO | WO-2019/150327 | A1 | 8/2019 |
| WO | WO-2019/178782 | A1 | 9/2019 |
| WO | WO-2019/199131 | A1 | 10/2019 |
| WO | WO-2019/199139 | A1 | 10/2019 |
| WO | WO-2019/199693 | A1 | 10/2019 |
| WO | WO-2019/200862 | A1 | 10/2019 |
| WO | WO-2019/233298 | A1 | 12/2019 |
| WO | WO-2019/242510 | A1 | 12/2019 |
| WO | WO-2020/029559 | A1 | 2/2020 |
| WO | WO-2020/029612 | A1 | 2/2020 |
| WO | WO-2020/029621 | A1 | 2/2020 |
| WO | WO-2020/045262 | A1 | 3/2020 |
| WO | WO-2020/052232 | A1 | 3/2020 |
| WO | WO-2020/057208 | A1 | 3/2020 |
| WO | WO-2020/079456 | A1 | 4/2020 |
| WO | WO-2020/105015 | A1 | 5/2020 |
| WO | WO-2020/134914 | A1 | 7/2020 |
| WO | WO-2020/191889 | A1 | 10/2020 |
| WO | WO-2020/192051 | A1 | 10/2020 |
| WO | WO-2020/195917 | A1 | 10/2020 |
| WO | WO-2020/199445 | A1 | 10/2020 |
| WO | WO-2020/226383 | A1 | 11/2020 |
| WO | WO-2020/261191 | A1 | 12/2020 |

OTHER PUBLICATIONS

Alhadid A. et al., "Design of Deep Eutectic Systems: A Simple Approach for Preselecting Eutectic Mixture Constituents", Molecules, 25.5 (2020):1077.

Allcock, H. R., and L. A. Siegel. "Phosphonitrilic compounds. III. 1 Molecular inclusion compounds of tris (o-phenylenedioxy) phosphonitrile trimer." Journal of the American Chemical Society 86.23 (1964): 5140-5144.

Allcock, H.R. "Phosphorus-nitrogen Compounds", pp. 400-407, Academic Press (1972).

Allcock, H.R. and Walsh, E.J., "Phosphonitrilic Compounds. XIV. Basic Hydrolysis of Aryloxy- and Spiroarylenedioxycyclophosphazenes", J. Amer. Chem. Soc., 94.13 (1972):4538-4545.

Allcock, Harry R., and Dawn E. Smith. "Surface studies of poly (organophosphazenes) containing dimethylsiloxane grafts." Chemistry of materials 7.8 (1995): 1469-1474.

Allcock, Harry R., and Michael L. Turner. "Ring expansion and polymerization of transannular bridged cyclotriphosphazenes and their spirocyclic analogs." Macromolecules 26.1 (1993): 3-10.

Allcock, Harry R., Gayann S. McDonnell, and James L. Desorcie. "Ring expansion and equilibration in organophosphazenes and the relationship to polymerization." Inorganic chemistry 29.19 (1990): 3839-3844.

Allcock, Harry R., Michael L. Turner, and Karyn B. Visscher. "Synthesis of transannular-and spiro- substituted cyclotriphosphazenes: x-ray crystal structures of 1, 1-[N3P3 (OCH2CF3) 4 {O2C12H8}], 1, 3-[N3P3 (OCH2CF3) 4 {O2C12H8}], 1, 1-[N3P3 (OCH2CF3) 4 {O2C10H6}], and 1, 3-[N3P3 (OCH2CF3) 4} O2C10H6}]." Inorganic chemistry 31.21 (1992): 4354-4364.

Araki, H. and Naka, K., "Syntheses and Properties of Dumbbell-Shaped POSS Derivatives Linked by Luminescent p-Conjugated Units", Polymer Chemistry, 50.20 (2012):4170-4181.

Araki, H. and Naka, K., "Syntheses and Properties of Star- and Dumbbell-Shaped POSS Derivatives Containing Isobutyl Groups", Polymer Journal, 44 (2012):340-346.

Araki, H. and Naka, K., "Syntheses of Dumbbell-Shaped Trifluoropropyl-Substituted POSS Derivatives Linked by Simple Aliphatic Chains and Their Optical Transparent Thermoplastic Films", Macromolecules, 44.15 (2011):6039-6045.

Asuncion, M.Z. et al., "Synthesis, Functionalization and Properties of Incompletely Condensed 'Half Cube' Silsesquioxanes as a Potential Route to Nanoscale Janus Particles", C. R. Chimie, 13.1-2 (2010):270-281.

Bae, J. et al. "Optically recoverable, deep ultraviolet (UV) stable and transparent sol-gel fluoro siloxane hybrid material for a UV LED encapsulant." RSC advances 6.32 (2016): 26826-26834.

Baradie, B. et al. "Synthesis and characterization of novel polysiloxane-grafted fluoropolymers." Canadian journal of chemistry 83.6-7 (2005): 553-558.

Barry, B., "Routes to Silsesquioxanes Functionalization—Capping of DDSQs for the Synthesis of Asymmetric POSS Compounds", Masters Thesis, Michigan State University (2019).

Bertolucci, M. et al. "Wetting Behavior of Films of New Fluorinated Styrene—Siloxane Block Copolymers." Macromolecules 37.10 (2004): 3666-3672.

(56) References Cited

OTHER PUBLICATIONS

Besli, S. et al., "Bridged Cyclophosphazenes Resulting From Deprotonation Reactions of Cyclotriphophazenes Bearing a P-NH Group", 40.19 (2011):5307.
Biederman, H. and Holland, L., "Metal Doped Fluorocarbon Polymer Films Prepared by Plasma Polymerization Using an RF Planar Magnetron Target", Nuclear Instruments and Methods, 212.1-3 (1983):497-503.
Biederman, H. et al., "The Properties of Fluorocarbon Films Prepared by R.F. Sputtering and Plasma Polymerization in Inert and Active Gas", Thin Solid Films, 41.3 (1977):329-339.
Blanchet, G.B., "Deposition of Amorphous Fluoropolymers Thin Films by Laser Ablation", Appl. Phys. Lett. 62 (1993):479-481.
Blanco, I., "The Rediscovery of POSS: A Molecule Rather than a Filler", Polymers, 10.8 (2018):904-914.
Boyne, D. et al., "Vacuum Thermal Evaporation of Polyaniline Doped with Camphor Sulfonic Acid", Journal of Vacuum Science & Technology A, 33.3 (2015):031510.
Brickley, J.F. et al., "Supramolecular Variations on a Molecular Theme: the Structural Diversity of Phosphazenes (RNH)6P3N3 in the Solid State", Dalton Trans., 7 (2003):1235-1244.
Buckley, D.H. and Johnson, R.L., "Degradation of Polymeric Compositions in Vacuum to 10-9 mm Hg in Evaporation and Sliding Friction Experiments", Polymer Engineering and Science, 4.4 (1964):306-314.
Buzin, M. I., et al. "Solid-state polymerization of hexaphenylcyclotrisiloxane." Journal of Polymer Science Part A: Polymer Chemistry 35.10 (1997): 1973-1984.
Cai, J. et al. "p. 13.10: A New Color Space Model for AMOLED Display Based on IR Drop" SID Symposium Digest of Technical Papers 54 (2023).
Camino, G. et al., "Polydimethylsiloxane Thermal Degradation Part 1. Kinetic Aspects", Polymer, 42.6 (2001): 2395-2402.
Chaiprasert, T. et al. "Vinyl-functionalized Janus ring siloxane: potential precursors to hybrid functional materials." Materials 14.8 (2021): 2014.
Chan, E.P. et al., "Viscoelastic Properties of Confined Polymer Films Measured via Thermal Wrinkling", Soft Matter, 5.23 (2009):4638-4641.
Chan, K.L. et al., "Cubic Silsesquioxanes for Use in Solution Processable Organic Light Emitting Diodes (OLED)", Journal of Materials Chemistry, 19.48 (2009):9103-9120.
Chandrasekhar, V. et al., "Cyclophosphazene-Based Multi-Site Coordination Ligands", Coordination Chemistry Reviews, 251.9-10 (2007):1045-1074.
Chaudhury, M. and Pocius, A. V. "Adhesion science and engineering-2: Surfaces, Chemistry and Applications" Elsevier (2002).
Chen, G. K. J., and J. Chen. "Flexible displays: Flexible AMOLED manufacturing." Handbook of Visual Display Technology; Chen, J., Cranton, W., Fihn, M., Eds (2016).
Chen, W. et al., "Highly Thermal Stable Phenolic Resin Based on Double-Decker-Shaped POSS Nanocomposites for Supercapacitors", Polymers, 12.9 (2020):2151-2165.
Cho, H.U. et al. "17-1: Invited Paper: Enhancement of Current Efficiency for OLED Devices Using Meta-Heuristic Algorithm." SID Symposium Digest of Technical Papers. 52.1 (2021).
Choi, B. K. et al. "48-1: Invited Paper: Next Generation Highly Efficient and Stable Phosphorescent Emitting Materials For OLEDs." SID Symposium Digest of Technical Papers 51.1 (2020).
Choi, J. et al., "Light Extraction Enhancement in Flexible Organic Light-Emitting Diodes by a Light-Scattering Layer of Dewetted Ag Nanoparticles at Low Temperatures", App. Mater. Interfaces, 10 (2018):32373-32379.
Cordes, D.B. et al., "Recent Developments in the Chemistry of Cubic Polyhedral Oligosilsesquioxanes", Chem. Rev., 110 (2010):2081-2173.
Dalvi, V.H. and Rossky, P.J., "Molecular Origins of Fluorocarbon Hydrophobicity", PNAS, 107.31 (2010): 13603-13607.
Dash, P. and Y. C.H. "How much battery does dark mode save? An accurate OLED display power profiler for modern smartphones." Proceedings of the 19th Annual International Conference on Mobile Systems, Applications, and Services (2021).
De Wilde, W., "Evaporation of Polytetrafluoroethylene by Electron Bombardment of the Bulk Material", Thin Solid Films, 24.1 (1974):101-111.
Dong, H. et al., "Surface Properties and Thermal Stability of a Novel Low-Surface-Energy Polybenzoxazine/Clay Nanocomposites", Polymer Composites, 33.8 (2012):1313-1320.
Drelich, J. et al., "Hydrophilic and Superhydrophilic Surfaces and Materials", Soft Matter, 7.21 (2011):9804-9828.
Dudziec, B. and Marciniec, B., "Double-decker Silsesquioxanes: Current Chemistry and Applications", Current Organic Chemistry, 21.28 (2017):2794-2813.
Dudziec, B. et al., "Synthetic Routes to Silsesquioxane-Based Systems as Photoactive Materials and Their Precursors", Polymers, 11.3 (2019):504-542.
Dutkiewicz, M. et al., "New Fluorocarbofunctional Spherosilicates: Synthesis and Characterization", Organometallics, 30.8 (2011):2149-2153.
Ellison, A. H., H. W. Fox, and W. A. Zisman. "Wetting of fluorinated solids by hydrogen-bonding liquids." The Journal of Physical Chemistry 57.7 (1953): 622-627.
Feher, F.J. and Budzichowski, T.A., "Silasesquioxanes as Ligands in Inorganic and Organometallic Chemistry", Polyhedron, 14.22 (1995):3239-3253.
Fox, H.W. et al., "Polyorganosiloxanes . . . Surface Active Properties", Ind. Eng. Chem., 39.11 (1947):1401-1409.
Gabler, D.G. and Haw, J.F., "Hydrolysis Chemistry of the Chlorophosphazene Cyclic Trimer", Inorganic Chemistry, 29.20 (1990):4018-4021.
Gan, Y. et al., "Self-Wrinkling Patterned Surface of Photocuring Coating Induced by the Fluorinated POSS Containing Thiol Groups (F-POSS-SH) as the Reactive Nanoadditive", Macromolecules, 45.18 (2012):7520-7526.
Gao Y., "Microphase Separation of Stimulus-Responsive Block-co-Polypeptides on Surfaces", Master's thesis, Duke University (2018).
Giebink, C. "Catastrophic OLED failure and pathways to address it" Department of Energy, url:https://www.energy.gov/sites/prod/files/2018/02/f48/giebink_oled-failure_nashville18_0.pdf (2018).
Glüge, J. et al., An Overview of the Uses of Per- and Polyfluoroalkyl Substances (PFAS), Environmental Science: Processes & Impacts, 20.12 (2020):2345-2373.
Gogoi, N. et al., "Low-Surface-Energy Materials Based on Polybenzoxazines for Surface Modification of Textiles", The Journal of The Textile Institute, 105.11 (2014):1212-1220.
Golovin, K. et al., "Low-Interfacial Toughness Materials for Effective Large-Scale Deicing", Science, 364.6438 (2019):371-375.
Golovin, K. et al., Supplementary Materials for "Low-Interfacial Toughness Materials for Effective Large-Scale Deicing", Science, 364.6438 (2019):371-375.
Goyal, S. et al. "Fundamentals of Organic-Glass Adhesion", Handbook of Materials Modeling, edited by Andreoni W. and Yip S., Springer Nature Switzerland AG (2020): 2049-2089.
Grant Norton, M. et al., "Pulsed Laser Ablation and Deposition of Fluorocarbon Polymers", Applied Surface Science, 96-98 (1996):617-620.
Gritsenko, K.P. and Krasovsky, A.M., "Thin-Film Deposition of Polymers by Vacuum Degradation", Chem. Rev., 103.9 (2003):3607-3649.
Grytsenko, K. "Vacuum-deposited fluoropolymer films for organic electronics" International Symphosium on Plastics Electronics (Part of Semicon Europe—2015) at Dresden, Germany (2015).
Grytsenko, K.P. et al., "Protective Applications of Vacuum-Deposited Perfluoropolymer Films", Semiconductor Physics, Quantum Electronics & Optoelectronics, 19.2 (2016):139-148.
Hoge, J. "Novel Benzoxazine Resin System for Flame Retardant Aircraft Interior Applications" The Sixth Triennial International Aircraft Fire and Cabin Safety Research (2010).
Holland, L. et al., "Sputtered and Plasma Polymerized Fluorocarbon Films", Thin Solid Films, 35 (1976): L19-L21.
Hwang, S. et al., "ChemInform Abstract: Dendritic Macromolecules for Organic Light-Emitting Diodes", Chemical Society Reviews, 37.11 (2008):2543-2557.

(56) References Cited

OTHER PUBLICATIONS

Lacono, S. T. et al. "Fluorinated polyhedral oligomeric silsesquioxanes (F-POSS), and pathways to address it", Defense Technical Information Center, url:https://apps.dtic.mil/sti/citations/ADA533422 (2010).
Iacono, S.T. et al., "Preparation of Composite Fluoropolymers with Enhanced Dewetting Using Fluorinated Silsesquioxanes as Drop-In Modifiers", J. Mater. Chem., 20.15 (2010):2979-2984.
Ibisoglu, H. et al., "Formation of Novel Spiro, Spiroansa and Dispiroansa Derivatives of Cyclotetraphosphazene From the Reactions of Polyfunctional Amines with Octachlorocyclotetraphosphazatetraene", J. Chem. Sci., 121.2 (2009):125-135.
Ikonnikov, D.A., "Controlling Multiple Diffraction with Quasiperiodic Gratings", Laser Phys. Lett., 16.12 (2019):126202.
Imoto, H. et al., "Corner- and Side-Opened Cage Silsesquioxanes: Structural Effects on the Materials Properties", European Journal of Inorganic Chemistry, 2020.9 (2020): 737-742.
Imoto, H. et al., "Tripodal Polyhedral Oligomeric Silsesquioxanes as a Novel Class of Three-Dimensional Emulsifiers", Polymer Journal, 47 (2015):609-615.
Ivleva, E.A. et al., "Synthesis of Adamantane Functional Derivatives Basing on N-[(Adamantan-1-yl)alkyl]acetamides", Russian Journal of Organic Chemistry, 52.11 (2016):1558-1564.
Iwamori, S. et al., "Adsorption Properties of Fluorocarbon Thin Films Prepared by Physical Vapor Deposition Methods", Surface & Coatings Technology, 204:16-17 (2010):2803-2807.
Iwamori, S., "Adhesion and Friction Properties of Fluorocarbon Polymer Thin Films Coated onto Metal Substrates", Key Engineering Materials, 384 (2008):311-320.
Jang, Sang Eok, et al. "Thermally stable fluorescent blue organic light-emitting diodes using spirobifluorene based anthracene host materials with different substitution position." Synthetic metals 160.11-12 (2010): 1184-1188.
Jarvis, N.L. and Zisman, W.A., "Surface Chemistry of Fluorochemicals", Defense Technical Information Center (1965):1-37.
Jin, Y. et al. "Two-Tier Ensemble Deep Learning Model for Anomaly Detection in OLED Encapsulation Process" The 21st International Meeting on Information Display, Seoul, Korea (2021).
Jung, W. et al. "High-precision laser glass cutting for future display" Journal of the Society for Information Display 30.5 (2022): 462-470.
Kaesler, K., "The hidden defenders : Silane and siloxane impregnation protects construction materials", European coatings journal, 3 (2006):36-41.
Kim, Chiwoo, et al. "Fine metal mask material and manufacturing process for high-resolution active-matrix organic light-emitting diode displays." Journal of the Society for Information Display 28.8 (2020): 668-679.
Kim, G. et al. "Multiscale Calculation of Carrier Mobility in Organic Solids Through the Fine-Tuned Kinetic Monte Carlo Method" The 21st International Meeting on Information Display, Seoul, Korea (2021).
Kim, H. et al. "83-2: Reliability Characterization of Luminance Degradation of OLED Mobile Display Considering Color Difference Index Based on Usage Patterns." SID Symposium Digest of Technical Papers 51.1 (2020).
Kim, J. et al. "Design of Stable Blue Phosphorescent OLEDs Using State Interaction between Exciplex and Component Host" The 21st International Meeting on Information Display, Seoul, Korea (2021).
Kim, J.H. et al., "Thickness and Composition Dependence of the Glass Transition Temperature in Thin Homogeneous Polymer Blend Films", Macromolecules, 35.1 (2002):311-313.
Kim, J.H. et al., "Thickness Dependence of the Glass Transition Temperature in Thin Polymer Films", Langmuir, 17.9 (2001):2703-2710.
Kim, J.H. et al., "Thickness Dependence of the Melting Temperature of Thin Polymer Films", Macromol. Rapid Commun. 22.6 (2001):386-389.
Kim, Kyu-Sung, et al. "Blue light-emitting OLED using new spiro [fluorene-7, 9'-benzofluorene] host and dopant materials." Organic Electronics 9.5 (2008): 797-804.
Kim, S et al. "25-3: Machine-Learning-Assisted Materials Discovery of Blue Emitter for More Efficient and Durable OLED Device." SID Symposium Digest of Technical Papers. 52.1 (2021).
Kim, S. "40-2: Invited Paper: Prolonging Device Lifetime of Blue Organic Light-Emitting Diodes." SID Symposium Digest of Technical Papers 53.1 (2022).
Kim, S. et al. "Autonomous Materials Design for More Efficient OLED Devices using Machine Learning" The 21st International Meeting on Information Display, Seoul, Korea (2021).
Kim, S. et al., "Origin of Macroscopic Adhesion in Organic Light-Emitting Diodes Analyzed at Different Length Scales", Scientific Reports, 8.6391 (2018): 1-7.
Kim, T. et al., "Electrical Injection and Transport in Teflon-Diluted Hole Transport Materials", Organic Electronics, 83 (2020):105754.
Kim, Y. "AI & Simulation Technology for Displays", SID 2021 Short Course, SID Display Week, virtual (2021).
Kim, Y. et al. "17-2: Invited Paper: Simulation Based Artificial Intelligence for Displays." SID Symposium Digest of Technical Papers. 52.1 (2021).
Kiskan, B., "Adapting Benzoxazine Chemistry for Unconventional Applications", Reactive and Functional Polymers, 129 (2018):76-88.
Koh, K et al., "Precision Synthesis of a Fluorinated Polyhedral Oligomeric Silsesquioxane-Terminated Polymer and Surface Characterization of Its Blend Film with Poly(methyl methacrylate)", Macromolecules, 38.4 (2005): 1264-1270.
Kota, Arun K., Gibum Kwon, and Anish Tuteja. "The design and applications of superomniphobic surfaces." NPG Asia Materials 6.7 (2014): e109.
Kovacik, P. et al., "Vacuum-Deposited Planar Heterojunction Polymer Solar Cells", ACS Appl. Mater. Interfaces, 3.1 (2011):11-15.
Krishnan, S. et al., "Fluorinated Polymers: Liquid Crystalline Properties and Applications in Lithography", The Chemical Record, 4.5 (2004):315-330.
Kunthom, R. et al., "Synthesis and Characterization of Unsymmetrical Double-Decker Siloxane (Basket Cage)", Molecules, 24.23 (2019):4252.
Kuo, S. et al., "Preparing Low-Surface-Energy Polymer Materials by Minimizing Intermolecular Hydrogen-Bonding Interactions", J. Phys. Chem. C, 113.48 (2009):20666-20673.
Lanoux, S. and Mas, R.H., "Reactions of the Hydrolyzed Phosphazene N3P3(OCH2CF3)5ONa", Phosphorus and Sulfur and the Related Elements, 26.2 (1986):139-142.
Lee, J. et al. "55-2: Methods for Overcoming the Trade-off between Efficiency and Lifetime of Organic Light-Emitting Diodes: OLED Lifetime Simulation." SID Symposium Digest of Technical Papers 51.1 (2020).
Lee, J.Y. and Saito, R., "Transparency and Water Vapor Barrier Properties of Polybenzoxazine-Silica Nanocomposites Provided with Perhydropolysilazane", J. Appl. Polym. Sci., 133.47 (2016):44238.
Lee, S. et al. "20-2: High Efficiency and Long Device Lifetime Green Organic Light Emitting Diodes using a Pt Complex." SID Symposium Digest of Technical Papers 51.1 (2020).
Li, L. et al., "Synthesis and Properties of Microporous Organic Polymers Based on Adamantane", Progress in Chemistry, 32 (2020):190-203.
Li, P. et al. "Preparation and application of fluorinated-siloxane protective surface coating material for stone inscriptions." Journal of Polymer Engineering 35.6 (2015): 511-522.
Li. J, et al. "40-4: Invited Paper: Self-Aligned Top-Gate Amorphous In—Ga—Zn—O Thin-Film Transistors with Hafnium-Induced Source/Drain Regions." SID Symposium Digest of Technical Papers. 54.1 (2023).
Liu, C. et al., "Mechanistic Studies on Ring-Opening Polymerization of Benzoxazines: A Mechanistically Based Catalyst Design", Macromolecules, 44.12 (2011):4616-4622.
Liu, F. et al. "Syntheses and structure of the first eight-membered fluoro and chloro hafnium siloxane complexes" Zeitschrift für anorganische und allgemeine Chemie 622.5 (1996): 819-822.

(56) References Cited

OTHER PUBLICATIONS

Liu, Z. et al., "Two-Dimensional Gratings of Hexagonal Holes for High Order Diffraction Suppression", Optics Express, 25.2 (2017): 1339-1349.
Lowe, R.D. et al., "Deposition of Dense Siloxane Monolayers from Water and Trimethoxyorganosilane Vapor", Langmuir, 27.16 (2011):9928-9935.
Lu, H. and Nutt, S., "Restricted Relaxation in Polymer Nanocomposites near the Glass Transition", Macromolecules, 36.11 (2003):4010-4016.
Lu, T. et al., "Blended Hybrids Based on Silsesquioxane-OH and Epoxy Resins", Journal of Applied Polymer Science, 106.6 (2007):4117-4123.
Lysien, M. et al. "55-1: Deposition of Conductive and Insulating Materials at Micrometer Scale for Display-Component Prototyping." SID Symposium Digest of Technical Papers 53.1 (2022).
Mabry, J.M. et al., "Fluorinated Polyhedral Oligomeric Silsesquioxanes (F-POSS)", Angew. Chem. Int. Ed., 47.22 (2008):4137-4140.
Mackus, A.J.M. et al. "From the bottom-up: toward area-selective atomic layer deposition with high selectivity" Chemistry of Materials 31.1 (2018): 2-12.
Majhy, B. et al., "Facile Fabrication and Mechanistic Understanding of a Transparent Reversible Superhydrophobic-Superhydrophilic Surface", Scientific Reports, 8 (2018):18018.
Mao, Y. and Gleason, K. K., "Vapor-Deposited Fluorinated Glycidyl Copolymer Thin Films with Low Surface Energy and Improved Mechanical Properties", Macromolecules, 39.11 (2006):3895-3900.
Marzari, N. et al. "Electronic-structure methods for materials design." Nature materials 20.6 (2021):736-749.
Mikhaylov, D.Y. and Budnikova, Y.H., "Fluoroalkylation of Organic Compounds", Russian Chemical Reviews, 82.9 (2013):835-864.
Mugisawa, M. et al., "Synthesis and Application of Novel Fluoroalkyl End-Capped Cooligomers Having Adamantane as a Pendant Group", Colloid Polym Sci, 285 (2007):737-744.
Murray, M. et al., "NMR Studies of Hydrolysis and Rearrangement Reactions of Cyclophosphazenes", Phosphorus, Sulfur, and Silicon and the Related Elements, 65.1-4 (1992):83-86.
Nason, T.C. et al., "Deposition of Amorphous Fluoropolymer Thin Films by Thermolysis of Teflon Amorphous Fluoropolymer", Appl. Phys. Lett. 60 (1992):1866-1868.
Nasrallah, H. and Hierso, J., "Porous Materials Based on 3-Dimensional Td-Directing Functionalized Adamantane Scaffolds and Applied as Recyclable Catalysts", Chem. Mater., 31.3 (2019):619-642.
Nicolas, G. and Spiegelmann, F., "Theoretical Study of Ethylene-Noble Metal Complexes", J. Am. Chem. Soc., 112 (1990):5410-5419.
Nishino, T. et al., "The Lowest Surface Free Energy Based on -CF3 Alignment", Langmuir, 15 (1999):4321-4323.
Niu, J. et al., "High Order Diffraction Suppression by Quasi-Periodic Two-Dimensional Gratings", Optical Materials Express, 7.2 (2017):366-375.
Office Action for Japanese Application No. 2021-566295 dated Dec. 14, 2023.
Ohnishi Y. et al., "Optical Characteristics of Poly(tetrafluoroethylene) Thin Film Prepared by a Vacuum Evaporation", Jpn. J. Appl. Phys., 55:2S (2016):02BB04.
Oka, M. and Satoshi, H. "Synthesis of photoresponsive cyclic poly (dimethyl siloxane) s from monodisperse linear precursors" Reactive and functional polymers 158 (2021): 104800.
Okui, N., H. M. Li, and J. H. Magill. "Thermal properties of poly (tetramethyl-p-silphenylene siloxane) and (tetramethyl-p-silphenylene siloxane-dimethyl siloxane) copolymers." Polymer 19.4 (1978): 411-415.
Olejnik, A. et al., "Silsesquioxanes in the Cosmetics Industry—Applications and Perspectives", Materials, 15.3 (2022):1126-1143.
Owen, M. J. "A review of significant directions in fluorosiloxane coatings" Surface Coatings International Part B: Coatings Transactions 87:B2 (2004).
Paulson, A.E et al., "Three-Dimensional Profiling of OLED by Laser Desorption Ionization-Mass Spectrometry Imaging", Journal of the American Society for Mass Spectrometry, 31.12 (2020), 2443-2451.
Pham, J.Q. and Green, P.F., "The Glass Transition of Thin Film Polymer/Polymer Blends: Interfacial Interactions and Confinement", J. Chem. Phys., 116.13 (2002):5801-5806.
Pocius, A. V. and Dillard, D.A. "Adhesion science and engineering-1: The Mechanics of Adhesion" Elsevier (2002).
Pu, T. et al., "Effects of Structure Parameters on High-Order Diffraction Suppression of Quasi-Periodic Gratings", Journal of the Optical Society of America B, 35.4 (2018):711-717.
Ramirez, S.M. et al., "Incompletely Condensed Fluoroalkyl Silsesquioxanes and Derivatives: Precursors for Low Surface Energy Materials", J. Am. Chem. Soc. 133.50 (2011):20084-20087.
Reichert, V.R. and Mathias, L.J., "Expanded Tetrahedral Molecules from 1,3,5,7-Tetraphenyladarnantane", Macromolecules, 27.24 (1994):7015-7023.
Riberiro, P et al., "Optics, Photonics and Laser Technology 2017", Chapters 2 and 3, Springer (2019).
Ringe, E., "Shapes, Plasmonic Properties, and Reactivity of Magnesium Nanoparticles", J. Phys, Chem. C, 124 (2020):15665.
Roy, M.R., "Surface Properties of Hard Fluorinated Amorphous Carbon Films Deposited by Pulsed-DC Discharges", Doctoral Thesis, Universitat de Barcelona (2012).
Sanju, K. S. "Synthesis of Organic Systems and Study of their Light Emitting Properties in Solution and Polymer Matrix." Chapter 1. https://shodhganga.inflibnet.ac.in/bitstream/10603/106813/8/08_chapter%201.pdf.
Schilling, C.I. et al., "Fourfold Suzuki-Miyaura and Sonogashira Cross-Coupling Reactions on Tetrahedral Methane and Adamantane Derivatives", Eur. J. Org. Chem., Sep. 2011 (2011): 1743-1754.
Seebauer, E.G. and Allen, C.E., "Estimating Surface Diffusion Coefficients", Progress in Surface Science, 49.3 (1995): 265-330.
Senchyk, A.G. et al., "1,2,4-Triazole Functionalized Adamantanes: a New Library of Polydentate Tectons for Designing Structures of Coordination Polymers", Dalton Trans., 41.28 (2012):8675-8689.
Senchyk, G.A. et al., "Functionalized Adamantane Tectons Used in the Design of Mixed-Ligand Copper(II) 1,2,4-Triazolyl/Carboxylate Metal-Organic Frameworks", Inorganic Chemistry, 52.2 (2013):863-872.
Sessler, C.D. et al., "CF2H, a Hydrogen Bond Donor", J. Am. Chem. Soc., 139.27 (2017):9325-9332.
Shen, Wen-Jian, et al. "Spirobifluorene-linked bisanthracene: An efficient blue emitter with pronounced thermal stability." Chemistry of materials 16.5 (2004): 930-934.
Shen. Y, et al. "32.1: Research of Nanocomposite Materials with High Refractive Index for HLEMS Application" SID Symposium Digest of Technical Papers 54 (2023).
Shevlin, S. et al. "Computational materials design." Nature Materials 20.6 (2021): 727-727.
Shih, H. et al., "A Cross-Linkable Triphenylamine Derivative as a Hole Injection/Transporting Material in Organic Light-Emitting Diodes", Polym. Chem., 6 (2015):6227-6237.
Shin, D. and Grassia, P. "Preliminary study on the self-patterning and self-registration of metal electrodes by exploiting the chemical and optical traits of an organic silver compound in conjunction with polyaniline." Journal of Micromechanics and Microengineering 20.2 (2010): 025030.
Sohn, I. et al. "Improved modeling of material deposition during OLED manufacturing using direct simulation monte carlo method on GPU Architecture." International Journal of Precision Engineering and Manufacturing-Green Technology 6 (2019): 861-873.
Sohn, I. et al. "Numerical Experiment Using Direct Simulation Monte Carlo for Improving Material Deposition Uniformity During OLED Manufacturing." International Journal of Precision Engineering and Manufacturing-Green Technology (2021): 1-14.
Spelt, J. K., Absolom, D. R., Neumann, A. W. "Solid Surface Tension: The Interpretation of Contact Angles by the Equation of State Approach and the Theory of Surface Tension Components." Langmuir 2.5 (1986): 620-625.

(56) References Cited

OTHER PUBLICATIONS

Spoljaric, S. et al., "Novel Elastomer-Dumbbell Functionalized POSS Composites: Thermomechanical and Morphological Properties", Journal of Applied Polymer Science, 123.1 (2012):585-600.
Starr, F.W. et al., "Bound Layers 'Cloak' Nanoparticles in Strongly Interacting Polymer Nanocomposites", ACS Nano, 10.12 (2016):10960-10965.
Sun, J. et al. "6-4: Late-News Paper: Realizing Deep Blue Emission in Blue Phosphorescent Organic Light-Emitting Diodes", SID Symposium Digest of Technical Papers, 51,2020: 65-66.
Sun, T. et al., "Reversible Switching between Superhydrophilicity and Superhydrophobicity", Angew. Chem. Int. Ed., 43.3 (2004):357-360.
Svorcik, V. et al., "Deposition of Polystyrene Films by Vacuum Evaporation", Journal of Materials Science Letters, 16 (1997):1564-1566.
Takele, H. et al., "Plasmonic Properties of Ag Nanoclusters in Various Polymer Matrices", Nanotechnology, 17.14 (2006):3499-3505.
Tao, C. et al., "Highly Icephobic Properties on Slippery Surfaces Formed From Polysiloxane and Fluorinated POSS", Progress in Organic Coatings, 103 (2017):48-59.
Thran, A., et al. "Condensation coefficients of Ag on polymers." Physical review letters 82.9 (1999): 1903-1906.
Tokuchi. S. et al. "8-4: Oxide Semiconductor In—Zn—O—X system with High Electron Mobility." SID Symposium Digest of Technical Papers 54.1 (2023).
Tong, T. et al., "Adhesion in Organic Electronics Structures", Journal of Applied Physics, 106.8 (2009): 083708.
Töpper, T. et al. "Siloxane-based thin films for biomimetic low-voltage dielectric actuators." Sensors and Actuators A: Physical 233 (2015): 32-41.
Tsubuku, M. et al. "8-1: Invited Paper: High Mobility Poly-Crystalline Oxide TFT Achieving Mobility over 50 cm2/Vs and High Level of Uniformity on the Large Size Substrates." SID Symposium Digest of Technical Papers 54.1 (2023).
Tsujioka, Tsuyoshi, Rie Takagi, and Takahiro Shiozawa. "Light-controlled metal deposition on photochromic polymer films." Journal of Materials Chemistry 20.43 (2010): 9623-9627.
Tuteja, A. et al., "Designing Superoleophobic Surfaces", Science, 318.5856 (2007):1618-1622.
Uslu, A. and Yesilot, S., "Chiral Configurations in Cyclophosphazene Chemistry", Coordination Chemistry Reviews, 291 (2015):28-67.
Usui, H. et al., "Anthracene and Polyethylene Thin Film Depositions by Ionized Cluster Beam", J. Vac. Sci. Technol., 4.1 (1986):52-60.
Usui, H. et al., "Effect of Substrate Temperature on the Deposition of Polytetrafluoroethylene by an Ionization-Assisted Evaporation Method", Journal of Vacuum Science & Technology A, 13.5 (1995):2318-2324.
Usui, H., "Deposition of Polymeric Thin Films by Ionization-Assisted Method", IEICE Trans. Electron., E83-C:7 (2000):1128-1133.
Vampola, K. J. et al. "12-1: Invited Paper: Through-OLED Display Ambient Color Sensing." SID Symposium Digest of Technical Papers. 53.1 (2022).
Van de Grampel, R.D., "Surfaces of Fluorinated Polymer Systems", Doctoral Thesis, Technische Universiteit Eindhoven (2002).
Vasilak, L. et al., "Statistical Paradigm for Organic Optoelectronic Devices: Normal Force Testing for Adhesion of Organic Photovoltaics and Organic Light-Emitting Diodes", ACS Appl. Mater. Interfaces, 9.15 (2017), 13347-13356.
Vij, A. et al. "Self Assembly of Ultrahydrophobic 'Teflon-Mimicking' Fluorinated (Polyhedral Oligomeric Silsesquioxanes) POSS Nano Columns" 14th European Symposium on Fluorine Chemistry, Poland (2004).
Vogelsang, D.F. et al., "Separation of Asymmetrically Capped Double-Decker Silsesquioxanes Mixtures", Polyhedron, 155 (2018): 189-193.
Von R. Schleyer, P. and Nicholas, R. D., "The Reactivity of Bridgehead Compounds of Adamantane", J. Am. Chem. Soc., 83.12 (1961):2700-2707.
Vu, B.D. et al., "Simple Two-step Procedure for the Synthesis of Memantine Hydrochloride from 1,3-Dimethyl-adamantane", ACS Omega, 5.26 (2020):16085-16088.
Wang, B. et al., "Graded-Index Fluoropolymer Antireflection Coatings for Invisible Plastic Optics", Nano Lett. 19.2 (2019):787-792.
Wang, C. et al., "Stable Superhydrophobic Polybenzoxazine Surfaces over a Wide pH Range", Langmuir, 22.20 (2006):8289-8292.
Wang, J. et al. "A new fluorinated polysiloxane with good optical properties and low dielectric constant at high frequency based on easily available tetraethoxysilane (TEOS)." Macromolecules 50.23 (2017): 9394-9402.
Wang, J. et al., "Fluorinated and Thermo-Cross-Linked Polyhedral Oligomeric Silsesquioxanes: New Organic-Inorganic Hybrid Materials for High Performance Dielectric Application", ACS Appl. Mater. Interfaces, 9.14 (2017):12782-12790.
Wang, Y. et al., "Substrate Effect on the Melting Temperature of Thin Polyethylene Films", Physical Review Letters, 96.2 (2006):028303.
Wei, H. and Eilers, H., "Electrical Conductivity of Thin-Film Composites Containing Silver Nanoparticles Embedded in a Dielectric Fluoropolymer Matrix", Thin Solid Films, 517.2 (2008):575-581.
Weigel, W.K. et al., "Direct Radical Functionalization Methods to Access Substituted Adamantanes and Diamondoids", Org. Biomol. Chem., 20 (2022):10-36.
Weiss, F.M. et al., "Molecular Beam Deposition of High-Permittivity Polydimethylsiloxane for Nanometer-Thin Elastomer Films in Dielectric Actuators", Materials and Design, 105 (2016):106-113.
Winget, P. et al. "57-1: Accelerating Next-Generation Display Materials Development with a Smart Digital Chemistry Platform." SID Symposium Digest of Technical Papers 54.1 (2023).
Wojtczak, L., "The Melting Point of Thin Films", Phys. Stat. Sol., 23.2 (1967):K163-K166.
Wu, Y. et al. "P-13.5: Investigation on Chromatic Dispersion of Reflection for CFOT Display" SID Symposium Digest of Technical Papers 54 (2023).
Xie, J. et al., "Regioselective Synthesis of Methyl-Substituted Adamantanes for Promoting Oxidation Stability of High-Density Fuels", Energy Fuels, 34.4 (2020):4516-4524.
Xu, J. et al., "Polyhedral Oligomeric Silsesquioxanes Tethered with Perfluoroalkylthioether Corner Groups: Facile Synthesis and Enhancement of Hydrophobicity of Their Polymer Blends", Journal of Materials Chemistry, 19.27 (2009):4740-4745.
Xu, X. et al. "A Unified Spatial-Angular Structured Light for Single-View Acquisition of Shape and Reflectance" Proceedings of the IEEE/CVF Conference on Computer Vision and Pattern Recognition (2023).
Xu, Y. et al. "Depth Estimation by Combining Binocular Stereo and Monocular Structured-Light" Proceedings of the IEEE/CVF Conference on Computer Vision and Pattern Recognition (2022).
Yang, H. et al., "Catalyst-Controlled C—H Functionalization of Adamantanes Using Selective H-Atom Transfer", ACS Catal., 9.6 (2019):5708-5715.
Yang, J. et al. "25-4: Methodology and Correlation of AI-Based Design for OLED Materials." SID Symposium Digest of Technical Papers 52.1 (2021).
Yao, Y. et al. "P-7.12: Research on High Brightness Mode Uniformity Problem of Flexible AMOLED Mobile" SID Symposium Digest of Technical Papers 54 (2023).
Yao, Z. et al. "Inverse design of nanoporous crystalline reticular materials with deep generative models." Nature Machine Intelligence 3.1 (2021): 76-86.
Yi, N. et al., "Preparation of Microstructure-Controllable Superhydrophobic Polytetrafluoroethylene Porous Thin Film by Vacuum Thermal-Evaporation", Front. Mater. Sci. 10.3 (2016):320-327.
Yoo, D. et al. "Retrosynthesis Planning for Thermally Activated Delayed Fluorescence Molecules" The 21st International Meeting on Information Display, Seoul, Korea (2021).

(56) References Cited

OTHER PUBLICATIONS

Youn, S. et al. "73-4: Novel Materials and Structures for High Efficiency and Long Lifetime Green Phosphorescent OLEDs in Automotive Applications." SID Symposium Digest of Technical Papers. 53.1 (2022).
Yun, J. et al. "A Novel Electroplex Host with Dual Triplet Exciton Up-Converting Channels for Long Lifetime Blue Phosphorescent Organic Light-Emitting Diodes" The 21st International Meeting on Information Display, Seoul, Korea (2021).
Zalewski, K. et al., "A Review of Polysiloxanes in Terms of Their Application in Explosives", Polymers, 13.7 (2021):1080-1090.
Zhang, W. et al., "Polymer/polyhedral Oligomeric Silsesquioxane (POSS) Nanocomposites: An Overview of Fire Retardance", Progress in Polymer Science, 67 (2017):77-125.
Zhang, W. et al., "Why We Need to Look Beyond the Glass Transition Temperature to Characterize the Dynamics of Thin Supported Polymer Films", PNAS Latest Articles, 115.22 (2018):5641-5646.
Zhu, C. et al. "A novel synthetic UV-curable fluorinated siloxane resin for low surface energy coating." Polymers 10.9 (2018): 979.
Zibarov, A. et al., "AB5 Derivatives of Cyclotriphosphazene for the Synthesis of Dendrons and Their Applications", Molecules, 26.13 (2021):4017-4040.
"Forrest, James A.""Reductions of the glass transition temperature in thin polymer films: Probing the length scale of cooperative dynamics."" Physical Review E 61.1 (2000): R53-6.".
Abraham, Michael H., et al. "Determination of molar refractions and Abraham descriptors for tris(acetylacetonato)chromium(III), tris(acetylacetonato)iron(III) and tris(acetylacetonato)cobalt(III)." New Journal of Chemistry 41 .23 (2017): 14259-14265.
Adams, R. O., A. Digiallonardo, and C. W. Nordin. "Films of rare earth oxides formed by electron beam evaporation." Thin Solid Films 154.1-2 (1987): 101-108.
Aftab, Alina. "Sintering Behavior, Structural, and Catalytic Properties of Ytterbium Oxide (Yb2O3)." (2019).
Ai, Lianghui, et al. "Synthesis and flame retardant properties of cyclophosphazene derivatives containing boron." Polymer Degradation and Stability 155 (2018): 250-261.
Alaaeddine, Ali, et al. "Synthesis and characterization of novel alternating fluorinated copolymers bearing oligo (ethylene oxide) side chains." Journal of Polymer Science Part A: Polymer Chemistry 51.4 (2013): 977-986.
Alipour, Mojtaba, and Zahra Safari. "Photophysics of OLED materials with emitters exhibiting thermally activated delayed fluorescence and used in hole/electron transporting layer from optimally tuned range-separated density functional theory." The Journal of Physical Chemistry C 123.1 (2018): 746-761.
Allcock, H. R. "Recent advances in phosphazene (phosphonitrilic) chemistry." chemical Reviews 72.4 (1972): 315-356.
Allcock, H. R. and Siegel, L. A. "Phosphonitrilic Compounds. 111.1 Molecular Inclusion Compounds of Tris(o-pheny1enedioxy)phosphonitrile Trimer." Journal of the American Chemical Society 86. 2591 (1964): 5140-5144.
Allcock, H. R., and D. B. Patterson. "Phosphorus-nitrogen compounds. 27. Ring-ring and ring-chain equilibration of dimethylphosphazenes. Relation to phosphazene polymerization." Inorganic Chemistry 16.1 (1977): 197-200.
Allcock, H. R., J. L. Schmutz, and Karen M. Kosydar. "A new route for poly (organophosphazene) synthesis. Polymerization, copolymerization, and ring-ring equilibration of trifluoroethoxy-and chloro-substituted cyclotriphosphazenes1, 2." Macromolecules 11.1 (1978): 179-186.
Allcock, H. R., R. L. Kugel, and K. J. Valan. "Phosphonitrilic compounds. VI. High molecular weight poly (alkoxy-and aryloxyphosphazenes)." Inorganic Chemistry 5.10 (1966): 1709-1715.
Allcock, H. R., W. J. Cook, and D. P. Mack. "Phosphonitrilic compounds. XV. High molecular weight poly [bis (amino) phosphazenes] and mixed-substituent poly (aminophosphazenes)." Inorganic Chemistry 11.11 (1972): 2584-2590.
Allcock, Harry R, et al. "Synthesis of transannular- and spiro-substituted cyclotriphosphazenes: x-ray crystal structures of 1,1-[N3P3(OCH2CF3)4{O2C12H8}], 1,3-[N3P3(OCH2CF3)4{O2C12H8}], 1,1-[N3P3(OCH2CF3)4{O2C10H6}], and 1,3-[N3P3(OCH2CF3)4}O2C10H6}]." Inorganic Chemistry 31.21 (1992): 4354-4364.
Allcock, Harry R. "The expanding field of polyphosphazene high polymers." Dalton Transactions 45.5 (2016): 1856-1862.
Allcock, Harry R. and Smith, Dawn E. "Surface Studies of Poly(organophosphazenes) Containing Dimethylsiloxane Grafts." Chemistry of Materials 7.8 (1995): 1469-1474.
Allcock, Harry R. and Turner, Michael L. "Ring Expansion and Polymerization of Transannular Bridged Cyclotriphosphazenes and Their Spirocyclic Analogues." Macromolecules 26.1 (1993): 3-10.
Allcock, Harry R., and Chen Chen. "Polyphosphazenes: phosphorus in inorganic-organic polymers." The Journal of Organic Chemistry 85.22 (2020): 14286-14297.
Allcock, Harry R., and Dennis C. Ngo. "Synthesis of poly [bis (phosphazo) phosphazenes] bearing aryloxy and alkoxy side groups." Macromolecules 25.11 (1992): 2802-2810.
Allcock, Harry R., and R. L. Kugel. "Synthesis of high polymeric alkoxy-and aryloxyphosphonitriles." Journal of the American Chemical Society 87.18 (1965): 4216-4217.
Allcock, Harry R., and Young Baek Kim. "Synthesis, characterization, and modification of poly (organophosphazenes) with both 2, 2, 2-trifluoroethoxy and phenoxy side groups." Macromolecules 27.14 (1994): 3933-3942.
Allcock, Harry R., et al. "Controlled refractive index polymers: polyphosphazenes with chlorinated-and fluorinated-, aryloxy-and alkoxy-side-groups." Chemistry of materials 15.2 (2003): 473-477.
Allcock, Harry R., et al. "Hydrophobic and superhydrophobic polyphosphazenes." Journal of adhesion science and technology 23.3 (2009): 435-445.
Allcock, Harry R., et al. "Plasma surface functionalization of poly [bis (2, 2, 2-trifluoroethoxy) phosphazene] films and nanofibers." Langmuir 23.15 (2007): 8103-8107.
Allcock, Harry R., et al. "Poly (monophosphazophosphazenes): New polymers with N: PR3 side groups." Macromolecules 27.26 (1994): 7556-7564.
Allcock, Harry R., et al. "Ring Expansion and Equilibration in Organophosphazenes and the Relationship to Polymerization." Inorganic Chemistry 29.19 (1990): 3839-3844.
Allcock, Harry R., et al. "Syntheses and structures of cyclic and short-chain linear phosphazenes bearing 4-phenylphenoxy side groups." Journal of the American Chemical Society 113.7 (1991): 2628-2634.
Allcock, Harry R., Lee B. Steely, and Anurima Singh. "Hydrophobic and superhydrophobic surfaces from polyphosphazenes." Polymer international 55.6 (2006): 621-625.
Amano, Akio, et al. "49.4 L: Late-News Paper: Highly Transmissive One Side Emission OLED Panel for Novel Lighting Applications." SID Symposium Digest of Technical Papers. vol. 44. No. 1. Oxford, UK: Blackwell Publishing Ltd, 2013.
Amat, Miguel A., et al. "Liquid-vapor equilibria and interfacial properties of -alkanes and perfluoroalkanes by molecular simulation." The Journal of chemical physics 132.11 (2010): 114704.
Aqra, Fathi, and Ahmed Ayyad. "Surface free energy of alkali and transition metal nanoparticles." Applied surface science 314 (2014): 308-313.
Aubouy, Miguel, et al. "Interfacial Properties of Polymeric Liquids." Physical Review Letters. 84.21 (2000): 4858-4861.
Aubouy, Miguel, Manoel Manghi, and Elie Rapha?l. "Interfacial properties of polymeric liquids." Physical Review Letters 84.21 (2000): 4858.
Azimi, Gisele, et al. "Hydrophobicity of rare-earth oxide ceramics (supplementary information)." Nature materials 12.4 (2013): 315-320.
Azimi, Gisele, et al. "Hydrophobicity of rare-earth oxide ceramics." Nature materials 12.4 (2013): 315-320.
B?hm, E., et al. "Novel transport materials for high-performance fluorescent and phosphorescent OLEDs." Journal of Information Display 12.3 (2011): 141-144.

(56) References Cited

OTHER PUBLICATIONS

Baek, Jang-Yeol, et al. "New asymmetrical limb structured blue emitting material for OLED." Optical Materials Express 4.6 (2014): 1151-1158.
Baek, Seungin, et al. "74-2: Diffracted Image Retrieving with Deep Learning."?SID Symposium Digest of Technical Papers. vol. 51. No. 1. 2020.
Balague, J., et al. "Synthesis of fluorinated telomers. Part 1. Telomerization of vinylidene fluoride with perfluoroalkyl iodides." Journal of Fluorine Chemistry 70.2 (1995): 215-223.
Barrett, Eric W., et al. "Patterning poly (organophosphazenes) for selective cell adhesion applications." Biomacromolecules 6.3 (2005): 1689-1697.
Batsanov, S. S., G. N. Grigor'eva, and N. P. Sokolova. "Optical properties of oxides of the rare-earth metals." Journal of Structural Chemistry 3.3 (1962): 323-325.
Bechtolsheim, C. V., V. Zaporojtchenko, and F. Faupel. "Interface structure and formation between gold and trimethylcyclohexane polycarbonate." Journal of materials research 14.9 (1999): 3538-3543.
Becke-Goehring, Margot, and Ekkehard Fluck. "Phosphonitrilic chlorides from phosphorus pentachloride." Angewandte Chemie International Edition in English 1.6 (1962): 281-285.
Beier, Petr, et al. "Preparation of SF5 Aromatics by Vicarious Nucleophilic Substitution Reactions of Nitro(pentafluorosulfanyl)benzenes with Carbanions." Journal of Organic Chemistry 76.11 (2011): 4781-4786.
Ben'kovskii, V.G., et al. "Density, surface tension and refractive index of aromatic hydrocarbons at low temperatures." Chemistry and Technology of Fuels and Oils 2.1 (1966): 23-26.
Bernstein, M.P., et al. "Ultraviolet irradiation of the polycyclic aromatic hydrocarbon (PAH) naphthalene in H2O. Implications for meteorites and biogenesis." Advances in Space Research 30.6 (2002): 1501-1508.
Bes**li, Serap, et al. "Regiochemical control in the substitution reactions of cyclotriphosphazene derivatives with secondary amines." Inorganic Chemistry 57.19 (2018): 12066-12077.
Bézière, Nicolas, and Ntziachristos, Vasilis. "Optoacoustic Imaging of Naphthalocyanine: Potential for Contrast Enhancement and Therapy Monitoring." Naphthalocyanine In Optoacoustic Imaging 56.2 (2015): 323-328.
Biddlestone, M., and R. A. Shaw. "A two-ring assembly phosphazene." Chemical Communications (London) 7 (1968): 407-408.
Bierwagen, Oliver, et al. "Oxygen-deficient oxide growth by subliming the oxide source material: The cause of silicide formation in rare earth oxides on silicon." Crystal growth & design 13.8 (2013): 3645-3650.
Breu, Josef, et al. "Crystal Structure of fac- Ir (ppy) 3 and Emission Properties under Ambient Conditions and at High Pressure." Chemistry of materials 17.7 (2005): 1745-1752.
Brown, Douglas E., et al. "Poly[(vinyloxy)cyclophosphazenes]." Macromolecules 34.9 (2001), 2870-2875.
Buzin, M. I., et al. "Solid-State Polymerization of Hexaphenylcyclotrisiloxane." Journal of Polymer Science 35.10 (1997): 1973-1984.
Calhoun, Harry P. Studies on the ligand properties of phosphonitrilic derivatives. Diss. University of British Columbia, 1973.
Carolina Mart?nez Ceballos, Evelyn, et al. "Synthesis and characterization of polyphosphazenes modified with hydroxyethyl methacrylate and lactic acid." International Journal of Polymer Science 2013 (2013).
Carriedo, Gabino A., et al. "Preparation of a new type of phosphazene high polymers containing 2, 2 '- dioxybiphenyl groups." Macromolecules 29.16 (1996): 5320-5325.
Casas-Solvas, Juan M., et al. "Synthesis of substituted pyrenes by indirect methods." Organic & Biomolecular Chemistry 12.2 (2014): 212-232.
Chambrier, Isabelle, et al. "Synthesis of Porphyrin-CdSe Quantum Dot Assemblies: Controlling Ligand Binding by Substituent Effects. " Inorganic chemistry 54.15 (2015): 7368-7380.
Chang, Li, et al. "A smart surface with switchable wettability by an ionic liquid." Nanoscale?9.18 (2017): 5822-5827.
Charpentier, P. A., et al. "Continuous polymerizations in supercritical carbon dioxide: chain-growth precipitation polymerizations." Macromolecules 32.18 (1999): 5973-5975.
Chen, Hsiao-Fan, et al. "1,3,5-Triazine?derivatives as new electron transport-type host materials for highly efficient green phosphorescent OLEDs." Journal of Materials Chemistry 19.43 (2009): 8112-8118.
Chen, Yu-Hung, et al. "58.2: High-Performance Large-Size OLED Tv with Ultra Hd Resolution." SID Symposium Digest of Technical Papers. vol. 46. No. 1. 2015.
Cheng, Yu, et al. "Delivery and efficacy of a cancer drug as a function of the bond to the gold nanoparticle surface." Langmuir 26.4 (2010): 2248-2255.
Chevir?, Fran?ois, Franck Tessier, and Roger Marchand. "Optical properties of rare-earth oxides and oxynitrides, . . . towards "second generation" UV absorbers." Silicates industriels 69.5-6 (2004): 159-163.
Ching, Suet Ying. "Plasmonic properties of silver-based alloy thin films." (2015). Open Access Theses and Dissertations. 194.
Ching, Suet Ying. "Plasmonic properties of silver-based alloy thin films." (2016).
Cho, Song Yun, and Harry R. Allcock. "Novel highly fluorinated perfluorocyclobutane-based phosphazene polymers for photonic applications." Chemistry of Materials 19.25 (2007): 6338-6344.
Ciftci, et al. "Investigation of the structural properties of 2-naphthylamine substituted cyclotetraphosphazenes." Polyhedron 77 (2014): 1-9.
Condorelli, Guglielmo G., et al. "Engineering of molecular architectures of β-diketonate precursors toward new advanced materials." Coordination chemistry reviews 251 .13-14 (2007): 1931-1950.
Crowder, Gene A., et al. "Vapor pressures and triple point temperatures for several pure fluorocarbons." Journal of Chemical and Engineering Data 12.4 (1967): 481-485.
Cuny, Philippe, et al. "Phenanthrene degradation, emulsification and surface tension activities of a pseudomonas putida strain isolated from a coastal oil contaminated microbial mat." Ophelia, 58.3 (2004), 283-287.
Dalvi, Vishwanath H., Rossky, Peter J. "Molecular origins of fluorocarbon hydrophobicity." Proceedings of the National Academy of Sciences of the United States of America 107.31 (2010): 13603-13607.
Dams, Rudy, and Hintzer, Klaus. "Chapter 1:Industrial Aspects of Fluorinated Oligomers and Polymers." Fluorinated Polymers: vol. 2: Applications (2016): 1-31.
Das, Prajwalita, et al. "Recent advancements in the synthesis of pentafluorosulfanyl (SF5)-containing heteroaromatic compounds." Tetrahedron Letters 58.52 (2017): 4803-4815.
David, Robert, Neumann, A. Wilhelm. "A Theory for the Surface Tensions and Contact Angles of HydrogenBonding Liquids." Langmuir 30.39 (2014):11634-11639.
Dawood, Kamal M., et al. "Electrolytic fluorination of organic compounds." Tetrahedron 7.60 (2004): 1435-1451.
Dayneko, Sergey, et al. "Effect of surface ligands on the performance of organic light-emitting diodes containing quantum dots." Optoelectronic Devices and Integration V. vol. 9270. SPIE, 2014.
Devaux, Didier, et al. "Crosslinked perfluoropolyether solid electrolytes for lithium ion transport." Solid State Ionics 310 (2017): 71-80.
Di Nicola, Giovanni, Gianluca Coccia, and Mariano Pierantozzi. "Surface tension of silanes: A new equation." Fluid Phase Equilibria 418 (2016): 88-93.
Dikarev, Evgeny V., et al. "Heterometallic Bismuth-Transition Metal Homoleptic B-Diketonates." Journal of the American Chemical Society 127.17 (2005): 6156-6157.
Dolbier, William R. Jr., and Kanishchev, Oleksandr S. "Chapter One—SF5-Substituted Aromatic Heterocycles." Advances in Heterocyclic Chemistry 120 (2016): 1-42.
Dolbier, William R. Jr., and Zheng, Zhaoyun. "Use of 1,3-Dipolar Reactions for the Preparation of SF5-Substituted Five-Membered Ring Heterocycles. Pyrroles and Thiophenes." / Journal of Fluorine Chemistry 132.6(2011): 389-393.

(56) References Cited

OTHER PUBLICATIONS

Drake, Simon R., et al. "Lanthanide β-diketonate glyme complexes exhibiting unusual co-ordination modes." Journal of the Chemical Society, Dalton Transactions 15 (1993): 2379-2386.
Drelich, Jaroslaw, et al. "Hydrophilic and Superhydrophilic Surfaces and Materials." Soft Matter, 7.21 (2011): 9804-9828.
Du, Libin, et al. "Fluoropolymer synthesis in supercritical carbon dioxide." The Journal of Supercritical Fluids 47.3 (2009): 447-457.
Dubrovskii, Vladimir. "Fundamentals of Nucleation Theory." Nucleation Theory and Growth of Nanostructures. Springer, Berlin, Heidelberg, 2014. 1-73.
Ebnesajjad, S. "Fluoroplastics: vol. 1: Non-Melt Processible Fluoroplastics. 2000." Plastics Design Library: United States of America, Norwich, NY, Chapter 11.
Ebnesajjad, Sina. "Chapter 4: Introduction to Fluoropolymers." Applied Plastics Engineering Handbook. William Andrew Publishing, Oxford 2011: 49-60.
Edrissi, M., et al. "Novel Method for the Preparation of Copper Phthalocyanin Blue Nanoparticles in an Electrochemical Cell Irradiated by Microwave (Research Note)". International Journal of Engineering, 20.3 (2007): 257-262.
Eguchi, Shingo, et al. "35-1: Strategy for Developing an Ultra-High-Luminance AMOLED Display." SID Symposium Digest of Technical Papers. vol. 49. No. 1. 2018.
Eilers, H., et al. "Teflon AF/Ag nanocomposites with tailored optical properties." Journal of materials research 21.9 (2006): 2168-2171.
Ellis, David A., et al. "Degradation of Fluorotelomer Alcohols:? A Likely Atmospheric Source of Perfluorinated Carboxylic Acids." Environmental science & technology 38.12 (2004): 3316-3321.
Ellis, David A., et al. "Partitioning of organofluorine compounds in the environment." Organofluorines. Springer, Berlin, Heidelberg, 2002. 63-83.
Ellison, A. H., et al. "Wetting of Fluorinated Solids by Hydrogen-Bonding Liquids." The Journal of Physical Chemistry 57.7 (1953): 622-627.
Elmas, Gamze, et al. "Phosphorus-nitrogen compounds. Part 52. The reactions of octachlorocyclotetraphosphazene with sodium 3-(N-ferrocenylmethylamino)-1-propanoxide: Investigations of spectroscopic, crystallographic and stereogenic properties." Inorganica Chimica Acta 497 (2019): 119106.
Emerton, Neil, David Ren, and Tim Large. "28-1: Image Capture Through TFT Arrays." SID Symposium Digest of Technical Papers. vol. 51. No. 1. 2020.
Endo, Ayataka, et al. "Measurement of photoluminescence efficiency of Ir (III) phenylpyridine derivatives in solution and solid-state films." Chemical Physics Letters 460.1-3 (2008): 155-157.
Evers, Robert C. "Low glass transition temperature fluorocarbon ether bibenzoxazole polymers." Journal of Polymer Science: Polymer Chemistry Edition 16.11 (1978): 2833-2848.
Farrow, Darcie A., et al. "Polarized pump-probe measurements of electronic motion via a conical intersection." The Journal of Chemical Physics 128.14 (2008): 144510.
Faupel, F., et al. "Nucleation, growth, interdiffusion, and adhesion of metal films on polymers." ?AIP Conference Proceedings. vol. 491. No. 1. American Institute of Physics, 1999.
Feistel, G. R., and T. Moeller. "The geminal structure of the compound N3P3CI4 (NH2) 2." Journal of Inorganic and Nuclear Chemistry 29.11 (1967): 2731-2737.
Feng, Zhengyu, et al. "28-3: Pixel Design for Transparent MicroLED Display with Low Blurring."?SID Symposium Digest of Technical Papers. vol. 51. No. 1. 2020.
Finkenzeller, Walter J., and Hartmut Yersin. "Emission of Ir (ppy) 3. Temperature dependence, decay dynamics, and magnetic field properties." Chemical physics letters 377.3-4 (2003): 299-305.
Flaningam, Ora L. "Vapor pressures of poly (dimethylsiloxane) oligomers." Journal of Chemical and engineering Data 31.3 (1986): 266-272.
Flores-Camacho, Jose Manuel, et al. "Growth and optical properties of Ag clusters deposited on poly (ethylene terephthalate)." Nanotechnology 22.27 (2011): 275710.
Fluorosilicone Fluids, retrieved from <https://s3.amazonaws.com/gelest/product-brochures/Inert_Silicones.pdf> on Mar. 24, 2022.
Formica, Nadia, et al. "Ultrastable and Atomically Smooth Ultrathin Silver Films Grown on a Copper Seed Layer." ACS Applied Materials & Interfaces 5.8 (2013): 3048-3053.
Fowkes, Frederick M. "Attractive Forces at Interfaces." Industrial and Engineering Chemistry 56.12 (1964): 40-52.
Freire, Mara G., et al. "Surface Tension of Liquid Fluorocompounds." Journal of Chemical & Engineering Data 51.5 (2006): 1820-1824.
Frey, Kurt, et al. "Implications of coverage-dependent O adsorption for catalytic NO oxidation on the late transition metals." Catalysis Science & Technology 4.12 (2014): 4356-4365.
Fryer, David S., et al. "Dependence of the glass transition temperature of polymer films on interfacial energy and thickness."? Macromolecules?34.16 (2001): 5627-5634.
Furukawa, Yutaka, et al. "Fluorosilicone elastomer based on the poly [(3, 3, 3-trifluoropropyl) methyl-siloxane-co-(3, 3, 4, 4, 5, 5, 6, 6, 6-nonafluorohexyl) methylsiloxane]." Polymers for Advanced Technologies 13.1 (2002): 60-65.
Furukawa, Yutaka, et al. "Reactivity of cyclosiloxane with 3, 3, 4, 4, 5, 5, 6, 6, 6-nonafluorohexyl group and its application to fluorosilicone synthesis." Journal of applied polymer science 82.13 (2001): 3333-3340.
Fusella, Michael A., et al. "Plasmonic enhancement of stability and brightness in organic light-emitting devices." Nature 585.7825 (2020): 379-382.
Fushimi, Toshiki, and Harry R. Allcock. "Synthesis and optical properties of sulfur-containing monomers and cyclomatrix polyphosphazenes." Dalton transactions 39.22 (2010): 5349-5355.
Gali, Sai Manoj, et al. "Ambipolarity and dimensionality of charge transport in crystalline group 14 phthalocyanines: A computational study." The Journal of Physical Chemistry C 122.5 (2018): 2554-2563.
Gan, Yanchang, Xuesong Jiang, and Jie Yin. "Self-wrinkling patterned surface of photocuring coating induced by the fluorinated POSS containing thiol groups (F-POSS-SH) as the reactive nanoadditive." Macromolecules 45.18 (2012): 7520-7526.
Gao, Lichao, et al. "Teflon is Hydrophilic. Comments on Definitions of Hydrophobic, Shear versus Tensile Hydrophobicity, and Wettability Characterization." Langmuir 24.17 (2008): 9183-9188.
Garrick, Lloyd M. "Novel , New Aromatic SF 5 Derivatives ! Prepared in High Yield via Highly Versatile & Cost Competitive Methods." (2019).
Gavrilenko, V. V., et al. "Synthesis of yttrium, lanthanum, neodymium, praseodymium, and lutetium alkoxides and acetylacetonates." Bulletin of the Russian Academy of Sciences, Division of chemical science 41.11 (1992): 1957-1959.
Golemme, Gianni, et al. "Perfluoropolymer/Molecular Sieve Mixed-Matrix Membranes." Membranes 9.2 (2019): 19.
Golovin, Kevin, et al. "Low-interfacial toughness materials for effective large-scale deicing." Science 364.6438 (2019): 371-375.
Graham, Paul, et al. "Fluoropolymers with very low surface energy characteristics." Journal of Fluorine Chemistry 104.1 (2000): 29-36.
Grant, Trevor M., et al. "Multifunctional ternary additive in bulk heterojunction OPV: increased device performance and stability." Journal of Materials Chemistry A 5.4 (2017): 1581-1587.
Gray, Victor, et al. "Photophysical characterization of the 9,10-disubstituted anthracene chromophore and its applications in triplet-triplet annihilation photon upconversion." Journal of Materials Chemistry C 3.42 (2015): 11111-11121.
Green, Mark. "The nature of quantum dot capping ligands." Journal of Materials Chemistry 20.28 (2010): 5797-5809.
Grzyll, Lawrence R., et al. "Density, Viscosity, and Surface Tension of Liquid Quinoline, Naphthalene, Biphenyl, Decafluorobiphenyl, and 1,2-Diphenylbenzene from 300 to 400 ?C." Journal of Chemical & Engineering Data 41.3 (1996): 446-450.
Guo, X. Andrew, et al. "Preparation and characterization of acrylates and polyacrylates having variable fluorine contents and distributions." Journal of Polymer Science Part A: Polymer Chemistry 32.1 (1994): 47-56.
Hammer, Nathan I., et al. "Quantum dots coordinated with conjugated organic ligands: new nanomaterials with novel photophysics." Nanoscale Research Letters 2.6 (2007): 282-290.

(56) References Cited

OTHER PUBLICATIONS

Han, Yoon Deok, et al. "Quantum dot and p-conjugated molecule hybrids: nanoscale luminescence and application to photoresponsive molecular electronics." NPG Asia Materials 6.6 (2014): e103-e103.
Handke, Bartosz, Lukasz Klita, and Wiktor Niemiec. "Self-assembly of dodecaphenyl POSS thin films." Surface Science 666 (2017): 70-75.
Hashimoto, A. "Evaporation kinetics of oxides of rare earth and refractory trace elements, and the chemical fractionation of hibonite by evaporation." Lunar and Planetary Science Conference. vol. 22. 1991.
Hashimoto, A. "Evaporation kinetics of REE oxides." Lunar and Planetary Science Conference. vol. 19. 1988.
Heaney, James B. "Evaluation of commercially supplied silver coated Teflon for spacecraft temperature control usage." (1974).
Hedley, Gordon J., Arvydas Ruseckas, and Ifor DW Samuel. "Ultrafast luminescence in Ir (ppy) 3." Chemical Physics Letters 450.4-6 (2008): 292-296.
Heinrich, Darina, et al. "Synthesis of Cyclopentadiene Ligands with Fluorinated Substituents by Reaction of Cobaltocene with Fluoroalkenes." European Journal of Inorganic Chemistry 2014.30 (2014): 5103-5106.
Herzog, Axel, et al. "A Perfluorinated Nanosphere: Synthesis and Structure of Perfluoro-deca-B-methyl-para-carborane." Angewandte Chemie International Edition 40.11 (2001): 2121-2123.
Hiroto, Satoru, et al. "Synthetic protocol for diarylethenes through Suzuki-Miyaura coupling." Chemical communications 47.25 (2011): 7149-7151.
Ho, P. S. "Chemistry and adhesion of metal-polymer interfaces." Applied surface science 41 (1990): 559-566.
Ho, P. S., et al. "Chemical bonding and reaction at metal/polymer interfaces." Journal of Vacuum Science & Technology A: Vacuum, Surfaces, and Films 3.3 (1985): 739-745.
Hodges, A. M., et al. "New pentafluoro-?6-sulfanyl (SF5) perfluoroalkyl benzene derivatives." Journal of fluorine chemistry 114.1 (2002): 3-8.
Hoene, Joan Von, et al. "Thermal Decomposition of Metal Acetylacetonates: Mass Spectrometer Studies." The Journal of Physical Chemistry 62.9 (1958): 1098-1101.
Hofbeck, Thomas, and Hartmut Yersin. "The triplet state of fac-lr (ppy) 3." Inorganic chemistry 49.20 (2010): 9290-9299.
Hopkin, Hywel T., Edward A. Boardman, and Tim M. Smeeton. "36-4: Solution-Processed Transparent Top Electrode for QD-LED." SID Symposium Digest of Technical Papers. vol. 51. No. 1. 2020.
Hughes, Russell P., Trujillo, Hernando A. "Selective Solubility of Organometallic Complexes in Saturated Fluorocarbons. Synthesis of Cyclopentadienyl Ligands with Fluorinated Ponytails." Organometallics 15.1 (1996): 286-294.
Hwang, Hyeon-Deuk, Kim, Hyun-Joong. "UV-curable low surface energy fluorinated polycarbonate-based polyurethane dispersion." Journal of Colloid and Interface Science 362.2 (2011): 274-284.
Hyre, Ariel S., and Linda H. Doerrer. "A structural and spectroscopic overview of molecular lanthanide complexes with fluorinated O-donor ligands." Coordination Chemistry Reviews 404 (2020): 213098.
Hyre, Ariel S., Doerrer, Linda H. "A structural and spectroscopic overview of molecular lanthanide complexes with fluorinated O-donor ligands." Coordination Chemistry Reviews 404 (2020): 213098.
Iacono, Scott T., et al. "Facile synthesis of hydrophobic fluoroalkyl functionalized silsesquioxane nanostructures." Chemical communications 47 (2007): 4992-4994.
Iacono, Scott T., et al. "Preparation of composite fluoropolymers with enhanced dewetting using fluorinated silsesquioxanes as drop-in modifiers." Journal of Materials Chemistry 20.15 (2010): 2979-2984.
Iacono, Scott T., et al. Fluorinated Polyhedral Oligomeric Silsesquioxanes (F-POSS). Air Force Research Lab Edwards AFB CA Propulsion Directorate, 2010.
Ibisoglu, Hanife, et al. "Formation of novel spiro, spiroansa and dispiroansa derivatives of cyclotetraphosphazene from the reactions of polyfunctional amines with octachlorocyclotetraphosphazatetraene." Journal of chemical sciences 121.2 (2009): 125-135.
Im, Yirang, et al. "Recent progress in high-efficiency blue-light-emitting materials for organic light-emitting diodes." Advanced Functional Materials 27.13 (2017): 1603007.
International Search Report and Written Opinion on PCT/IB2020/054359 Dtd Jul. 28, 2020.
Ito, Hitoshi, et al. "Synthesis and Thermal Properties of Fully Aromatic Polysilarylenesiloxanes." Polymer Journal 38.2 (2006): 109-116.
Jain, Akash, et al. "Estimation of Melting Points of Organic Compounds." Industrial & engineering chemistry research 43.23 (2004): 7618-7621.
Jarvis N.L., Zisman W.A. "Surface Chemistry of Fluorochemicals." U.S. Naval Research Laboratory (NRL); Washington, DC, USA, 1965.
Jean G. Riess. "Understanding the Fundamentals of Perfluorocarbons and Perfluorocarbon Emulsions Relevant to In Vivo Oxygen Delivery." Artificial Cells, Blood Substitutes, and Biotechnology 33.1 (2005): 47-63.
Jiao, Zhiqiang, et al. "61-2: Weakening Micro-Cavity Effects in White Top-Emitting WOLEDs with Semitransparent Metal Top Electrode."?SID Symposium Digest of Technical Papers. vol. 49. No. 1. 2018.
Johnson, P.G., Tittle, B. "The preparation of perfluorinated carboxylic esters and perfluoro carbonates." Journal of Fluorine Chemistry 3.1 (1973): 1-6.
Joliton, Adrien, and Carreira, Erick M. "Ir-Catalyzed Preparation of SF5-Substituted Potassium Aryl Trifluoroborates via C—H Borylation and Their Application in the Suzuki-Miyaura Reaction." Organic Letters 15.20 (2013): 5147-5149.
Josefsen, Leanne B., and Ross W. Boyle. "Photodynamic therapy and the development of metal-based photosensitisers." Metal-based drugs 2008 (2008).
Kanzow, J., et al. "Formation of a metal/epoxy resin interface." Applied surface science 239.2 (2005): 227-236.
Karabacak, Tansel. "Thin-film growth dynamics with shadowing and re-emission effects." Journal of Nanophotonics 5.1 (2011): 052501.
Kaspaul, A. F., and E. E. Kaspaul. "Application of molecular amplification to microcircuitry." Trans. 10th National Vacuum Symposium. 1963. pp. 422-427.
Kato, Daimotsu, et al. "52.4 L Transmissive One-Side-Emission OLED Panel using Alignment-Free Cathode Patterning."?SID Symposium Digest of Technical Papers. vol. 46. No. 1. 2015.
Ke, L., et al. "Panchromatic ternary/quaternary polymer/fullerene BHJ solar cells based on novel silicon naphthalocyanine and silicon phthalocyanine dye sensitizers." Journal of Materials Chemistry A 5.6 (2017): 2550-2562.
Khan, Sami. Hydrophobicity of rare-earth oxide ceramics and their application in promoting sustained drop-wise condensation. Diss. Massachusetts Institute of Technology, 2016.
Khanin, D.A., et al. "New hybrid materials based on cyclophosphazene and polysiloxane precursors: Synthesis and properties." Polymer 186 (2020): 122011.
Khetubol, Adis, et al. "Ligand exchange leads to efficient triplet energy transfer to CdSe/ZnS Q-dots in a poly(N-vinylcarbazole) matrix nanocomposite." Journal of Applied Physics 113.8 (2013): 083507.
Khetubol, Adis, et al. "Triplet Harvesting in Poly(9-vinylcarbazole) and Poly(9-(2,3-epoxypropyl)carbazole) Doped with CdSe/ZnS Quantum Dots Encapsulated with 16-(N-Carbazolyl) Hexadecanoic Acid Ligands." Journal of Polymer Science Part B: Polymer Physics 52.7 (2014): 539-551.
Kim, Beomjin, et al. "Synthesis and electroluminescence properties of highly efficient blue fluorescence emitters using dual core chromophores." Journal of Materials Chemistry C 1.3 (2013): 432-440.
Kim, Haewon, et al. "Analysis of Semi-Transparent Cathode Performance Based on Fabrication Methods." IDW '19. 2019.

(56) References Cited

OTHER PUBLICATIONS

Kim, Hyun-Chang, et al. "39-4: A Method of Panel-Current Limitation for Automotive OLED Displays."?SID Symposium Digest of Technical Papers. vol. 51. No. 1. 2020.
Kim, Kwon-Hyeon, and Jang-Joo Kim. "Origin and Control of Orientation of Phosphorescent and TADF Dyes for High-Efficiency OLEDs." Advanced Materials 30.42 (2018): 1705600.
Kim, S.K.,et al. "5-4: High Efficiency Top-Emission Organic Light Emitting Diodes Realized Using Newly Developed Low Absorption Pure Ag cathode Configuration." SID Symposium Digest of Technical Papers, 50: 50-53. 2019.
Kim, Sinheui, et al. "Degradation of blue-phosphorescent organic light-emitting devices involves exciton-induced generation of polaron pair within emitting layers." Nature communications 9.1 (2018): 1-11.
King, Allison, et al. "Semicrystalline polyphosphazenes: A comparative study of topology, morphology, and contact angles for three fluorous and one aryl polyphosphazene." Polymer 54.3 (2013): 1123-1129.
Kireev, Vyacheslav V., V. I. Astrina, and Eugeny A. Chernyshev. "Oligomeric Alkoxyphosphazens." Russian Chemical Reviews 50.12 (1981): 1186.
Kisin, Srdjan.? Adhesion changes at metal-polymer interfaces: Study of the copper-(acrylonitrile-butadiene-styrene) system. Diss. Dissertation, Technische Universiteit Eindhoven, 2007.
Knight Jr, L. B., et al. "Unusual behavior of vaporized magnesium under low pressure conditions."?The Journal of Physical Chemistry? 79.12 (1975): 1183-1190.
Kobayashi, Hideki, and Michael J. Owen. "Surface tension of liquid polysiloxanes having fluorinated alkyl side-chains." Die Makromolekulare Chemie: Macromolecular Chemistry and Physics 194.6 (1993): 1785-1792.
Kober, Ehrenfried, Henry Lederle, and Gerhard Ottmann. "Fluoroalkylphosphonitrilates: A New Class of Potential Fire-Resistant Hydraulic Fluids and Lubricants. I." Asle Transactions 7.4 (1964): 389-397.
Koh, Kyoungmoo, et al. "Precision synthesis of a fluorinated polyhedral oligomeric silsesquioxane-terminated polymer and surface characterization of its blend film with poly (methyl methacrylate)." Macromolecules 38.4 (2005): 1264-1270.
Kohonenko, V. I., et al. "Density and surface tension of liquid rare earth metals, scandium, and yttrium." physica status solidi (a) 84.2 (1984): 423-432.
Koma, N. et al. "44.2: Novel Front-light System Using Fine-pitch Patterned OLED." SID Symposium Digest of Technical Papers, 39: 655-658. 2008.
Korich, Andrew L., and Iovine, Peter M. "Boroxine chemistry and applications: A perspective." Dalton Transactions 39.6 (2010): 1423-1431.
Kota, Arun K. et al. "The design and applications of superomniphobic surfaces." NPG Asia Materials 6.7 (2014): e109-e109.
Kovacina, T. A., et al. "Syntheses and characterizations of poly(pentafluorosulfur diacetylenes)." Industrial & Engineering Chemistry Product Research and Development 22.2 (1983): 170-172.
Kovalchuk, N.M., et al. "Fluoro- vs hydrocarbon surfactants: Why do they differ in wetting performance?" Advances in Colloid and Interface Science 210 (2014): 65-71.
Krishnamurthy, S. S., P. M. Sundaram, and Michael Woods. "Studies of phosphazenes. 12. Reactions of N4P4CI8 with dibenzylamine-isolation of an unusual "bicyclic" phosphazene, N4P4 [N (CH2Ph) 2] 6 (NCH2Ph)." Inorganic Chemistry 21.1 (1982): 406-410.
Kwak, Sang Woo, et al. "Synthesis and Electroluminescence Properties of 3-(Trifluoromethyl)phenyl-Substituted 9,10-Diarylanthracene Derivatives for Blue Organic Light-Emitting Diodes." Applied Sciences 7.11 (2017): 1109-1120.
Lederle, Henry, Ehrenfried Kober, and Gerhard Ottmann. "Fluoroaklyl Phosphonitrilates: A New Class of Potential Fire-Resistant Hydraulic Fluids and Lubricants." Journal of Chemical and Engineering Data 11.2 (1966): 221-228.
Lee, Chang-Jun, et al. "Microcavity effect of top-emission organic light-emitting diodes using aluminum cathode and anode." Bulletin of the Korean Chemical Society 26.9 (2005): 1344-1346.
Lee, Chia-Tse, et al. "58.3: A Novel Highly Transparent 6-in. AMOLED Display Consisting of IGZO TFTs."?SID Symposium Digest of Technical Papers. vol. 46. No. 1. 2015.
Lee, David KY, et al. "Synthesis and inclusion behavior of cyclotriphosphazene molecules with asymmetric spiro rings." Dalton Transactions 39.22 (2010): 5341-5348.
Lee, Donggu, et al. "The influence of sequential ligand exchange and elimination on the performance of P3HT: CdSe quantum dot hybrid solar cells." Nanotechnology 26.46 (2015): 465401.
Lee, Jiun-Haw, et al. "Blue organic light-emitting diodes: current status, challenges, and future outlook." Journal of Materials Chemistry C 7.20 (2019): 5874-5888.
Lee, Sangwha, et al. "The Wettability of Fluoropolymer Surfaces: Influence of Surface Dipoles." Langmuir 24.9 (2008): 4817-4826.
Lei, Hui, et al. "Fluorine-free low surface energy organic coating for anti-stain applications." Progress in Organic Coatings 103 (2017): 182-192.
Lei, Ying Duan, Frank Wania, and Dan Mathers. "Temperature-dependent vapor pressure of selected cyclic and linear polydimethylsiloxane oligomers." Journal of Chemical & Engineering Data 55.12 (2010): 5868-5873.
Lenton, M. V., and B. Lewis. "Preparation and properties of some novel diaminotetra (fluoroalkoxy)-triphosphonitriles." Journal of the Chemical Society A: Inorganic, Physical, Theoretical (1966): 665-667.
Li, Chong, et al. "Photocontrolled Intramolecular Charge/Energy Transfer and Fluorescence Switching of Tetraphenylethene-Dithienylethene-Perylenemonoimide Triad with Donor-Bridge-Acceptor Structure." Chem. Asian J., 9.1 (2014): 104-109.
Li, Lu, et al. "Fluorinated anthracene derivatives as deep-blue emitters and host materials for highly efficient organic light-emitting devices." RSC Advances 5.73 (2015): 59027-59036.
Lifka, H et al. "P-169: Single Side Emitting Transparent OLED Lamp." SID Symposium Digest of Technical Papers, 42: 1737-1739. 2011.
Lim, Sehoon, et al. "74-1: Image Restoration for Display-Integrated Camera." SID Symposium Digest of Technical Papers. vol. 51. No. 1. 2020.
Lin, Rong Jie, Chi Jui Cheng, and Hoang Yan Lin. "P-165: An Optimized Algorithm to Reconstruct the Structure of Transparent OLED Display Based on Monte Carlo Method." SID Symposium Digest of Technical Papers. vol. 51. No. 1. 2020.
Liu, Meng, et al. "Facile fabrication of superhydrophobic surface from fluorinated poss acrylate copolymer via one-step breath figure method and its anti-corrosion property." Polymers 11.12 (2019): 1953.
Liu, Xiao, et al. "Substituent exchange reactions of linear oligomeric aryloxyphosphazenes with sodium 2, 2, 2-trifluoroethoxide." Inorganic chemistry 51.21 (2012): 11910-11916.
Liu, Xiao, et al. "Substituent exchange reactions with high polymeric organophosphazenes." Macromolecules 45.22 (2012): 9100-9109.
Liu, Yang, et al. "P-168: Top Emission WOLED for High Resolution OLED TV." SID Symposium Digest of Technical Papers. vol. 49. No. 1. 2018.
Liu, Yunfei, et al. "P-202: High Transmittance Top Conductive Electrodes of OLEDs by Using Conductive Interface Layer." SID Symposium Digest of Technical Papers. vol. 51. No. 1. 2020.
Lo, Angel S. W. and Horváth, István. T. "Fluorous Ethers." Green Chemistry 17.10 (2015): 4701-4714.
Lu, Changqing, et al. "Synthesis of perfluoro-t-butyl trifluorovinyl ether and its copolymerization with TFE." Journal of Fluorine Chemistry 131.1 (2010): 17-20.
Lund, L. G., et al. "514. Phosphonitrilic derivatives. Part I. The preparation of cyclic and linear phosphonitrilic chlorides." Journal of the Chemical Society (Resumed) (1960): 2542-2547.
Mabry, Joseph M., et al. "Fluorinated polyhedral oligomeric silsesquioxanes (F-POSS)." Angewandte Chemie International Edition 47.22 (2008): 4137-4140.

(56) References Cited

OTHER PUBLICATIONS

Mabry, Joseph M., et al. Ultrahydrophobic Fluorinated Polyhedral Oligomeric Silsesquioxanes (F-POSS)(Preprint). Air Force Research Lab Edwards AFB CA Propulsion Directorate, 2007.
Maderna, A., et al. "The Syntheses of Amphiphilic Camouflaged Carboranes as Modules for Supramolecular Construction." J. Am. Chem. Soc. 123. 42 (2001): 10423-10424.
Magda van Leeuwen, et al. "The photochemistry and photophysics of a series of alpha octa(alkyl-substituted) silicon, zinc and palladium phthalocyanines." Photochemical & Photobiological Sciences 13.1 (2014): 62-69.
Maher, Andrew E., and Harry R. Allcock. "Influence of the n-Hexoxy Group on the Properties of Fluoroalkoxyphosphazene Polymers." Macromolecules 38.2 (2005): 641-642.
Maissel, Leon I., and Maurice H. Francombe. An introduction to thin films. CRC Press, 1973. pp. 61-83, 198, 199.
Malandrino, Graziella, et al. "New Thermally Stable and Highly Volatile Precursors for Lanthanum MOCVD: Synthesis and Characterization of Lanthanum β-Diketonate Glyme Complexes." Inorganic Chemistry 34.25 (1995): 6233-6234.
Mao, Hui-Ting, et al. "Recent progress in phosphorescent Ir (III) complexes for nondoped organic light-emitting diodes." Coordination Chemistry Reviews 413 (2020): 213283.
Marchon, B., et al. "Fomblin Multidentate Lubricants for Ultra-Low Magnetic Spacing." IEEE Transactions on Magnetics 42.10 (2006): 2504-2506.
McDowell, Matthew, et al. "Semiconductor Nanocrystals Hybridized with Functional Ligands: New Composite Materials with Tunable Properties." Materials 3.1 (2010): 614-637.
Mcintosh, Thomas J., et al. "Structure and Interactive Properties of Highly Fluorinated Phospholipid Bilayers." Biophysical Journal 71.4 (1996): 1853-1868.
Medenbach, O., et al. "Refractive index and optical dispersion of rare earth oxides using a small-prism technique." Journal of Optics A: Pure and Applied Optics 3.3 (2001): 174.
Meinders, Marcel BJ, William Kloek, and Ton van Vliet. "Effect of surface elasticity on Ostwald ripening in emulsions." Langmuir 17.13 (2001): 3923-3929.
Melville, Owen A., Trevor M. Grant, and Beno?t H. Lessard. "Silicon phthalocyanines as N-type semiconductors in organic thin film transistors." Journal of Materials Chemistry C 6.20 (2018): 5482-5488.
Michel, U., et al. "Copolymerization of tetrafluoroethylene and 2, 2-bis (trifluoromethyl)-4, 5-difluoro-1, 3-dioxole in supercritical carbon dioxide." Macromolecules 36.19 (2003): 7107-7113.
Michele Ricks. Advanced OLED Materials Enabling Large-Size OLED Displays by Ink Jet Printing. OLEDs World Summit, Sep. 2020.
Mishra, Shashank, and Daniele, Stephane. "Metal-Organic Derivatives with Fluorinated Ligands as Precursors for Inorganic Nanomaterials." Chemical Reviews 115.16 (2015): 8379-8448.
Mittal, Kashmiri Lal, ed. Metallized plastics 3: fundamental and applied aspects. Springer Science & Business Media, 2012.
Modzelewski, Tomasz, and Harry R. Allcock. "An unusual polymer architecture for the generation of elastomeric properties in fluorinated polyphosphazenes." Macromolecules 47.19 (2014): 6776-6782.
Morgenstern, Karina, Georg Rosenfeld, and George Comsa. "Decay of two-dimensional Ag islands on Ag (111)." Physical review letters 76.12 (1996): 2113.
Mucur, S.P., et al. "Conventional and inverted organic light emitting diodes based on bright green emmisive polyfluorene derivatives." Polymer 151.12 (2018): 101-107.
Murano, Sven, et al. "30.3: Invited Paper: AMOLED Manufacturing-Challenges and Solutions from a Material Makers Perspective."? SID Symposium Digest of Technical Papers. vol. 45. No. 1. 2014.
Murotani, Eisuke, et al. "Synthesis and polymerization of a novel perfluorinated monomer." Journal of Fluorine Chemistry 128.10 (2007): 1131-1136.
Nabatova-Gabain, Nataliya, Yoko Wasai, and Taiju Tsuboi. "Spectroscopic ellipsometry study of Ir (ppy) 3 organic light emitting diode." Current Applied Physics 6.5 (2006): 833-838.
Nakamura, Daiki, et al. "68-4: Top-emission OLED Kawara-type Multidisplay with Auxiliary Electrode." SID Symposium Digest of Technical Papers. vol. 49. No. 1. 2018.
Navarrini, Walter, et al. "Low surface energy coatings covalently bonded on diamond-like carbon films." Diamond & Related Materials 19.4 (2010): 336-341.
Nittler, Laurent, et al. "Morphology study of small amounts of evaporated gold on polymers." Surface and interface analysis 44.8 (2012): 1072-1075.
Nyk?nen, Virginia P. Silva, et al. "An efficient and stable star-shaped plasticizer for starch: cyclic phosphazene with hydrogen bonding aminoethoxy ethanol side chains." Green Chemistry 16.9 (2014): 4339-4350.
Oh, Il-Kwon, et al. "Hydrophobicity of rare earth oxides grown by atomic layer deposition." Chemistry of Materials 27.1 (2015): 148-156.
Ohring, Milton. Materials science of thin films. Elsevier, 2001.
Okamoto, Yoshiyuki, et al. "New amorphous perfluoro polymers: perfluorodioxolane polymers for use as plastic optical fibers and gas separation membranes." Polymers for Advanced Technologies 27.1 (2016): 33-41.
Okui, N., et al. "Thermal properties of poly(tetramethyl-p-silphenylene siloxane) and (tetramethyl-p-silphenylene siloxane-dimethyl siloxane) copolymers." Polymer 19 (1978): 411-415.
Okuyama, Kentaro, et al.?"79-4L :?Late-News Paper: Highly Transparent LCD using New Scattering-type Liquid Crystal with Field Sequential Color Edge Light."?SID Symposium Digest of Technical Papers, ?48, 2017.
Olshavsky, Michael, and Harry R. Allcock. "Polyphosphazenes with high refractive indices: optical dispersion and molar refractivity." Macromolecules 30.14 (1997): 4179-4183.
Ottmann, Gerhard, Henry Lederle, and Ehrenfried Kober. "Arylamino Polyfluoroalkoxy Phosphonitriles. New Class of Potential Fire-Resistant Hydraulic Fluids and Lubricants." Industrial & Engineering Chemistry Product Research and Development 5.2 (1966): 202-204.
Pandharkar, Riddhish, et al. "A Computational Study of AIF3 and ACF Surfaces." Inorganics 6.4 (2018): 124.
Park, Chan II, et al. "54-1: Distinguished Paper: World 1st Large Size 77-inch Transparent Flexible OLED Display."?SID Symposium Digest of Technical Papers. vol. 49. No. 1. 2018.
Park, Eun Ji, et al. "Fabrication of conductive, transparent and superhydrophobic thin films consisting of multi-walled carbon nanotubes." RSC Advances 4.57 (2014): 30368-30374.
Park, Jongwoong, et al. "8-1: The Method to Compensate IR-Drop of AMOLED Display." SID Symposium Digest of Technical Papers. vol. 50. No. 1. 2019.
Park, Woo-Young, et al. "P-175L: Late-News Poster: High Efficiency Light Extraction from Top-Emitting Organic Light-Emitting Diodes Employing Mask-Free Plasma Etched Stochastic Polymer Surface." SID Symposium Digest of Technical Papers. vol. 46. No. 1. 2015.
Pearson, Andrew J., et al. "Silicon phthalocyanines as dopant red emitters for efficient solution processed OLEDs." Journal of Materials Chemistry C 5.48 (2017): 12688-12698.
Peters, Richard D., et al. "Using Self-Assembled Monolayers Exposed to X-rays To Control the Wetting Behavior of Thin Films of Diblock Copolymers." Langmuir 16.10 (2000): 4625-4631.
Piorecka, Kinga, et al. "Hydrophilic Polyhedral Oligomeric Silsesquioxane, POSS (OH) 32, as a Complexing Nanocarrier for Doxorubicin and Daunorubicin." Materials 13.23 (2020): 5512.
Pittman, Allen G., et al. "Polymers derived from fluoroketones. II. Wetting properties of fluoroalkyl acrylates and methacrylates." Journal of Polymer Science Part A-1: Polymer Chemistry 6.6 (1968): 1729-1740.
Plajer, Alex J., et al. "A modular approach to inorganic phosphazane macrocycles." Angewandte Chemie International Edition 56.31 (2017): 9087-9090.

(56) References Cited

OTHER PUBLICATIONS

Plajer, Alex J., et al. "Conformational Control in Main Group Phosphazane Anion Receptors and Transporters." Journal of the American Chemical Society 142.2 (2019): 1029-1037.
Plajer, Alex J., et al. "Tailoring the Binding Properties of Phosphazane Anion Receptors and Transporters." Journal of the American Chemical Society 141.22 (2019): 8807-8815.
Plint, Trevor, Beno?t H. Lessard, and Timothy P. Bender. "Assessing the potential of group 13 and 14 metal/metalloid phthalocyanines as hole transport layers in organic light emitting diodes." Journal of Applied Physics 119.14 (2016): 145502.
Quan, Wei, et al. "69-2: Transparent Conductive Hybrid Cathode Structure for Top-Emitting Organic Light-Emitting Devices."?SID Symposium Digest of Technical Papers. vol. 51. No. 1. 2020.
Quast, Matthew J., et al. "Synthesis and Physical Properties of Highly Branched Perfluorinated Polymers from AB and AB2 Monomers." Journal of Polymer Science Part A: Polymer Chemistry 53.16 (2015): 1880-1894.
Ramirez, Sean M., et al. "Incompletely condensed fluoroalkyl silsesquioxanes and derivatives: precursors for low surface energy materials." Journal of the American Chemical Society 133.50 (2011): 20084-20087.
Ratz, Rudi, et al. "A New Class of Stable Phosphonitrilic Acid Esters. Polyfluoroalkyl Phosphonitrilates." Journal of the American Chemical Society 84.4 (1962): 551-555.
Ren, Zhongjie, and Yan, Shouke. "Polysiloxanes for optoelectronic applications." Progress in Materials Science 83 (2016): 383-416.
Roesky, H. W., and E. Niecke. "Darstellung von P3N3F5NH2 und P3N3F5NPCI3." Inorganic and Nuclear Chemistry Letters 4.8 (1968): 463-465.
Roesky, Herbert W. "Lineare und cyclische Chlorphosphazene." Chemische Berichte 105.4 (1972): 1439-1445.
Roesky, Herbert W., Walter Grosse B?wing, and Edgar Niecke. "?ber die Darstellung von Fluorcyclotriphosphazenen mit Phosphazenseitenketten." Chemische Berichte 104.2 (1971): 653-660.
Roitman, James N., Pittman, Allen G. "Wetting properties of acrylic polymers containing perfluoro-t-butyl side chains." Polymer Letters 10.7 (1972): 499-503.
Roitman, James N., Pittman, Allen G. "Wetting properties of bis(trifluoromethyl)carbinyl acrylate polymers." Journal of Polymer Science: Polymer Chemiatry Edition 12.7 (1974): 1421-1436.
Rokni-Fard, Mahroo, and Quanmin Guo. "Biased Ostwald ripening in site-selective growth of two-dimensional gold clusters." The Journal of Physical Chemistry C 122.14 (2018): 7801-7805.
Romack, T. J., et al. "Synthesis of Tetrafluoroethylene-Based, Nonaqueous Fluoropolymers in Supercritical Carbon Dioxide." Macromolecules 28.24 (1995): 8429-8431.
Romack, T. J., J. M. DeSimone, and T. A. Treat. "Synthesis of tetrafluoroethylene-based, nonaqueous fluoropolymers in supercritical carbon dioxide." Macromolecules 28.24 (1995): 8429-8431.
Rumyant?ev, R.V., Fukin, G.K. "Intramolecular C-F?Ln dative interactions in lanthanide complexes with fluorinated ligands." Russian Chemical Bulletin 66.9 (2017): 1557-1562.
S?zen, Yasemin, and Simge Metinoglu. "Novel cyclomatrix-type polyphosphazene microspheres crosslinked with octachlorocyclotetraphosphazene: preparation and characterization." Anadolu University Journal of Science and Technology A—Applied Sciences and Engineering 18.5 (2017): 973-987.
Safonov, Alexey I., et al. "Deposition of thin composite films consisting of fluoropolymer and silver nanoparticles having surface plasmon resonance." Thin Solid Films 603 (2016): 313-316.
Sajoto, Tissa, et al. "Temperature dependence of blue phosphorescent cyclometalated Ir (III) complexes." Journal of the American Chemical Society 131.28 (2009): 9813-9822.
Sakamoto, Keiichi, and Eiko Ohno-Okumura. "Syntheses and functional properties of phthalocyanines." Materials 2.3 (2009): 1127-1179.
Sakka, Tetsuo, et al. "Surface tension of fluoroalkanes in a liquid phase." Journal of Fluorine Chemistry 126.3 (2005): 371-375.
Satulu, Veronica, et al. "Combining fluorinated polymers with Ag nanoparticles as a route to enhance optical properties of composite materials." Polymers 12.8 (2020): 1640.
Scharnberg, M., et al. "Radiotracer measurements as a sensitive tool for the detection of metal penetration in molecular-based organic electronics." Applied Physics Letters 86.2 (2005): 024104.
Schenck, Rudolf, and G. R?mer. "?ber die Phosphornitrilchloride und ihre Umsetzungen (I.)." Berichte der deutschen chemischen Gesellschaft (A and B Series) 57.8 (1924): 1343-1355.
Schissel, Paul, and Alvin Warren Czanderna. "Reactions at the silver/polymer interface: a review." Solar Energy Materials 3.1-2 (1980): 225-245.
Schneider, Andreas, Stefan Kairies, and Klaus Rose. "Synthesis of alkoxysilyl substituted cyclophosphazenes and their properties in the sol-gel process." Silicon Chemistry. Springer, Vienna, 1999. 89-98.
Schwab, Tobias. Top-Emitting OLEDs: Improvement of the Light Extraction Efficiency and Optimization of Microcavity Effects for White Emission. Diss. Saechsische Landesbibliothek-Staats-und Universitaetsbibliothek Dresden, 2014.
Senaweera, Sameera M., and Weaver, Jimmie D., "Selective Perfluoro- and Polyfluoroarylation of Meldrum's Acid". The Journal of Organic Chemistry 79.21 (2014): 10466-10476.
Shen, Mingmin, et al. "Destabilization of Ag nanoislands on Ag (100) by adsorbed sulfur." The Journal of chemical physics 135.15 (2011): 154701.
Shen, Xiao-Min, et al. "Highly photostable silicon(IV) phthalocyanines containing adamantane moieties: synthesis, structure, and properties." Tetrahedron 66.46 (2010): 9041-9048.
Shi, Shiming, et al. "56-1: Invited Paper: Research on Commercial Foldable AMOLED and Relevant Technologies."?SID Symposium Digest of Technical Papers. vol. 51. No. 1. 2020.
Shi, Yan X., et al. "Synthesis and hydrolytic studies on the air-stable [(4-CN-PhO)(E) P (μ-N t Bu)] 2 (E= O, S, and Se) cyclodiphosphazanes." Inorganic Chemistry 54.13 (2015): 6423-6432.
Shin, Dong-Youn, and Inyoung Kim. "Self-patterning of fine metal electrodes by means of the formation of isolated silver nanoclusters embedded in polyaniline."?Nanotechnology?20.41 (2009): 415301.
Shirasaki, Yasuhiro. Efficiency loss mechanisms in colloidal quantum-dot light-emitting diodes. Diss. Massachusetts Institute of Technology, 2013.
Shizu, Katsuyuki, et al. "Highly efficient blue electroluminescence using delayed-fluorescence emitters with large overlap density between luminescent and ground states." The Journal of Physical Chemistry C 119.47 (2015): 26283-26289.
Sim, Ying, et al. "Orthogonality in main group compounds: a direct one-step synthesis of air-and moisture-stable cyclophosphazanes by mechanochemistry." Chemical Communications 54.50 (2018): 6800-6803.
Singh, Anurima, Lee Steely, and Harry R. Allcock. "Poly [bis (2, 2, 2-trifluoroethoxy) phosphazene] superhydrophobic nanofibers." Langmuir 21.25 (2005): 11604-11607.
Singh, Rajendra Prasad, et al. "A Novel Synthesis of Hexakis (trifluoromethyl) cyclotriphosphazene. Single-Crystal X-ray Structures of N3P3 (CF3) 6 and N3P3F6." Inorganic Chemistry 39.2 (2000): 375-377.
Smith, Arthur RG, Paul L. Burn, and Ben J. Powell. "Spin-Orbit Coupling in Phosphorescent Iridium (III) Complexes." ChemPhysChem 12.13 (2011): 2429-2438.
Smith, Arthur RG, Paul L. Burn, and Benjamin J. Powell. "Exact exchange and the density functional theory of metal-to-ligand charge-transfer in fac-lr (ppy) 3." Organic Electronics 33 (2016): 110-115.
Smithson, Robert LW, Donald J. McClure, and D. Fennell Evans. "Effects of polymer substrate surface energy on nucleation and growth of evaporated gold films." Thin Solid Films 307.1-2 (1997): 110-112.
Snyder Jr, Carl E. "Structural Modifications of Fluoro-alkyl S-Triazines and Their Lubricant Properties." Asle Transactions 14.3 (1971): 237-242.

(56) References Cited

OTHER PUBLICATIONS

Song, Hongwei, Olusegun J. Ilegbusi, and L. I. Trakhtenberg. "Modeling vapor deposition of metal/semiconductor-polymer nanocomposite." Thin Solid Films 476.1 (2005): 190-195.
Song, Wenfeng, et al. "5-3: 3-Stacked Top-Emitting White OLEDs with Super-Wide Color Gamut and High Efficiency." SID Symposium Digest of Technical Papers. vol. 50. No. 1. 2019.
Song, Wook, and Jun Yeob Lee. "Degradation mechanism and lifetime improvement strategy for blue phosphorescent organic light-emitting diodes." Advanced Optical Materials 5.9 (2017): 1600901.
Sonoda, Tohru, et al. "84-1: Invited Paper: 30-inch 4K Rollable OLED Display." SID Symposium Digest of Technical Papers. vol. 51. No. 1. 2020.
Spelt, J. K., Absolom, D. R., Neumann, A. W. "Solid Surface Tension: The Interpretation of Contact Angles by the Equation of State Approach and the Theory of Surface Tension Components." Langmuir 2 (1986): 620-625.
Spelt, J. K., Neumann, A. W. "Solid Surface Tension: The Equation of State Approach and the Theory of Surface Tension Components. Theoretical and Conceptual Considerations." Langmuir 3 (1987): 588-591.
Steely, Lee B., et al. "Foam formation from fluorinated polyphosphazenes by liquid CO2 processing." Polymer Engineering & Science 48.4 (2008): 683-686.
Stokes, H. N. "On trimetaphosphimic acid and its decomposition-products." Amer. chem. J. 18 (1986): 629-663.
Stokes, Ho No. "On the chloronitrides of phosphorus." Amer. Chem. 17 (1985): 275-291.
Sundaram, P. M., et al. "The Reaction of N4P4C18 with Dibenzylamine: Formation of an Unusual Bicyclic Phosphazene, N4P4 [N (CH2Ph) 2] 6 (NCH2Ph), by Dealkylation." Phosphorus and Sulfur and the Related Elements 8.3 (1980): 373-374.
Syafiq, A., et al. "Superhydrophilic Smart Coating for Self-Cleaning Application on Glass Substrate." Journal of Nanomaterials 2018 (2018).
Szab?, D?nes, et al. "Synthesis of novel lipophilic and/or fluorophilic ethers of perfluoro-tert-butyl alcohol, perfluoropinacol and hexafluoroacetone hydrate via a Mitsunobu reaction: Typical cases of ideal product separation." Journal of Fluorine Chemistry 126.4 (2005): 639-650.
T?pper, Tino, et al. "Siloxane-based thin films for biomimetic low-voltage dielectric actuators." Sensors and Actuators A: Physical 233 (2015): 32-41.
T?pper, Tino, et al. "Tailoring the mass distribution and functional group density of dimethylsiloxane-based films by thermal evaporation." APL Materials 4.5 (2016): 056101.
Tang, Meixian, et al. "Inhibition of bacterial adhesion and biofilm formation by a textured fluorinated alkoxyphosphazene surface." Bioactive Materials 6.2 (2021): 447-459.
Tang, Quan, et al. "28-2: Study of the Image Blur through FFS LCD Panel Caused by Diffraction for Camera under Panel." SID Symposium Digest of Technical Papers. vol. 51. No. 1. 2020.
Tao, Chao, et al. "Highly icephobic properties on slippery surfaces formed from polysiloxane and fluorinated POSS." Progress in Organic Coatings 103 (2017): 48-59.
Tarasevich, Y. I. "Surface energy of oxides and silicates." Theoretical and Experimental Chemistry 42 (2006): 145-161.
Tarasevich, Yu I. "Surface energy of oxides and silicates." Theoretical and Experimental Chemistry 42.3 (2006): 145-161.
Thran, A., et al. "Condensation coefficients of Ag on polymers." Physical review letters 82.9 (1999): 1903.
Thurston, John H., et al. "Toward a General Strategy for the Synthesis of Heterobimetallic Coordination Complexes for Use as Precursors to Metal Oxide Materials :? Synthesis, Characterization, and Thermal Decomposition of Bi2(Hsal)6?M(Acac)3 (M = Al, Co, V, Fe, Cr)." Inorganic chemistry 43.10 (2004): 3299-3305.
Tian, Zhicheng, Chen Chen, and Harry R. Allcock. "New Mixed-Substituent Fluorophosphazene High Polymers and Small Molecule Cyclophosphazene Models: Synthesis, Characterization, and Structure Property Correlations." Macromolecules 48.5 (2015): 1483-1492.
Tian, Zhicheng, et al. "Limits to expanding the PN-F series of polyphosphazene elastomers." Polymer Engineering & Science 54.8 (2014): 1827-1832.
Tian, Zhicheng, et al. "Phosphazene high polymers and models with cyclic aliphatic side groups: new structure-property relationships." Macromolecules 48.13 (2015): 4301-4311.
Trautner, Frank, et al. "Gas-Phase Structure of Hexakis (trifluoromethyl)-cyclotriphosphazene, [(CF3)2PN] 3." Inorganic Chemistry 39.23 (2000): 5398-5399.
Tsai, Yu-Hsiang, et al. "P-202: A Flexible Transparent OLED Display with FlexUPTM Technology."?SID Symposium Digest of Technical Papers. vol. 48. No. 1. 2017.
Tsujioka, Tsuyoshi, and Kosuke Tsuji. "Metal-vapor deposition modulation on soft polymer surfaces." Applied Physics Express 5.2 (2012): 021601.
Tsujioka, Tsuyoshi, et al. "Selective metal deposition on photoswitchable molecular surfaces." Journal of the American Chemical Society 130.32 (2008): 10740-10747.
Tu, Kuan-Heng, et al. "A cyano-rich small molecule dopant for organic thermoelectrics." Organic Electronics 87 (2020): 105978.
Tuteja, Anish, et al. "Designing superoleophobic surfaces." Science 318.5856 (2007): 1618-1622.
Umemoto, Teruo, et al. "Discovery of practical production processes for arylsulfur pentafluorides and their higher homologues, bis- and tris(sulfur pentafluorides): Beginning of a new era of 'super- trifluoromethyl' arene chemistry and its industry." Beilstein Journal of Organic Chemistry 8 (2012): 461-471.
Uslu, Aylin, and Serkan Yesilot. "Chiral configurations in cyclophosphazene chemistry." Coordination Chemistry Reviews 291 (2015): 28-67.
Van de Grampel, Robert Dirk. "Surfaces of fluorinated polymer systems." Eindhoven: Technische Universiteit Eindhoven, 2002.
Varagnolo, Silvia, et al. "Embedded-grid silver transparent electrodes fabricated by selective metal condensation."?Journal of Materials Chemistry C?8.38 (2020): 13453-13457.
Varagnolo, Silvia, et al. "Selective deposition of silver and copper films by condensation coefficient modulation." Electronic Supplementary Material (ESI) for Materials Horizons. (2020).
Varagnolo, Silvia, et al. "Selective deposition of silver and copper films by condensation coefficient modulation." Materials Horizons 7.1 (2020): 143-148.
Vassileva, P., et al. "XPS determination of the binding energies of phosphorus and nitrogen in phosphazenes." Journal of materials science 39.9 (2004): 3201-3202.
Vitos, Levente, et al. "The surface energy of metals." Surface science 411.1-2 (1998): 186-202.
Wadley, Maurice L., et al. "Solvent Dependence of the Morphology of Spin-Coated Thin Films of Polydimethylsiloxane-Rich Polystyrene-block-Polydimethylsiloxane Copolymers." Macromolecules 45.13 (2012): 5538-5545.
Wahl, Helene, Delia A. Haynes, and Tanya le Roex. "A series of polymorphs of hexakis (4-fluorophenoxy) cyclotriphosphazene." Crystal growth & design 12.8 (2012): 4031-4038.
Walker, Amy V., et al. "Dynamics of interaction of magnesium atoms on methoxy-terminated self-assembled monolayers: an example of a reactive metal with a low sticking probability." The Journal of Physical Chemistry C 111.2 (2007): 765-772.
Walsh, Patrick N., Harold W. Goldstein, and David White. "Vaporization of Rare-Earth Oxides." Journal of the American Ceramic Society 43.5 (1960): 229-233.
Wang, Hailiang, et al. "P-132: An Under-Display Camera Optical Structure for Full-Screen LCD."?SID Symposium Digest of Technical Papers. vol. 51. No. 1. 2020.
Wang, Jiajia, et al. "Fluorinated and thermo-cross-linked polyhedral oligomeric silsesquioxanes: New organic-inorganic hybrid materials for high-performance dielectric application." ACS Applied Materials & Interfaces 9.14 (2017): 12782-12790.
Wang, Maw Ling, and Ho Sheng Wu. "Kinetic study of the substitution reaction of hexachlorocyclotriphosphazene with 2, 2,

(56) References Cited

OTHER PUBLICATIONS 2-trifluoroethanol by phase-transfer catalysis and separation of the products." Industrial & engineering chemistry research 29.10 (1990): 2137-2142.
Wang, Y., and Q. J. Wang. "Lubrication regimes." Encyclopedia of Tribology (2013): 2056.
Wang, Zhibin, et al. "55-1: Invited Paper: Self-Assembled Cathode Patterning in AMOLED for Under-Display Camera."?SID Symposium Digest of Technical Papers. vol. 51. No. 1. 2020.
Wang, Zhibin, et al. "60-5: Late-News Paper: 17-inch Transparent AMOLED Display With Self-Assembled Auxiliary Electrode." SID Symposium Digest of Technical Papers. vol. 50. No. 1. 2019.
Wei, Qiang, et al. "Small-Molecule Emitters with High Quantum Efficiency: Mechanisms, Structures, and Applications in OLED Devices." Advanced Optical Materials 6.20 (2018): 1800512.
Weimer, P. K. "Physics of Thin Films, vol. 2.". Academic Press, (1964).
Wheeler, Bob L., et al. "A silicon phthalocyanine and a silicon naphthalocyanine: synthesis, electrochemistry, and electrogenerated chemiluminescence." Journal of the American Chemical Society 106.24 (1984): 7404-7410.
Wilcock, Donald F. "Vapor pressure-viscosity relations in methylpolysiloxanes." Journal of the American Chemical Society 68.4 (1946): 691-696.
Winter, R. W., et al. "The application of novel methodology for the synthesis of o-, m-, and p-(SF5-perfluoroethyl) benzene derivatives." Journal of fluorine chemistry 122.2 (2003): 251-253.
Wolf, Florian F., et al. "Hydrogen-bonding cyclodiphosphazanes: superior effects of 3,5-(CF3)2-substitution in anion-recognition and counter-ion catalysis." New Journal of Chemistry 42.7 (2018): 4854-4870.
Wolfgang Decker, Vast Films, Ltd. "Pattern Metallization: Selective Deposition of Metals on Polymer Films for Functional Applications" AIMCAL Fall Conference 2005.
Wu, Yinghua, and Jean-Luc Br?das. "Simulations of the emission spectra of fac-tris (2-phenylpyridine) iridium and Duschinsky rotation effects using the Herman-Kluk semiclassical initial value representation method." The Journal of chemical physics 129.21 (2008): 214305.
Wu, Zhongyuan, et al. "34-2: Distinguished Paper: Development of 55inch 8K AMOLED TV by Inkjet Printing Process."?SID Symposium Digest of Technical Papers. vol. 51. No. 1. 2020.
Xia, Z. Y., et al. "High performance organic light-emitting diodes based on tetra(methoxy)-containing anthracene derivatives as a hole transport and electron-blocking layer." Journal of Materials Chemistry 20.38 (2010): 8382-8388.
Xu, Guang-Rui, Miao-Jun Xu, and Bin Li. "Synthesis and characterization of a novel epoxy resin based on cyclotriphosphazene and its thermal degradation and flammability performance." Polymer degradation and stability 109 (2014): 240-248.
Xu, Hua, et al. "Transparent AMOLED Display Derived by Metal Oxide Thin Film Transistor with Praseodymium Doping." Proceedings of the International Display Workshops vol. 26 (IDW '19). 2019.
Xu, Pengyun, et al. "Superhydrophobic ceramic coating: Fabrication by solution precursor plasma spray and investigation of wetting behavior." Journal of Colloid and Interface Science 523 (2018): 35-44.
Yamada, Toshikazu, et al. "Nanoparticle chemisorption printing technique for conductive silver patterning with submicron resolution." Nature communications 7.1 (2016): 1-9.
Yang, Jun-Yu, et al. "32-3: AMOLED IR Drop Compensation for Channel Length Modulation." SID Symposium Digest of Technical Papers. vol. 51. No. 1. 2020.
Yang, Min K., et al. "Optical properties of Teflon AF amorphous fluoropolymers." Journal of Micro/Nanolithography, MEMS, and MOEMS 7.3 (2008): 033010.
Yanyan, Z. H. U., F. A. N. G. Zebo, and L. I. U. Yongsheng. "Structural and optical properties of Er2O3 films." Journal of Rare Earths 28.5 (2010): 752-755.
Yao, Pan, et al. "Highly soluble and thermally stable copolyimides modified with trifluoromethyl and siloxane." Journal of Applied Polymer Science 132.13 (2015): 41713.
Yao, Wenqiang, et al. "Fluorinated poly(meth)acrylate: Synthesis and properties." Polymer?55.24 (2014): 6197-6211.
Yersin, Hartmut, et al. "Design of a new mechanism beyond thermally activated delayed fluorescence toward fourth generation organic light emitting diodes." Chemistry of Materials 31.16 (2019): 6110-6116.
Yersin, Hartmut, et al. "The triplet state of organo-transition metal compounds. Triplet harvesting and singlet harvesting for efficient OLEDs." Coordination Chemistry Reviews 255.21-22 (2011): 2622-2652.
Yeung, Leo W.Y., et al. "Simultaneous analysis of perfluoroalkyl and polyfluoroalkyl substances including ultrashort-chain C2 and C3 compounds in rain and river water samples by ultra performance convergence chromatography." Journal of Chromatography A 1522 (2017): 78-85.
Yook, Kyoung Soo, and Jun Yeob Lee. "Organic materials for deep blue phosphorescent organic light-emitting diodes." Advanced materials 24.24 (2012): 3169-3190.
Yoshinaga, Harunobu, et al. "Spin-orbit coupling analyses of phosphorescence: the effects of cyclometalated ligand replacement in fac-lr (ppy) 3 with various bpy ligands on blue phosphorescence." RSC advances 6.69 (2016): 65020-65030.
Yu, Jun Ho, et al. "64-2: Fabrication of Auxiliary Electrodes using Ag Inkjet Printing for OLED Lighting." SID Symposium Digest of Technical Papers. vol. 49. No. 1. 2018.
Yuan, Fulong, et al. "A modified method for preparation of a pure octachlorocyclotetraphosphazene." Phosphorus, Sulfur, and Silicon and the Related Elements 176.1 (2001): 77-81.
Zaporojtchenko, V., et al. "Condensation coefficients of noble metals on polymers: a novel method of determination by x-ray photoelectron spectroscopy." Surface and Interface Analysis: An International Journal devoted to the development and application of techniques for the analysis of surfaces, interfaces and thin films 30.1 (2000): 439-443.
Zaporojtchenko, V., et al. "Controlled growth of nano-size metal clusters on polymers by using VPD method."?Surface science?532 (2003): 300-305.
Zaporojtchenko, V., et al. "Determination of condensation coefficients of metals on polymer surfaces."?Surface science?454 (2000): 412-416.
Zaporojtchenko, V., et al. "Formation of metal-polymer interfaces by metal evaporation: influence of deposition parameters and defects." Microelectronic engineering 50.1-4 (2000): 465-471.
Zaporojtchenko, V., et al. "Metal/polymer interfaces with designed morphologies." Journal of Adhesion Science and Technology 14.3 (2000): 467-490.
Zarian, J., P. C. Painter, and M. M. Coleman. "Vibrational Spectra and Normal Coordinate Calculations of Chlorophosphazene Compounds. II. Octachlorocyclotetraphosphazene." Applied Spectroscopy 36.3 (1982): 272-277.
Zeng, Yang, et al. "28-4: Investigation of Moir? Interference in Pinhole Matrix Fingerprint on Display Technology." SID Symposium Digest of Technical Papers. vol. 51. No. 1. 2020.
Zhang, Bing, et al. "P-124: A 17.3-inch WQHD Top-Emission Foldable AMOLED Display with Outstanding Optical Performance and Visual Effects."?SID Symposium Digest of Technical Papers. vol. 51. No. 1. 2020.
Zhang, Hao, et al. "P-131: A Design of Under-screen Face Recognition based on Screen Miniature Blind Apertures." SID Symposium Digest of Technical Papers. vol. 51. No. 1. 2020.
Zhang, Tianzhan, et al. "Bio-inspired superhydrophilic coatings with high anti-adhesion against mineral scales." NPG Asia Materials 10.3 (2018): e471-e471.
Zhang, Xu, et al. "General approach to compute phosphorescent OLED efficiency." The Journal of Physical Chemistry C 122.11 (2018): 6340-6347.
Zhang, Xuan, et al. "Synthesis of extended polycyclic aromatic hydrocarbons by oxidative tandem spirocyclization and 1, 2-aryl migration." Nature communications 8.1 (2017): 1-8.

(56) References Cited

OTHER PUBLICATIONS

Zhang, Yongjie, Mingshuai Fan, and Xiaopei Li. "Reaction of "unreactive" silicone: synthesis of long-chain alkyl fluorosilicone via a simple siloxane equilibration process." Polymer Bulletin 77.6 (2020): 2855-2871.
Zhang, Zhenhua. "74-3: Image Deblurring of Camera Under Display by Deep Learning."?SID Symposium Digest of Technical Papers. vol. 51. No. 1. 2020.
Zhao, Lei, Daqun Chen, and Weihua Hu. "Patterning of metal films on arbitrary substrates by using polydopamine as a UV-sensitive catalytic layer for electroless deposition." Langmuir 32.21 (2016): 5285-5290.
Zhao, Xuan, et al. "P-233: Late-News-Poster: Color Shift Improvement of AMOLED Device with Color Filter." SID Symposium Digest of Technical Papers. vol. 51. No. 1. 2020.
Zharkova, N. M., M. A. Kleinovskaya, and Yu K. Molokanov. "Evaporation of oligoorganic siloxanes under hgh vacuum." Chemistry and Technology of Fuels and Oils 5.4 (1969): 257-261.
Zheng, Bi-Yuan, et al. "Synthesis and antifungal photodynamic activities of a series of novel zinc(II) phthalocyanines substituted with piperazinyl moieties." Dyes and Pigments 99.1 (2013): 185-191.
Zheng, Dongxiao, et al. "Non-conjugated and p-conjugated functional ligands on semiconductive quantum dots." Composites Communications 11 (2019): 21-26.

* cited by examiner

800

MATERIALS FOR FORMING A NUCLEATION-INHIBITING COATING AND DEVICES INCORPORATING SAME

RELATED APPLICATIONS

The present application is a 371 National Stage Entry of International Application No. PCT/US2020/054359, filed May 7, 2020, which in turn claims the benefit of priority to U.S. Provisional Patent Application No. 62/845,273, filed May 8, 2019, and U.S. Provisional Patent Application 62/886,896, filed Aug. 14, 2019, the contents of which are incorporated herein by reference in their entirety.

TECHNICAL FIELD

The present disclosure relates to opto-electronic devices and in particular to an opto-electronic device having first and second electrodes separated by a semiconductor layer and having a conductive coating deposited thereon patterned using a nucleation-inhibiting coating (NIC).

BACKGROUND

In an opto-electronic device such as an organic light emitting diode (OLED), at least one semiconducting layer is disposed between a pair of electrodes, such as an anode and a cathode. The anode and cathode are electrically coupled to a power source and respectively generate holes and electrons that migrate toward each other through the at least one semiconducting layer. When a pair of holes and electrons combine, a photon may be emitted.

OLED display panels may comprise a plurality of (sub-) pixels, each of which has an associated pair of electrodes. Various layers and coatings of such panels are typically formed by vacuum-based deposition techniques.

In some applications, it may be desirable to provide a conductive coating in a pattern for each (sub-)pixel of the panel across either or both of a lateral and a cross-sectional aspect thereof, by selective deposition of the conductive coating to form a device feature, such as, without limitation, an electrode and/or a conductive element electrically coupled thereto, during the OLED manufacturing process.

One method for doing so, in some non-limiting applications, involves the interposition of a fine metal mask (FMM) during deposition of an electrode material and/or a conductive element electrically coupled thereto. However, materials typically used as electrodes have relatively high evaporation temperatures, which impacts the ability to re-use the FMM and/or the accuracy of the pattern that may be achieved, with attendant increases in cost, effort and complexity.

One method for doing so, in some non-limiting examples, involves depositing the electrode material and thereafter removing, including by a laser drilling process, unwanted regions thereof to form the pattern. However, the removal process often involves the creation and/or presence of debris, which may affect the yield of the manufacturing process.

Further, such methods may not be suitable for use in some applications and/or with some devices with certain topographical features.

It would be beneficial to provide an improved mechanism for providing selective deposition of a conductive coating.

BRIEF DESCRIPTION OF THE DRAWINGS

Examples of the present disclosure will now be described by reference to the following FIGURES, in which identical reference numerals in different FIGURES indicate identical and/or in some non-limiting examples, analogous and/or corresponding elements and in which.

Figure 1:
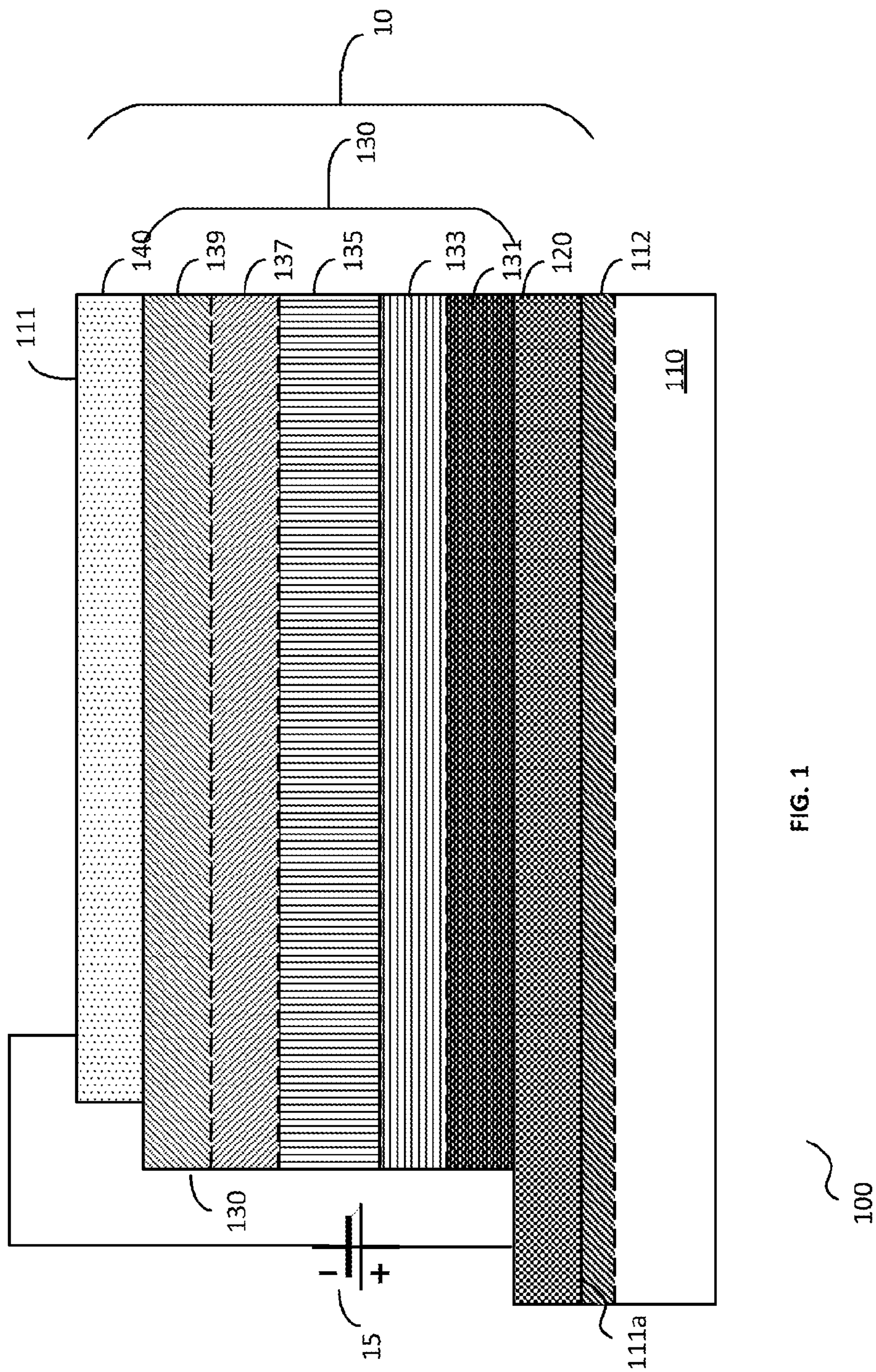
FIG. 1 is a block diagram from a cross-sectional aspect, of an example electro-luminescent device according to an example in the present disclosure.

In the present disclosure, for purposes of explanation and not limitation, specific details are set forth in order to provide a thorough understanding of the present disclosure, including, without limitation, particular architectures, interfaces and/or techniques. In some instances, detailed descriptions of well-known systems, technologies, components, devices, circuits, methods and applications are omitted so as not to obscure the description of the present disclosure with unnecessary detail.

Further, it will be appreciated that block diagrams reproduced herein can represent conceptual views of illustrative components embodying the principles of the technology.

Accordingly, the system and method components have been represented where appropriate by conventional symbols in the drawings, showing only those specific details that are pertinent to understanding the examples of the present disclosure, so as not to obscure the disclosure with details that will be readily apparent to those of ordinary skill in the art having the benefit of the description herein.

Any drawings provided herein may not be drawn to scale and may not be considered to limit the present disclosure in any way.

Any feature or action shown in dashed outline may in some examples be considered as optional.

SUMMARY

It is an object of the present disclosure to obviate or mitigate at least one disadvantage of the prior art.

The present disclosure discloses an opto-electronic device having a plurality of layers, comprising, in a lateral aspect, a first portion and a second portion. In the first portion, the device comprises a nucleation-inhibiting coating (NIC) is disposed on a first layer surface.

In the second portion, a conductive coating is disposed on a second layer surface.

An initial sticking probability for forming the conductive coating onto a surface of the NIC in the first portion is substantially less than the initial sticking probability for forming the conductive coating onto the second layer surface in the second portion. Accordingly, in some embodiments, the first portion is substantially devoid of the conductive coating.

According to a broad aspect of the present disclosure, there is disclosed an opto-electronic device having a plurality of layers, comprising: a nucleation-inhibiting coating (NIC) disposed on a first layer surface in a first portion in a lateral aspect thereof; and a conductive coating disposed on a second layer surface in a second portion of the lateral aspect thereof; wherein the surface of the NIC in the first portion is substantially devoid of the conductive coating; and wherein the NIC comprises a compound of Formula (I), (II), (III), (IV), (V), (VI), (VII), (VIII), (IX), (X), (XI), (XII), (XIII), (XIV), (XV), (XVI), (XVII), (XVIII), (XIX), and/or (XX):

Formula (I)

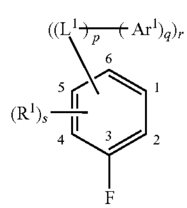

-continued

Formula (II)

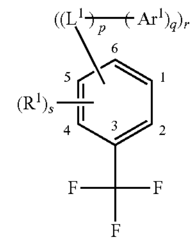

Formula (III)

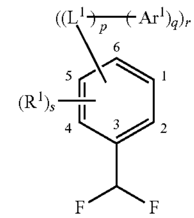

Formula (IV)

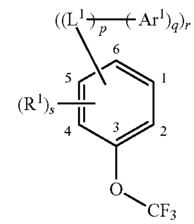

Formula (V)

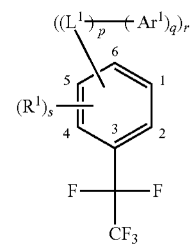

Formula (VI)

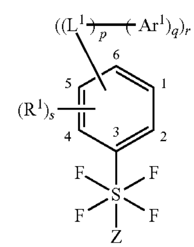

Formula (VII)

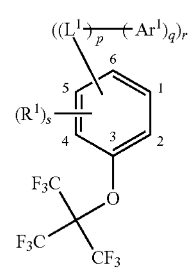

-continued
Formula (VIII)
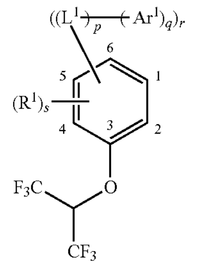
Formula (IX)
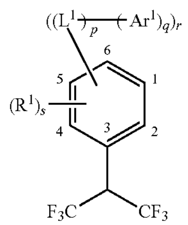
Formula (X)
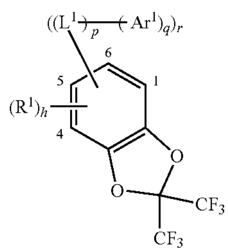
Formula (XI)
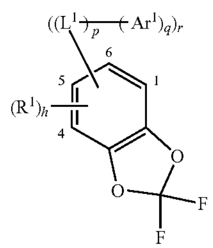
Formula (XII)
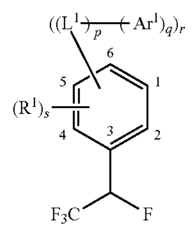
Formula (XIII)
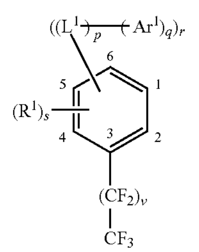
-continued
Formula (XIV)
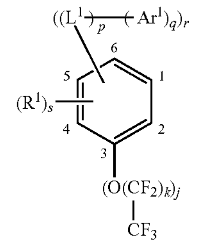
Formula (XV)
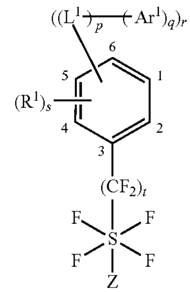
Formula (XVI)
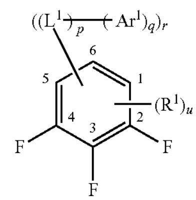
Formula (XVII)
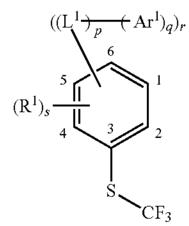
Formula (XVIII)
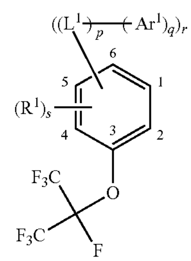
Formula (XIX)
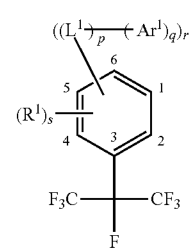

-continued

Formula (XX)

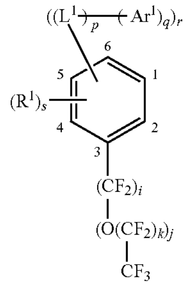

wherein:

$L^1$ independently represents C, $CR^2$, $CR^2R^3$, N, $NR^3$, S, O, substituted or unsubstituted cycloalkylene having 3-6 carbon atoms, substituted or unsubstituted arylene group having 5-60 carbon atoms, or a substituted or unsubstituted heteroarylene group having 4-60 carbon atoms;

$Ar^1$ independently represents a substituted or unsubstituted aryl group having 5 to 60 carbon atoms, a substituted or unsubstituted haloaryl group having 5 to 60 carbon atoms, or a substituted or unsubstituted heteroaryl group having 4 to 60 carbon atoms;

$R^1$, $R^2$, and $R^3$ independently represents H, D (deutero), F, Cl, alkyl including C1-C6 alkyl, cycloaklyl including C3-C6 cycloalkyl, alkoxy including C1-C6 alkoxy, fluoroalkyl, haloaryl, heteroaryl, haloalkoxy, fluoroaryl, fluoroalkoxy, fluoroalkylsulfanyl, fluoromethyl, difluoromethyl, trifluoromethyl, difluoromethoxy, trifluoromethoxy, fluoroethyl, polyfluoroethyl, 4-fluorophenyl, 3,4,5-trifluorophenyl, polyfluoroaryl, 4-(trifluoromethoxy)phenyl, $SF_4Cl$, $SF_5$, $(CF_2)_aSF_5$, $(O(CF_2)_b)_dCF_3$, $(CF_2)_e(O(CF_2)_b)_d)CF_3$, or trifluoromethylsulfanyl;

Z independently represents F or Cl;

s represents an integer of 0 to 4, wherein the sum of r and s is 5;

r represents an integer of 1 to 3;

p represents an integer of 0 to 6;

q represents an integer of 1 to 8;

represents an integer of 2 to 4;

j represents an integer of 1 to 3;

k represents an integer of 1 to 4;

t represents an integer of 2 to 6;

u represents an integer of 0 to 2, wherein the sum of r and u is 3;

h represents an integer of 0 to 4, wherein the sum of r and h is 4;

i represents an integer of 1 to 4;

a represents an integer of 2 to 6;

b represents an integer of 1 to 4;

d represents an integer of 1 to 3; and e represents an integer of 1 to 4.

Examples have been described above in conjunctions with aspects of the present disclosure upon which they can be implemented. Those skilled in the art will appreciate that examples may be implemented in conjunction with the aspect with which they are described, but may also be implemented with other examples of that or another aspect. When examples are mutually exclusive, or are otherwise incompatible with each other, it will be apparent to those having ordinary skill in the relevant art. Some examples may be described in relation to one aspect, but may also be applicable to other aspects, as will be apparent to those having ordinary skill in the relevant art.

Some aspects or examples of the present disclosure may provide an opto-electronic device having a first portion of a lateral aspect thereof, comprising a nucleation-inhibiting coating (NIC) on a first layer surface thereof and a second portion having a conductive coating on a second layer surface thereof, wherein an initial sticking probability for forming the conductive coating onto a surface of the NIC in the first portion is substantially less than the initial sticking probability for forming the conductive coating onto the second layer surface in the second portion, such that the first portion is substantially devoid of the conductive coating.

DESCRIPTION

Opto-Electronic Device

The present disclosure relates generally to electronic devices, and more specifically, to opto-electronic devices. An opto-electronic device generally encompasses any device that converts electrical signals into photons and vice versa.

In the present disclosure, the terms “photon” and “light” may be used interchangeably to refer to similar concepts. In the present disclosure, photons may have a wavelength that lies in the visible light spectrum, in the infrared (IR) and/or ultraviolet (UV) region thereof.

An organic opto-electronic device can encompass any opto-electronic device where one or more active layers and/or strata thereof are formed primarily of an organic (carbon-containing) material, and more specifically, an organic semiconductor material.

In the present disclosure, it will be appreciated by those having ordinary skill in the relevant art that an organic material, may comprise, without limitation, a wide variety of organic molecules, and/or organic polymers. Further, it will be appreciated by those having ordinary skill in the relevant art that organic materials that are doped with various inorganic substances, including without limitation, elements and/or inorganic compounds, may still be considered to be organic materials. Still further, it will be appreciated by those having ordinary skill in the relevant art that various organic materials may be used, and that the processes described herein are generally applicable to an entire range of such organic materials.

In the present disclosure, an inorganic substance may refer to a substance that primarily includes an inorganic material. In the present disclosure, an inorganic material may comprise any material that is not considered to be an organic material, including without limitation, metals, glasses and/or minerals.

Where the opto-electronic device emits photons through a luminescent process, the device may be considered an electro-luminescent device. In some non-limiting examples, the electro-luminescent device may be an organic light-emitting diode (OLED) device. In some non-limiting examples, the electro-luminescent device may be part of an electronic device. By way of non-limiting example, the electro-luminescent device may be an OLED lighting panel or module, and/or an OLED display or module of a computing device, such as a smartphone, a tablet, a laptop, an e-reader, and/or of some other electronic device such as a monitor and/or a television set.

In some non-limiting examples, the opto-electronic device may be an organic photo-voltaic (OPV) device that converts photons into electricity. In some non-limiting examples, the opto-electronic device may be an electro-luminescent quantum dot device. In the present disclosure, unless specifically indicated to the contrary, reference will be made to OLED devices, with the understanding that such disclosure could, in some examples, equally be made applicable to other opto-electronic devices, including without limitation, an OPV and/or quantum dot device in a manner apparent to those having ordinary skill in the relevant art.

The structure of such devices will be described from each of two aspects, namely from a cross-sectional aspect and/or from a lateral (plan view) aspect.

In the present disclosure, the terms “layer” and “strata” may be used interchangeably to refer to similar concepts.

In the context of introducing the cross-sectional aspect below, the components of such devices are shown in substantially planar lateral strata. Those having ordinary skill in the relevant art will appreciate that such substantially planar representation is for purposes of illustration only, and that across a lateral extent of such a device, there may be localized substantially planar strata of different thicknesses and dimension, including, in some non-limiting examples, the substantially complete absence of a layer, and/or layer(s) separated by non-planar transition regions (including lateral gaps and even discontinuities). Thus, while for illustrative purposes, the device is shown below in its cross-sectional aspect as a substantially stratified structure, in the plan view aspect discussed below, such device may illustrate a diverse topography to define features, each of which may substantially exhibit the stratified profile discussed in the cross-sectional aspect.

Cross-Sectional Aspect

FIG. 1 is a simplified block diagram from a cross-sectional aspect, of an example electro-luminescent device according to the present disclosure. The electro-luminescent device, shown generally at 100 comprises, a substrate 110, upon which a frontplane 10, comprising a plurality of layers, respectively, a first electrode 120, at least one semiconducting layer 130, and a second electrode 140, are disposed. In some non-limiting examples, the frontplane 10 may provide mechanisms for photon emission and/or manipulation of emitted photons. In some non-limiting examples, a barrier coating 1650 (FIG. 16C) may be provided to surround and/or encapsulate the layers 120, 130, 140 and/or the substrate 110 disposed thereon.

For purposes of illustration, an exposed layer surface of underlying material is referred to as 111. In FIG. 1, the exposed layer surface 111 is shown as being of the second electrode 140. Those having ordinary skill in the relevant art will appreciate that, at the time of deposition of, by way of non-limiting example, the first electrode 120, the exposed layer surface 111 would have been shown as 111*a*, of the substrate 110.

Those having ordinary skill in the relevant art will appreciate that when a component, a layer, a region and/or portion thereof is referred to as being “formed”, “disposed” and/or “deposited” on another underlying material, component, layer, region and/or portion, such formation, disposition and/or deposition may be directly and/or indirectly on an exposed layer surface 111 (at the time of such formation, disposition and/or deposition) of such underlying material, component, layer, region and/or portion, with the potential of intervening material(s), component(s), layer(s), region(s) and/or portion(s) therebetween.

In the present disclosure, a directional convention is followed, extending substantially normally relative to the lateral aspect described above, in which the substrate 110 is considered to be the “bottom” of the device 100, and the layers 120, 130, 140 are disposed on “top” of the substrate 11. Following such convention, the second electrode 140 is at the top of the device 100 shown, even if (as may be the case in some examples, including without limitation, during a manufacturing process, in which one or more layers 120, 130, 140 may be introduced by means of a vapor deposition process), the substrate 110 is physically inverted such that the top surface, on which one of the layers 120, 130, 140, such as, without limitation, the first electrode 120, is to be disposed, is physically below the substrate 110, so as to allow the deposition material (not shown) to move upward and be deposited upon the top surface thereof as a thin film.

In some non-limiting examples, the device 100 may be electrically coupled to a power source 15. When so coupled, the device 100 may emit photons as described herein.

In some non-limiting examples, the device 100 may be classified according to a direction of emission of photons generated therefrom. In some non-limiting examples, the device 100 may be considered to be a bottom-emission device if the photons generated are emitted in a direction toward and through the substrate 100 at the bottom of the device 100 and away from the layers 120, 130, 140 disposed on top of the substrate 110. In some non-limiting examples, the device 100 may be considered to be a top-emission device if the photons are emitted in a direction away from the substrate 110 at the bottom of the device 100 and toward and/or through the top layer 140 disposed, with intermediate layers 120, 130, on top of the substrate 110. In some non-limiting examples, the device 100 may be considered to be a double-sided emission device if it is configured to emit photons in both the bottom (toward and through the substrate 110) and top (toward and through the top layer 140).

Thin Film Formation

Figure 8:
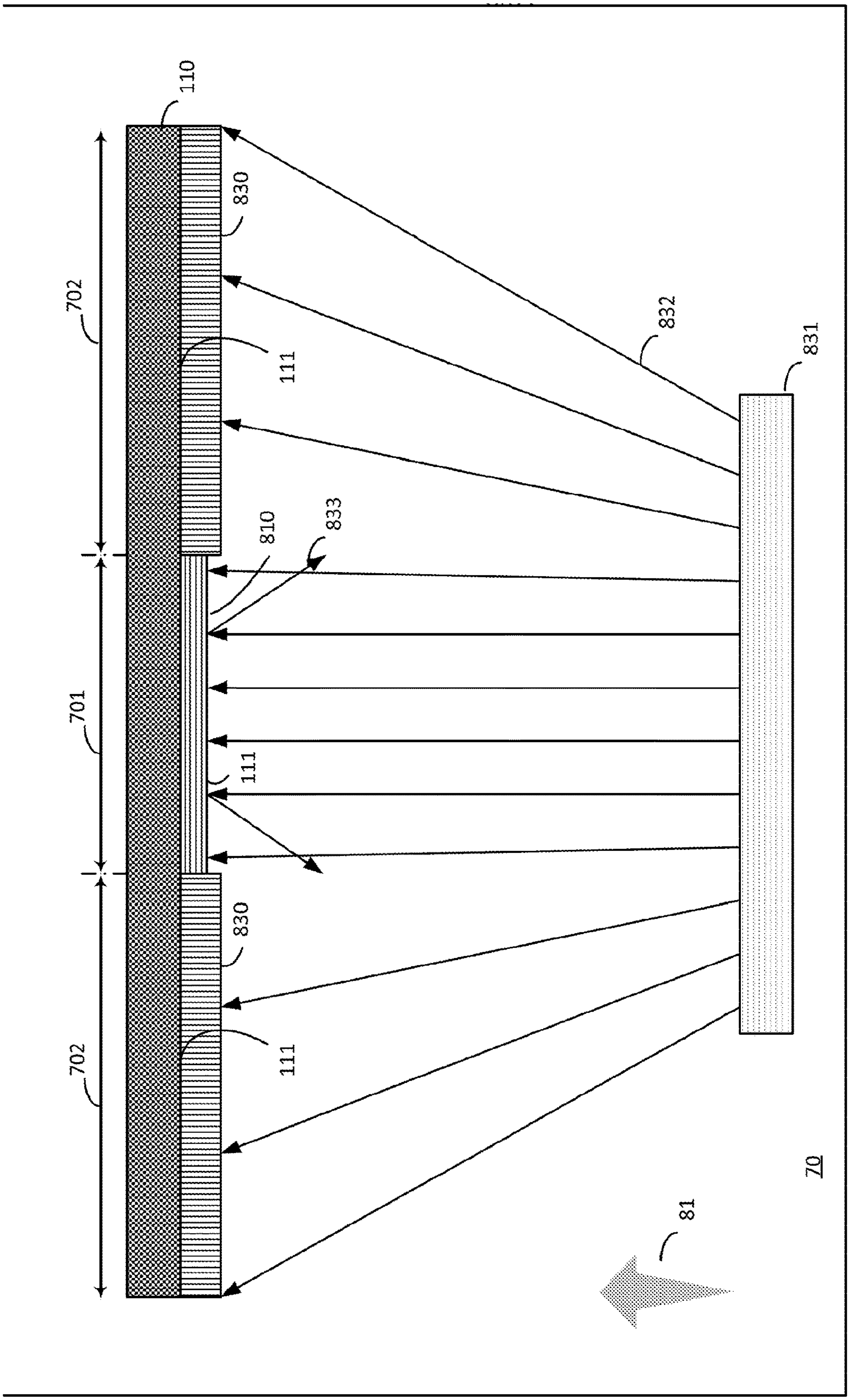
FIG. 8 is a schematic diagram showing an example process for depositing a conductive coating in the first pattern on an exposed layer surface that comprises the deposited pattern of the selective coating of FIG. 7 where the selective coating is a nucleation-inhibiting coating (NIC)

The frontplane 10 layers 120, 130, 140 may be disposed in turn on a target exposed layer surface 111 (and/or, in some non-limiting examples, including without limitation, in the case of selective deposition disclosed herein, at least one target region and/or portion of such surface) of an underlying material, which in some non-limiting examples, may be, from time to time, the substrate 110 and intervening lower layers 120, 130, 140, as a thin film. In some non-limiting examples, an electrode 120, 140, 1750, 4150 may be formed of at least one thin conductive film layer of a conductive coating 830 (FIG. 8).

The thickness of each layer, including without limitation, layers 120, 130, 140, and of the substrate 110, shown in FIG. 1, and throughout the FIGURES, is illustrative only and not necessarily representative of a thickness relative to another layer 120, 130, 140 (and/or of the substrate 110).

The formation of thin films during vapor deposition on an exposed layer surface 111 of an underlying material involves processes of nucleation and growth. During initial stages of film formation, a sufficient number of vapor monomers (which in some non-limiting examples may be molecules and/or atoms) typically condense from a vapor phase to form initial nuclei on the surface 111 presented, whether of the substrate 110 (or of an intervening lower layer 120, 130, 140). As vapor monomers continue to impinge on such surface, a size and density of these initial nuclei increase to form small clusters or islands. After reaching a saturation island density, adjacent islands typically will start to coalesce, increasing an average island size, while decreasing an island density. Coalescence of adjacent islands may continue until a substantially closed film is formed.

There may be at least three basic growth modes for the formation of thin films: 1) island (Volmer-Weber), 2) layer-by-layer (Frank-van der Merwe), and 3) Stranski-Krastanov. Island growth typically occurs when stale clusters of monomers nucleate on a surface and grow to form discrete islands. This growth mode occurs when the interactions between the monomers is stronger than that between the monomers and the surface.

The nucleation rate describes how many nuclei of a given size (where the free energy does not push a cluster of such nuclei to either grow or shrink) ("critical nuclei") form on a surface per unit time. During initial stages of film formation, it is unlikely that nuclei will grow from direct impingement of monomers on the surface, since the density of nuclei is low, and thus the nuclei cover a relatively small fraction of the surface (e.g. there are large gaps/spaces between neighboring nuclei). Therefore, the rate at which critical nuclei grow typically depends on the rate at which adatoms (e.g. adsorbed monomers) on the surface migrate and attach to nearby nuclei.

After adsorption of an adatom on a surface, the adatom may either desorb from the surface, or may migrate some distance on the surface before either desorbing, interacting with other adatoms to form a small cluster, or attaching to a growing nucleus. An average amount of time that an adatom remains on the surface after initial adsorption is given by:

$$\tau_s = \frac{1}{v}\exp\left(\frac{E_{des}}{kT}\right)$$

In the above equation, v is a vibrational frequency of the adatom on the surface, k is the Botzmann constant, T is temperature, and $E_{des}$ 631 (FIG. 6) is an energy involved to desorb the adatom from the surface. From this equation it is noted that the lower the value of $E_{des}$ 631 the easier it is for the adatom to desorb from the surface, and hence the shorter the time the adatom will remain on the surface. A mean distance an adatom can diffuse is given by, $$X = a_0\exp\left(\frac{E_{des} - E_s}{2kT}\right)$$

where $a_0$ is a lattice constant and $E_s$ 621 (FIG. 6) is an activation energy for surface diffusion. For low values of $E_{des}$ 631 and/or high values of $E_s$ 621, the adatom will diffuse a shorter distance before desorbing, and hence is less likely to attach to growing nuclei or interact with another adatom or cluster of adatoms.

During initial stages of film formation, adsorbed adatoms may interact to form clusters, with a critical concentration of clusters per unit area being given by, $$\frac{N_i}{n_0} = \left|\frac{N_1}{n_0}\right|^i \exp\left(\frac{E_i}{kT}\right)$$

where $E_i$ is an energy involved to dissociate a critical cluster containing i adatoms into separate adatoms, $n_0$ is a total density of adsorption sites, and $N_1$ is a monomer density given by:

$$N_1 = \dot{R}\tau_s$$

where $\dot{R}$ is a vapor impingement rate. Typically i will depend on a crystal structure of a material being deposited and will determine the critical cluster size to form a stable nucleus.

A critical monomer supply rate for growing clusters is given by the rate of vapor impingement and an average area over which an adatom can diffuse before desorbing:

$$\dot{R}X^2 = \alpha_0^2\exp\left(\frac{E_{des} - E_s}{kT}\right)$$

The critical nucleation rate is thus given by the combination of the above equations:

$$\dot{N}_i = \dot{R}\alpha_0^2 n_0\left(\frac{\dot{R}}{vn_0}\right)^i \exp\left(\frac{(i+1)E_{des} - E_s + E_i}{kT}\right)$$

From the above equation it is noted that the critical nucleation rate will be suppressed for surfaces that have a low desorption energy for adsorbed adatoms, a high activation energy for diffusion of an adatom, are at high temperatures, and/or are subjected to vapor impingement rates.

Sites of substrate heterogeneities, such as defects, ledges or step edges, may increase $E_{des}$ 631, leading to a higher density of nuclei observed at such sites. Also, impurities or contamination on a surface may also increase $E_{des}$ 631, leading to a higher density of nuclei. For vapor deposition processes, conducted under high vacuum conditions, the type and density of contaminates on a surface is affected by a vacuum pressure and a composition of residual gases that make up that pressure.

Under high vacuum conditions, a flux of molecules that impinge on a surface (per $cm^2$-sec) is given by:

$$\phi = 3.513 \times 10^{22}\frac{P}{MT}$$

where P is pressure, and M is molecular weight. Therefore, a higher partial pressure of a reactive gas, such as $H_2O$, can lead to a higher density of contamination on a surface during vapor deposition, leading to an increase in $E_{des}$ 631 and hence a higher density of nuclei.

While the present disclosure discusses thin film formation, in reference to at least one layer or coating, in terms of vapor deposition, those having ordinary skill in the relevant art will appreciate that, in some non-limiting examples, various components of the electro-luminescent device 100 may be selectively deposited using a wide variety of techniques, including without limitation, evaporation (including without limitation, thermal evaporation and/or electron beam evaporation), photolithography, printing (including without limitation, ink jet and/or vapor jet printing, reel-to-reel printing and/or micro-contact transfer printing), physical vapor deposition (PVD) (including without limitation, sputtering), chemical vapor deposition (CVD) (including without limitation, plasma-enhanced CVD (PECVD) and/or organic vapor phase deposition (OVPD)), laser annealing, laser-induced thermal imaging (LITI) patterning, atomic-layer deposition (ALD), coating (including without limitation, spin coating, dip coating, line coating and/or spray coating), and/or combinations of any two or more thereof. Some processes may be used in combination with a shadow mask, which may, in some non-limiting examples, be an open mask and/or fine metal mask (FMM), during deposition of any of various layers and/or coatings to achieve various patterns by masking and/or precluding deposition of a deposited material on certain portions of a surface of an underlying material exposed thereto.

In the present disclosure, the terms "evaporation" and/or "sublimation" may be used interchangeably to refer generally to deposition processes in which a source material is converted into a vapor, including without limitation by heating, to be deposited onto a target surface in, without limitation, a solid state. As will be understood, an evaporation process is a type of PVD process where one or more source materials are evaporated and/or sublimed under a low pressure (including without limitation, a vacuum) environment and deposited on a target surface through de-sublimation of the one or more evaporated source materials. A variety of different evaporation sources may be used for heating a source material, and, as such, it will be appreciated by those having ordinary skill in the relevant art, that the source material may be heated in various ways. By way of non-limiting example, the source material may be heated by an electric filament, electron beam, inductive heating, and/or by resistive heating. In some non-limiting examples, the source material may be loaded into a heated crucible, a heated boat, a Knudsen cell (which may be an effusion evaporator source) and/or any other type of evaporation source.

In some non-limiting examples, a deposition source material may be a mixture. In some non-limiting examples, at least one component of a mixture of a deposition source material may not be deposited during the deposition process (or, in some non-limiting examples, be deposited in a relatively small amount compared to other components of such mixture).

In the present disclosure, a reference to a layer thickness of a material, irrespective of the mechanism of deposition thereof, refers to an amount of the material deposited on a target exposed layer surface 111, which corresponds to an amount of the material to cover the target surface with a uniformly thick layer of the material having the referenced layer thickness. By way of non-limiting example, depositing a layer thickness of 10 nanometers (nm) of material indicates that an amount of the material deposited on the surface corresponds to an amount of the material to form a uniformly thick layer of the material that is 10 nm thick. It will be appreciated that, having regard to the mechanism by which thin films are formed discussed above, by way of non-limiting example, due to possible stacking or clustering of monomers, an actual thickness of the deposited material may be non-uniform. By way of non-limiting example, depositing a layer thickness of 10 nm may yield some parts of the deposited material having an actual thickness greater than 10 nm, or other parts of the deposited material having an actual thickness less than 10 nm. A certain layer thickness of a material deposited on a surface may thus correspond, in some non-limiting examples, to an average thickness of the deposited material across the target surface.

In the present disclosure, a reference to a reference layer thickness refers to a layer thickness of magnesium (Mg) that is deposited on a reference surface exhibiting a high initial sticking probability $S_0$ (that is, a surface having an initial sticking probability $S_0$ that is about and/or close to 1). The reference layer thickness does not indicate an actual thickness of Mg deposited on a target surface (such as, without limitation, a surface of a nucleation-inhibiting coating (NIC) 810 (FIG. 8)). Rather, the reference layer thickness refers to a layer thickness of Mg that would be deposited on a reference surface, in some non-limiting examples, a surface of a quartz crystal positioned inside a deposition chamber for monitoring a deposition rate and the reference layer thickness, upon subjecting the target surface and the reference surface to identical Mg vapor flux for the same deposition period. Those having ordinary skill in the relevant art will appreciate that in the event that the target surface and the reference surface are not subjected to identical vapor flux simultaneously during deposition, an appropriate tooling factor may be used to determine and/or to monitor the reference layer thickness.

In the present disclosure, a reference to depositing a number X of monolayers of material refers to depositing an amount of the material to cover a desired area of an exposed layer surface 111 with X single layer(s) of constituent monomers of the material. In the present disclosure, a reference to depositing a fraction 0.X monolayer of a material refers to depositing an amount of the material to cover a fraction 0.X of a desired area of a surface with a single layer of constituent monomers of the material. Those having ordinary skill in the relevant art will appreciate that due to, by way of non-limiting example, possible stacking and/or clustering of monomers, an actual local thickness of a deposited material across a desired area of a surface may be non-uniform. By way of non-limiting example, depositing 1 monolayer of a material may result in some local regions of the desired area of the surface being uncovered by the material, while other local regions of the desired area of the surface may have multiple atomic and/or molecular layers deposited thereon.

In the present disclosure, a target surface (and/or target region(s) thereof) may be considered to be "substantially devoid of", "substantially free of" and/or "substantially uncovered by" a material if there is a substantial absence of the material on the target surface as determined by any suitable determination mechanism.

In some non-limiting examples, one measure of an amount of a material on a surface is a percentage coverage of the surface by such material. In some non-limiting examples surface coverage may be assessed using a variety of imaging techniques, including without limitation, transmission electron microscopy (TEM), atomic force microscopy (AFM) and/or scanning electron microscopy (SEM).

In some non-limiting examples, one measure of an amount of an electrically conductive material on a surface is a (light) transmittance, since in some non-limiting examples, electrically conductive materials, including without limitation, metals, including without limitation Mg, attenuate and/or absorb photons.

Thus, in some non-limiting examples, a surface of a material may be considered to be substantially devoid of an electrically conductive material if the transmittance therethrough is greater than 90%, greater than 92%, greater than 95%, and/or greater than 98% of the transmittance of a reference material of similar composition and dimension of such material, in some non-limiting examples, in the visible part of the electromagnetic spectrum.

In the present disclosure, for purposes of simplicity of illustration, details of deposited materials, including without limitation, thickness profiles and/or edge profiles of layer(s) have been omitted. Various possible edge profiles at an interface between NICs 810 and conductive coatings 830 are discussed herein.

Substrate

In some examples, the substrate 110 may comprise a base substrate 112. In some examples, the base substrate 112 may be formed of material suitable for use thereof, including without limitation, an inorganic material, including without limitation, silicon (Si), glass, metal (including without limitation, a metal foil), sapphire, and/or other inorganic material, and/or an organic material, including without limitation, a polymer, including without limitation, a polyimide and/or a silicon-based polymer. In some examples, the base substrate 112 may be rigid or flexible. In some examples, the substrate 112 may be defined by at least one planar surface. The substrate 110 has at least one surface that supports the remaining front plane 10 components of the device 100, including without limitation, the first electrode 120, the at least one semiconducting layer 130 and/or the second electrode 140.

In some non-limiting examples, such surface may be an organic surface and/or an inorganic surface.

In some examples, the substrate 110 may comprise, in addition to the base substrate 112, one or more additional organic and/or inorganic layers (not shown nor specifically described herein) supported on an exposed layer surface 111 of the base substrate 112.

In some non-limiting examples, such additional layers may comprise and/or form one or more organic layers, which may comprise, replace and/or supplement one or more of the at least one semiconducting layers 130.

In some non-limiting examples, such additional layers may comprise one or more inorganic layers, which may comprise and/or form one or more electrodes, which in some non-limiting examples, may comprise, replace and/or supplement the first electrode 120 and/or the second electrode 140.

In some non-limiting examples, such additional layers may comprise and/or be formed of and/or as a backplane layer 20 (FIG. 2) of a semiconductor material. In some non-limiting examples, the backplane layer 20 contains power circuitry and/or switching elements for driving the device 100, including without limitation, electronic TFT structure(s) and/or component(s) 200 (FIG. 2) thereof that may be formed by a photolithography process, which may not be provided under, and/or may precede the introduction of low pressure (including without limitation, a vacuum) environment.

In the present disclosure, a semiconductor material may be described as a material that generally exhibits a band gap. In some non-limiting examples, the band gap may be formed between a highest occupied molecular orbital (HOMO) and a lowest unoccupied molecular orbital (LUMO) of the semiconductor material. Semiconductor materials thus generally exhibit electrical conductivity that is less than that of a conductive material (including without limitation, a metal), but that is greater than that of an insulating material (including without limitation, a glass). In some non-limiting examples, the semiconductor material may comprise an organic semiconductor material. In some non-limiting examples, the semiconductor material may comprise an inorganic semiconductor material.

Backplane and TFT Structure(s) Embodied Therein

Figure 2:
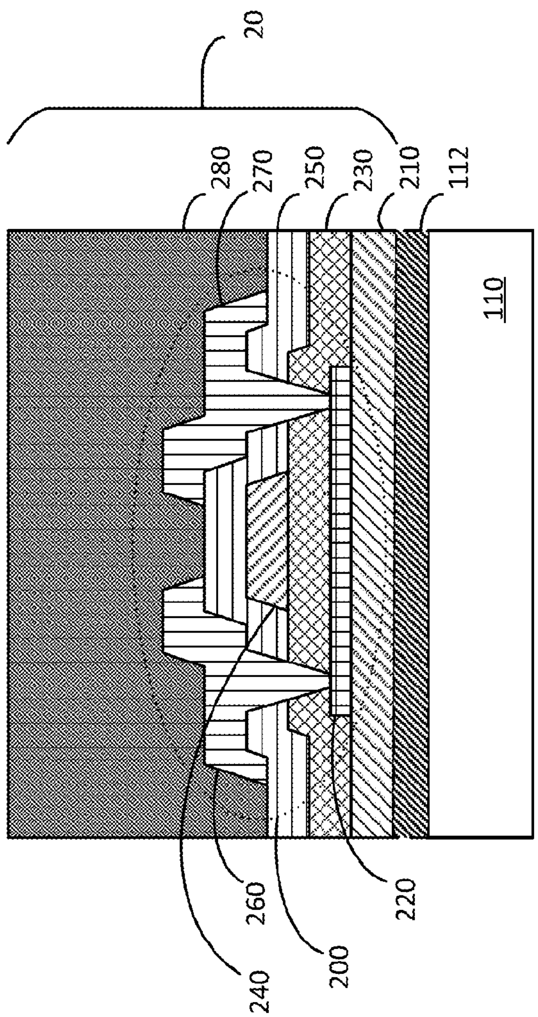
FIG. 2 is a cross-sectional view of an example backplane layer of the substrate of the device of FIG. 1, showing a thin film transistor (TFT) embodied therein.

FIG. 2 is a simplified cross-sectional view of an example of the substrate 110 of the device 100, including a backplane layer 20 thereof. In some non-limiting examples, the backplane 20 of the substrate 110 may comprise one or more electronic and/or opto-electronic components, including without limitation, transistors, resistors and/or capacitors, such as which may support the device 100 acting as an active-matrix and/or a passive matrix device. In some non-limiting examples, such structures may be a thin-film transistor (TFT) structure, such as is shown at 200. In some non-limiting examples, the TFT structure 200 may be fabricated using organic and/or inorganic materials to form various layers 210, 220, 230, 240, 250, 270, 270, 280 and/or parts of the backplane layer 20 of the substrate 110 above the base substrate 112. In FIG. 2, the TFT structure 200 shown is a top-gate TFT. In some non-limiting examples, TFT technology and/or structures, including without limitation, one or more of the layers 210, 220, 230, 240, 250, 270, 270, 280, may be employed to implement non-transistor components, including without limitation, resistors and/or capacitors.

In some non-limiting examples, the backplane 20 may comprise a buffer layer 210 deposited on an exposed layer surface 111 of the base substrate 112 to support the components of the TFT structure 200. In some non-limiting examples, the TFT structure 200 may comprise a semiconductor active area 220, a gate insulating layer 230, a TFT gate electrode 240, an interlayer insulating layer 250, a TFT source electrode 260, a TFT drain electrode 270 and/or a TFT insulating layer 280. In some non-limiting examples, the semiconductor active area 220 is formed over a part of the buffer layer 210, and the gate insulating layer 230 is deposited on substantially cover the semiconductor active area 220. In some non-limiting examples, the gate electrode 240 is formed on top of the gate insulating layer 230 and the interlayer insulating layer 250 is deposited thereon. The TFT source electrode 270 and the TFT drain electrode 270 are formed such that they extend through openings formed through both the interlayer insulating layer 250 and the gate insulating layer 230 such that they are electrically coupled to the semiconductor active area 220. The TFT insulating layer 280 is then formed over the TFT structure 200.

In some non-limiting examples, one or more of the layers 210, 220, 230, 240, 250, 270, 270, 280 of the backplane 20 may be patterned using photolithography, which uses a photomask to expose selective parts of a photoresist covering an underlying device layer to UV light. Depending upon a type of photoresist used, exposed or unexposed parts of the photomask may then be removed to reveal desired parts of the underlying device layer. In some examples, the photoresist is a positive photoresist, in which the selective parts thereof exposed to UV light are not substantially removable thereafter, while the remaining parts not so exposed are substantially removable thereafter. In some non-limiting examples, the photoresist is a negative photoresist, in which the selective parts thereof exposed to UV light are substantially removable thereafter, while the remaining parts not so exposed are not substantially removable thereafter. A patterned surface may thus be etched, including without limitation, chemically and/or physically, and/or washed off and/or away, to effectively remove an exposed part of such layer 210, 220, 230, 240, 250, 260, 270, 280.

Further, while a top-gate TFT structure 200 is shown in FIG. 2, those having ordinary skill in the relevant art will appreciate that other TFT structures, including without limitation a bottom-gate TFT structure, may be formed in the backplane 20 without departing from the scope of the present disclosure.

In some non-limiting examples, the TFT structure 200 may be an n-type TFT and/or a p-type TFT. In some non-limiting examples, the TFT structure 200 may incorporate any one or more of amorphous Si (a-Si), indium gallium zinc (Zn) oxide (IGZO) and/or low-temperature polycrystalline Si (LTPS).

First Electrode

The first electrode 120 is deposited over the substrate 110. In some non-limiting examples, the first electrode 120 is electrically coupled to a terminal of the power source 15 and/or to ground. In some non-limiting examples, the first electrode 120 is so coupled through at least one driving circuit 300 (FIG. 3), which in some non-limiting examples, may incorporate at least one TFT structure 200 in the backplane 20 of the substrate 110.

Figure 3:
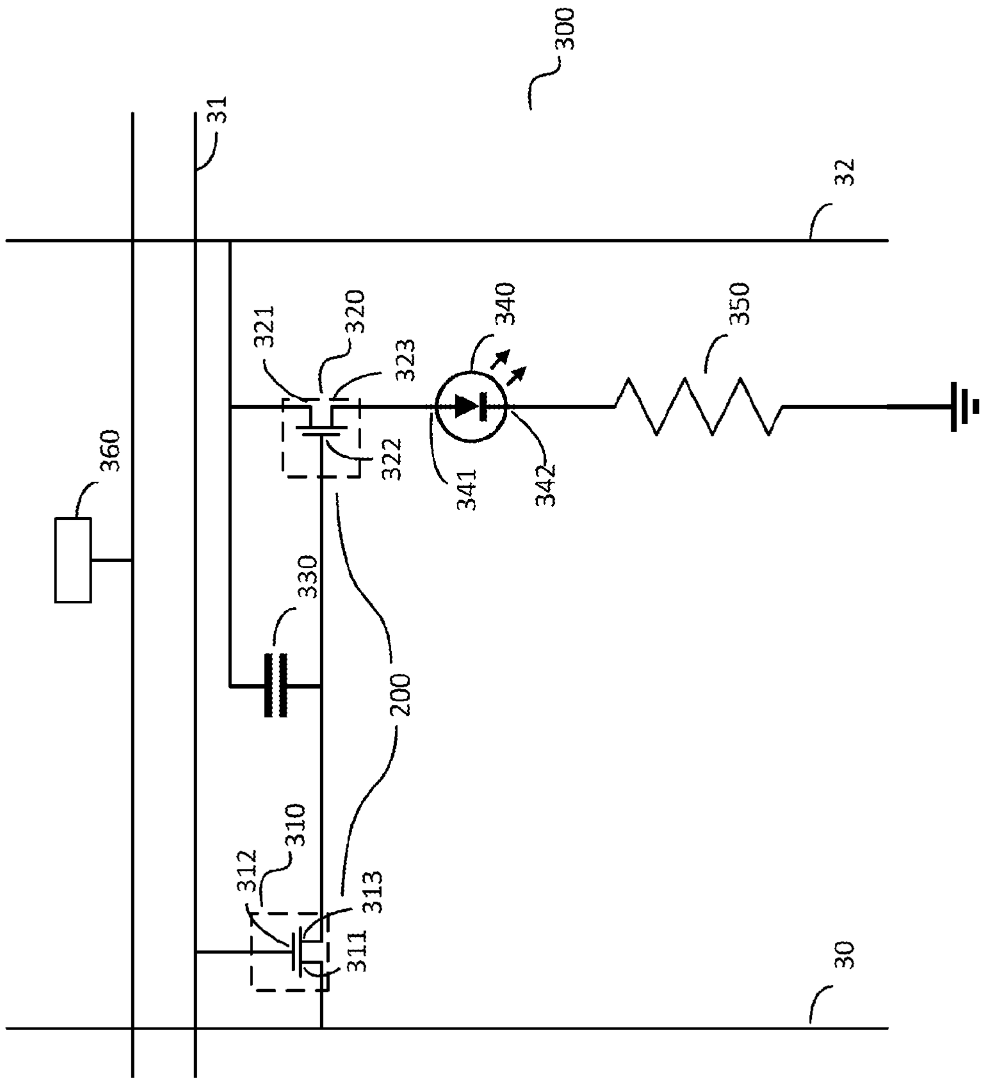
FIG. 3 is a circuit diagram for an example circuit such as may be provided by one or more of the TFTs shown in the backplane layer of FIG. 2.

In some non-limiting examples, the first electrode 120 may comprise an anode 341 (FIG. 3) and/or a cathode 342 (FIG. 3). In some non-limiting examples, the first electrode 120 is an anode 341.

Figure 4:
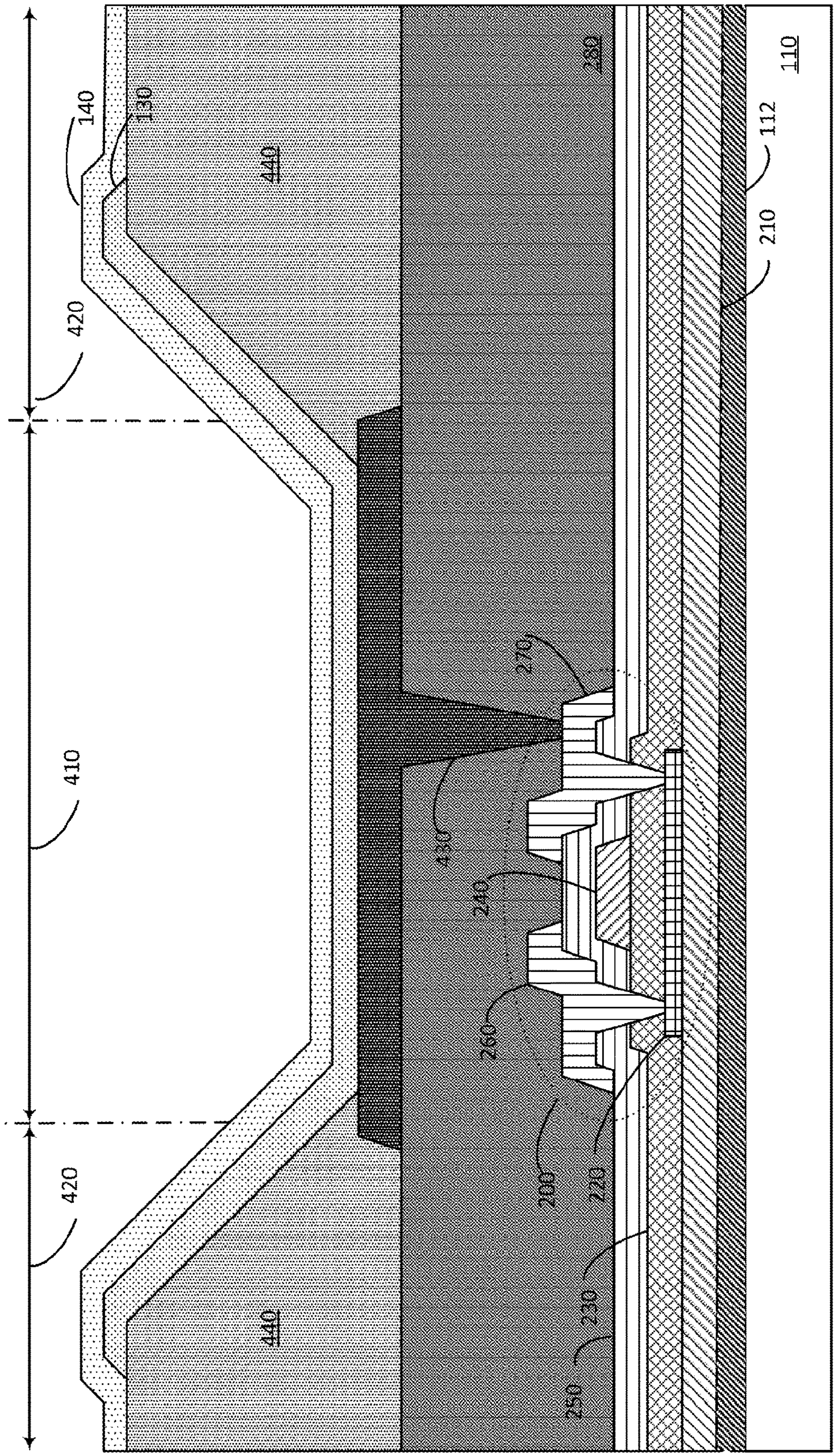
FIG. 4 is a cross-sectional view of the device of FIG. 1.

In some non-limiting examples, the first electrode 120 may be formed by depositing at least one thin conductive film, over (a portion of) the substrate 110. In some non-limiting examples, there may be a plurality of first electrodes 120, disposed in a spatial arrangement over a lateral aspect of the substrate 110. In some non-limiting examples, one or more of such at least one first electrodes 120 may be deposited over (a portion of) the TFT insulating layer 280 disposed in a lateral aspect in a spatial arrangement. If so, in some non-limiting examples, at least one of such at least one first electrodes 120 may extend through an opening of the corresponding TFT insulating layer 280, as shown in FIG. 4, to be electrically coupled to an electrode 240, 260, 270 of the TFT structure 200 in the backplane 20. In FIG. 4, a part of the at least one first electrode 120 is shown coupled to the TFT drain electrode 270.

In some non-limiting examples, the at least one first electrode 120 and/or at least one thin film thereof, may comprise various materials, including without limitation, one or more metallic materials, including without limitation, Mg, aluminum (Al), calcium (Ca), Zn, silver (Ag), cadmium (Cd), barium (Ba) and/or ytterbium (Yb), and/or combinations of any two or more thereof, including without limitation, alloys containing any of such materials, one or more metal oxides, including without limitation, a transparent conducting oxide (TCO), including without limitation, ternary compositions such as, without limitation, fluorine tin oxide (FTO), indium zinc oxide (IZO), and/or indium tin oxide (ITO), and/or combinations of any two or more thereof and/or in varying proportions, and/or combinations of any two or more thereof in at least one layer, any one or more of which may be, without limitation, a thin film.

In some non-limiting examples, a thin conductive film comprising the first electrode 120 may be selectively deposited, deposited and/or processed using a variety of techniques, including without limitation, evaporation (including without limitation, thermal evaporation and/or electron beam evaporation), photolithography, printing (including without limitation, ink jet and/or vapor jet printing, reel-to-reel printing and/or micro-contact transfer printing), PVD (including without limitation, sputtering), CVD (including without limitation, PECVD and/or OVPD), laser annealing, LITI patterning, ALD, coating (including without limitation, spin coating, dip coating, line coating and/or spray coating), and/or combinations of any two or more thereof.

Second Electrode

The second electrode 140 is deposited over the at least one semiconducting layer 130. In some non-limiting examples, the second electrode 140 is electrically coupled to a terminal of the power source 15 and/or to ground. In some non-limiting examples, the second electrode 140 is so coupled through at least one driving circuit 300, which in some non-limiting examples, may incorporate at least one TFT structure 200 in the backplane 20 of the substrate 110.

In some non-limiting examples, the second electrode 140 may comprise an anode 341 and/or a cathode 342. In some non-limiting examples, the second electrode 130 is a cathode 342.

In some non-limiting examples, the second electrode 140 may be formed by depositing a conductive coating 830, in some non-limiting examples, as at least one thin film, over (a part of) the at least one semiconducting layer 130. In some non-limiting examples, there may be a plurality of second electrodes 140, disposed in a spatial arrangement over a lateral aspect of the at least one semiconducting layer 130.

In some non-limiting examples, the at least one second electrode 140 may comprise various materials, including without limitation, one or more metallic materials, including without limitation, Mg, Al, Ca, Zn, Ag, Cd, Ba and/or Yb, and/or combinations of any two or more thereof, including without limitation, alloys containing any of such materials, one or more metal oxides, including without limitation, a TCO, including without limitation, ternary compositions such as, without limitation, FTO, IZO, and/or ITO, and/or combinations of any two or more thereof and/or in varying proportions, and/or zinc oxide (ZnO) and/or other oxides containing indium (In) and/or Zn, and/or combinations of any two or more thereof in at least one layer, and/or one or more non-metallic materials, any one or more of which may be, without limitation, a thin conductive film. In some non-limiting examples, for a Mg:Ag alloy, such alloy composition may range from about 1:9 to about 9:1 by volume.

In some non-limiting examples, a thin conductive film comprising the second electrode 140 may be selectively applied, deposited and/or processed using a variety of techniques, including without limitation, evaporation (including without limitation, thermal evaporation and/or electron beam evaporation), photolithography, printing (including without limitation, ink jet and/or vapor jet printing, reel-to-reel printing and/or micro-contact transfer printing), PVD (including without limitation, sputtering), CVD (including without limitation, PECVD and/or OVPD), laser annealing, LITI patterning, ALD, coating (including without limitation, spin coating, dip coating, line coating and/or spray coating), and/or combinations of any two or more thereof.

In some non-limiting examples, the deposition of the second electrode 140 may be performed using an open-mask and/or a mask-free deposition process.

In some non-limiting examples, the second electrode 140 may comprise a plurality of such layers and/or coatings. In some non-limiting examples, such layers and/or coatings may be distinct layers and/or coatings disposed on top of one another.

In some non-limiting examples, the second electrode 140 may comprise a Yb/Ag bi-layer coating. By way of non-limiting examples, such bi-layer coating may be formed by depositing a Yb coating, followed by an Ag coating. A thickness of such Ag coating may be greater than a thickness of the Yb coating.

In some non-limiting examples, the second electrode 140 may be a multi-layer electrode 140 comprising at least one metallic layer and/or at least one oxide layer.

In some non-limiting examples, the second electrode 140 may comprise a fullerene and Mg.

In the present disclosure, the term "fullerene" may refer generally to a material including carbon molecules. Non-limiting examples of fullerene molecules include carbon cage molecules, including without limitation, a three-dimensional skeleton that includes multiple carbon atoms that form a closed shell and which may be, without limitation, spherical and/or semi-spherical in shape. In some non-limiting examples, a fullerene molecule can be designated as $C_n$, where n is an integer corresponding to a number of carbon atoms included in a carbon skeleton of the fullerene molecule. Non-limiting examples of fullerene molecules include $C_n$, where n is in the range of 50 to 250, such as, without limitation, $C_n$, $C_{70}$, $C_{72}$, $C_{74}$n $C_{76}$n $C_{78}$n $C_{80}$, $C_{82}$, and $C_{84}$. Additional non-limiting examples of fullerene molecules include carbon molecules in a tube and/or a cylindrical shape, including without limitation, single-walled carbon nanotubes and/or multi-walled carbon nanotubes.

By way of non-limiting examples, such coating may be formed by depositing a fullerene coating followed by an Mg coating. In some non-limiting examples, a fullerene may be dispersed within the Mg coating to form a fullerene-containing Mg alloy coating. Non-limiting examples of such coatings are described in United States Patent Application Publication No. 2015/0287846 published 8 Oct. 2015 and/or in PCT International Application No. PCT/IB2017/054970 filed 15 Aug. 2017 and published as WO2018/033860 on 22 Feb. 2018.

Driving Circuit

In the present disclosure, the concept of a sub-pixel 2641-2643 (FIG. 26) may be referenced herein, for simplicity of description only, as a sub-pixel 264*x*. Likewise, in the present disclosure, the concept of a pixel 340 (FIG. 3) may be discussed in conjunction with the concept of at least one sub-pixel 264*x* thereof. For simplicity of description only, such composite concept is referenced herein as a "(sub-) pixel 340/264*x*" and such term is understood to suggest either or both of a pixel 340 and/or at least one sub-pixel 264*x* thereof, unless the context dictates otherwise.

FIG. 3 is a circuit diagram for an example driving circuit such as may be provided by one or more of the TFT structures 200 shown in the backplane 20. In the example shown, the circuit, shown generally at 300 is for an example driving circuit for an active-matrix OLED (AMOLED) device 100 (and/or a (sub-)pixel 340/264*x* thereof) for supplying current to the first electrode 120 and the second electrode 140, and that controls emission of photons from the device 100 (and/or a (sub-)pixel 340/264*x*). The circuit 300 shown incorporates a plurality of p-type top-gate thin film TFT structures 200, although the circuit 300 could equally incorporate one or more p-type bottom-gate TFT structures 200, one or more n-type top-gate TFT structures 200, one or more n-type bottom-gate TFT structures 200, one or more other TFT structure(s) 200, and/or any combination thereof, whether or not formed as one or a plurality of thin film layers. The circuit 300 comprises, in some non-limiting examples, a switching TFT 310, a driving TFT 320 and a storage capacitor 330.

A (sub-)pixel 340/264*x* of the OLED display 100 is represented by a diode 340. The source 311 of the switching TFT 310 is coupled to a data (or, in some non-limiting examples, a column selection) line 30. The gate 312 of the switching TFT 310 is coupled to a gate (or, in some non-limiting examples, a row selection) line 31. The drain 313 of the switching TFT 310 is coupled to the gate 322 of the driving TFT 320.

The source 321 of the driving TFT 320 is coupled to a positive (or negative) terminal of the power source 15. The (positive) terminal of the power source 15 is represented by a power supply line (VDD) 32.

The drain 323 of the driving TFT 320 is coupled to the anode 341 (which may be, in some non-limiting examples, the first electrode 120) of the diode 340 (representing a (sub-)pixel 340/264*x* of the OLED display 100) so that the driving TFT 320 and the diode 340 (and/or a (sub-)pixel 340/264*x* of the OLED display 100) are coupled in series between the power supply line (VDD) 32 and ground.

The cathode 342 (which may be, in some non-limiting examples, the second electrode 140) of the diode 340 (representing a (sub-)pixel 340/264*x* of the OLED display 100) is represented as a resistor 350 in the circuit 300.

The storage capacitor 330 is coupled at its respective ends to the source 321 and gate 322 of the driving TFT 320. The driving TFT 320 regulates a current passed through the diode 340 (representing a (sub-)pixel 340/264*x* of the OLED display 100) in accordance with a voltage of a charge stored in the storage capacitor 330, such that the diode 340 outputs a desired luminance. The voltage of the storage capacitor 330 is set by the switching TFT 310, coupling it to the data line 30.

In some non-limiting examples, a compensation circuit 370 is provided to compensate for any deviation in transistor properties from variances during the manufacturing process and/or degradation of the switching TFT 310 and/or driving TFT 320 over time.

Semiconducting Layer

In some non-limiting examples, the at least one semiconducting layer 130 may comprise a plurality of layers 131, 133, 135, 137, 139, any of which may be disposed, in some non-limiting examples, in a thin film, in a stacked configuration, which may include, without limitation, any one or more of a hole injection layer (HIL) 131, a hole transport layer (HTL) 133, an emissive layer (EL) 135, an electron transport layer (ETL) 137 and/or an electron injection layer (EIL) 139. In the present disclosure, the term "semiconducting layer(s)" may be used interchangeably with "organic layer(s)" since the layers 131, 133, 135, 137, 139 in an OLED device 100 may in some non-limiting examples, may comprise organic semiconducting materials.

In some non-limiting examples, the at least one semiconducting layer 130 may form a "tandem" structure comprising a plurality of ELs 135. In some non-limiting examples, such tandem structure may also comprise at least one charge generation layer (CGL).

In some non-limiting examples, a thin film comprising a layer 131, 133, 135, 137, 139 in the stack making up the at least one semiconducting layer 130, may be selectively applied, deposited and/or processed using a variety of techniques, including without limitation, evaporation (including without limitation, thermal evaporation and/or electron beam evaporation), photolithography, printing (including without limitation, ink jet and/or vapor jet printing, reel-to-reel printing and/or micro-contact transfer printing), PVD (including without limitation, sputtering), CVD (including without limitation, PECVD and/or OVPD), laser annealing, LITI patterning, ALD, coating (including without limitation, spin coating, dip coating, line coating and/or spray coating), and/or combinations of any two or more thereof.

Those having ordinary skill in the relevant art will readily appreciate that the structure of the device 100 may be varied by omitting and/or combining one or more of the semiconductor layers 131, 133, 135, 137, 139.

Further, any of the layers 131, 133, 135, 137, 139 of the at least one semiconducting layer 130 may comprise any number of sub-layers. Still further, any of such layers 131, 133, 135, 137, 139 and/or sub-layer(s) thereof may comprise various mixture(s) and/or composition gradient(s). In addition, those having ordinary skill in the relevant art will appreciate that the device 100 may comprise one or more layers containing inorganic and/or organometallic materials and is not necessarily limited to devices composed solely of organic materials. By way of non-limiting example, the device 100 may comprise one or more quantum dots.

In some non-limiting examples, the HIL 131 may be formed using a hole injection material, which may facilitate injection of holes by the anode 341.

In some non-limiting examples, the HTL 133 may be formed using a hole transport material, which may, in some non-limiting examples, exhibit high hole mobility.

In some non-limiting examples, the ETL 137 may be formed using an electron transport material, which may, in some non-limiting examples, exhibit high electron mobility.

In some non-limiting examples, the EIL 139 may be formed using an electron injection material, which may facilitate injection of electrons by the cathode 342.

In some non-limiting examples, the EL 135 may be formed, by way of non-limiting example, by doping a host material with at least one emitter material. In some non-limiting examples, the emitter material may be a fluorescent emitter, a phosphorescent emitter, a thermally activated delayed fluorescence (TADF) emitter and/or a plurality of any combination of these.

In some non-limiting examples, the device 100 may be an OLED in which the at least one semiconducting layer 130 comprises at least an EL 135 interposed between conductive thin film electrodes 120, 140, whereby, when a potential difference is applied across them, holes are injected into the at least one semiconducting layer 130 through the anode 341 and electrons are injected into the at least one semiconducting layer 130 through the cathode 342.

The injected holes and electrons tend to migrate through the various layers 131, 133, 135, 137, 139 until they reach and meet each other. When a hole and an electron are in close proximity, they tend to be attracted to one another due to a Coulomb force and in some examples, may combine to form a bound state electron-hole pair referred to as an exciton. Especially if the exciton is formed in the EL 135, the exciton may decay through a radiative recombination process, in which a photon is emitted. The type of radiative recombination process may depend upon a spin state of an exciton. In some examples, the exciton may be characterized as having a singlet or a triplet spin state. In some non-limiting examples, radiative decay of a singlet exciton may result in fluorescence. In some non-limiting examples, radiative decay of a triplet exciton may result in phosphorescence.

More recently, other photon emission mechanisms for OLEDs have been proposed and investigated, including without limitation, TADF. In some non-limiting examples, TADF emission occurs through a conversion of triplet excitons into single excitons via a reverse inter-system crossing process with the aid of thermal energy, followed by radiative decay of the singlet excitons.

In some non-limiting examples, an exciton may decay through a non-radiative process, in which no photon is released, especially if the exciton is not formed in the EL 135.

In the present disclosure, the term "internal quantum efficiency" (IQE) of an OLED device 100 refers to a proportion of all electron-hole pairs generated in the device 100 that decay through a radiative recombination process and emit a photon.

In the present disclosure, the term "external quantum efficiency" (EQE) of an OLED device 100 refers to a proportion of charge carriers delivered to the device 100 relative to a number of photons emitted by the device 100. In some non-limiting examples, an EQE of 100% indicates that one photon is emitted for each electron that is injected into the device 100.

Those having ordinary skill in the relevant art will appreciate that the EQE of a device 100 may, in some non-limiting examples, be substantially lower than the IQE of the same device 100. A difference between the EQE and the IQE of a given device 100 may in some non-limiting examples be attributable to a number of factors, including without limitation, adsorption and reflection of photons caused by various components of the device 100.

In some non-limiting examples, the device 100 may be an electro-luminescent quantum dot device in which the at least one semiconducting layer 130 comprises an active layer comprising at least one quantum dot. When current is provided by the power source 15 to the first electrode 120 and second electrode 140, photons are emitted from the active layer comprising the at least one semiconducting layer 130 between them.

Those having ordinary skill in the relevant art will readily appreciate that the structure of the device 100 may be varied by the introduction of one or more additional layers (not shown) at appropriate position(s) within the at least one semiconducting layer 130 stack, including without limitation, a hole blocking layer (not shown), an electron blocking layer (not shown), an additional charge transport layer (not shown) and/or an additional charge injection layer (not shown).

Barrier Coating

In some non-limiting examples, a barrier coating 1650 may be provided to surround and/or encapsulate the first electrode 120, second electrode 140, and the various layers of the at least one semiconducting layer 130 and/or the substrate 110 disposed thereon of the device 100.

In some non-limiting examples, the barrier coating 1650 may be provided to inhibit the various layers 120, 130, 140 of the device 100, including the at least one semiconducting layer 130 and/or the cathode 342 from being exposed to moisture and/or ambient air, since these layers 120, 130, 140 may be prone to oxidation.

In some non-limiting examples, application of the barrier coating 1650 to a highly non-uniform surface may increase a likelihood of poor adhesion of the barrier coating 1650 to such surface.

In some non-limiting examples, the absence of a barrier coating 1650 and/or a poorly-applied barrier coating 1650 may cause and/or contribute to defects in and/or partial and/or total failure of the device 100. In some non-limiting examples, a poorly-applied barrier coating 1650 may reduce adhesion of the barrier coating 1650 to the device 100. In some non-limiting examples, poor adhesion of the barrier coating 1650 may increase a likelihood of the barrier coating 1650 peeling off the device 100 in whole or in part, especially if the device 100 is bent and/or flexed. In some non-limiting examples, a poorly-applied barrier coating 1650 may allow air pockets to be trapped, during application of the barrier coating 1650, between the barrier coating 1650 and an underlying surface of the device 100 to which the barrier coating 1650 was applied.

In some non-limiting examples, the barrier coating 1650 may be a thin film encapsulation (TFE) layer 2050 (FIG. 20B) and may be selectively applied, deposited and/or processed using a variety of techniques, including without limitation, evaporation (including without limitation, thermal evaporation and/or electron beam evaporation), photolithography, printing (including without limitation, ink jet and/or vapor jet printing, reel-to-reel printing and/or micro-contact transfer printing), PVD (including without limitation, sputtering), CVD (including without limitation, PECVD and/or OVPD), laser annealing, LITI patterning, ALD, coating (including without limitation, spin coating, dip coating, line coating and/or spray coating), and/or combinations of any two or more thereof.

In some non-limiting examples, the barrier coating 1650 may be provided by laminating a pre-formed barrier film onto the device 100. In some non-limiting examples, the barrier coating 1650 may comprise a multi-layer coating comprising at least one of an organic material, an inorganic material and/or any combination thereof. In some non-limiting examples, the barrier coating 1550 may further comprise a getter material and/or a desiccant.

Lateral Aspect

In some non-limiting examples, including where the OLED device 100 comprises a lighting panel, an entire lateral aspect of the device 100 may correspond to a single lighting element. As such, the substantially planar cross-sectional profile shown in FIG. 1 may extend substantially along the entire lateral aspect of the device 100, such that photons are emitted from the device 100 substantially along the entirety of the lateral extent thereof. In some non-limiting examples, such single lighting element may be driven by a single driving circuit 300 of the device 100.

In some non-limiting examples, including where the OLED device 100 comprises a display module, the lateral aspect of the device 100 may be sub-divided into a plurality of emissive regions 1910 of the device 100, in which the cross-sectional aspect of the device structure 100, within each of the emissive region(s) 1910 shown, without limitation, in FIG. 1 causes photons to be emitted therefrom when energized.

Emissive Regions

In some non-limiting examples, individual emissive regions 1910 of the device 100 may be laid out in a lateral pattern. In some non-limiting examples, the pattern may extend along a first lateral direction. In some non-limiting examples, the pattern may also extend along a second lateral direction, which in some non-limiting examples, may be substantially normal to the first lateral direction. In some non-limiting examples, the pattern may have a number of elements in such pattern, each element being characterized by one or more features thereof, including without limitation, a wavelength of light emitted by the emissive region 1910 thereof, a shape of such emissive region 1910, a dimension (along either or both of the first and/or second lateral direction(s)), an orientation (relative to either and/or both of the first and/or second lateral direction(s)) and/or a spacing (relative to either or both of the first and/or second lateral direction(s)) from a previous element in the pattern. In some non-limiting examples, the pattern may repeat in either or both of the first and/or second lateral direction(s).

In some non-limiting examples, each individual emissive region 1910 of the device 100 is associated with, and driven by, a corresponding driving circuit 300 within the backplane 20 of the device 100, in which the diode 340 corresponds to the OLED structure for the associated emissive region 1910. In some non-limiting examples, including without limitation, where the emissive regions 1910 are laid out in a regular pattern extending in both the first (row) lateral direction and the second (column) lateral direction, there may be a signal line 30, 31 in the backplane 20, which may be the gate line (or row selection) line 31, corresponding to each row of emissive regions 1910 extending in the first lateral direction and a signal line 30, 31, which may in some non-limiting examples be the data (or column selection) line 30, corresponding to each column of emissive regions 1910 extending in the second lateral direction. In such a non-limiting configuration, a signal on the row selection line 31 may energize the respective gates 312 of the switching TFT(s) 310 electrically coupled thereto and a signal on the data line 30 may energize the respective sources of the switching TFT(s) 310 electrically coupled thereto, such that a signal on a row selection line 31/data line 30 pair will electrically couple and energise, by the positive terminal (represented by the power supply line VDD 32) of the power source 15, the anode 341 of the OLED structure of the emissive region 1910 associated with such pair, causing the emission of a photon therefrom, the cathode 342 thereof being electrically coupled to the negative terminal of the power source 15.

In some non-limiting examples, each emissive region 1910 of the device 100 corresponds to a single display pixel 340. In some non-limiting examples, each pixel 340 emits light at a given wavelength spectrum. In some non-limiting examples, the wavelength spectrum corresponds to a colour in, without limitation, the visible light spectrum.

In some non-limiting examples, each emissive region 1910 of the device 100 corresponds to a sub-pixel 264*x* of a display pixel 340. In some non-limiting examples, a plurality of sub-pixels 264*x* may combine to form, or to represent, a single display pixel 340.

In some non-limiting examples, a single display pixel 340 may be represented by three sub-pixels 2641-2643. In some non-limiting examples, the three sub-pixels 2641-2643 may be denoted as, respectively, R(ed) sub-pixels 2641, G(reen) sub-pixels 2642 and/or B(lue) sub-pixels 2643. In some non-limiting examples, a single display pixel 340 may be represented by four sub-pixels 264*x*, in which three of such sub-pixels 264*x* may be denoted as R, G and B sub-pixels 2641-2643 and the fourth sub-pixel 264*x* may be denoted as a W(hite) sub-pixel 264*x*. In some non-limiting examples, the emission spectrum of the light emitted by a given sub-pixel 264*x* corresponds to the colour by which the sub-pixel 264*x* is denoted. In some non-limiting examples, the wavelength of the light does not correspond to such colour but further processing is performed, in a manner apparent to those having ordinary skill in the relevant art, to transform the wavelength to one that does so correspond.

Since the wavelength of sub-pixels 264*x* of different colours may be different, the optical characteristics of such sub-pixels 264*x* may differ, especially if a common electrode 120, 140 having a substantially uniform thickness profile is employed for sub-pixels 264*x* of different colours.

When a common electrode 120, 140 having a substantially uniform thickness is provided as the second electrode 140 in a device 100, the optical performance of the device 100 may not be readily be fine-tuned according to an emission spectrum associated with each (sub-)pixel 340/264*x*. The second electrode 140 used in such OLED devices 100 may in some non-limiting examples, be a common electrode 120, 140 coating a plurality of (sub-)pixels 340/264*x*. By way of non-limiting example, such common electrode 120, 140 may be a relatively thin conductive film having a substantially uniform thickness across the device 100. While efforts have been made in some non-limiting examples, to tune the optical microcavity effects associated with each (sub-)pixel 340/264*x* color by varying a thickness of organic layers disposed within different (sub-)pixel(s) 340/264*x*, such approach may, in some non-limiting examples, provide a significant degree of tuning of the optical microcavity effects in at least some cases. In addition, in some non-limiting examples, such approach may be difficult to implement in an OLED display production environment.

As a result, the presence of optical interfaces created by numerous thin-film layers and coatings with different refractive indices, such as may in some non-limiting examples be used to construct opto-electronic devices including without limitation OLED devices 100, may create different optical microcavity effects for sub-pixels 264*x* of different colours.

Some factors that may impact an observed microcavity effect in a device 100 includes, without limitation, the total path length (which in some non-limiting examples may correspond to the total thickness of the device 100 through which photons emitted therefrom will travel before being out-coupled) and the refractive indices of various layers and coatings.

In some non-limiting examples, modulating the thickness of an electrode 120, 140 in and across a lateral aspect 410 of emissive region(s) 1910 of a (sub-)pixel 340/264*x* may impact the microcavity effect observable. In some non-limiting examples, such impact may be attributable to a change in the total optical path length.

In some non-limiting examples, a change in a thickness of the electrode 120, 140 may also change the refractive index of light passing therethrough, in some non-limiting examples, in addition to a change in the total optical path length. In some non-limiting examples, this may be particularly the case where the electrode 120, 140 is formed of at least one conductive coating 830.

In some non-limiting examples, the optical properties of the device 100, and/or in some non-limiting examples, across the lateral aspect 410 of emissive region(s) 1910 of a (sub-)pixel 340/264*x* that may be varied by modulating at least one optical microcavity effect, include, without limitation, the emission spectrum, the intensity (including without limitation, luminous intensity) and/or angular distribution of emitted light, including without limitation, an angular dependence of a brightness and/or color shift of the emitted light.

In some non-limiting examples, a sub-pixel 264*x* is associated with a first set of other sub-pixels 264*x* to represent a first display pixel 340 and also with a second set of other sub-pixels 264*x* to represent a second display pixel 340, so that the first and second display pixels 340 may have associated therewith, the same sub-pixel(s) 264*x*.

The pattern and/or organization of sub-pixels 264*x* into display pixels 340 continues to develop. All present and future patterns and/or organizations are considered to fall within the scope of the present disclosure.

Non-Emissive Regions

In some non-limiting examples, the various emissive regions 1910 of the device 100 are substantially surrounded and separated by, in at least one lateral direction, one or more non-emissive regions 1920, in which the structure and/or configuration along the cross-sectional aspect, of the device structure 100 shown, without limitation, in FIG. 1, is varied, so as to substantially inhibit photons to be emitted therefrom. In some non-limiting examples, the non-emissive regions 1920 comprise those regions in the lateral aspect, that are substantially devoid of an emissive region 1910.

Thus, as shown in the cross-sectional view of FIG. 4, the lateral topology of the various layers of the at least one semiconducting layer 130 may be varied to define at least one emissive region 1910, surrounded (at least in one lateral direction) by at least one non-emissive region 1920.

In some non-limiting examples, the emissive region 1910 corresponding to a single display (sub-)pixel 340/264*x* may be understood to have a lateral aspect 410, surrounded in at least one lateral direction by at least one non-emissive region 1920 having a lateral aspect 420.

A non-limiting example of an implementation of the cross-sectional aspect of the device 100 as applied to an emissive region 1910 corresponding to a single display (sub-)pixel 340/264*x* of an OLED display 100 will now be described. While features of such implementation are shown to be specific to the emissive region 1910, those having ordinary skill in the relevant art will appreciate that in some non-limiting examples, more than one emissive region 1910 may encompass common features.

In some non-limiting examples, the first electrode 120 may be disposed over an exposed layer surface 111 of the device 100, in some non-limiting examples, within at least a part of the lateral aspect 410 of the emissive region 1910. In some non-limiting examples, at least within the lateral aspect 410 of the emissive region 1910 of the (sub-)pixel(s) 340/264*x*, the exposed layer surface 111, may, at the time of deposition of the first electrode 120, comprise the TFT insulating layer 280 of the various TFT structures 200 that make up the driving circuit 300 for the emissive region 1910 corresponding to a single display (sub-) pixel 340/264*x*.

In some non-limiting examples, the TFT insulating layer 280 may be formed with an opening 430 extending therethrough to permit the first electrode 120 to be electrically coupled to one of the TFT electrodes 240, 260, 270, including, without limitation, as shown in FIG. 4, the TFT drain electrode 270.

Those having ordinary skill in the relevant art will appreciate that the driving circuit 300 comprises a plurality of TFT structures 200, including without limitation, the switching TFT 310, the driving TFT 320 and/or the storage capacitor 330. In FIG. 4, for purposes of simplicity of illustration, only one TFT structure 200 is shown, but it will be appreciated by those having ordinary skill in the relevant art, that such TFT structure 200 is representative of such plurality thereof that comprise the driving circuit 300.

In a cross-sectional aspect, the configuration of each emissive region 1910 may, in some non-limiting examples, be defined by the introduction of at least one pixel definition layer (PDL) 440 substantially throughout the lateral aspects 420 of the surrounding non-emissive region(s) 1920. In some non-limiting examples, the PDLs 440 may comprise an insulating organic and/or inorganic material.

In some non-limiting examples, the PDLs 440 are deposited substantially over the TFT insulating layer 280, although, as shown, in some non-limiting examples, the PDLs 440 may also extend over at least a part of the deposited first electrode 120 and/or its outer edges.

In some non-limiting examples, as shown in FIG. 4, the cross-sectional thickness and/or profile of the PDLs 440 may impart a substantially valley-shaped configuration to the emissive region 1910 of each (sub-)pixel 340/264*x* by a region of increased thickness along a boundary of the lateral aspect 420 of the surrounding non-emissive region 1920 with the lateral aspect 410 of the surrounded emissive region 1910, corresponding to a (sub-)pixel 340/264*x*.

In some non-limiting examples, the profile of the PDLs 440 may have a reduced thickness beyond such valley-shaped configuration, including without limitation, away from the boundary between the lateral aspect 420 of the surrounding non-emissive region 1920 and the lateral aspect 410 of the surrounded emissive region 1910, in some non-limiting examples, substantially well within the lateral aspect 420 of such non-emissive region 1920.

While the PDL(s) 440 have been generally illustrated as having a linearly-sloped surface to form a valley-shaped configuration that define the emissive region(s) 1910 surrounded thereby, those having ordinary skill in the relevant art will appreciate that in some non-limiting examples, at least one of the shape, aspect ratio, thickness, width and/or configuration of such PDL(s) 440 may be varied. By way of non-limiting example, a PDL 440 may be formed with a steeper or more gradually-sloped part. In some non-limiting examples, such PDL(s) 440 may be configured to extend substantially normally away from a surface on which it is deposited, that covers one or more edges of the first electrode 120. In some non-limiting examples, such PDL(s) 440 may be configured to have deposited thereon at least one semiconducting layer 130 by a solution-processing technology, including without limitation, by printing, including without limitation, ink-jet printing.

In some non-limiting examples, the at least one semiconducting layer 130 may be deposited over the exposed layer surface 111 of the device 100, including at least a part of the lateral aspect 410 of such emissive region 1910 of the (sub-)pixel(s) 340/264*x*. In some non-limiting examples, at least within the lateral aspect 410 of the emissive region 1910 of the (sub-)pixel(s) 340/264*x*, such exposed layer surface 111, may, at the time of deposition of the at least one semiconducting layer 130 (and/or layers 131, 133, 135, 137, 139 thereof), comprise the first electrode 120.

In some non-limiting examples, the at least one semiconducting layer 130 may also extend beyond the lateral aspect 410 of the emissive region 1910 of the (sub-)pixel(s) 340/264*x* and at least partially within the lateral aspects 420 of the surrounding non-emissive region(s) 1920. In some non-limiting examples, such exposed layer surface 111 of such surrounding non-emissive region(s) 1920 may, at the time of deposition of the at least one semiconducting layer 130, comprise the PDL(s) 440.

In some non-limiting examples, the second electrode 140 may be disposed over an exposed layer surface 111 of the device 100, including at least a part of the lateral aspect 410 of the emissive region 1910 of the (sub-)pixel(s) 340/264*x*. In some non-limiting examples, at least within the lateral aspect 410 of the emissive region 1910 of the (sub-)pixel(s) 340/264*x*, such exposed layer surface 111, may, at the time of deposition of the second electrode 130, comprise the at least one semiconducting layer 130.

In some non-limiting examples, the second electrode 140 may also extend beyond the lateral aspect 410 of the emissive region 1910 of the (sub-) pixel(s) 340/264*x* and at least partially within the lateral aspects 420 of the surrounding non-emissive region(s) 1920. In some non-limiting examples, such exposed layer surface 111 of such surrounding non-emissive region(s) 1920 may, at the time of deposition of the second electrode 140, comprise the PDL(s) 440.

In some non-limiting examples, the second electrode 140 may extend throughout substantially all or a substantial part of the lateral aspects 420 of the surrounding non-emissive region(s) 1920.

Transmissivity

Because the OLED device 100 emits photons through either or both of the first electrode 120 (in the case of a bottom-emission and/or a double-sided emission device), as well as the substrate 110 and/or the second electrode 140 (in the case of a top-emission and/or double-sided emission device), it may be desirable to make either or both of the first electrode 120 and/or the second electrode 140 substantially photon— (or light)-transmissive ("transmissive"), in some non-limiting examples, at least across a substantial part of the lateral aspect 410 of the emissive region(s) 1910 of the device 100. In the present disclosure, such a transmissive element, including without limitation, an electrode 120, 140, a material from which such element is formed, and/or property thereof, may comprise an element, material and/or property thereof that is substantially transmissive ("transparent"), and/or, in some non-limiting examples, partially transmissive ("semi-transparent"), in some non-limiting examples, in at least one wavelength range.

A variety of mechanisms have been adopted to impart transmissive properties to the device 100, at least across a substantial part of the lateral aspect 410 of the emissive region(s) 1910 thereof.

In some non-limiting examples, including without limitation, where the device 100 is a bottom-emission device and/or a double-sided emission device, the TFT structure(s) 200 of the driving circuit 300 associated with an emissive region 1910 of a (sub-)pixel 340/264*x*, which may at least partially reduce the transmissivity of the surrounding substrate 110, may be located within the lateral aspect 420 of the surrounding non-emissive region(s) 1920 to avoid impacting the transmissive properties of the substrate 110 within the lateral aspect 410 of the emissive region 1910.

In some non-limiting examples, where the device 100 is a double-sided emission device, in respect of the lateral aspect 410 of an emissive region 1910 of a (sub-)pixel 340/264*x*, a first one of the electrode 120, 140 may be made substantially transmissive, including without limitation, by at least one of the mechanisms disclosed herein, in respect of the lateral aspect 410 of neighbouring and/or adjacent (sub-)pixel(s) 340/264*x*, a second one of the electrodes 120, 140 may be made substantially transmissive, including without limitation, by at least one of the mechanisms disclosed herein. Thus, the lateral aspect 410 of a first emissive region 1910 of a (sub-)pixel 340/264*x* may be made substantially top-emitting while the lateral aspect 410 of a second emissive region 1910 of a neighbouring (sub-)pixel 340/264*x* may be made substantially bottom-emitting, such that a subset of the (sub-)pixel(s) 340/264*x* are substantially top-emitting and a subset of the (sub-)pixel(s) 340/264*x* are substantially bottom-emitting, in an alternating (sub-)pixel 340/264*x* sequence, while only a single electrode 120, 140 of each (sub-)pixel 340/264*x* is made substantially transmissive.

In some non-limiting examples, a mechanism to make an electrode 120, 140, in the case of a bottom-emission device and/or a double-sided emission device, the first electrode 120, and/or in the case of a top-emission device and/or a double-sided emission device, the second electrode 140, transmissive is to form such electrode 120, 140 of a transmissive thin film.

In some non-limiting examples, an electrically conductive coating 830, in a thin film, including without limitation, those formed by a depositing a thin conductive film layer of a metal, including without limitation, Ag, Al and/or by depositing a thin layer of a metallic alloy, including without limitation, an Mg:Ag alloy and/or a Yb:Ag alloy, may exhibit transmissive characteristics. In some non-limiting examples, the alloy may comprise a composition ranging from between about 1:9 to about 9:1 by volume. In some non-limiting examples, the electrode 120, 140 may be formed of a plurality of thin conductive film layers of any combination of conductive coatings 830, any one or more of which may be comprised of TCOs, thin metal films, thin metallic alloy films and/or any combination of any of these.

In some non-limiting examples, especially in the case of such thin conductive films, a relatively thin layer thickness may be up to substantially a few tens of nm so as to contribute to enhanced transmissive qualities but also favorable optical properties (including without limitation, reduced microcavity effects) for use in an OLED device 100.

In some non-limiting examples, a reduction in the thickness of an electrode 120, 140 to promote transmissive qualities may be accompanied by an increase in the sheet resistance of the electrode 120, 140.

In some non-limiting examples, a device 100 having at least one electrode 120, 140 with a high sheet resistance creates a large current-resistance (IR) drop when coupled to the power source 15, in operation. In some non-limiting examples, such an IR drop may be compensated for, to some extent, by increasing a level (VDD) of the power source 15. However, in some non-limiting examples, increasing the level of the power source 15 to compensate for the IR drop due to high sheet resistance, for at least one (sub-)pixel 340/264*x* may call for increasing the level of a voltage to be supplied to other components to maintain effective operation of the device 100.

In some non-limiting examples, to reduce power supply demands for a device 100 without significantly impacting an ability to make an electrode 120, 140 substantially transmissive (by employing at least one thin film layer of any combination of TCOs, thin metal films and/or thin metallic alloy films), an auxiliary electrode 1750 and/or busbar structure 4150 may be formed on the device 100 to allow current to be carried more effectively to various emissive region(s) of the device 100, while at the same time, reducing the sheet resistance and its associated IR drop of the transmissive electrode 120, 140.

In some non-limiting examples, a sheet resistance specification, for a common electrode 120, 140 of an AMOLED display device 100, may vary according to a number of parameters, including without limitation, a (panel) size of the device 100 and/or a tolerance for voltage variation across the device 100. In some non-limiting examples, the sheet resistance specification may increase (that is, a lower sheet resistance is specified) as the panel size increases. In some non-limiting examples, the sheet resistance specification may increase as the tolerance for voltage variation decreases.

In some non-limiting examples, a sheet resistance specification may be used to derive an example thickness of an auxiliary electrode 1750 and/or a busbar 4150 to comply with such specification for various panel sizes. In one non-limiting example, an aperture ratio of 0.64 was assumed for all display panel sizes and a thickness of the auxiliary electrode 1750 for various example panel sizes were calculated for example voltage tolerances of 0.1 V and 0.2 V in Table 1 below.

TABLE 1

Example Auxiliary Electrode Thickness for Various Panel Size and Voltage Tolerances

| Panel Size (in.) | | 9.7 | 12.9 | 15.4 | 27 | 65 |
|---|---|---|---|---|---|---|
| Specified Thickness (nm) | @0.1 V | 132 | 239 | 335 | 1200 | 6500 |
| | @0.2 V | 67 | 117 | 175 | 516 | 21000 |

By way of non-limiting example, for a top-emission device, the second electrode 140 may be made transmissive. On the other hand, in some non-limiting examples, such auxiliary electrode 1750 and/or busbar 4150 may not be substantially transmissive but may be electrically coupled to the second electrode 140, including without limitation, by deposition of a conductive coating 830 therebetween, to reduce an effective sheet resistance of the second electrode 140.

In some non-limiting examples, such auxiliary electrode 1750 may be positioned and/or shaped in either or both of a lateral aspect and/or cross-sectional aspect so as not to interfere with the emission of photons from the lateral aspect 410 of the emissive region 1910 of a (sub-)pixel 340/264*x*.

In some non-limiting examples, a mechanism to make the first electrode 120, and/or the second electrode 140, is to form such electrode 120, 140 in a pattern across at least a part of the lateral aspect 410 of the emissive region(s) 1910 thereof and/or in some non-limiting examples, across at least a part of the lateral aspect 420 of the non-emissive region(s) 1920 surrounding them. In some non-limiting examples, such mechanism may be employed to form the auxiliary electrode 1750 and/or busbar 4150 in a position and/or shape in either or both of a lateral aspect and/or cross-sectional aspect so as not to interfere with the emission of photons from the lateral aspect 410 of the emissive region 1910 of a (sub-)pixel 340/264*x*, as discussed above.

In some non-limiting examples, the device 100 may be configured such that it is substantially devoid of a conductive oxide material in an optical path of photons emitted by the device 100. By way of non-limiting example, in the lateral aspect 410 of at least one emissive region 1910 corresponding to a (sub-)pixel 340/264*x*, at least one of the layers and/or coatings deposited after the at least one semiconducting layer 130, including without limitation, the second electrode 140, the NIC 810 and/or any other layers and/or coatings deposited thereon, may be substantially devoid of any conductive oxide material. In some non-limiting examples, being substantially devoid of any conductive oxide material may reduce absorption and/or reflection of light emitted by the device 100. By way of non-limiting example, conductive oxide materials, including without limitation, ITO and/or IZO, may absorb light in at least the B(lue) region of the visible spectrum, which may, in generally, reduce efficiency and/or performance of the device 100.

In some non-limiting examples, a combination of these and/or other mechanisms may be employed.

Additionally, in some non-limiting examples, in addition to rendering one or more of the first electrode 120, the second electrode 140, the auxiliary electrode 1750 and/or the busbar 4150, substantially transmissive across at least across a substantial part of the lateral aspect 410 of the emissive region 1910 corresponding to the (sub-)pixel(s) 340/264*x* of the device 100, in order to allow photons to be emitted substantially across the lateral aspect 410 thereof, it may be desired to make at least one of the lateral aspect(s) 420 of the surrounding non-emissive region(s) 1920 of the device 100 substantially transmissive in both the bottom and top directions, so as to render the device 100 substantially transmissive relative to light incident on an external surface thereof, such that a substantial part such externally-incident light may be transmitted through the device 100, in addition to the emission (in a top-emission, bottom-emission and/or double-sided emission) of photons generated internally within the device 100 as disclosed herein.

Conductive Coating

In some non-limiting examples, a conductive coating material 831 (FIG. 9) used to deposit a conductive coating 830 onto an exposed layer surface 111 of underlying material may be a mixture.

In some non-limiting examples, at least one component of such mixture is not deposited on such surface, may not be deposited on such exposed layer surface 111 during deposition and/or may be deposited in a small amount relative to an amount of remaining component(s) of such mixture that are deposited on such exposed layer surface 111.

In some non-limiting examples, such at least one component of such mixture may have a property relative to the remaining component(s) to selectively deposit substantially only the remaining component(s). In some non-limiting examples, the property may be a vapor pressure.

In some non-limiting examples, such at least one component of such mixture may have a lower vapor pressure relative to the remaining components.

In some non-limiting examples, the conductive coating material 831 may be a copper (Cu)-magnesium (Cu—Mg) mixture, in which Cu has a lower vapor pressure than Mg.

In some non-limiting examples, the conductive coating material 831 used to deposit a conductive coating 830 onto an exposed layer surface 111 may be substantially pure.

In some non-limiting examples, the conductive coating material 831 used to deposit Mg is and in some non-limiting examples, comprises substantially pure Mg. In some non-limiting examples, substantially pure Mg may exhibit substantially similar properties relative to pure Mg. In some non-limiting examples, purity of Mg may be about 95% or higher, about 98% or higher, about 99% or higher, about 99.9% or higher and/or about 99.99% and higher.

In some non-limiting examples, a conductive coating material 831 used to deposit a conductive coating 830 onto an exposed layer surface 111 may comprise other metals in place of and/or in combination of Mg. In some non-limiting examples, a conductive coating material 831 comprising such other metals may include high vapor pressure materials, including without limitation, Yb, Cd, Zn and/or any combination of any of these.

In some non-limiting examples, a conductive coating 830 in an opto-electronic device according to various example includes Mg. In some non-limiting examples, the conductive coating 830 comprises substantially pure Mg. In some non-limiting examples, the conductive coating 830 includes other metals in place of and/or in combination with Mg. In some non-limiting examples, the conductive coating 830 includes an alloy of Mg with one or more other metals. In some non-limiting examples, the conductive coating 830 includes an alloy of Mg with Yb, Cd, Zn, and/or Ag. In some non-limiting examples, such alloy may be a binary alloy having a composition ranging from between about 5 vol. % Mg and about 95 vol. % Mg, with the remainder being the other metal. In some non-limiting examples, the conductive coating 830 includes a Mg:Ag alloy having a composition ranging from between about 1:10 to about 10:1 by volume.

Patterning

As a result of the foregoing, it may be desirable to selectively deposit, across the lateral aspect 410 of the emissive region 1910 of a (sub-)pixel **340/264*x* and/or the lateral aspect 420 of the non-emissive region(s) 1920 surrounding the emissive region 1910, a device feature, including without limitation, at least one of the first electrode 120, the second electrode 140, the auxiliary electrode 1750 and/or busbar 4150 and/or a conductive element electrically coupled thereto, in a pattern, on an exposed layer surface 111 of a frontplane 10 layer of the device 100. In some non-limiting examples, the first electrode 120, the second electrode 140, the auxiliary electrode 1750 and/or the busbar 4150 may be deposited in at least one of a plurality of conductive coatings 830**.

However, it may not be feasible to employ a shadow mask such as a fine metal mask (FMM) that may, in some non-limiting examples, be used to form relatively small features, with a feature size on the order of tens of microns or smaller to achieve such patterning of a conductive coating 830, since, in some non-limiting examples:

an FMM may be deformed during a deposition process, especially at high temperatures, such as may be employed for deposition of a thin conductive film;

limitations on the mechanical (including, without limitation, tensile) strength of the FMM and/or shadowing effects, especially in a high-temperature deposition process, may impart a constraint on an aspect ratio of features that may be achievable using such FMMs;

the type and number of patterns that may be achievable using such FMMs may be constrained since, by way of non-limiting example, each part of the FMM will be physically supported so that, in some non-limiting examples, some patterns may not be achievable in a single processing stage, including by way of non-limiting example, where a pattern specifies an isolated feature;

FMMs may exhibit a tendency to warp during a high-temperature deposition process, which may, in some non-limiting examples, distort the shape and position of apertures therein, which may cause the selective deposition pattern to be varied, with a degradation in performance and/or yield;

FMMs that may be used to produce repeating structures spread across the entire surface of a device 100, may call for a large number of apertures to be formed in the FMM, which may compromise the structural integrity of the FMM;

repeated use of FMMs in successive depositions, especially in a metal deposition process, may cause the deposited material to adhere thereto, which may obfuscate features of the FMM and which may cause the selective deposition pattern to be varied, with a degradation in performance and/or yield;

while FMMs may be periodically cleaned to remove adhered non-metallic material, such cleaning procedures may not be suitable for use with adhered metal, and even so, in some non-limiting examples, may be time-consuming and/or expensive; and irrespective of any such cleaning processes, continued use of such FMMs, especially in a high-temperature deposition process, may render them ineffective at producing a desired patterning, at which point they may be discarded and/or replaced, in a complex and expensive process.

Figure 5:
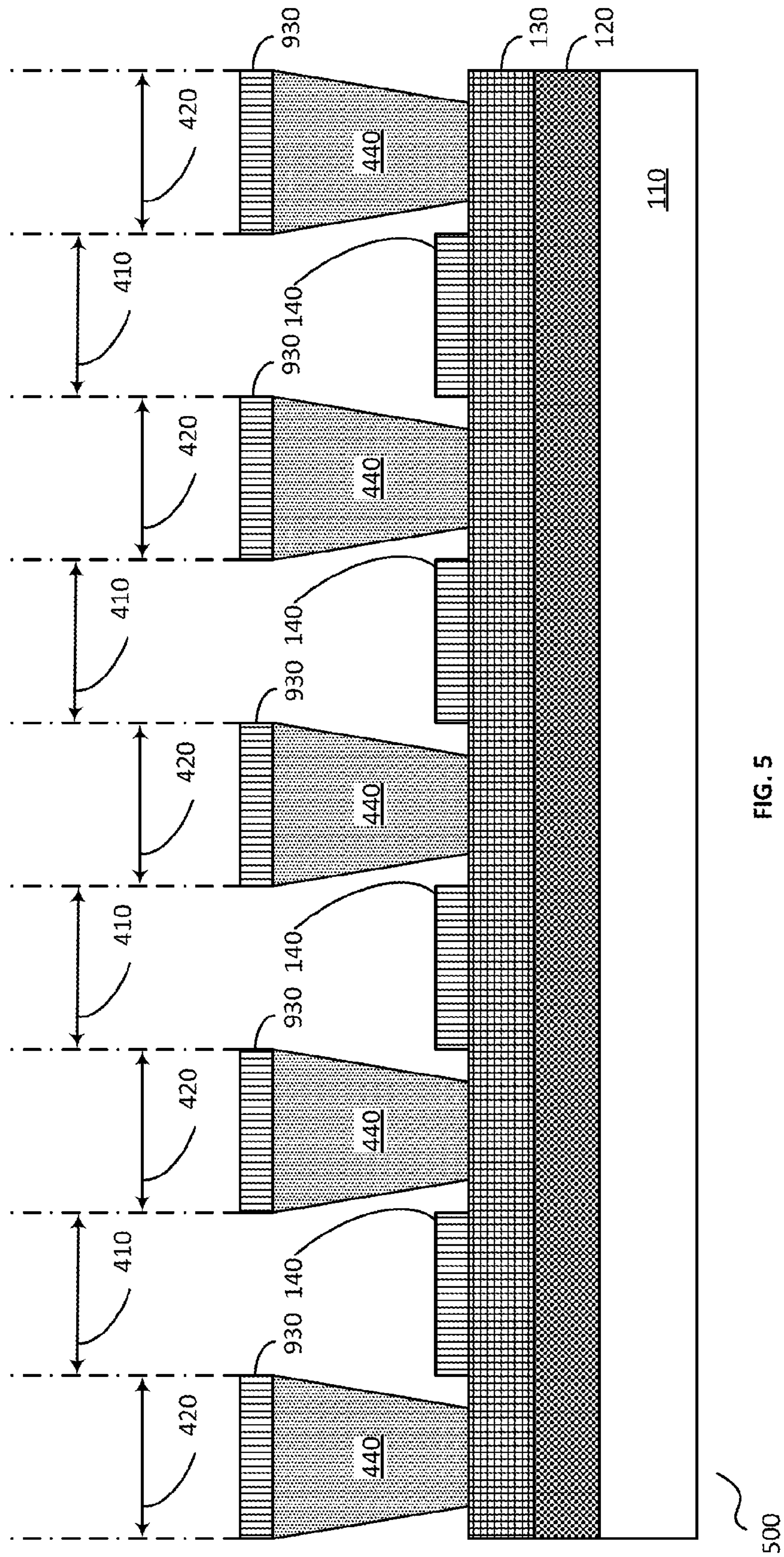
FIG. 5 is a cross-sectional view of an example version of the device of FIG. 1, showing at least one example pixel definition layer (PDL) supporting deposition of at least one second electrode of the device.

FIG. 5 shows an example cross-sectional view of a device 500 that is substantially similar to the device 100, but further comprises a plurality of raised PDLs 440 across the lateral aspect(s) 420 of non-emissive regions 1920 surrounding the lateral aspect(s) 410 of emissive region(s) 1910 corresponding to (sub-)pixel(s) **340/264*x***.

When the conductive coating 830 is deposited, in some non-limiting examples, using an open-mask and/or a mask-free deposition process, the conductive coating 830 is deposited across the lateral aspect(s) 410 of emissive region(s) 1910 corresponding to (sub-)pixel(s) **340/264*x* to form (in the FIGURE) the second electrode 140 thereon, and also across the lateral aspect(s) 420 of non-emissive regions 1920 surrounding them, to form regions of conductive coating 830 on top of the PDLs 440. To ensure that each (segment) of the second electrode 140 is not electrically coupled to any of the at least one conductive region(s) 830, a thickness of the PDL(s) 440 is greater than a thickness of the second electrode(s) 140. In some non-limiting examples, the PDL(s) 440 may be provided, as shown in the FIGURE, with an undercut profile to further decrease a likelihood that any (segment) of the second electrode(s) 140 will be electrically coupled to any of the at least one conductive region(s) 830**.

In some non-limiting examples, application of a barrier coating 1650 over the device 500 may result in poor adhesion of the barrier coating 1650 to the device 500, having regard to the highly non-uniform surface topography of the device 500.

In some non-limiting examples, it may be desirable to tune optical microcavity effects associated with sub-pixel(s) 264$x$ of different colours (and/or wavelengths) by varying a thickness of the at least one semiconducting layer 130 (and/or a layer thereof) across the lateral aspect 410 of emissive region(s) 1910 corresponding to sub-pixel(s) 264$x$ of one colour relative to the lateral aspect 410 of emissive region(s) 1910 corresponding to sub-pixel(s) 264$x$ of another colour. In some non-limiting examples, the use of FMMs to perform patterning may not provide a precision called for to provide such optical microcavity tuning effects in at least some cases and/or, in some non-limiting examples, in a production environment for OLED displays 100.

Nucleation-Inhibiting and/or Promoting Material Properties

In some non-limiting examples, a conductive coating 830, that may be employed as, or as at least one of a plurality of layers of thin conductive films to form a device feature, including without limitation, at least one of the first electrode 120, the first electrode 140, an auxiliary electrode 1750 and/or a busbar 4150 and/or a conductive element electrically coupled thereto, may exhibit a relatively low affinity towards being deposited on an exposed layer surface 111 of an underlying material, so that the deposition of the conductive coating 830 is inhibited.

The relative affinity or lack thereof of a material and/or a property thereof to having a conductive coating 830 deposited thereon may be referred to as being "nucleation-promoting" or "nucleation-inhibiting" respectively.

In the present disclosure, "nucleation-inhibiting" refers to a coating, material and/or a layer thereof that has a surface that exhibits a relatively low affinity for (deposition of) a conductive coating 830 thereon, such that the deposition of the conductive coating 830 on such surface is inhibited.

In the present disclosure, "nucleation-promoting" refers to a coating, material and/or a layer thereof that has a surface that exhibits a relatively high affinity for (deposition of) a conductive coating 830 thereon, such that the deposition of the conductive coating 830 on such surface is facilitated.

The term "nucleation" in these terms references the nucleation stage of a thin film formation process, in which monomers in a vapor phase condense onto the surface to form nuclei.

Without wishing to be bound by a particular theory, it is postulated that the shapes and sizes of such nuclei and the subsequent growth of such nuclei into islands and thereafter into a thin film may depend upon a number of factors, including without limitation, interfacial tensions between the vapor, the surface and/or the condensed film nuclei.

In the present disclosure, such affinity may be measured in a number of fashions.

One measure of a nucleation-inhibiting and/or nucleation-promoting property of a surface is the initial sticking probability $S_0$ of the surface for a given electrically conductive material, including without limitation, Mg. In the present disclosure, the terms "sticking probability" and "sticking coefficient" may be used interchangeably.

In some non-limiting examples, the sticking probability S may be given by:

$$S = \frac{N_{ads}}{N_{total}}$$

where $N_{ads}$ is a number of adsorbed monomers ("adatoms") that remain on an exposed layer surface 111 (that is, are incorporated into a film) and $N_{total}$ is a total number of impinging monomers on the surface. A sticking probability S equal to 1 indicates that all monomers that impinge on the surface are adsorbed and subsequently incorporated into a growing film. A sticking probability S equal to 0 indicates that all monomers that impinge on the surface are desorbed and subsequently no film is formed on the surface. A sticking probability S of metals on various surface can be evaluated using various techniques of measuring the sticking probability S, including without limitation, a dual quartz crystal microbalance (QCM) technique as described by Walker et al., *J. Phys. Chem. C* 2007, 111, 765 (2006).

As the density of islands increases (e.g., increasing average film thickness), a sticking probability S may change. By way of non-limiting example, a low initial sticking probability $S_0$ may increase with increasing average film thickness. This can be understood based on a difference in sticking probability S between an area of a surface with no islands, by way of non-limiting example, a bare substrate 110, and an area with a high density of islands. By way of non-limiting example, a monomer that impinges on a surface of an island may have a sticking probability S that approaches 1.

An initial sticking probability $S_0$ may therefore be specified as a sticking probability S of a surface prior to the formation of any significant number of critical nuclei. One measure of an initial sticking probability $S_0$ can involve a sticking probability S of a surface for a material during an initial stage of deposition of the material, where an average thickness of the deposited material across the surface is at or below a threshold value. In the description of some non-limiting examples a threshold value for an initial sticking probability $S_0$ can be specified as, by way of non-limiting example, 1 nm. An average sticking probability $\overline{S}$ may then be given by:

$$\overline{S} = S_0(1 - A_{nuc}) + S_{nuc}(A_{nuc})$$

where $S_{nuc}$ is a sticking probability S of an area covered by islands, and $A_{nuc}$ is a percentage of an area of a substrate surface covered by islands.

Figure 6:
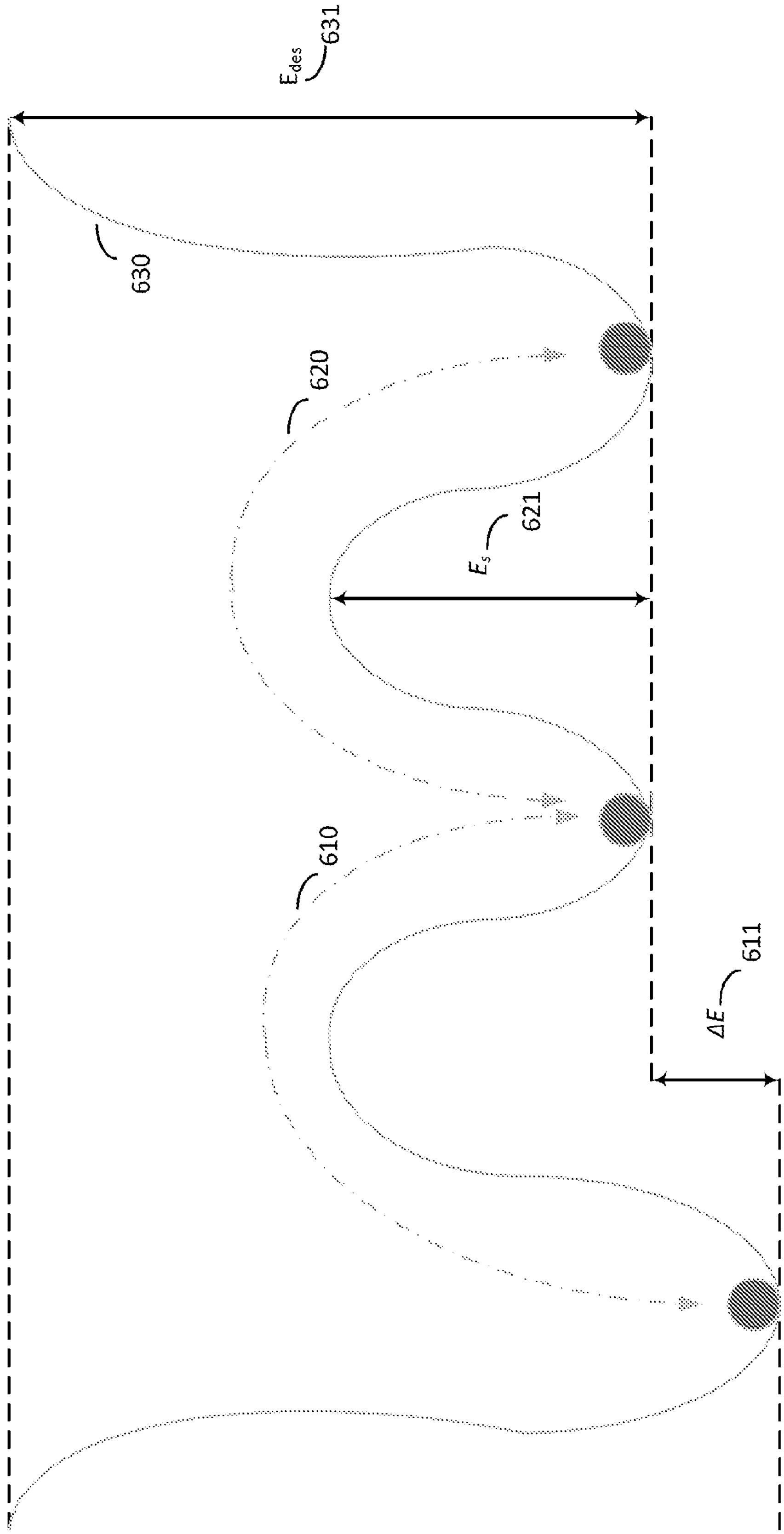
FIG. 6 is an example energy profile illustrating relative energy states of an adatom absorbed onto a surface according to an example in the present disclosure.

An example of an energy profile of an adatom adsorbed onto an exposed layer surface 111 of an underlying material (in the FIGURE, the substrate 110) is illustrated in FIG. 6. Specifically, FIG. 6 illustrates example qualitative energy profiles corresponding to: an adatom escaping from a local low energy site (610); diffusion of the adatom on the exposed layer surface 111 (620); and desorption of the adatom (630).

In 610, the local low energy site may be any site on the exposed layer surface 111 of an underlying material, onto which an adatom will be at a lower energy. Typically, the nucleation site may comprise a defect and/or an anomaly on the exposed layer surface 111, including without limitation, a step edge, a chemical impurity, a bonding site and/or a kink. Once the adatom is trapped at the local low energy site, there may in some non-limiting examples, typically be an energy barrier before surface diffusion takes place. Such energy barrier is represented as ΔE 611 in FIG. 6. In some non-limiting examples, if the energy barrier ΔE 611 to escape the local low energy site is sufficiently large, the site may act as a nucleation site.

In 620, the adatom may diffuse on the exposed layer surface 111. By way of non-limiting example, in the case of localized absorbates, adatoms tend to oscillate near a minimum of the surface potential and migrate to various neighboring sites until the adatom is either desorbed, and/or is incorporated into a growing film and/or growing islands formed by a cluster of adatoms. In FIG. 6, the activation energy associated with surface diffusion of adatoms is represented as $E_s$ 621.

In 630, the activation energy associated with desorption of the adatom from the surface is represented as $E_{des}$ 631. Those having ordinary skill in the relevant art will appreciate that any adatoms that are not desorbed may remain on the exposed layer surface 111. By way of non-limiting example, such adatoms may diffuse on the exposed layer surface 111, be incorporated as part of a growing film and/or coating, and/or become part of a cluster of adatoms that form islands on the exposed layer surface 111.

Based on the energy profiles 610, 620, 630 shown in FIG. 6, it may be postulated that NIC 810 materials exhibiting relatively low activation energy for desorption ($E_{des}$ 631) and/or relatively high activation energy for surface diffusion ($E_s$ 631) may be particularly advantageous for use in various applications.

One measure of a nucleation-inhibiting and/or nucleation-promoting property of a surface is an initial deposition rate of a given electrically conductive material, including without limitation, Mg, on the surface, relative to an initial deposition rate of the same conductive material on a reference surface, where both surfaces are subjected to and/or exposed to an evaporation flux of the conductive material.

Selective Coatings for Impacting Nucleation-Inhibiting and/or Promoting Material Properties In some non-limiting examples, one or more selective coatings 710 (FIG. 7) may be selectively deposited on at least a first portion 701 (FIG. 7) of an exposed layer surface 111 of an underlying material to be presented for deposition of a thin film conductive coating 830 thereon. Such selective coating(s) 710 have a nucleation-inhibiting property (and/or conversely a nucleation-promoting property) with respect to the conductive coating 830 that differs from that of the exposed layer surface 111 of the underlying material. In some non-limiting examples, there may be a second portion 702 (FIG. 7) of the exposed layer surface 111 of an underlying material to which no such selective coating(s) 710, has been deposited.

Such a selective coating 710 may be an NIC 810 and/or a nucleation promoting coating (NPC 1120 (FIG. 11)).

It will be appreciated by those having ordinary skill in the relevant art that the use of such a selective coating 710 may, in some non-limiting examples, facilitate and/or permit the selective deposition of the conductive coating 830 without employing an FMM during the stage of depositing the conductive coating 830.

In some non-limiting examples, such selective deposition of the conductive coating 830 may be in a pattern. In some non-limiting examples, such pattern may facilitate providing and/or increasing transmissivity of at least one of the top and/or bottom of the device 100, within the lateral aspect 410 of one or more emissive region(s) 1910 of a (sub-)pixel 340/264*x* and/or within the lateral aspect 420 of one or more non-emissive region(s) 1920 that may, in some non-limiting examples, surround such emissive region(s) 1910.

In some non-limiting examples, the conductive coating 830 may be deposited on a conductive structure and/or in some non-limiting examples, form a layer thereof, for the device 100, which in some non-limiting examples may be the first electrode 120 and/or the second electrode 140 to act as one of an anode 341 and/or a cathode 342, and/or an auxiliary electrode 1750 and/or busbar 4150 to support conductivity thereof and/or in some non-limiting examples, be electrically coupled thereto.

In some non-limiting examples, an NIC 810 for a given conductive coating 830, including without limitation Mg, may refer to a coating having a surface that exhibits a relatively low initial sticking probability $S_0$ for the conductive coating 830 (in the example Mg) in vapor form, such that deposition of the conductive coating 830 (in the example Mg) onto the exposed layer surface 111 is inhibited. Thus, in some non-limiting examples, selective deposition of an NIC 810 may reduce an initial sticking probability $S_0$ of an exposed layer surface 111 (of the NIC 810) presented for deposition of the conductive coating 830 thereon.

In some non-limiting examples, an NPC 1120, for a given conductive coating 830, including without limitation Mg, may refer to a coating having an exposed layer surface 111 that exhibits a relatively high initial sticking probability $S_0$ for the conductive coating 830 in vapor form, such that deposition of the conductive coating 830 onto the exposed layer surface 111 is facilitated. Thus, in some non-limiting examples, selective deposition of an NPC 1120 may increase an initial sticking probability $S_0$ of an exposed layer surface 111 (of the NPC 1120) presented for deposition of the conductive coating 830 thereon.

When the selective coating 710 is an NIC 810, the first portion 701 of the exposed layer surface 111 of the underlying material, upon which the NIC 810 is deposited, will thereafter present a treated surface (of the NIC 810) whose nucleation-inhibiting property has been increased or alternatively, whose nucleation-promoting property has been reduced (in either case, the surface of the NIC 810 deposited on the first portion 701), such that it has a reduced affinity for deposition of the conductive coating 830 thereon relative to that of the exposed layer surface 111 of the underlying material upon which the NIC 810 has been deposited. By contrast the second portion 702, upon which no such NIC 810 has been deposited, will continue to present an exposed layer surface 111 (of the underlying substrate 110) whose nucleation-inhibiting property or alternatively, whose nucleation-promoting property (in either case, the exposed layer surface 111 of the underlying substrate 110 that is substantially devoid of the selective coating 710), has an affinity for deposition of the conductive coating 830 thereon that has not been substantially altered.

When the selective coating 710 is an NPC 1120, the first portion 701 of the exposed layer surface 111 of the underlying material, upon which the NPC 1120 is deposited, will thereafter present a treated surface (of the NPC 1120) whose nucleation-inhibiting property has been reduced or alternatively, whose nucleation-promoting property has been increased (in either case, the surface of the NPC 1120 deposited on the first portion 701), such that it has an increased affinity for deposition of the conductive coating 830 thereon relative to that of the exposed layer surface 111 of the underlying material upon which the NPC 1120 has been deposited. By contrast, the second portion 702, upon which no such NPC 1120 has been deposited, will continue to present an exposed layer surface 111 (of the underlying substrate 110) whose nucleation-inhibiting property or alternatively, whose nucleation-promoting property (in either case, the exposed layer surface 111 of the underlying substrate 110 that is substantially devoid of the NPC 1120), has an affinity for deposition of the conductive coating 830 thereon that has not been substantially altered.

In some non-limiting examples, both an NIC 810 and an NPC 1120 may be selectively deposited on respective first portions 701 and NPC portions 1103 (FIG. 11A) of an exposed layer surface 111 of an underlying material to respectively alter a nucleation-inhibiting property (and/or conversely a nucleation-promoting property) of the exposed layer surface 111 to be presented for deposition of a conductive coating 830 thereon. In some non-limiting examples, there may be a second portion 702 of the exposed layer surface 111 of an underlying material to which no selective coating 710 has been deposited, such that the nucleation-inhibiting property (and/or conversely its nucleation-promoting property) to be presented for deposition of the conductive coating 830 thereon is not substantially altered.

In some non-limiting examples, the first portion 701 and NPC portion 1103 may overlap, such that a first coating of an NIC 810 and/or an NPC 1120 may be selectively deposited on the exposed layer surface 111 of the underlying material in such overlapping region and the second coating of the NIC 810 and/or the NPC 1120 may be selectively deposited on the treated exposed layer surface 111 of the first coating. In some non-limiting examples, the first coating is an NIC 810. In some non-limiting examples, the first coating is an NPC 1120.

In some non-limiting examples, the first portion 701 (and/or NPC portion 1103) to which the selective coating 710 has been deposited, may comprise a removal region, in which the deposited selective coating 710 has been removed, to present the uncovered surface of the underlying material for deposition of the conductive coating 830 thereon, such that the nucleation-inhibiting property (and/or conversely its nucleation-promoting property) to be presented for deposition of the conductive coating 830 thereon is not substantially altered.

In some non-limiting examples, the underlying material may be at least one layer selected from the substrate 110 and/or at least one of the frontplane 10 layers, including without limitation, the first electrode 120, the second electrode 140, the at least one semiconducting layer 130 (and/or at least one of the layers thereof) and/or any combination of any of these.

In some non-limiting examples, the conductive coating 830 may have specific material properties. In some non-limiting examples, the conductive coating 830 may comprise Mg, whether alone or in a compound and/or alloy.

By way of non-limiting example, pure and/or substantially pure Mg may not be readily deposited onto some organic surfaces due to a low sticking probability S of Mg on some organic surfaces.

Deposition of Selective Coatings

In some non-limiting examples, a thin film comprising the selective coating 710, may be selectively deposited and/or processed using a variety of techniques, including without limitation, evaporation (including without limitation), thermal evaporation and/or electron beam evaporation), photolithography, printing (including without limitation, ink jet and/or vapor jet printing, reel-to-reel printing and/or microcontact transfer printing), PVD (including without limitation, sputtering), CVD (including without limitation, PECVD and/or OVPD), laser annealing, LITI patterning, ALD, coating (including without limitation, spin coating, dip coating, line coating and/or spray coating), and/or combinations of any two or more thereof.

Figure 7:
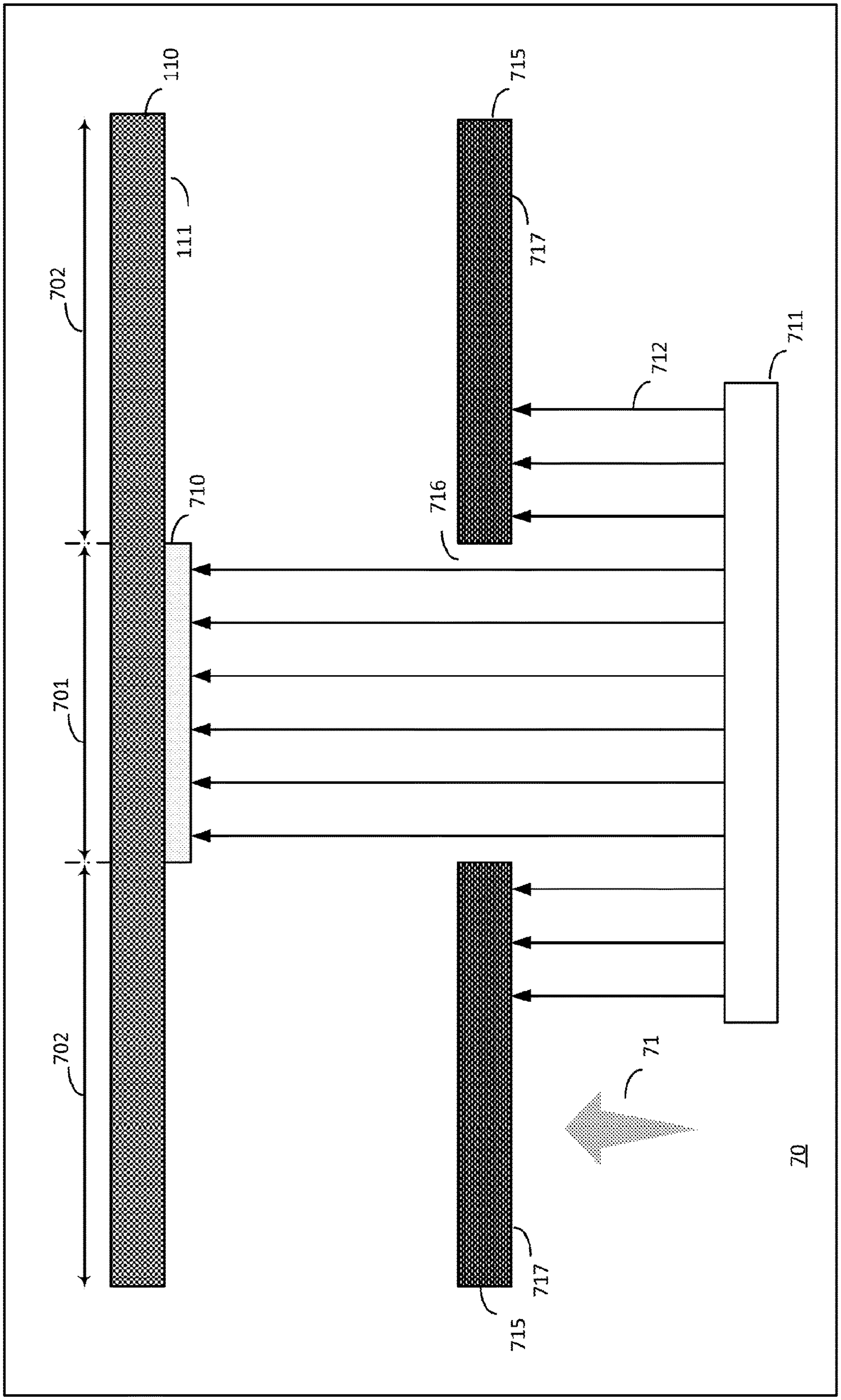
FIG. 7 is a schematic diagram showing an example process for depositing a selective coating in a pattern on an exposed layer surface of an underlying material in an example version of the device of FIG. 1, according to an example in the present disclosure.

FIG. 7 is an example schematic diagram illustrating a non-limiting example of an evaporative process, shown generally at 700, in a chamber 70, for selectively depositing a selective coating 710 onto a first portion 701 of an exposed layer surface 111 of an underlying material (in the FIGURE, for purposes of simplicity of illustration only, the substrate 110).

In the process 700, a quantity of a selective coating material 711, is heated under vacuum, to evaporate and/or sublime 712 the selective coating material 711. In some non-limiting examples, the selective coating material 711 comprises entirely, and/or substantially, a material used to form the selective coating 710. Evaporated selective coating material 712 is directed through the chamber 70, including in a direction indicated by arrow 71, toward the exposed layer surface 111. When the evaporated selective coating material 712 is incident on the exposed layer surface 111, that is, in the first portion 701, the selective coating 710 is formed thereon.

In some non-limiting examples, as shown in the FIGURE for the process 700, the selective coating 710 may be selectively deposited only onto a portion, in the example illustrated, the first portion 701, of the exposed layer surface 111, by the interposition, between the selective coating material 711 and the exposed layer surface 111, of a shadow mask 715, which in some non-limiting examples, may be an FMM. The shadow mask 715 has at least one aperture 716 extending therethrough such that a part of the evaporated selective coating material 712 passes through the aperture 716 and is incident on the exposed layer surface 111 to form the selective coating 710. Where the evaporated selective coating material 712 does not pass through the aperture 716 but is incident on the surface 717 of the shadow mask 715, it is precluded from being disposed on the exposed layer surface 111 to form the selective coating 710 within the second portion 703. The second portion 702 of the exposed layer surface 111 is thus substantially devoid of the selective coating 710. In some non-limiting examples (not shown), the selective coating material 711 that is incident on the shadow mask 715 may be deposited on the surface 717 thereof.

Accordingly, a patterned surface is produced upon completion of the deposition of the selective coating 710.

In some non-limiting examples, for purposes of simplicity of illustration, the selective coating 710 employed in FIG. 7 may be an NIC 810. In some non-limiting examples, for purposes of simplicity of illustration, the selective coating 710 employed in FIG. 7 may be an NPC 1120.

FIG. 8 is an example schematic diagram illustrating a non-limiting example of a result of an evaporative process, shown generally at 800, in a chamber 70, for selectively depositing a conductive coating 830 onto a second portion 702 of an exposed layer surface 111 of an underlying material (in the FIGURE, for purposes of simplicity of illustration only, the substrate 110) that is substantially devoid of the NIC 810 that was selectively deposited onto a first portion 701, including without limitation, by the evaporative process 700 of FIG. 7. In some non-limiting examples, the second portion 702 comprises that part of the exposed layer surface 111 that lies beyond the first portion 701.

Once the NIC 810 has been deposited on a first portion 701 of an exposed layer surface 111 of an underlying material (in the FIGURE, the substrate 110), the conductive coating 830 may be deposited on the second portion 702 of the exposed layer surface 111 that is substantially devoid of the NIC 810.

In the process 800, a quantity of a conductive coating material 831, is heated under vacuum, to evaporate and/or sublime 832 the conductive coating material 831. In some non-limiting examples, the conductive coating material 831 comprises entirely, and/or substantially, a material used to form the conductive coating 830. Evaporated conductive coating material 832 is directed inside the chamber 70, including in a direction indicated by arrow 81, toward the exposed layer surface 111 of the first portion 701 and of the second portion 702. When the evaporated conductive coating material 832 is incident on the second portion 702 of the exposed layer surface 111, the conductive coating 830 is formed thereon.

In some non-limiting examples, deposition of the conductive coating material 831 may be performed using an open mask and/or mask-free deposition process, such that the conductive coating 830 is formed substantially across the entire exposed layer surface 111 of the underlying material (in the FIGURE, the substrate 110) to produce a treated surface (of the conductive coating 830).

It will be appreciated by those having ordinary skill in the relevant art that, contrary to that of an FMM, the feature size of an open mask is generally comparable to the size of a device 100 being manufactured. In some non-limiting examples, such an open mask may have an aperture that may generally correspond to a size of the device 100, which in some non-limiting examples, may correspond, without limitation, to about 1 inch for micro-displays, about 4-6 inches for mobile displays, and/or about 8-17 inches for laptop and/or tablet displays, so as to mask edges of such device 100 during manufacturing. In some non-limiting examples, the feature size of an open mask may be on the order of about 1 cm and/or greater. In some non-limiting examples, an aperture formed in an open mask may in some non-limiting examples be sized to encompass the lateral aspect(s) 410 of a plurality of emissive regions 1910 each corresponding to a (sub-) pixel 340/264*x* and/or surrounding and/or the lateral aspect(s) 420 of surrounding and/or intervening non-emissive region(s) 1920.

It will be appreciated by those having ordinary skill in the relevant art that, in some non-limiting examples, the use of an open mask may be omitted, if desired. In some non-limiting examples, an open mask deposition process described herein may alternatively be conducted without the use of an open mask, such that an entire target exposed layer surface 111 may be exposed.

In some non-limiting examples, as shown in the FIGURE for the process 800, deposition of the conductive coating 830 may be performed using an open mask and/or mask-free deposition process, such that the conductive coating 830 is formed substantially across the entire exposed layer surface 111 of the underlying material (in the FIGURE, of the substrate 110) to produce a treated surface (of the conductive coating 830).

Indeed, as shown in FIG. 8, the evaporated conductive coating material 832 is incident both on an exposed layer surface 111 of NIC 810 across the first portion 701 as well as the exposed layer surface 111 of the substrate 110 across the second portion 702 that is substantially devoid of NIC 810.

Since the exposed layer surface 111 of the NIC 810 in the first portion 701 exhibits a relatively low initial sticking probability $S_0$ for the conductive coating 830 compared to the exposed layer surface 111 of the substrate 110 in the second portion 702, the conductive coating 830 is selectively deposited substantially only on the exposed layer surface 111 of the substrate 110 in the second portion 702 that is substantially devoid of the NIC 810. By contrast, the evaporated conductive coating material 832 incident on the exposed layer surface 111 of NIC 810 across the first portion 701 tends not to be deposited, as shown (833) and the exposed layer surface 111 of NIC 810 across the first portion 701 is substantially devoid of the conductive coating 830.

In some non-limiting examples, an initial deposition rate of the evaporated conductive coating material 832 on the exposed layer surface 111 of the substrate 110 in the second portion 702 may be at least and/or greater than about 200 times, at least and/or greater than about 550 times, at least and/or greater than about 900 times, at least and/or greater than about 1,000 times, at least and/or greater than about 1,500 times, at least and/or greater than about 1,900 times and/or at least and/or greater than about 2,000 times an initial deposition rate of the evaporated conductive coating material 832 on the exposed layer surface 111 of the NIC 810 in the first portion 701.

The foregoing may be combined in order to effect the selective deposition of at least one conductive coating 830 to form a device feature, including without limitation, a patterned electrode 120, 140, 1750, 4150 and/or a conductive element electrically coupled thereto, without employing an FMM within the conductive coating 830 deposition process. In some non-limiting examples, such patterning may permit and/or enhance the transmissivity of the device 100.

In some non-limiting examples, the selective coating 710, which may be an NIC 810 and/or an NPC 1120 may be applied a plurality of times during the manufacturing process of the device 100, in order to pattern a plurality of electrodes 120, 140, 1750, 4150 and/or various layers thereof and/or a device feature comprising a conductive coating 830 electrically coupled thereto.

FIGS. 9A-9D illustrate non-limiting examples of open masks.

Figure 9A:
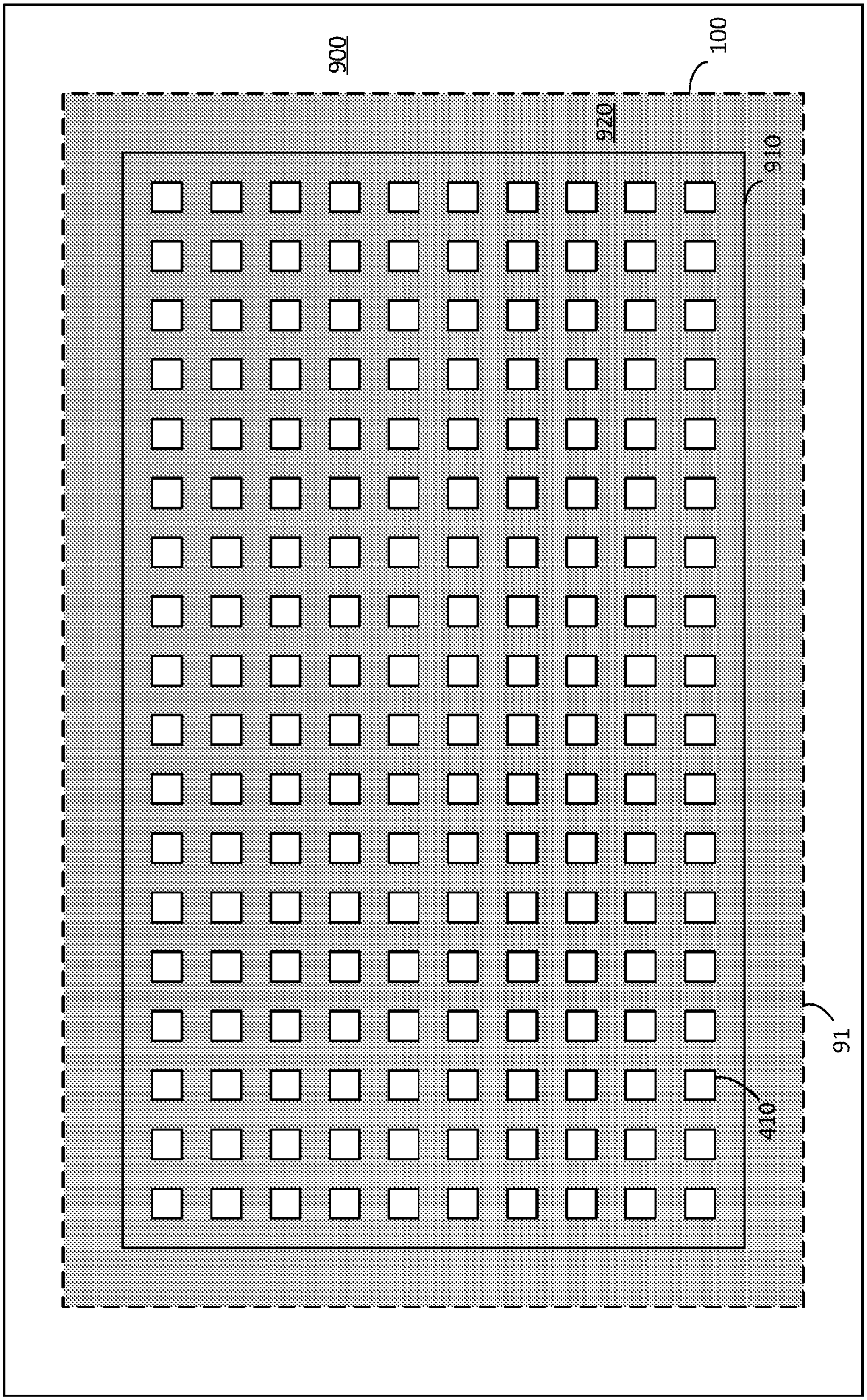
FIGS. 9A-D are a schematic diagrams showing example open masks, suitable for use with the process of FIG. 7, having an aperture therewithin according to an example in the present disclosure.

FIG. 9A illustrates a non-limiting example of an open mask 900 having and/or defining an aperture 910 formed therein. In some non-limiting examples, such as shown, the aperture 910 of the open mask 900 is smaller than a size of a device 100, such that when the mask 900 is overlaid on the device 100, the mask 900 covers edges of the device 100. In some non-limiting examples, as shown, the lateral aspect(s) 410 of the emissive regions 1910 corresponding to all and/or substantially all of the (sub-)pixel(s) 340/264*x* of the device 100 are exposed through the aperture 910, while an unexposed region 920 is formed between outer edges 91 of the device 100 and the aperture 910. It will be appreciated by those having ordinary skill in the relevant art that, in some non-limiting examples, electrical contacts and/or other components (not shown) of the device 100 may be located in such unexposed region 920, such that these components remain substantially unaffected throughout an open mask deposition process.

Figure 9B:
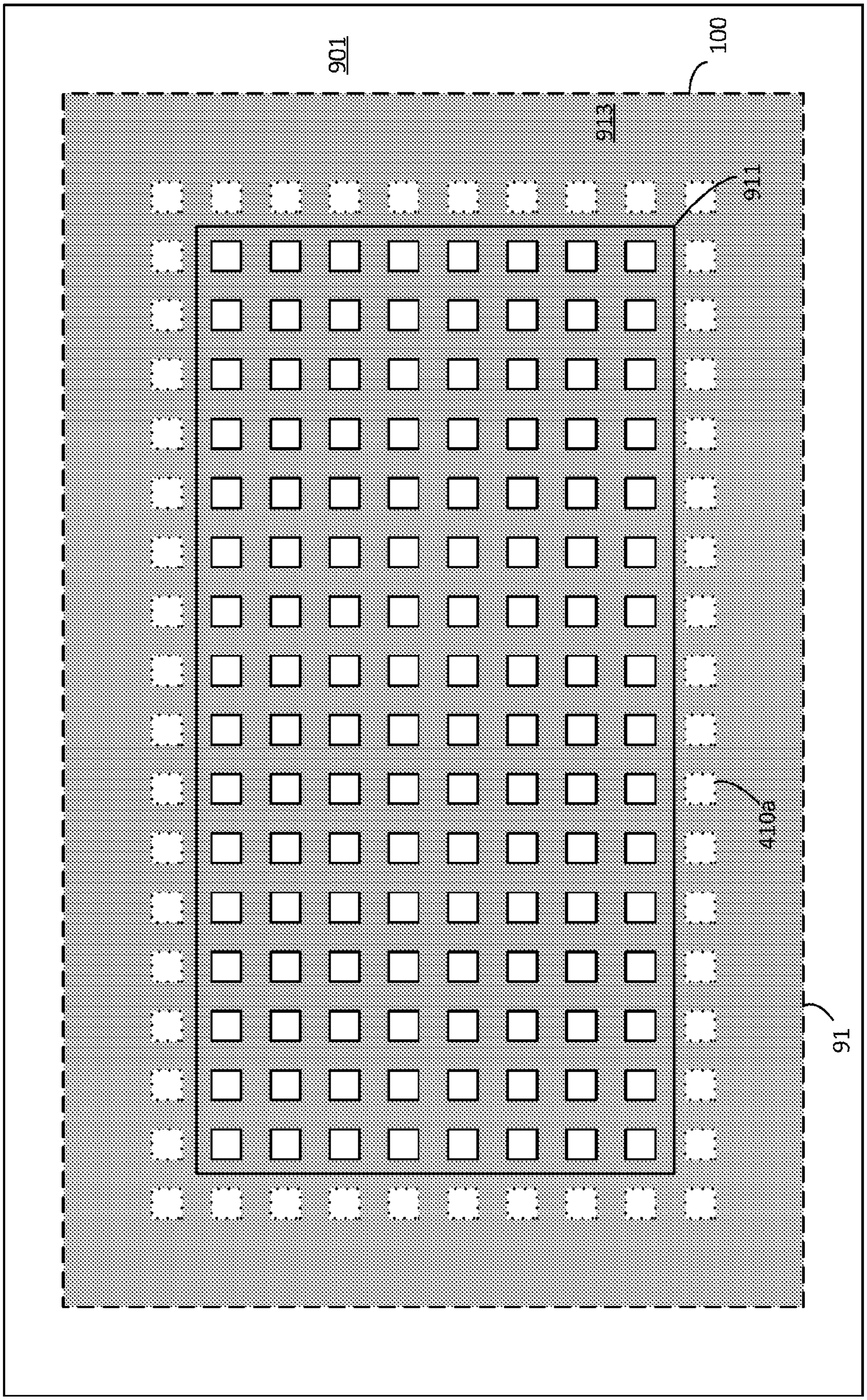

FIG. 9B illustrates a non-limiting example of an open mask 901 having and/or defining an aperture 911 formed therein that is smaller than the aperture 910 of FIG. 9A, such that when the mask 901 is overlaid on the device 100, the mask 901 covers at least the lateral aspect(s) 410*a* of the emissive region(s) 1910 corresponding to at least some (sub-)pixel(s) 340/264*x*. As shown, in some non-limiting examples, the lateral aspect(s) 410*a* of the emissive region(s) 1910 corresponding to outermost (sub-)pixel(s) 340/264*x* are located within an unexposed region 913 of the device 100, formed between the outer edges 91 of the device 100 and the aperture 911, are masked during an open mask deposition process to inhibit evaporated conductive coating material 832 from being incident on the unexposed region 913.

Figure 9C:
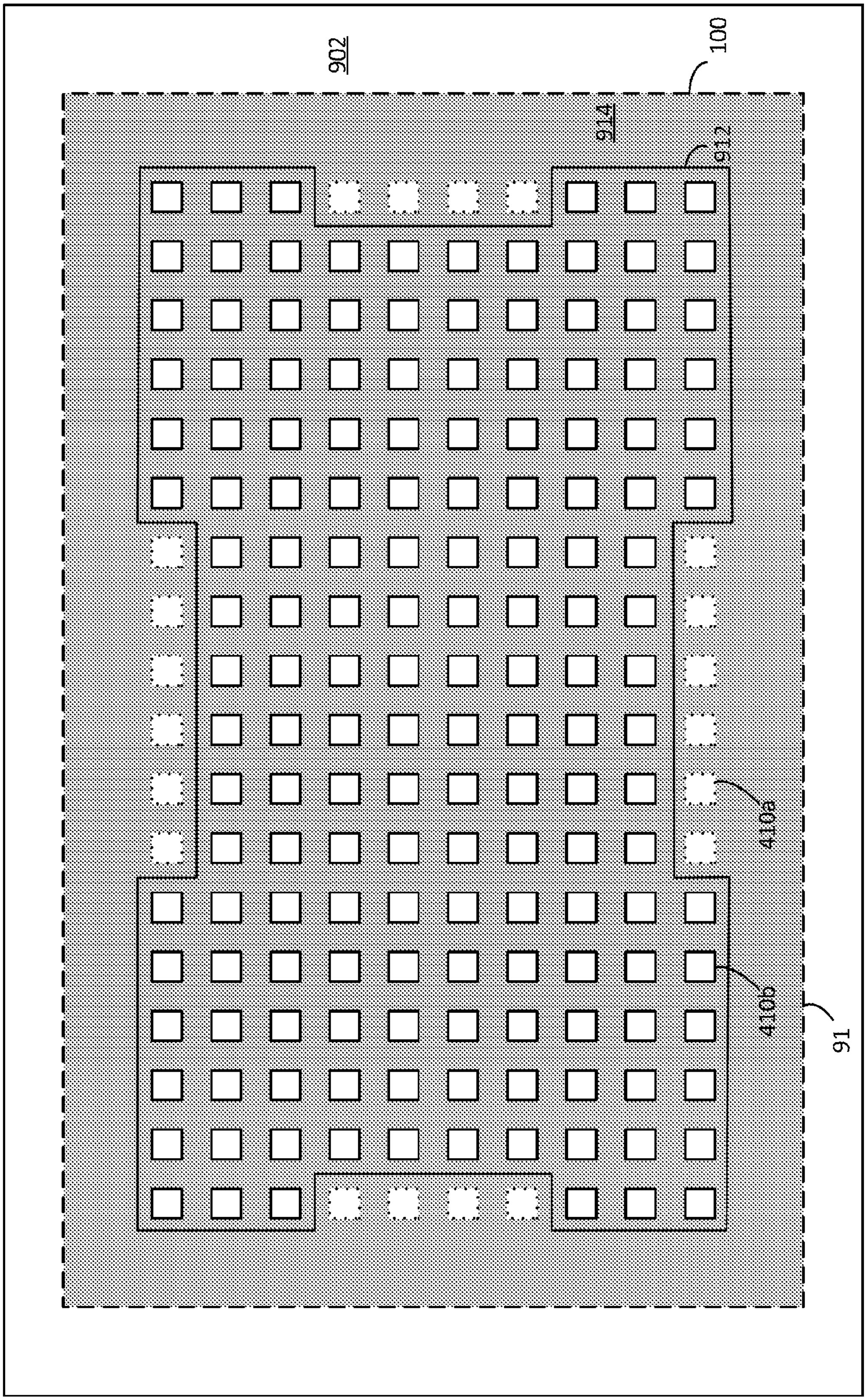

FIG. 9C illustrates a non-limiting example of an open mask 902 having and/or defining an aperture 912 formed therein defines a pattern that covers the lateral aspect(s) 410*a* of the emissive region(s) 1910 corresponding to at least some (sub-)pixel(s) 340/264*x*, while exposing the lateral aspect(s) 410*b* of the emissive region(s) 1910 corresponding to at least some (sub-)pixel(s) 340/264*x*. As shown, in some non-limiting examples, the lateral aspect(s) 410*a* of the emissive region(s) 1910 corresponding to at least some (sub-)pixel(s) 340/264*x* located within an unexposed region 914 of the device 100, are masked during an open mask deposition process to inhibit evaporated conductive coating material 830 from being incident on the unexposed region 914.

While in FIGS. 9B-9C, the lateral aspects 410*a* of the emissive region(s) 1910 corresponding to at least some of the outermost (sub-)pixel(s) 340/264*x* have been masked, as illustrated, those having ordinary skill in the relevant art will appreciate that, in some non-limiting examples, an aperture of an open mask 900-902 may be shaped to mask the lateral aspects 410 of other emissive region(s) 1910 and/or the lateral aspects 420 of non-emissive region(s) 1920 of the device 100.

Furthermore, while FIGS. 9A-9C show open masks 900-902 having a single aperture 910-912, those having ordinary skill in the relevant art will appreciate that such open masks 900-902 may, in some non-limiting examples (not shown), additional apertures (not shown) for exposing multiple regions of an exposed layer surface 111 of an underlying material of a device 100.

Figure 9D:
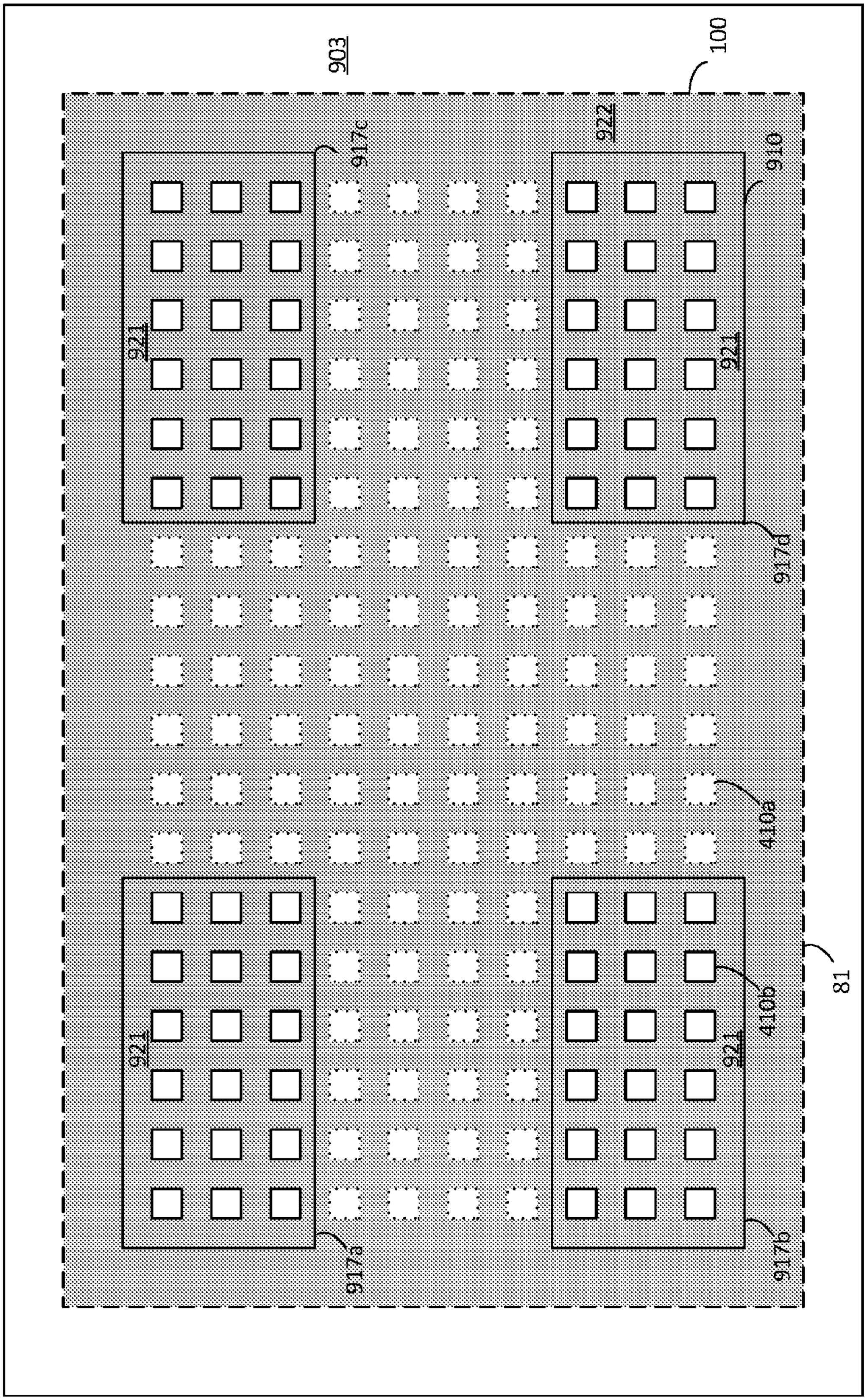

FIG. 9D illustrates a non-limiting example of an open mask 903 having and/or defining a plurality of apertures 917*a*-917*d*. The apertures 917*a*-917*d* are, in some non-limiting examples, positioned such that they may selectively expose certain regions 921 of the device 100, while masking other regions 922. In some non-limiting examples, the lateral aspects 410*b* of certain emissive region(s) 1910 corresponding to at least some (sub-)pixel(s) 340/264*x* are exposed through the apertures 917*a*-917*d* in the regions 921, while the lateral aspects 410*a* of other emissive region(s) 1910 corresponding to at least one some (sub-)pixel(s) 340/264*x* lie within regions 922 and are thus masked.

Figure 10:
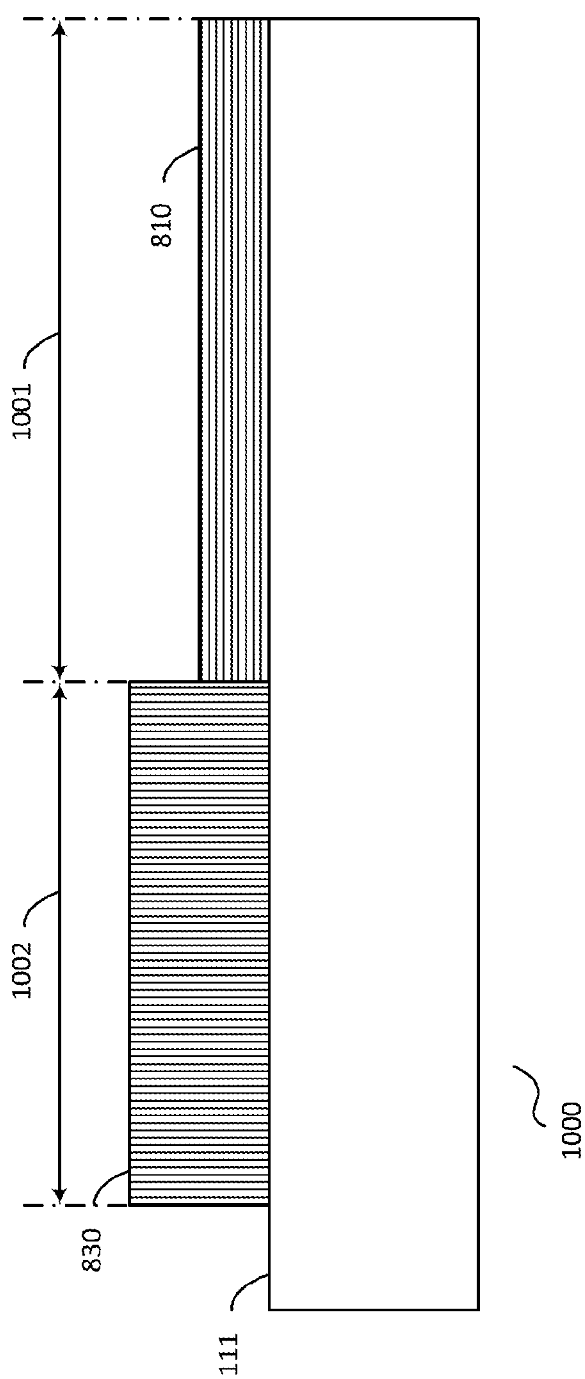
FIG. 10 is an example version of the device of FIG. 1, with additional example deposition steps according to an example in the present disclosure.

Turning now to FIG. 10, there is shown an example version 1000 of the device 100 shown in FIG. 1, but with a number of additional deposition steps that are described herein.

The device 1000 shows a lateral aspect of the exposed layer surface 111 of the underlying material. The lateral aspect comprises a first portion 1001 and a second portion 1002. In the first portion 1001, an NIC 810 is disposed on the exposed layer surface 111. However, in the second portion 1002, the exposed layer surface 111 is substantially devoid of the NIC 810.

After selective deposition of the NIC 810 across the first portion 1001, the conductive coating 830 is deposited over the device 1000, in some non-limiting examples, using an open mask and/or a mask-free deposition process, but remains substantially only within the second portion 1002, which is substantially devoid of NIC 810.

The NIC 810 provides, within the first portion 1001, a surface with a relatively low initial sticking probability $S_0$, for the conductive coating 830, and that is substantially less than the initial sticking probability $S_0$, for the conductive coating 830, of the exposed layer surface 111 of the underlying material of the device 1000 within the second portion 1002.

Thus, the first portion 1001 is substantially devoid of the conductive coating 830.

In this fashion, the NIC 810 may be selectively deposited, including using a shadow mask, to allow the conductive coating 830 to be deposited, including without limitation, using an open mask and/or a mask-free deposition process, so as to form a device feature, including without limitation, at least one of the first electrode 120, the second electrode 140, the auxiliary electrode 1750, a busbar 4150 and/or at least one layer thereof, and/or a conductive element electrically coupled thereto.

Figure 11A:
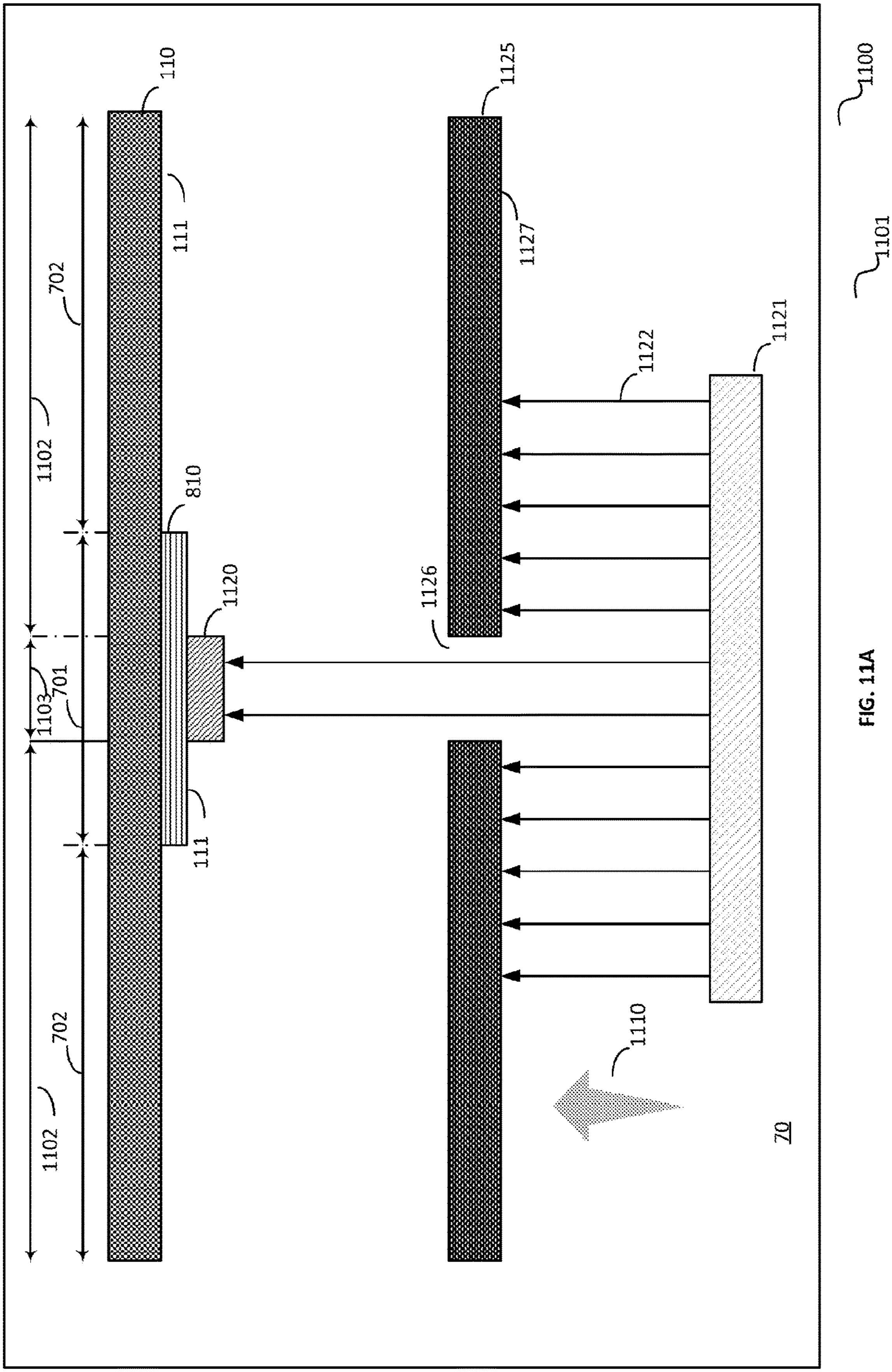
FIG. 11A is a schematic diagram showing an example process for depositing a selective coating that is a nucleation-promoting coating (NPC) in a pattern on an exposed layer surface that comprises the deposited pattern of the selective coating of FIG. 9.
Figure 11B:
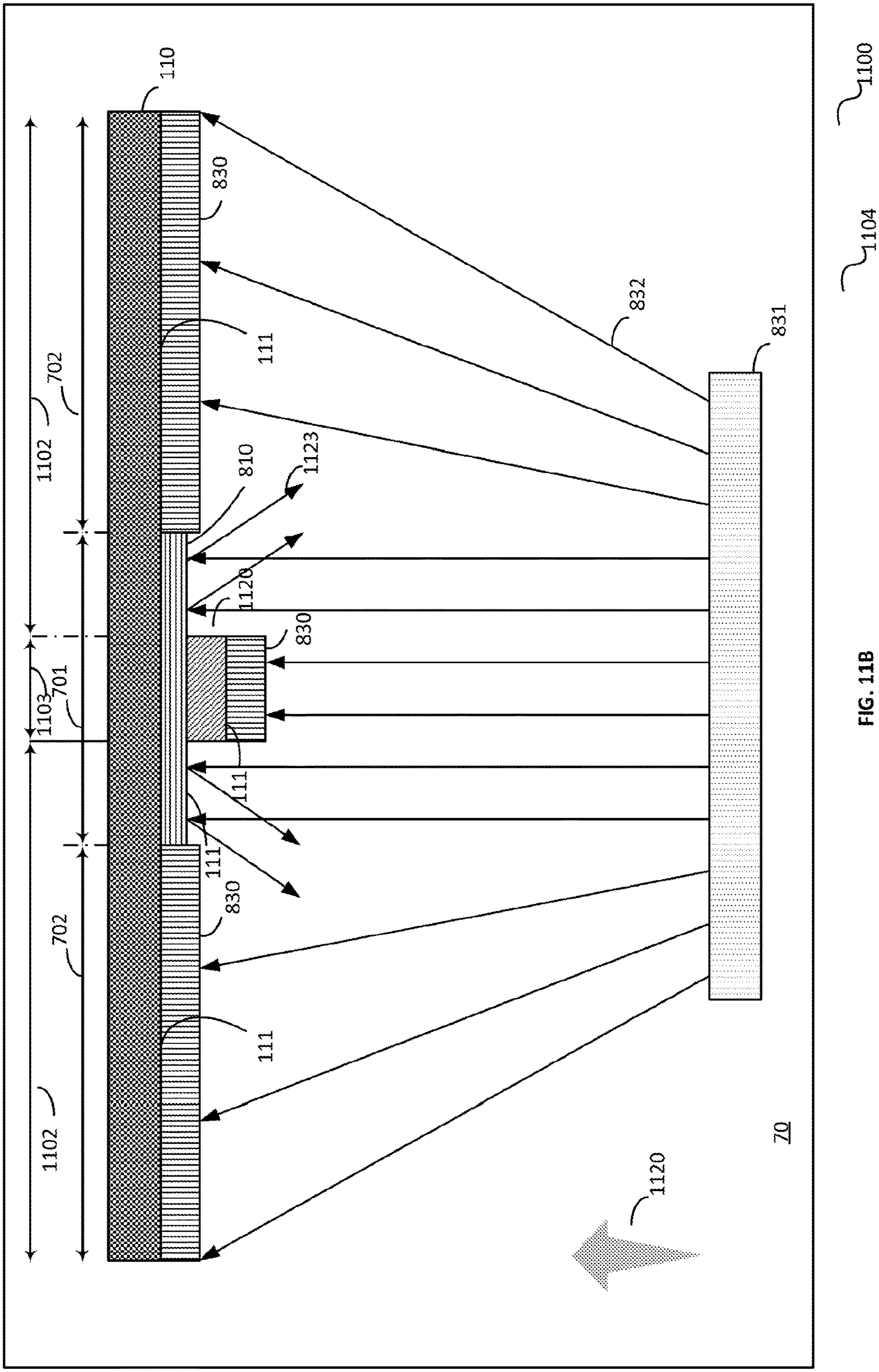
FIG. 11B is a schematic diagram showing an example process for depositing a conductive coating in a pattern on an exposed layer surface that comprises the deposited pattern of the NPC of FIG. 11A.

FIGS. 11A-11B illustrate a non-limiting example of an evaporative process, shown generally at 1100, in a chamber 70, for selectively depositing a conductive coating 830 onto a second portion 702 of an exposed layer surface 111 of an underlying material (in the FIGURE, for purposes of simplicity of illustration only, the substrate 110), that is substantially devoid of the NIC 810 that was selectively deposited onto a first portion 701, and onto an NPC portion 1103 of the first portion 701, on which the NIC 810 was deposited, including without limitation, by the evaporative process 700 of FIG. 7.

FIG. 11A describes a stage 1101 of the process 1100, in which, once the NIC 810 has been deposited on the first portion 701 of an exposed layer surface 111 of an underlying material (in the FIGURE, the substrate 110), the NPC 1120 may be deposited on the NPC portion 1103 of the exposed layer surface 111 of the NIC 810 disposed on the substrate 110 in the first portion 701. In the FIGURE, by way of non-limiting example, the NPC portion 1103 extends completely within the first portion 701.

In the stage 1101, a quantity of an NPC material 1121, is heated under vacuum, to evaporate and/or sublime 1122 the NPC material 1121. In some non-limiting examples, the NPC material 1121 comprises entirely, and/or substantially, a material used to form the NPC 1120. Evaporated NPC material 1122 is directed through the chamber 70, including in a direction indicated by arrow 1110, toward the exposed layer surface 111 of the first portion 701 and of the NPC portion 1103. When the evaporated NPC material 1122 is incident on the NPC portion 1103 of the exposed layer surface 111, the NPC 1120 is formed thereon.

In some non-limiting examples, deposition of the NPC material 1121 may be performed using an open mask and/or a mask-free deposition technique, such that the NPC 1120 is formed substantially across the entire exposed layer surface 111 of the underlying material (which could be, in the FIGURE, the NIC 810 throughout the first portion 701 and/or the substrate 110 through the second portion 702) to produce a treated surface (of the NPC 1120).

In some non-limiting examples, as shown in the FIGURE for the stage 1101, the NPC 1120 may be selectively deposited only onto a portion, in the example illustrated, the NPC portion 1103, of the exposed layer surface 111 (in the figure, of the NIC 810), by the interposition, between the NPC material 1121 and the exposed layer surface 111, of a shadow mask 1125, which in some non-limiting examples, may be an FMM. The shadow mask 1125 has at least one aperture 1126 extending therethrough such that a part of the evaporated NPC material 1122 passes through the aperture 1126 and is incident on the exposed layer surface 111 (in the FIGURE, by way of non-limiting example, of the NIC 810 within the NPC portion 1103 only) to form the NPC 1120. Where the evaporated NPC material 1122 does not pass through the aperture 1126 but is incident on the surface 1127 of the shadow mask 1125, it is precluded from being disposed on the exposed layer surface 111 to form the NPC 1120. The portion 1102 of the exposed layer surface 111 that lies beyond the NPC portion 1103, is thus substantially devoid of the NPC 1120. In some non-limiting examples (not shown), the evaporated NPC material 1122 that is incident on the shadow mask 1125 may be deposited on the surface 1127 thereof.

While the exposed layer surface 111 of the NIC 810 in the first portion 701 exhibits a relatively low initial sticking probability $S_0$ for the conductive coating 830, in some non-limiting examples, this may not necessarily be the case for the NPC coating 1120, such that the NPC coating 1120 is still selectively deposited on the exposed layer surface (in the FIGURE, of the NIC 810) in the NPC portion 1103.

Accordingly, a patterned surface is produced upon completion of the deposition of the NPC 1120.

FIG. 11B describes a stage 1104 of the process 1100, in which, once the NIC 810 has been deposited on the first portion 701 of an exposed layer surface 111 of an underlying material (in the FIGURE, the substrate 110) and the NPC 1120 has been deposited on the NPC portion 1103 of the exposed layer surface 111 (in the FIGURE, of the NIC 810), the conductive coating 830 may be deposited on the NPC portion 1103 and the second portion 702 of the exposed layer surface 111 (in the FIGURE, the substrate 110).

In the stage 1104, a quantity of a conductive coating material 831, is heated under vacuum, to evaporate and/or sublime 832 the conductive coating material 831. In some non-limiting examples, the conductive coating material 831 comprises entirely, and/or substantially, a material used to form the conductive coating 830. Evaporated conductive coating material 832 is directed through the chamber 70, including in a direction indicated by arrow 1120, toward the exposed layer surface 111 of the first portion 701, of the NPC portion 1103 and of the second portion 702. When the evaporated conductive coating material 832 is incident on the NPC portion 1103 of the exposed layer surface 111 (of the NPC 1120) and on the second portion 702 of the exposed layer surface 111 (of the substrate 110), that is, other than on the exposed layer surface 111 of the NIC 810, the conductive coating 830 is formed thereon.

In some non-limiting examples, as shown in the FIGURE for the stage 1104, deposition of the conductive coating 830 may be performed using an open mask and/or mask-free deposition process, such that the conductive coating 830 is formed substantially across the entire exposed layer surface 111 of the underlying material (other than where the underlying material is the NIC 810) to produce a treated surface (of the conductive coating 830).

Indeed, as shown in FIG. 11B, the evaporated conductive coating material 832 is incident both on an exposed layer surface 111 of NIC 810 across the first portion 701 that lies beyond the NPC portion 1103, as well as the exposed layer surface 111 of the NPC 1120 across the NPC portion 1103 and the exposed layer surface 111 of the substrate 110 across the second portion 702 that is substantially devoid of NIC 810.

Since the exposed layer surface 111 of the NIC 810 in the first portion 701 that lies beyond the NPC portion 1103 exhibits a relatively low initial sticking probability $S_0$ for the conductive coating 830 compared to the exposed layer surface 111 of the substrate 110 in the second portion 702, and/or since the exposed layer surface 111 of the NPC 1120 in the NPC portion 1103 exhibits a relatively high initial sticking probability $S_0$ for the conductive coating 830 compared to both the exposed layer surface 111 of the NIC 810 in the first portion 701 that lies beyond the NPC portion 1103 and the exposed layer surface 111 of the substrate 110 in the second portion 702, the conductive coating 830 is selectively deposited substantially only on the exposed layer surface 111 of the substrate 110 in the NPC portion 1103 and the second portion 702, both of which are substantially devoid of the NIC 810. By contrast, the evaporated conductive coating material 832 incident on the exposed layer surface 111 of NIC 810 across the first portion 701 that lies beyond the NPC portion 1103, tends not to be deposited, as shown (1123) and the exposed layer surface 111 of NIC 810 across the first portion 701 that lies beyond the NPC portion 1103 is substantially devoid of the conductive coating 830.

Accordingly, a patterned surface is produced upon completion of the deposition of the conductive coating 830.

Figure 12A:
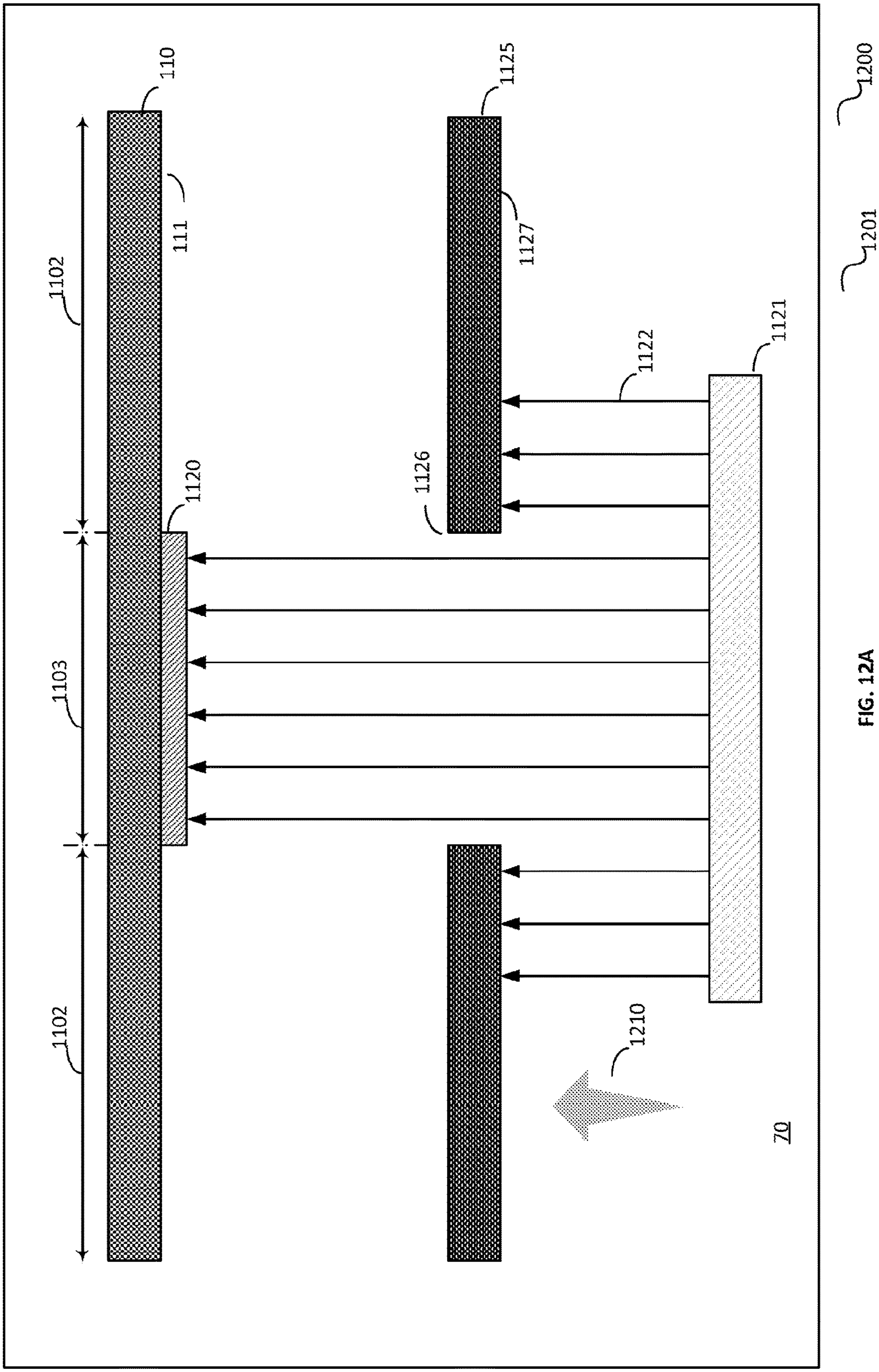
FIG. 12A is a schematic diagram showing an example process for depositing an NPC in a pattern on an exposed layer surface of an underlying material in an example version of the device of FIG. 1, according to an example in the present disclosure.
Figure 12B:
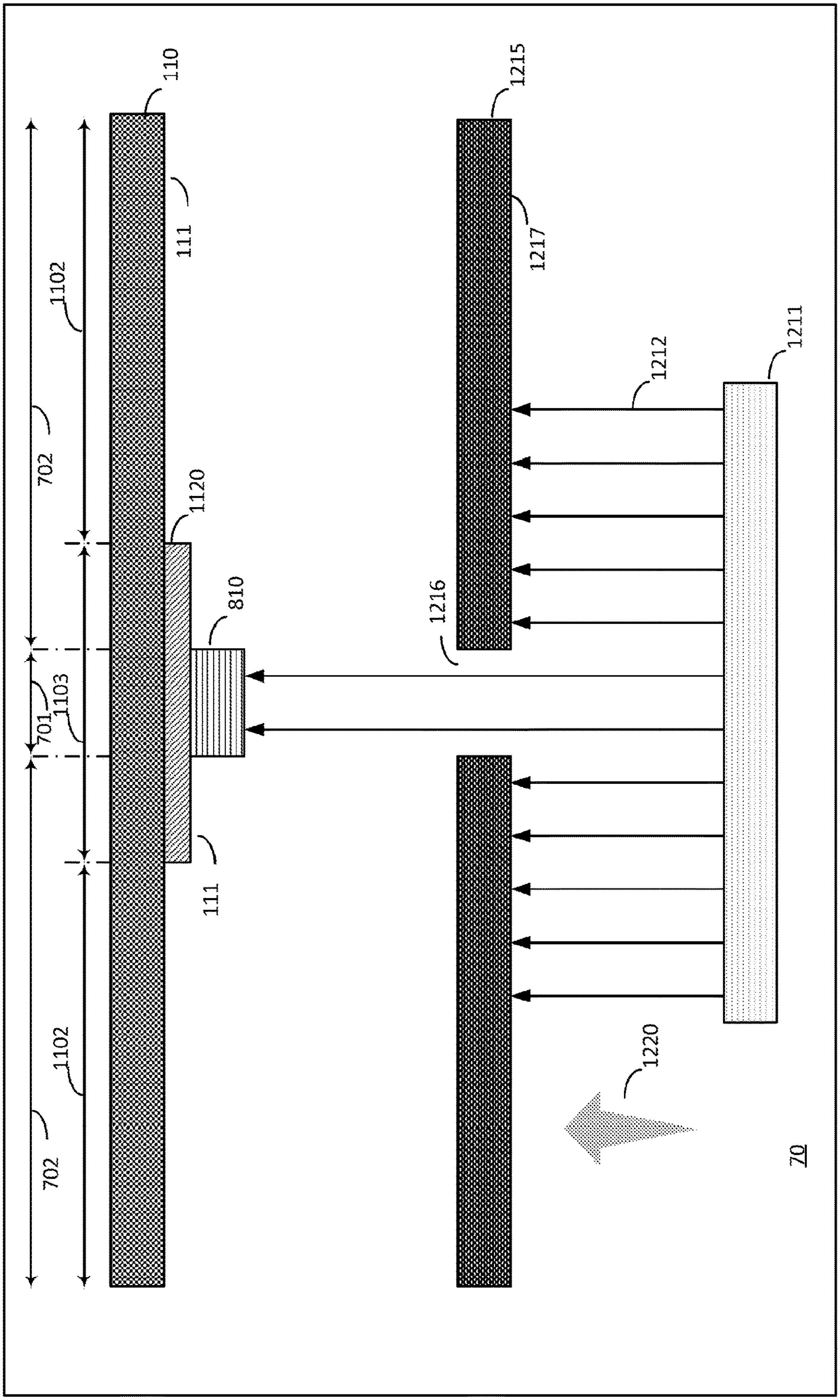
FIG. 12B is a schematic diagram showing an example process of depositing an NIC in a pattern on an exposed layer surface that comprises the deposited pattern of the NPC of FIG. 12A.
Figure 12C:
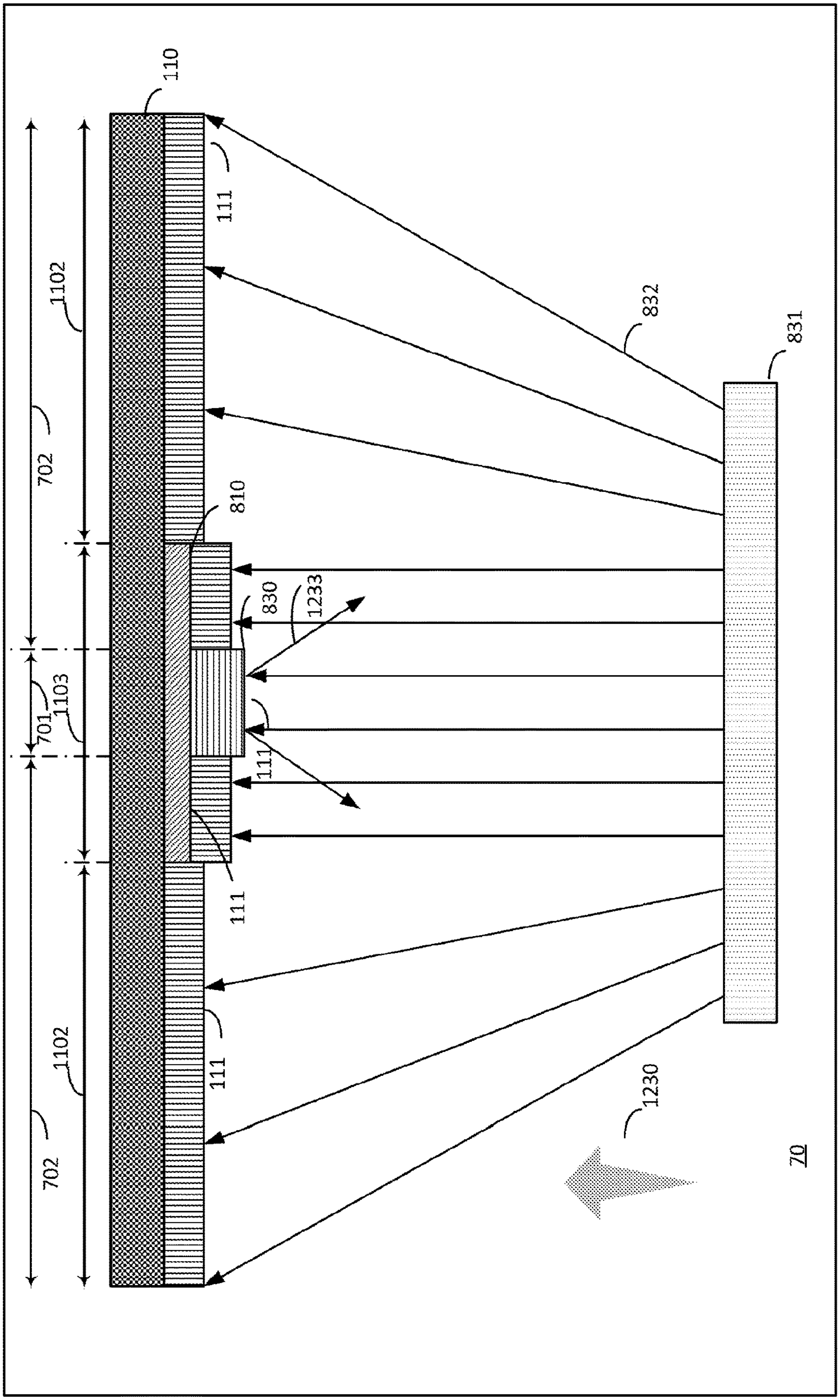
FIG. 12C is a schematic diagram showing an example process for depositing a conductive coating in a pattern on an exposed layer surface that comprises the deposited pattern of the NIC of FIG. 12B.

FIGS. 12A-12C illustrate a non-limiting example of an evaporative process, shown generally at 1200, in a chamber 70, for selectively depositing a conductive coating 830 onto a second portion 1202 (FIG. 12C) of an exposed layer surface 111 of an underlying material.

FIG. 12A describes a stage 1201 of the process 1200, in which, a quantity of an NPC material 1121, is heated under vacuum, to evaporate and/or sublime 1122 the NPC material 1121. In some non-limiting examples, the NPC material 1121 comprises entirely, and/or substantially, a material used to form the NPC 1120. Evaporated NPC material 1122 is directed through the chamber 70, including in a direction indicated by arrow 1210, toward the exposed layer surface 111 (in the FIGURE, the substrate 110).

In some non-limiting examples, deposition of the NPC material 1121 may be performed using an open mask and/or mask-free deposition process, such that the NPC 1120 is formed substantially across the entire exposed layer surface 111 of the underlying material (in the FIGURE, the substrate 110) to produce a treated surface (of the NPC 1120).

In some non-limiting examples, as shown in the FIGURE for the stage 1201, the NPC 1120 may be selectively deposited only onto a portion, in the example illustrated, the NPC portion 1103, of the exposed layer surface 111, by the interposition, between the NPC material 1121 and the exposed layer surface 111, of the shadow mask 1125, which in some non-limiting examples, may be an FMM. The shadow mask 1125 has at least one aperture 1126 extending therethrough such that a part of the evaporated NPC material 1122 passes through the aperture 1126 and is incident on the exposed layer surface 111 to form the NPC 1120 in the NPC portion 1103. Where the evaporated NPC material 1122 does not pass through the aperture 1126 but is incident on the surface 1127 of the shadow mask 1125, it is precluded from being disposed on the exposed layer surface 111 to form the NPC 1120 within the portion 1102 of the exposed layer surface 111 that lies beyond the NPC portion 1103. The portion 1102 is thus substantially devoid of the NPC 1120. In some non-limiting examples (not shown), the NPC material 1121 that is incident on the shadow mask 1125 may be deposited on the surface 1127 thereof.

When the evaporated NPC material 1122 is incident on the exposed layer surface 111, that is, in the NPC portion 1103, the NPC 1120 is formed thereon.

Accordingly, a patterned surface is produced upon completion of the deposition of the NPC 1120.

FIG. 12B describes a stage 1202 of the process 1200, in which, once the NPC 1120 has been deposited on the NPC portion 1103 of an exposed layer surface 111 of an underlying material (in the FIGURE, the substrate 110), the NIC 810 may be deposited on a first portion 701 of the exposed layer surface 111. In the figure, by way of non-limiting example, the first portion 701 extends completely within the NPC portion 1103. As a result, in the FIGURE, by way of non-limiting example, the portion 1102 comprises that portion of the exposed layer surface 111 that lies beyond the first portion 701.

In the stage 1202, a quantity of an NIC material 1211, is heated under vacuum, to evaporate and/or sublime 1212 the NIC material 1211. In some non-limiting examples, the NIC material 1121 comprises entirely, and/or substantially, a material used to form the NIC 810. Evaporated NIC material 1212 is directed through the chamber 70, including in a direction indicated by arrow 1220, toward the exposed layer surface 111 of the first portion 701, of the NPC portion 1103 that extends beyond the first portion 701 and of the portion 1102. When the evaporated NIC material 1212 is incident on the first portion 701 of the exposed layer surface 111, the NIC 810 is formed thereon.

In some non-limiting examples, deposition of the NIC material 1211 may be performed using an open mask and/or mask-free deposition process, such that the NIC 810 is formed substantially across the entire exposed layer surface 111 of the underlying material to produce a treated surface (of the NIC 810).

In some non-limiting examples, as shown in the FIGURE for the stage 1202, the NIC 810 may be selectively deposited only onto a portion, in the example illustrated, the first portion 701, of the exposed layer surface 111 (in the FIGURE, of the NPC 1120), by the interposition, between the NIC material 1211 and the exposed layer surface 111, of a shadow mask 1215, which in some non-limiting examples, may be an FMM. The shadow mask 1215 has at least one aperture 1216 extending therethrough such that a part of the evaporated NIC material 1212 passes through the aperture 1216 and is incident on the exposed layer surface 111 (in the FIGURE, by way of non-limiting example, of the NPC 1120) to form the NIC 810. Where the evaporated NIC material 1212 does not pass through the aperture 1216 but is incident on the surface 1217 of the shadow mask 1215, it is precluded from being disposed on the exposed layer surface 111 to form the NIC 810 within the second portion 702 beyond the first portion 701. The second portion 702 of the exposed layer surface 111 that lies beyond the first portion 701, is thus substantially devoid of the NIC 810. In some non-limiting examples (not shown), the evaporated NIC material 1212 that is incident on the shadow mask 1215 may be deposited on the surface 1217 thereof.

While the exposed layer surface 111 of the NPC 1120 in the NPC portion 1103 exhibits a relatively high initial sticking probability $S_0$ for the conductive coating 830, in some non-limiting examples, this may not necessarily be the case for the NIC coating 810. Even so, in some non-limiting examples such affinity for the NIC coating 810 may be such that the NIC coating 810 is still selectively deposited on the exposed layer surface 111 (in the FIGURE, of the NPC 1120) in the first portion 701.

Accordingly, a patterned surface is produced upon completion of the deposition of the NIC 810.

FIG. 12C describes a stage 1204 of the process 1200, in which, once the NIC 810 has been deposited on the first portion 701 of an exposed layer surface 111 of an underlying material (in the FIGURE, the NPC 1120), the conductive coating 830 may be deposited on a second portion 702 of the exposed layer surface 111 (in the FIGURE, of the substrate 110 across the portion 1102 beyond the NPC portion 1103 and of the NPC 1120 across the NPC portion 1103 beyond the first portion 701).

In the stage 1204, a quantity of a conductive coating material 831, is heated under vacuum, to evaporate and/or sublime 832 the conductive coating material 831. In some non-limiting examples, the conductive coating material 831 comprises entirely, and/or substantially, a material used to form the conductive coating 830. Evaporated conductive coating material 832 is directed through the chamber 70, including in a direction indicated by arrow 1230, toward the exposed layer surface 111 of the first portion 701, of the NPC portion 1103 and of the portion 1102 beyond the NPC portion 1103. When the evaporated conductive coating material 832 is incident on the NPC portion 1103 of the exposed layer surface 111 (of the NPC 1120) beyond the first portion 701 and on the portion 1102 beyond the NPC portion 1103 of the exposed layer surface 111 (of the substrate 110), that is, on the second portion 702 other than on the exposed layer surface 111 of the NIC 810, the conductive coating 830 is formed thereon.

In some non-limiting examples, as shown in the FIGURE for the stage 1204, deposition of the conductive coating 830 may be performed using an open mask and/or mask-free deposition process, such that the conductive coating 830 is formed substantially across the entire exposed layer surface 111 of the underlying material (other than where the underlying material is the NIC 810) to produce a treated surface (of the conductive coating 830).

Indeed, as shown in FIG. 12C, the evaporated conductive coating material 832 is incident both on an exposed layer surface 111 of NIC 810 across the first portion 701 that lies within the NPC portion 1103, as well as the exposed layer surface 111 of the NPC 1120 across the NPC portion 1103 that lies beyond the first portion 701 and the exposed layer surface 111 of the substrate 110 across the portion 1102 that lies beyond the NPC portion 1103.

Since the exposed layer surface 111 of the NIC 810 in the first portion 701 exhibits a relatively low initial sticking probability $S_0$ for the conductive coating 830 compared to the exposed layer surface 111 of the substrate 110 in the second portion 702 that lies beyond the NPC portion 1103, and/or since the exposed layer surface 111 of the NPC 1120 in the NPC portion 1103 that lies beyond the first portion 701 exhibits a relatively high initial sticking probability $S_0$ for the conductive coating 830 compared to both the exposed layer surface 111 of the NIC 810 in the first portion 701 and the exposed layer surface 111 of the substrate 110 in the portion 1102 that lies beyond the NPC portion 1103, the conductive coating 830 is selectively deposited substantially only on the exposed layer surface 111 of the substrate 110 in the NPC portion 1103 that lies beyond the first portion 701 and on the portion 1102 that lies beyond the NPC portion 1103, both of which are substantially devoid of the NIC 810. By contrast, the evaporated conductive coating material 832 incident on the exposed layer surface 111 of NIC 810 across the first portion 701, tends not to be deposited, as shown (1233) and the exposed layer surface 111 of NIC 810 across the first portion 701 is substantially devoid of the conductive coating 830.

Accordingly, a patterned surface is produced upon completion of the deposition of the conductive coating 830.

In some non-limiting examples, an initial deposition rate of the evaporated conductive coating material 832 on the exposed layer surface 111 in the second portion 702 may be at least and/or greater than about 200 times, at least and/or greater than about 550 times, at least and/or greater than about 900 times, at least and/or greater than about 1,000 times, at least and/or greater than about 1,500 times, at least and/or greater than about 1,900 times and/or at least and/or greater than about 2,000 times an initial deposition rate of the evaporated conductive coating material 832 on the exposed layer surface 111 of the NIC 810 in the first portion 701.

Figures 13A, 13B, 13C:
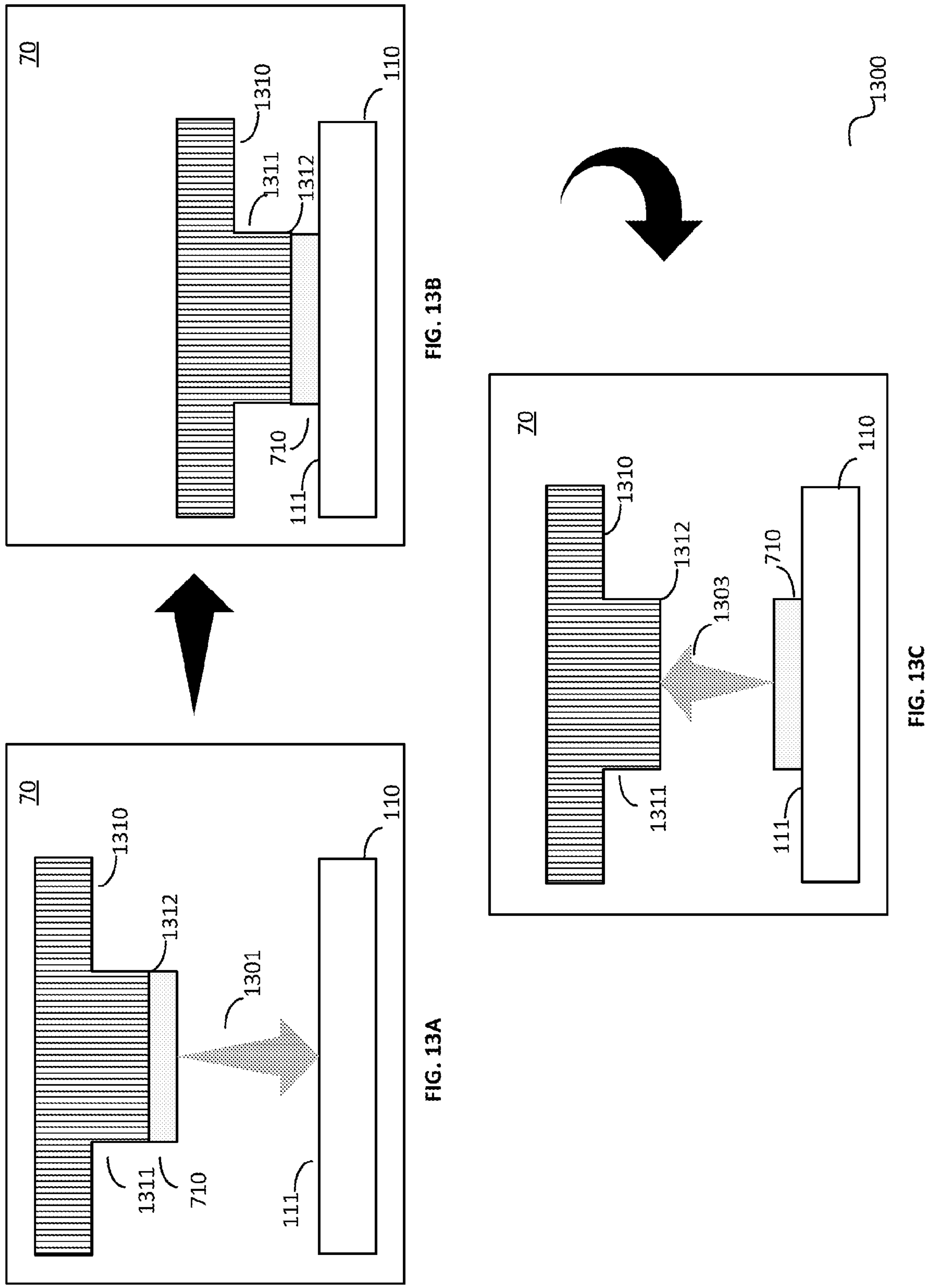
FIGS. 13A-13C are schematic diagrams that show example stages of an example printing process for depositing a selective coating in a pattern on an exposed layer surface in an example version of the device of FIG. 1, according to an example in the present disclosure.

FIGS. 13A-13C illustrate a non-limiting example of a printing process, shown generally at 1300, for selectively depositing a selective coating 710, which in some non-limiting examples may be an NIC 810 and/or an NPC 1120, onto an exposed layer surface 111 of an underlying material (in the FIGURE, for purposes of simplicity of illustration only, the substrate 110).

FIG. 13A describes a stage of the process 1300, in which a stamp 1310 having a protrusion 1311 thereon is provided with the selective coating 710 on an exposed layer surface 1312 of the protrusion 1311. Those having ordinary skill in the relevant art will appreciate that the selective coating 710 may be deposited and/or deposited on the protrusion surface 1312 using a variety of suitable mechanisms.

FIG. 13B describes a stage of the process 1300, in which the stamp 1310 is brought into proximity 1301 with the exposed layer surface 111, such that the selective coating 710 comes into contact with the exposed layer surface 111 and adheres thereto.

FIG. 13C describes a stage of the process 1300, in which the stamp 1310 is moved away 1303 from the exposed layer surface 111, leaving the selective coating 710 deposited on the exposed layer surface 111.

Selective Deposition of a Patterned Electrode

The foregoing may be combined in order to effect the selective deposition of at least one conductive coating 830 to form a patterned electrode 120, 140, 1750, 4150, which may, in some non-limiting examples, may be the second electrode 140 and/or an auxiliary electrode 1750, without employing an FMM within the high-temperature conductive coating 830 deposition process. In some non-limiting examples, such patterning may permit and/or enhance the transmissivity of the device 100.

Figure 14:
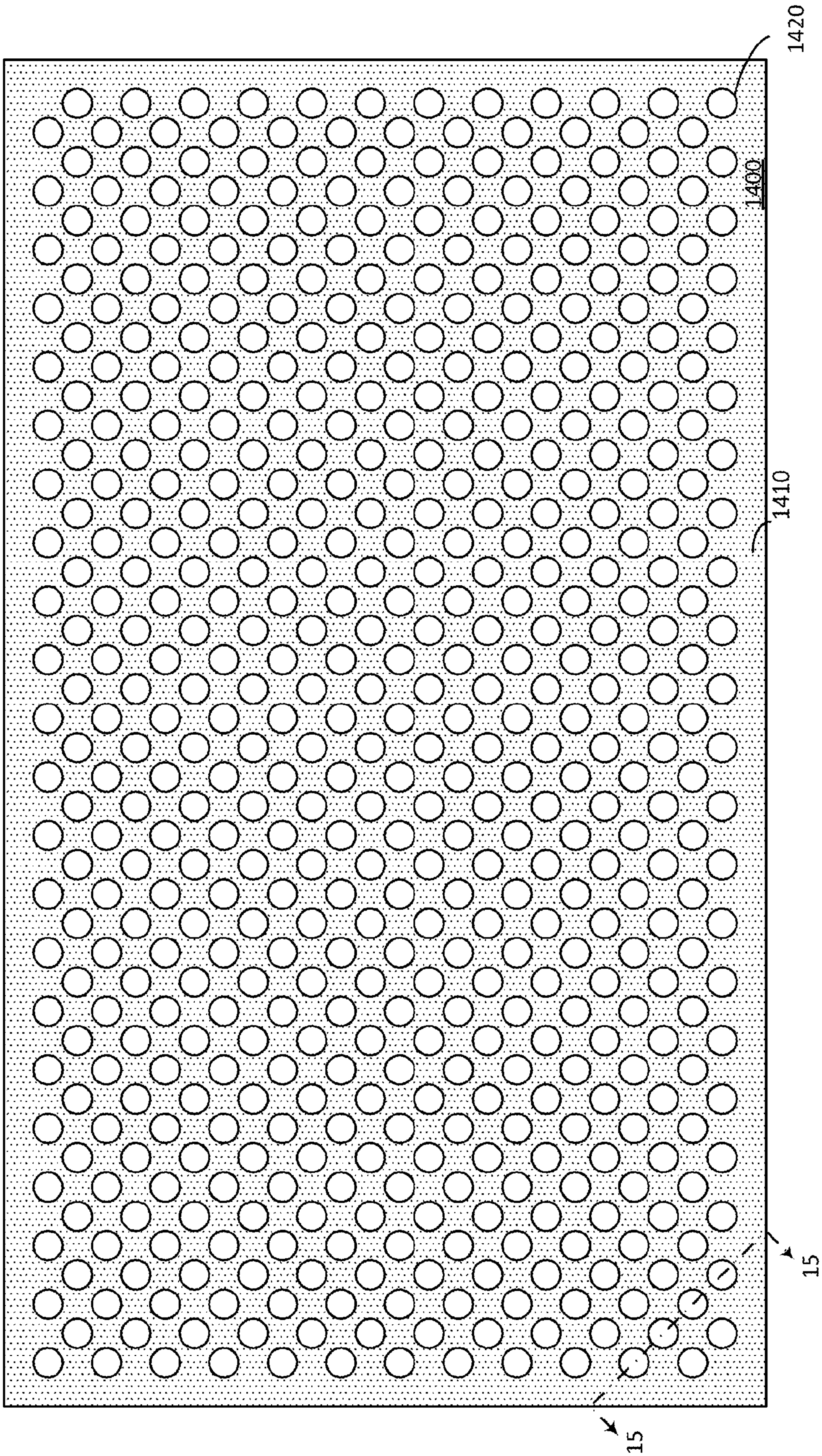
FIG. 14 is a schematic diagram illustrating, in plan view, an example patterned electrode suitable for use in a version of the device of FIG. 1, according to an example in the present disclosure.

FIG. 14 shows an example patterned electrode 1400 in plan view, in the FIGURE, the second electrode 140 suitable for use in an example version 1500 (FIG. 15) of the device 100. The electrode 1400 is formed in a pattern 1410 that comprises a single continuous structure, having or defining a patterned plurality of apertures 1420 therewithin, in which the apertures 1420 correspond to regions of the device 100 where there is no cathode 342.

In the FIGURE, by way of non-limiting example, the pattern 1410 is disposed across the entire lateral extent of the device 1500, without differentiation between the lateral aspect(s) 410 of emissive region(s) 1910 corresponding to (sub-)pixel(s) 340/264*x* and the lateral aspect(s) 420 of non-emissive region(s) 1920 surrounding such emissive region(s) 1910. Thus, the example illustrated may correspond to a device 1500 that is substantially transmissive relative to light incident on an external surface thereof, such that a substantial part of such externally-incident light may be transmitted through the device 1500, in addition to the emission (in a top-emission, bottom-emission and/or double-sided emission) of photons generated internally within the device 1500 as disclosed herein.

The transmittivity of the device 1500 may be adjusted and/or modified by altering the pattern 1410 employed, including without limitation, an average size of the apertures 1420, and/or a spacing and/or density of the apertures 1420.

Figure 15:
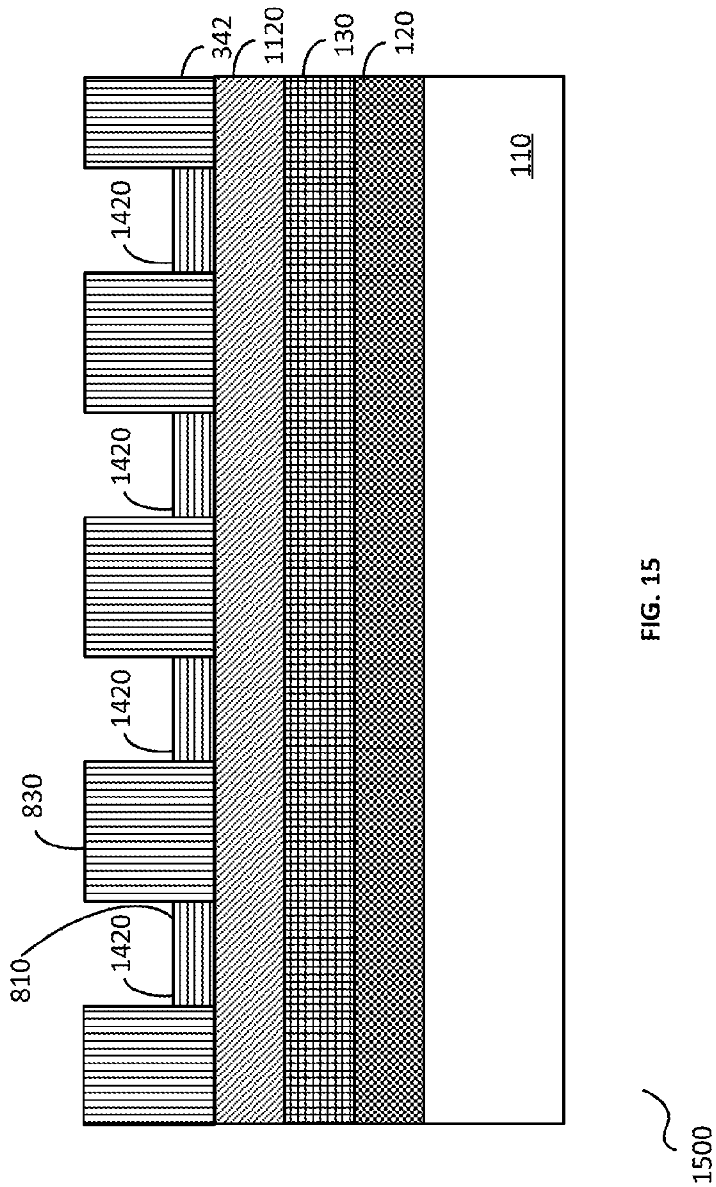
FIG. 15 is a schematic diagram illustrating an example cross-sectional view of the device of FIG. 14 taken along line 15-15.

Turning now to FIG. 15, there is shown a cross-sectional view of the device 1500, taken along line 15-15 in FIG. 14. In the FIGURE, the device 1500 is shown as comprising the substrate 110, the first electrode 120 and the at least one semiconducting layer 130. In some non-limiting examples, an NPC 1120 is disposed on substantially all of the exposed layer surface 111 of the at least one semiconducting layer 130. In some non-limiting examples, the NPC 1120 could be omitted.

An NIC 810 is selectively disposed in a pattern substantially corresponding to the pattern 1410 on the exposed layer surface 111 of the underlying material, which, as shown in the FIGURE, is the NPC 1120 (but, in some non-limiting examples, could be the at least one semiconducting layer 130 if the NPC 1120 has been omitted).

A conductive coating 830 suitable for forming the patterned electrode 1400, which in the FIGURE is the second electrode 140, is disposed on substantially all of the exposed layer surface 111 of the underlying material, using an open mask and/or a mask-free deposition process, neither of which employs any FMM during the high-temperature conductive coating deposition process. The underlying material comprises both regions of the NIC 810, disposed in the pattern 1410, and regions of NPC 1120, in the pattern 1410 where the NIC 810 has not been deposited. In some non-limiting examples, the regions of the NIC 810 may correspond substantially to a first portion comprising the apertures 1420 shown in the pattern 1410.

Because of the nucleation-inhibiting properties of those regions of the pattern 1410 where the NIC 810 was disposed (corresponding to the apertures 1420), the conductive coating 830 disposed on such regions tends not to remain, resulting in a pattern of selective deposition of the conductive coating 830, that corresponds substantially to the remainder of the pattern 1410, leaving those regions of the first portion of the pattern 1410 corresponding to the apertures 1420 substantially devoid of the conductive coating 830.

In other words, the conductive coating 830 that will form the cathode 342 is selectively deposited substantially only on a second portion comprising those regions of the NPC 1120 that surround but do not occupy the apertures 1420 in the pattern 1410.

Figure 16A:
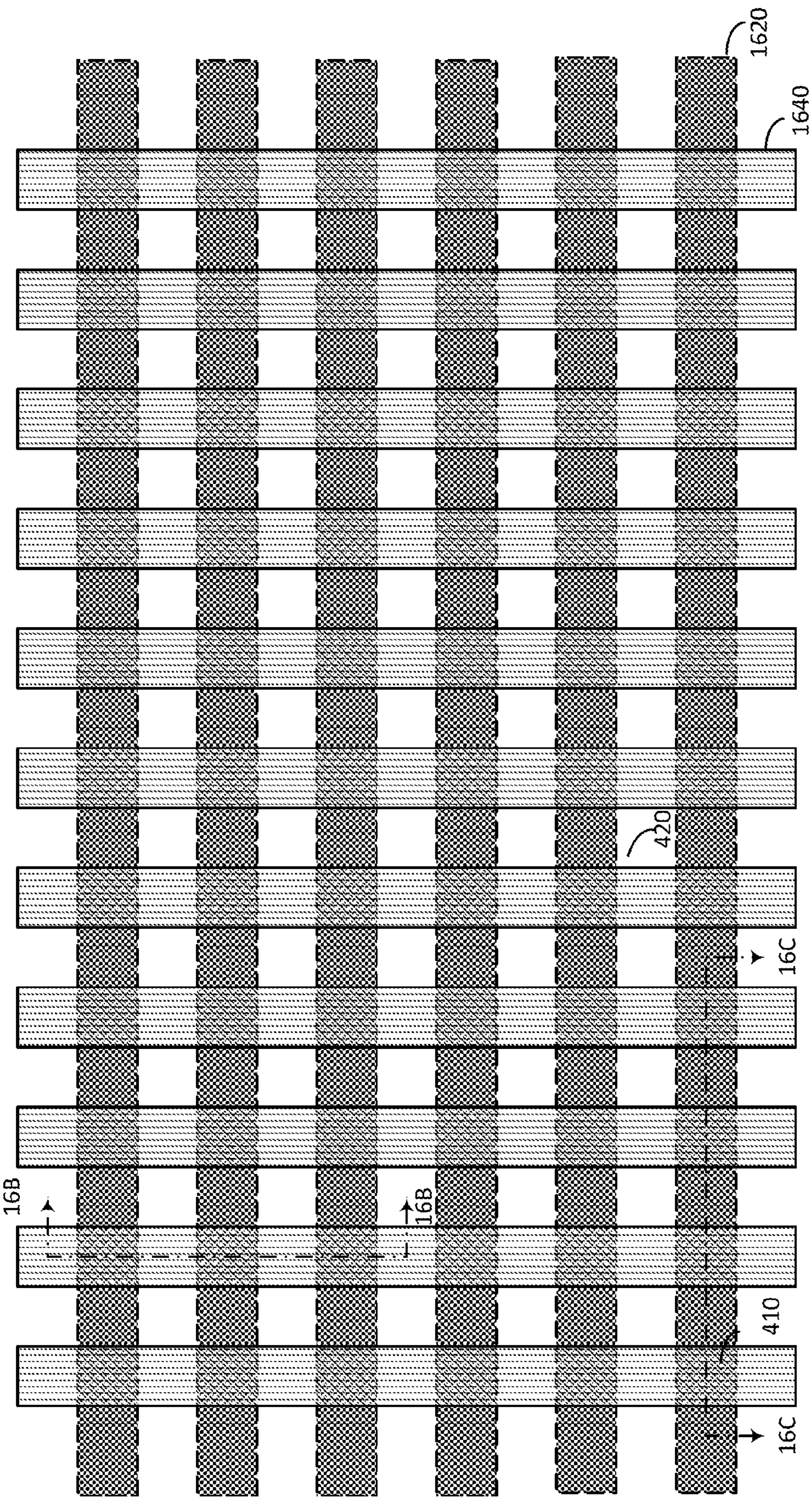
FIG. 16A is a schematic diagram illustrating, in plan view, a plurality of example patterns of electrodes suitable for use in an example version of the device of FIG. 1, according to an example in the present disclosure.

FIG. 16A shows, in plan view, a schematic diagram showing a plurality of patterns 1620, 1640 of electrodes 120, 140, 1750.

In some non-limiting examples, the first pattern 1620 comprises a plurality of elongated, spaced-apart regions that extend in a first lateral direction. In some non-limiting examples, the first pattern 1620 may comprise a plurality of first electrodes 120. In some non-limiting examples, a plurality of the regions that comprise the first pattern 1620 may be electrically coupled.

In some non-limiting examples, the second pattern 1640 comprises a plurality of elongated, spaced-apart regions that extend in a second lateral direction. In some non-limiting examples, the second lateral direction may be substantially normal to the first lateral direction. In some non-limiting examples, the second pattern 1640 may comprise a plurality of second electrodes 140. In some non-limiting examples, a plurality of the regions that comprise the second pattern 1640 may be electrically coupled.

In some non-limiting examples, the first pattern 1620 and the second pattern 1640 may form part of an example version, shown generally at 1600 (FIG. 16C) of the device 100, which may comprise a plurality of PMOLED elements.

In some non-limiting examples, the lateral aspect(s) 410 of emissive region(s) 1910 corresponding to (sub-)pixel(s) 340/264*x* are formed where the first pattern 1620 overlaps the second pattern 1640. In some non-limiting examples, the lateral aspect(s) 420 of non-emissive region 1920 correspond to any lateral aspect other than the lateral aspect(s) 410.

In some non-limiting examples, a first terminal, which, in some non-limiting examples, may be a positive terminal, of the power source 15, is electrically coupled to at least one electrode 120, 140, 1750 of the first pattern 1620. In some non-limiting examples, the first terminal is coupled to the at least one electrode 120, 140, 1750 of the first pattern 1620 through at least one driving circuit 300. In some non-limiting examples, a second terminal, which, in some non-limiting examples, may be a negative terminal, of the power source 15, is electrically coupled to at least one electrode 120, 140, 1750 of the second pattern 1640. In some non-limiting examples, the second terminal is coupled to the at least one electrode 120, 140, 1750 of the second pattern 1740 through the at least one driving circuit 300.

Figure 16B:
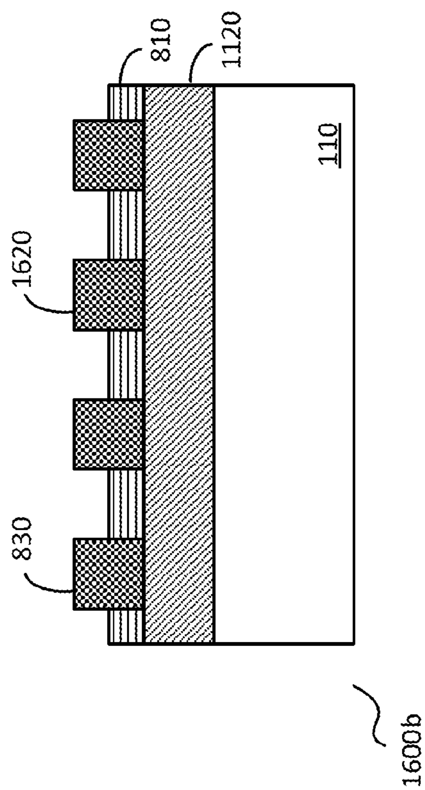
FIG. 16B is a schematic diagram illustrating an example cross-sectional view, at an intermediate stage, of the device of FIG. 16A taken along line 16B-16B.

Turning now to FIG. 16B, there is shown a cross-sectional view of the device 1600, at a deposition stage 1600*b*, taken along line 16B-16B in FIG. 16A. In the FIGURE, the device 1600 at the stage 1600*b* is shown as comprising the substrate 110. In some non-limiting examples, an NPC 1120 is disposed on the exposed layer surface 111 of the substrate 110. In some non-limiting examples, the NPC 1120 could be omitted.

An NIC 810 is selectively disposed in a pattern substantially corresponding to the inverse of the first pattern 1620 on the exposed layer surface 111 of the underlying material, which, as shown in the FIGURE, is the NPC 1120.

A conductive coating 830 suitable for forming the first pattern 1620 of electrodes 120, 140, 1750, which in the FIGURE is the first electrode 120, is disposed on substantially all of the exposed layer surface 111 of the underlying material, using an open mask and/or a mask-free deposition process, neither of which employs any FMM during the high-temperature conductive coating deposition process. The underlying material comprises both regions of the NIC 810, disposed in the inverse of the first pattern 1620, and regions of NPC 1120, disposed in the first pattern 1620 where the NIC 810 has not been deposited. In some non-limiting examples, the regions of the NPC 1120 may correspond substantially to the elongated spaced-apart regions of the first pattern 1620, while the regions of the NIC 810 may correspond substantially to a first portion comprising the gaps therebetween.

Because of the nucleation-inhibiting properties of those regions of the first pattern 1620 where the NIC 810 was disposed (corresponding to the gaps therebetween), the conductive coating 830 disposed on such regions tends not to remain, resulting in a pattern of selective deposition of the conductive coating 830, that corresponds substantially to elongated spaced-apart regions of the first pattern 1620, leaving a first portion comprising the gaps therebetween substantially devoid of the conductive coating 830.

In other words, the conductive coating 830 that will form the first pattern 1620 of electrodes 120, 140, 1750 is selectively deposited substantially only on a second portion comprising those regions of the NPC 1120 (or in some non-limiting examples, the substrate 110 if the NPC 1120 has been omitted), that define the elongated spaced-apart regions of the first pattern 1620.

Figure 16C:
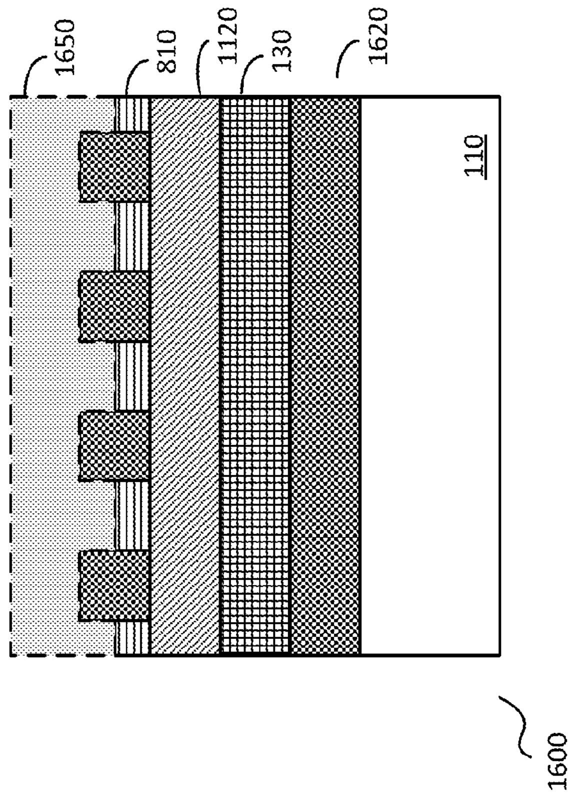
FIG. 16C is a schematic diagram illustrating an example cross-sectional view of the device of FIG. 16A taken along line 16C-16C.

Turning now to FIG. 16C, there is shown a cross-sectional view of the device 1600, taken along line 16C-16C in FIG. 16A. In the FIGURE, the device 1600 is shown as comprising the substrate 110; the first pattern 1620 of electrodes 120 deposited as shown in FIG. 16B, and the at least one semiconducting layer(s) 130.

In some non-limiting examples, the at least one semiconducting layer(s) 130 may be provided as a common layer across substantially all of the lateral aspect(s) of the device 1600.

In some non-limiting examples, an NPC 1120 is disposed on substantially all of the exposed layer surface 111 of the at least one semiconducting layer 130. In some non-limiting examples, the NPC 1120 could be omitted.

An NIC 810 is selectively disposed in a pattern substantially corresponding to the second pattern 1640 on the exposed layer surface 111 of the underlying material, which, as shown in the FIGURE, is the NPC 1120 (but, in some non-limiting examples, could be the at least one semiconducting layer 130 if the NPC 1120 has been omitted).

A conductive coating 830 suitable for forming the second pattern 1640 of electrodes 120, 140, 1750, which in the FIGURE is the second electrode 140, is disposed on substantially all of the exposed layer surface 111 of the underlying material, using an open mask and/or a mask-free deposition process, neither of which employs any FMM during the high-temperature conductive coating deposition process. The underlying material comprises both regions of the NIC 810, disposed in the inverse of the second pattern 1640, and regions of NPC 1120, in the second pattern 1640 where the NIC 810 has not been deposited. In some non-limiting examples, the regions of the NPC 1120 may correspond substantially to a first portion comprising the elongated spaced-apart regions of the second pattern 1640, while the regions of the NIC 810 may correspond substantially to the gaps therebetween.

Because of the nucleation-inhibiting properties of those regions of the second pattern 1640 where the NIC 810 was disposed (corresponding to the gaps therebetween), the conductive coating 830 disposed on such regions tends not to remain, resulting in a pattern of selective deposition of the conductive coating 830, that corresponds substantially to elongated spaced-apart regions of the second pattern 1640, leaving the first portion comprising the gaps therebetween substantially devoid of the conductive coating 830.

In other words, the conductive coating 830 that will form the second pattern 1640 of electrodes 120, 140, 1750 is selectively deposited substantially only on a second portion comprising those regions of the NPC 1120 that define the elongated spaced-apart regions of the second pattern 1640.

In some non-limiting examples, a thickness of the NIC 810 and of the conductive coating 830 deposited thereafter for forming either or both of the first pattern 1620 and/or the second pattern 1640 of electrodes 120, 140, 1750 may be varied according to a variety of parameters, including without limitation, a desired application and desired performance characteristics. In some non-limiting examples, the thickness of the NIC 810 may be comparable to and/or substantially less than a thickness of conductive coating 830 deposited thereafter. Use of a relatively thin NIC 810 to achieve selective patterning of a conductive coating deposited thereafter may be suitable to provide flexible devices 1600, including without limitation, PMOLED devices. In some non-limiting examples, a relatively thin NIC 810 may provide a relatively planar surface on which the barrier coating 1650 may be deposited. In some non-limiting examples, providing such a relatively planar surface for application of the barrier coating 1650 may increase adhesion of the barrier coating 1650 to such surface.

At least one of the first pattern 1620 of electrodes 120, 140, 1750 and at least one of the second pattern 1640 of electrodes 120, 140, 1750 may be electrically coupled to the power source 15, whether directly and/or, in some non-limiting examples, through their respective driving circuit(s) 300 to control photon emission from the lateral aspect(s) 410 of the emissive region(s) 1910 corresponding to (sub-)pixel(s) 340/264*x*.

Those having ordinary skill in the relevant art will appreciate that the process of forming the second electrode 140 in the second pattern 1640 shown in FIGS. 16A-16C may, in some non-limiting examples, be used in similar fashion to form an auxiliary electrode 1750 for the device 1600. In some non-limiting examples, the second electrode 140 thereof may comprise a common electrode, and the auxiliary electrode 1750 may be deposited in the second pattern 1640, in some non-limiting examples, above or in some non-limiting examples below, the second electrode 140 and electrically coupled thereto. In some non-limiting examples, the second pattern 1640 for such auxiliary electrode 1750 may be such that the elongated spaced-apart regions of the second pattern 1640 lie substantially within the lateral aspect(s) 420 of non-emissive region(s) 1920 surrounding the lateral aspect(s) 410 of emissive region(s) 1910 corresponding to (sub-)pixel(s) 340/264*x*. In some non-limiting examples, the second pattern 1640 for such auxiliary electrodes 1750 may be such that the elongated spaced-apart regions of the second pattern 1640 lie substantially within the lateral aspect(s) 410 of emissive region(s) 1910 corresponding to (sub-)pixel(s) 340/264*x* and/or the lateral aspect(s) 420 of non-emissive region(s) 1920 surrounding them.

Figure 17:
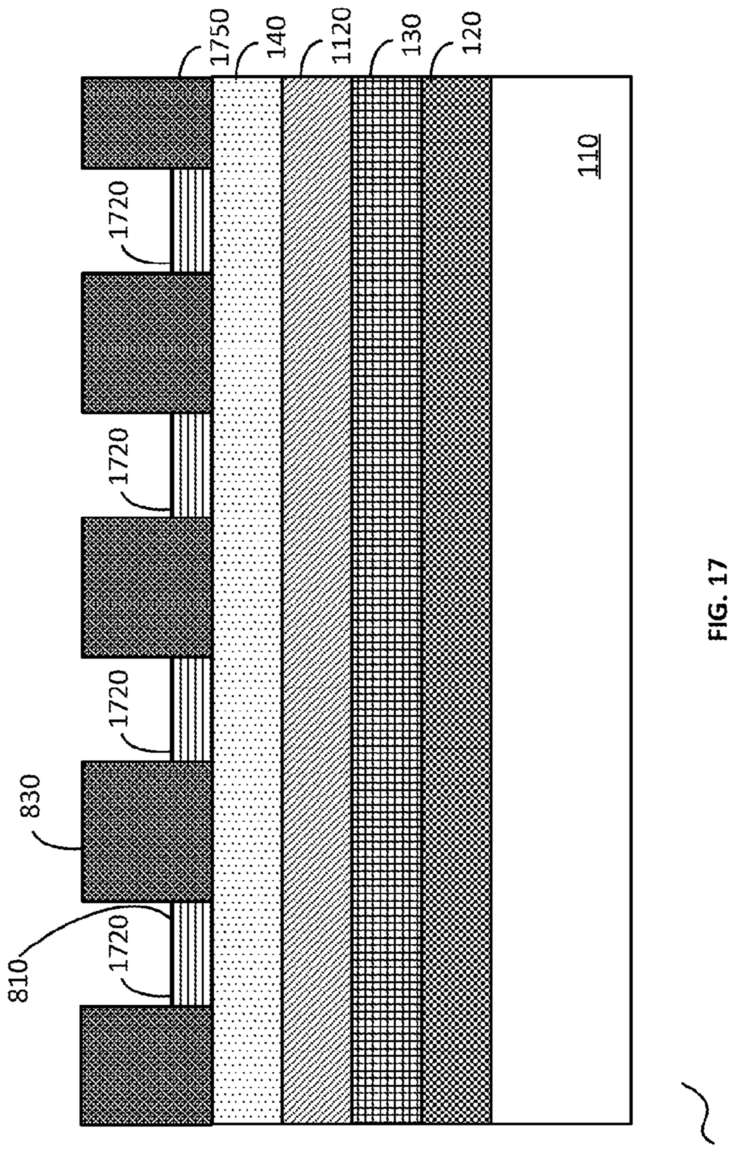
FIG. 17 is a schematic diagram illustrating a cross-sectional view of an example version of the device of FIG. 1, having an example patterned auxiliary electrode according to an example in the present disclosure.

FIG. 17 shows an example cross-sectional view of an example version 1700 of the device 100 that is substantially similar thereto, but further comprises at least one auxiliary electrode 1750 disposed in a pattern above and electrically coupled (not shown) with the second electrode 140.

The auxiliary electrode 1750 is electrically conductive. In some non-limiting examples, the auxiliary electrode 1750 may be formed by at least one metal and/or metal oxide. Non-limiting examples of such metals include Cu, Al, molybdenum (Mo) and/or Ag. By way of non-limiting examples, the auxiliary electrode 1750 may comprise a multi-layer metallic structure, including without limitation, one formed by Mo/Al/Mo. Non-limiting examples of such metal oxides include ITO, ZnO, IZO and/or other oxides containing In and/or Zn. In some non-limiting examples, the auxiliary electrode 1750 may comprise a multi-layer structure formed by a combination of at least one metal and at least one metal oxide, including without limitation, Ag/ITO, Mo/ITO, ITO/Ag/ITO and/or ITO/Mo/ITO. In some non-limiting examples, the auxiliary electrode 1750 comprises a plurality of such electrically conductive materials.

The device 1700 is shown as comprising the substrate 110, the first electrode 120 and the at least one semiconducting layer 130.

In some non-limiting examples, an NPC 1120 is disposed on substantially all of the exposed layer surface 111 of the at least one semiconducting layer 130. In some non-limiting examples, the NPC 1120 could be omitted.

The second electrode 140 is disposed on substantially all of the exposed layer surface 111 of the NPC 1120 (or the at least one semiconducting layer 130, if the NPC 1120 has been omitted).

In some non-limiting examples, particularly in a top-emission device 1700, the second electrode 140 may be formed by depositing a relatively thin conductive film layer (not shown) in order, by way of non-limiting example, to reduce optical interference (including, without limitation, attenuation, reflections and/or diffusion) related to the presence of the second electrode 140. In some non-limiting examples, as discussed elsewhere, a reduced thickness of the second electrode 140, may generally increase a sheet resistance of the second electrode 140, which may, in some non-limiting examples, reduce the performance and/or efficiency of the device 1700. By providing the auxiliary electrode 1750 that is electrically coupled to the second electrode 140, the sheet resistance and thus, the IR drop associated with the second electrode 140, may, in some non-limiting examples, be decreased.

In some non-limiting examples, the device 1700 may be a bottom-emission and/or double-sided emission device 1700. In such examples, the second electrode 140 may be formed as a relatively thick conductive layer without substantially affecting optical characteristics of such a device 1700. Nevertheless, even in such scenarios, the second electrode 140 may nevertheless be formed as a relatively thin conductive film layer (not shown), by way of non-limiting example, so that the device 1700 may be substantially transmissive relative to light incident on an external surface thereof, such that a substantial part such externally-incident light may be transmitted through the device 1700, in addition to the emission of photons generated internally within the device 1700 as disclosed herein.

An NIC 810 is selectively disposed in a pattern on the exposed layer surface 111 of the underlying material, which, as shown in the FIGURE, is the NPC 1120. In some non-limiting examples, as shown in the FIGURE, the NIC 810 may be disposed, in a first portion of the pattern, as a series of parallel rows 1720.

A conductive coating 830 suitable for forming the patterned auxiliary electrode 1750, is disposed on substantially all of the exposed layer surface 111 of the underlying material, using an open mask and/or a mask-free deposition process, neither of which employs any FMM during the high-temperature conductive coating deposition process. The underlying material comprises both regions of the NIC 810, disposed in the pattern of rows 1720, and regions of NPC 1120 where the NIC 810 has not been deposited.

Because of the nucleation-inhibiting properties of those rows 1720 where the NIC 810 was disposed, the conductive coating 830 disposed on such rows 1720 tends not to remain, resulting in a pattern of selective deposition of the conductive coating 830, that corresponds substantially to at least one second portion of the pattern, leaving the first portion comprising the rows 1720 substantially devoid of the conductive coating 830.

In other words, the conductive coating 830 that will form the auxiliary electrode 1750 is selectively deposited substantially only on a second portion comprising those regions of the NPC 1120, that surround but do not occupy the rows 1720.

In some non-limiting examples, selectively depositing the auxiliary electrode 1750 to cover only certain rows 1720 of the lateral aspect of the device 1700, while other regions thereof remain uncovered, may control and/or reduce optical interference related to the presence of the auxiliary electrode 1750.

In some non-limiting examples, the auxiliary electrode 1750 may be selectively deposited in a pattern that cannot be readily detected by the naked eye from a typical viewing distance.

In some non-limiting examples, the auxiliary electrode 1750 may be formed in devices other than OLED devices, including for decreasing an effective resistance of the electrodes of such devices.

Auxiliary Electrode

The ability to pattern electrodes 120, 140, 1750, 4150 including without limitation, the second electrode 140 and/or the auxiliary electrode 1750 without employing FMMs during the high-temperature conductive coating 830 deposition process by employing a selective coating 710, including without limitation, the process depicted in FIG. 17, allows numerous configurations of auxiliary electrodes 1750 to be deployed.

Figure 18B:
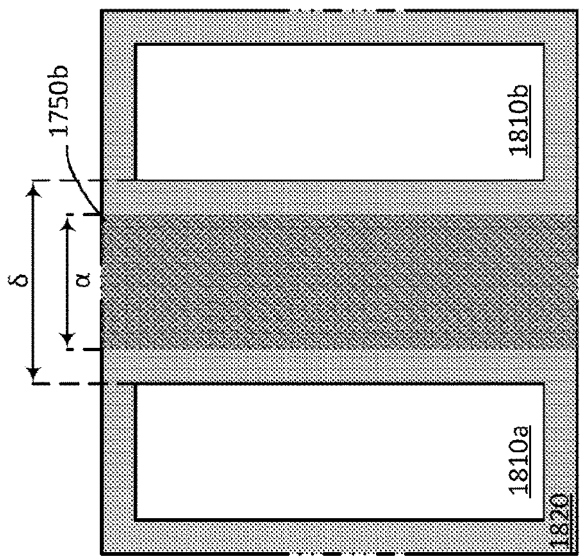
FIGS. 18B-18D are schematic diagrams each illustrating a segment of a part of FIG. 18A, showing an example auxiliary electrode overlaying a non-emissive region according to an example in the present disclosure.
Figure 18D:
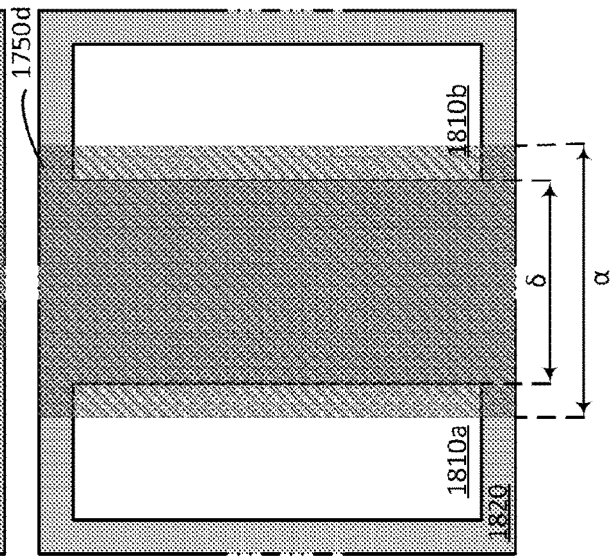
Figure 18A:
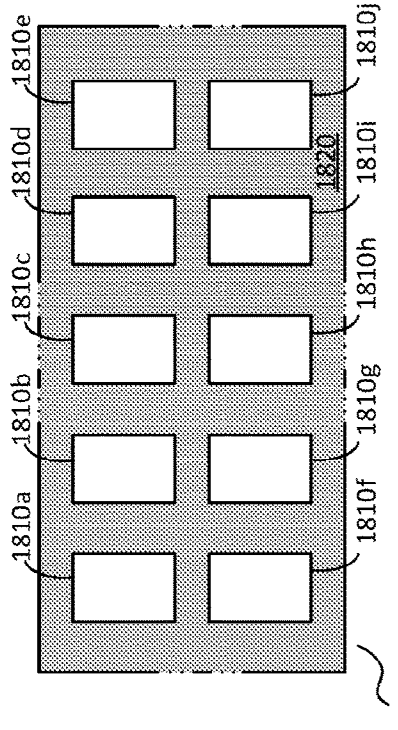
FIG. 18A is a schematic diagram illustrating, in plan view, an example arrangement of emissive region(s) and/or non-emissive region(s) in an example version of the device of FIG. 1, according to an example in the present disclosure.

FIG. 18A shows, in plan view, a part of an example version 1800 of the device 100 having a plurality of emissive regions 1910*a*-1910*j* and at least one non-emissive region 1820 surrounding them. In some non-limiting examples, the device 1800 may be an AMOLED device in which each of the emissive regions 1910*a*-1910*j* corresponds to a (sub-) pixel 340/264*x* thereof.

Figure 18C:
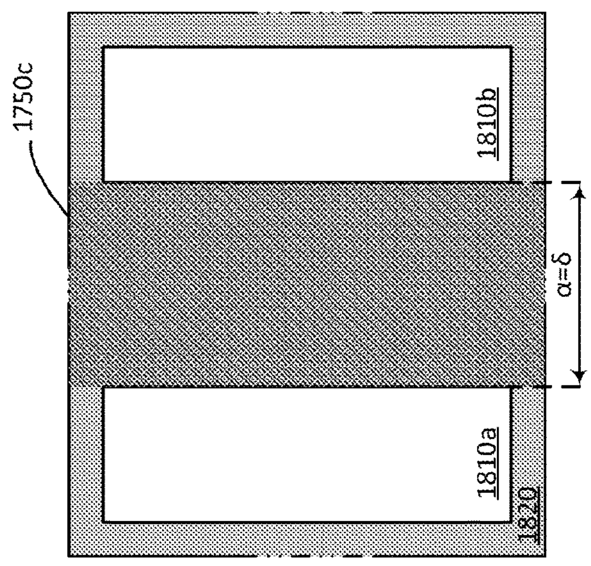

FIGS. 18B-18D show examples of a part of the device 1800 corresponding to neighbouring emissive regions 1910*a* and 1910*b* thereof and a part of the at least one non-emissive region 1820 therebetween, in conjunction with different configurations 1750*b*-1750*d* of an auxiliary electrode 1750 overlaid thereon. In some non-limiting examples, while not expressly illustrated in FIGS. 18B-18D, the second electrode 140 of the device 1800, is understood to substantially cover at least both emissive regions 1910*a* and 1910*b* thereof and the part of the at least one non-emissive region 1820 therebetween.

In FIG. 18B, the auxiliary electrode configuration 1750*b* is disposed between the two neighbouring emissive regions 1910*a* and 1910*b* and electrically coupled to the second electrode 140. In this example, a width α of the auxiliary electrode configuration 1750*b* is less than a separation distance δ between the neighbouring emissive regions 1910*a* and 1910*b*. As a result, there exists a gap within the at least one non-emissive region 1820 on each side of the auxiliary electrode configuration 1830*b*. In some non-limiting examples, such an arrangement may reduce a likelihood that the auxiliary electrode configuration 1750*b* would interfere with an optical output of the device 1800, in some non-limiting examples, from at least one of the emissive regions 1910*a* and 1910*b*. In some non-limiting examples, such an arrangement may be appropriate where the auxiliary electrode configuration 1750*b* is relatively thick (in some non-limiting examples, greater than several hundred nm and/or on the order of a few microns in thickness). In some non-limiting examples, a ratio of a height (thickness) of the auxiliary electrode configuration 1750*b* a width thereof ("aspect ratio") may be greater than about 0.05, such as about 0.1 or greater, about 0.2 or greater, about 0.5 or greater, about 0.8 or greater, about 1 or greater, and/or about 2 or greater. By way of non-limiting example, a height (thickness) of the auxiliary electrode configuration 1750*b* may be greater than about 50 nm, such as about 80 nm or greater, about 100 nm or greater, about 200 nm or greater, about 500 nm or greater, about 700 nm or greater, about 1000 nm or greater, about 1500 nm or greater, about 1700 nm or greater, or about 2000 nm or greater.

In FIG. 18C, the auxiliary electrode configuration 1750*c* is disposed between the two neighbouring emissive regions 1910*a* and 1910*b* and electrically coupled to the second electrode 140. In this example, the width α of the auxiliary electrode configuration 1750*c* is substantially the same as the separation distance δ between the neighbouring emissive regions 1910*a* and 1910*b*. As a result, there is no gap within the at least one non-emissive region 1820 on either side of the auxiliary electrode configuration 1750*c*. In some non-limiting examples, such an arrangement may be appropriate where the separation distance δ between the neighbouring emissive regions 1910*a* and 1910*b* is relatively small, by way of non-limiting example, in a high pixel density device 1800.

In FIG. 18D, the auxiliary electrode 1750*d* is disposed between the two neighbouring emissive regions 1910*a* and 1910*b* and electrically coupled to the second electrode 140. In this example, the width α of the auxiliary electrode configuration 1750*d* is greater than the separation distance δ between the neighbouring emissive regions 1910*a* and 1910*b*. As a result, a part of the auxiliary electrode configuration 1750*d* overlaps a part of at least one of the neighbouring emissive regions 1910*a* and/or 1910*b*. While the FIGURE shows that the extent of overlap of the auxiliary electrode configuration 1750*d* with each of the neighbouring emissive regions 1910*a* and 1910*b*, in some non-limiting examples, the extent of overlap and/or in some non-limiting examples, a profile of overlap between the auxiliary electrode configuration 1750*d* and at least one of the neighbouring emissive regions 1910*a* and 1910*b* may be varied and/or modulated.

Figure 19:
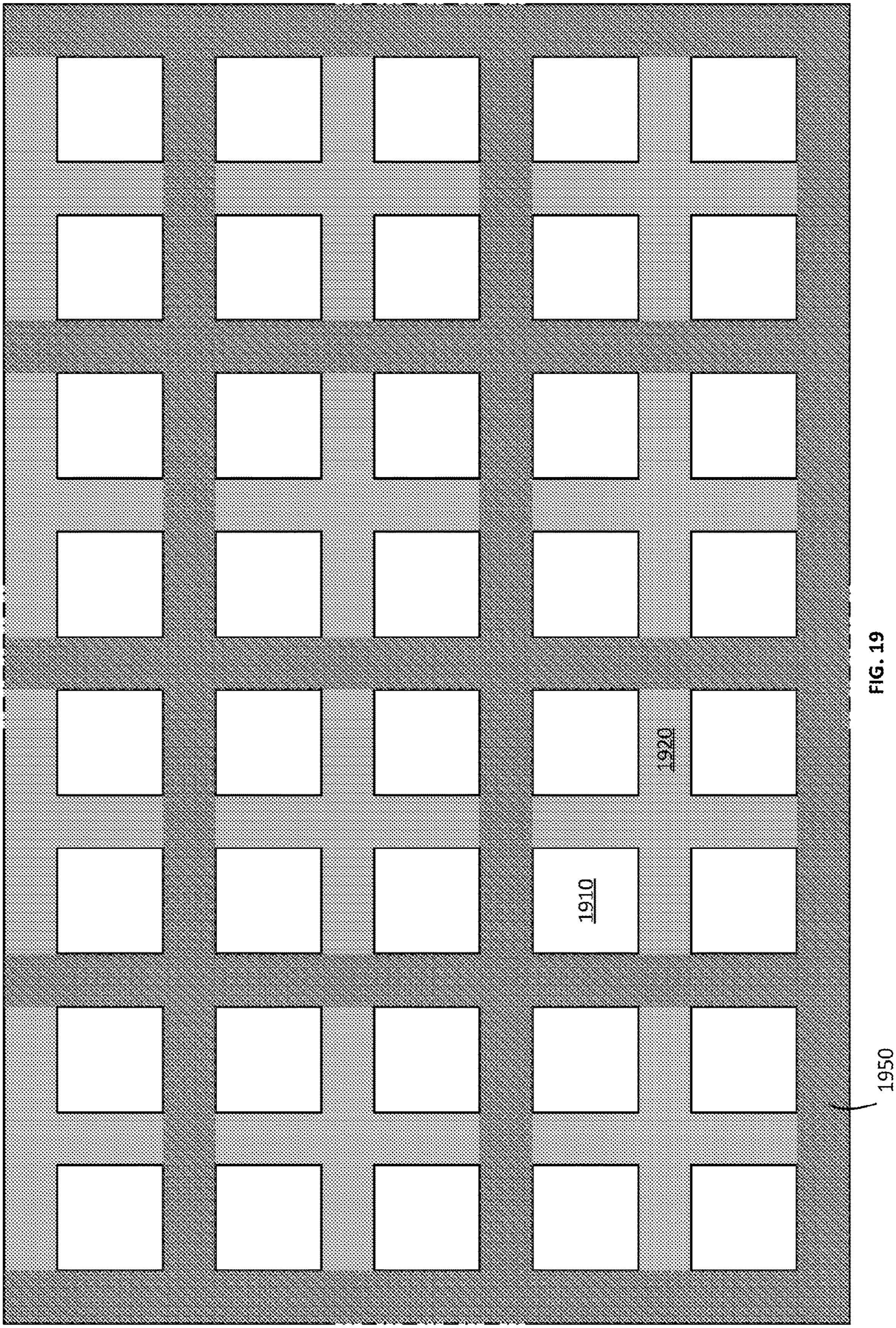
FIG. 19 is a schematic diagram illustrating, in plan view an example pattern of an auxiliary electrode overlaying at least one emissive region and at least one non-emissive region according to an example in the present disclosure.

FIG. 19 shows, in plan view, a schematic diagram showing an example of a pattern 1950 of the auxiliary electrode 1750 formed as a grid that is overlaid over both the lateral aspects 410 of emissive regions 1910, which may correspond to (sub-)pixel(s) 340/264*x* of an example version 1900 of device 100, and the lateral aspects 420 of non-emissive regions 1920 surrounding the emissive regions 1910.

In some non-limiting examples, the auxiliary electrode pattern 1950 extends substantially only over some but not all of the lateral aspects 420 of non-emissive regions 1920, so as not to substantially cover any of the lateral aspects 410 of the emissive regions 1910.

Those having ordinary skill in the relevant art will appreciate that while, in the FIGURE, the auxiliary electrode pattern 1950 is shown as being formed as a continuous structure such that all elements thereof are both physically connected and electrically coupled with one another and electrically coupled to at least one electrode 120, 140, 1750, 4150, which in some non-limiting examples may be the first electrode 120 and/or the second electrode 140, in some non-limiting examples, the auxiliary electrode pattern 1950 may be provided as a plurality of discrete elements of the auxiliary electrode pattern 1950 that, while remaining electrically coupled to one another, are not physically connected to one another. Even so, such discrete elements of the auxiliary electrode pattern 1950 may still substantially lower a sheet resistance of the at least one electrode 120, 140, 1750, 4150 with which they are electrically coupled, and consequently of the device 1900, so as to increase an efficiency of the device 1900 without substantially interfering with its optical characteristics.

In some non-limiting examples, auxiliary electrodes 1750 may be employed in devices 100 with a variety of arrangements of (sub-)pixel(s) 340/264*x*. In some non-limiting examples, the (sub-)pixel 340/264*x* arrangement may be substantially diamond-shaped.

Figure 20A:
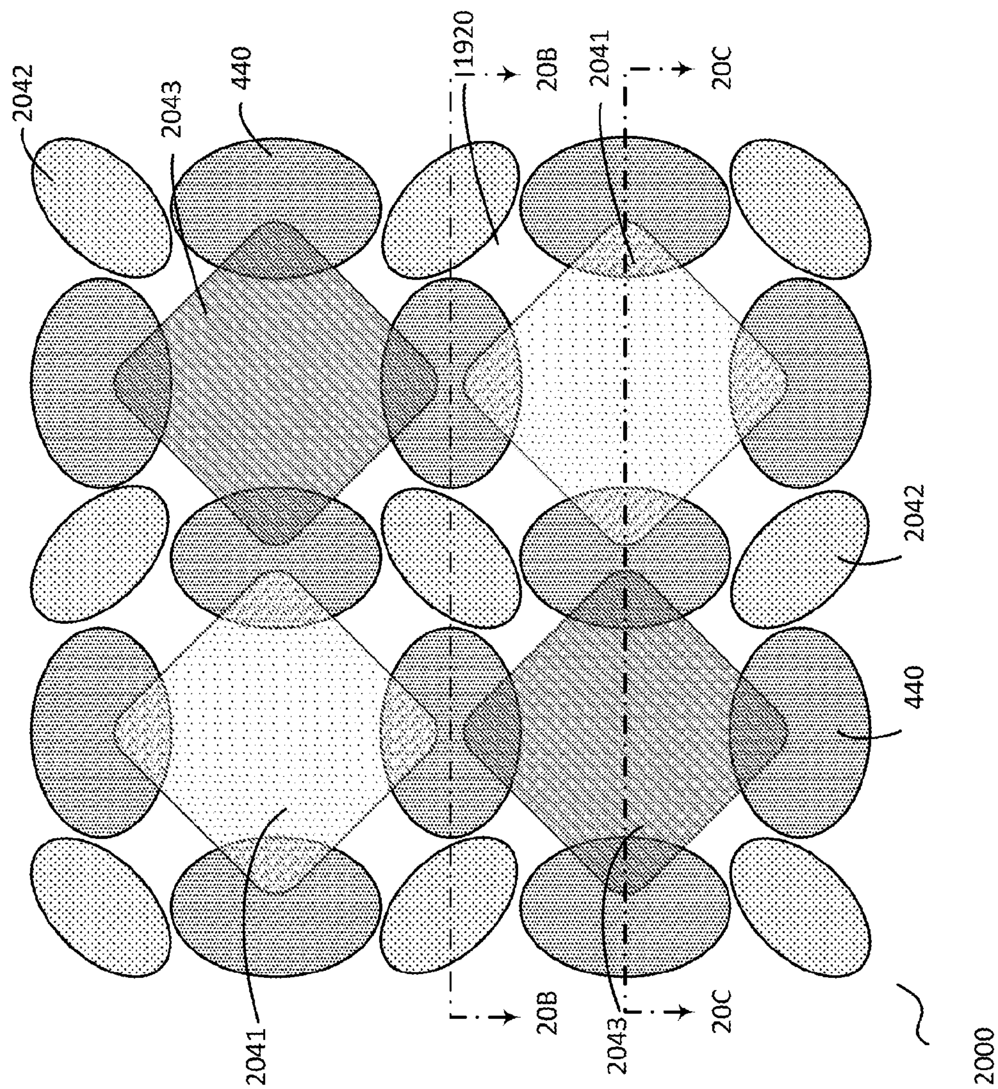
FIG. 20A is a schematic diagram illustrating, in plan view, an example pattern of an example version of the device of FIG. 1, having a plurality of groups of emissive regions in a diamond configuration according to an example in the present disclosure.

By way of non-limiting example, FIG. 20A shows, in plan view, in an example version 2000 of device 100, a plurality of groups 2041-2043 of emissive regions 1910 each corresponding to a sub-pixel 264*x*, surrounded by the lateral aspects of a plurality of non-emissive regions 1920 comprising PDLs 440 in a diamond configuration. In some non-limiting examples, the configuration is defined by patterns 2041-2043 of emissive regions 1910 and PDLs 440 in an alternating pattern of first and second rows.

In some non-limiting examples, the lateral aspects 420 of the non-emissive regions 1920 comprising PDLs 440 may be substantially elliptically-shaped. In some non-limiting examples, the major axes of the lateral aspects 420 of the non-emissive regions 1920 in the first row are aligned and substantially normal to the major axes of the lateral aspects 420 of the non-emissive regions 1920 in the second row. In some non-limiting examples, the major axes of the lateral aspects 420 of the non-emissive regions 1920 in the first row are substantially parallel to an axis of the first row.

In some non-limiting examples, a first group 2041 of emissive regions 1910 correspond to sub-pixels 264*x* that emit light at a first wavelength, in some non-limiting examples the sub-pixels 264*x* of the first group 2041 may correspond to red (R) sub-pixels 2641. In some non-limiting examples, the lateral aspects 410 of the emissive regions 1910 of the first group 2041 may have a substantially diamond-shaped configuration. In some non-limiting examples, the emissive regions 1910 of the first group 2041 lie in the pattern of the first row, preceded and followed by PDLs 440. In some non-limiting examples, the lateral aspects 410 of the emissive regions 1910 of the first group 2041 slightly overlap the lateral aspects 420 of the preceding and following non-emissive regions 1920 comprising PDLs 440 in the same row, as well as of the lateral aspects 420 of adjacent non-emissive regions 1920 comprising PDLs 440 in a preceding and following pattern of the second row.

In some non-limiting examples, a second group 2042 of emissive regions 1910 correspond to sub-pixels 264*x* that emit light at a second wavelength, in some non-limiting examples the sub-pixels 264*x* of the second group 2042 may correspond to green (G) sub-pixels 2642. In some non-limiting examples, the lateral aspects 410 of the emissive regions 1910 of the second group 2041 may have a substantially elliptical configuration. In some non-limiting examples, the emissive regions 1910 of the second group 2041 lie in the pattern of the second row, preceded and followed by PDLs 440. In some non-limiting examples, the major axis of some of the lateral aspects 410 of the emissive regions 1910 of the second group 2041 may be at a first angle, which in some non-limiting examples, may be 45° relative to an axis of the second row. In some non-limiting examples, the major axis of others of the lateral aspects 410 of the emissive regions 1910 of the second group 2041 may be at a second angle, which in some non-limiting examples may be substantially normal to the first angle. In some non-limiting examples, the emissive regions 1910 of the first group 2041, whose lateral aspects 410 have a major axis at the first angle, alternate with the emissive regions 1910 of the first group 2041, whose lateral aspects 410 have a major axis at the second angle.

In some non-limiting examples, a third group 2043 of emissive regions 1910 correspond to sub-pixels 264*x* that emit light at a third wavelength, in some non-limiting examples the sub-pixels 264*x* of the third group 2043 may correspond to blue (B) sub-pixels 2643. In some non-limiting examples, the lateral aspects 410 of the emissive regions 1910 of the third group 2043 may have a substantially diamond-shaped configuration. In some non-limiting examples, the emissive regions 1910 of the third group 2043 lie in the pattern of the first row, preceded and followed by PDLs 440. In some non-limiting examples, the lateral aspects 410 of the emissive regions 1910 of the third group 2043 slightly overlap the lateral aspects 410 of the preceding and following non-emissive regions 1920 comprising PDLs 440 in the same row, as well as of the lateral aspects 420 of adjacent non-emissive regions 1920 comprising PDLs 440 in a preceding and following pattern of the second row. In some non-limiting examples, the pattern of the second row comprises emissive regions 1910 of the first group 2041 alternating emissive regions 1910 of the third group 2043, each preceded and followed by PDLs 440.

Figure 20B:
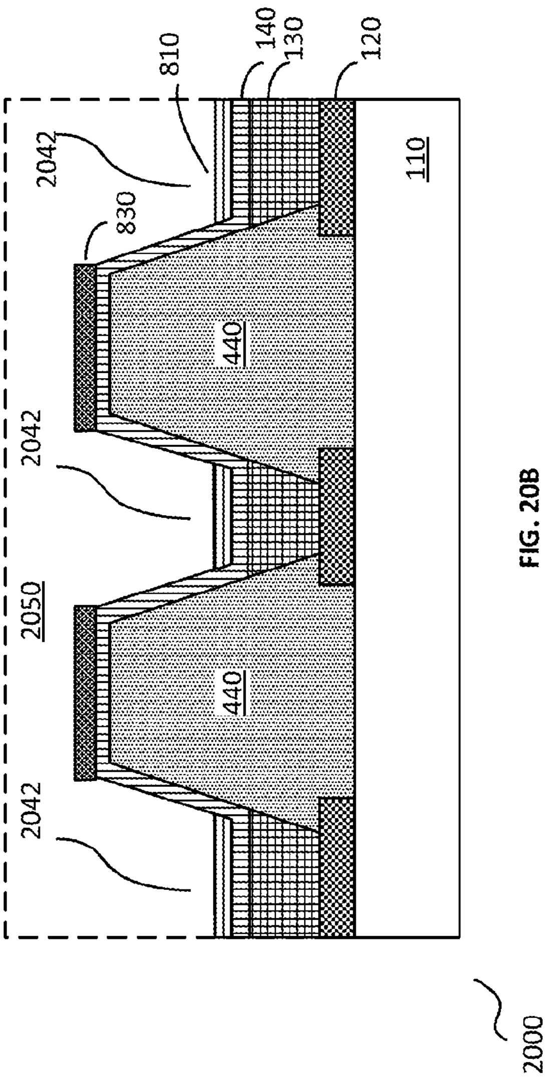
FIG. 20B is a schematic diagram illustrating an example cross-sectional view of the device of FIG. 20A taken along line 20B-20B.

Turning now to FIG. 20B, there is shown an example cross-sectional view of the device 2000, taken along line 20B-20B in FIG. 20A. In the FIGURE, the device 2000 is shown as comprising a substrate 110 and a plurality of elements of a first electrode 120, formed on an exposed layer surface 111 thereof. The substrate 110 may comprise the base substrate 112 (not shown for purposes of simplicity of illustration) and/or at least one TFT structure 200, corresponding to and for driving each sub-pixel 264*x*. PDLs 440 are formed over the substrate 110 between elements of the first electrode 120, to define emissive region(s) 1910 over each element of the first electrode 120, separated by non-emissive region(s) 1920 comprising the PDL(s) 440. In the FIGURE, the emissive region(s) 1910 all correspond to the second group 2042.

In some non-limiting examples, at least one semiconducting layer 130 is deposited on each element of the first electrode 120, between the surrounding PDLs 440.

In some non-limiting examples, a second electrode 140, which in some non-limiting examples, may be a common cathode, may be deposited over the emissive region(s) 1910 of the second group 2042 to form the G(reen) sub-pixel(s) 2642 thereof and over the surrounding PDLs 440.

In some non-limiting examples, an NIC 810 is selectively deposited over the second electrode 140 across the lateral aspects 410 of the emissive region(s) 1910 of the second group 2042 of G(reen) sub-pixels 2642 to allow selective deposition of a conductive coating 830 over parts of the second electrode 140 that is substantially devoid of the NIC 810, namely across the lateral aspects 420 of the non-emissive region(s) 1920 comprising the PDLs 440. In some non-limiting examples, the conductive coating 830 may tend to accumulate along the substantially planar parts of the PDLs 440, as the conductive coating 830 may not tend to remain on the inclined parts of the PDLs 440, but tends to descend to a base of such inclined parts, which are coated with the NIC 810. In some non-limiting examples, the conductive coating 830 on the substantially planar parts of the PDLs 440 may form at least one auxiliary electrode 1750 that may be electrically coupled to the second electrode 140.

In some non-limiting examples, the device 2000 may comprise a capping layer and/or an outcoupling layer. By way of non-limiting example, such capping layer and/or outcoupling layer may be provided directly on a surface of the second electrode 140 and/or a surface of the NIC 810. In some non-limiting examples, such capping layer and/or outcoupling layer may be provided across the lateral aspect 410 of at least one emissive region 1910 corresponding to a (sub-) pixel 340/264*x*.

In some non-limiting examples, the NIC 810 may also act as an index-matching coating. In some non-limiting examples, the NIC 810 may also act as an outcoupling layer.

In some non-limiting examples, the device 2000 comprises an encapsulation layer. Non-limiting examples of such encapsulation layer include a glass cap, a barrier film, a barrier adhesive and/or a TFE layer 2050 such as shown in dashed outline in the FIGURE, provided to encapsulate the device 2000. In some non-limiting examples, the TFE layer 2050 may be considered a type of barrier coating 1650.

In some non-limiting examples, the encapsulation layer may be arranged above at least one of the second electrode 140 and/or the NIC 810. In some non-limiting example, the device 2000 comprises additional optical and/or structural layers, coatings and components, including without limitation, a polarizer, a color filter, an anti-reflection coating, an anti-glare coating, cover class and/or an optically-clear adhesive (OCA).

Figure 20C:
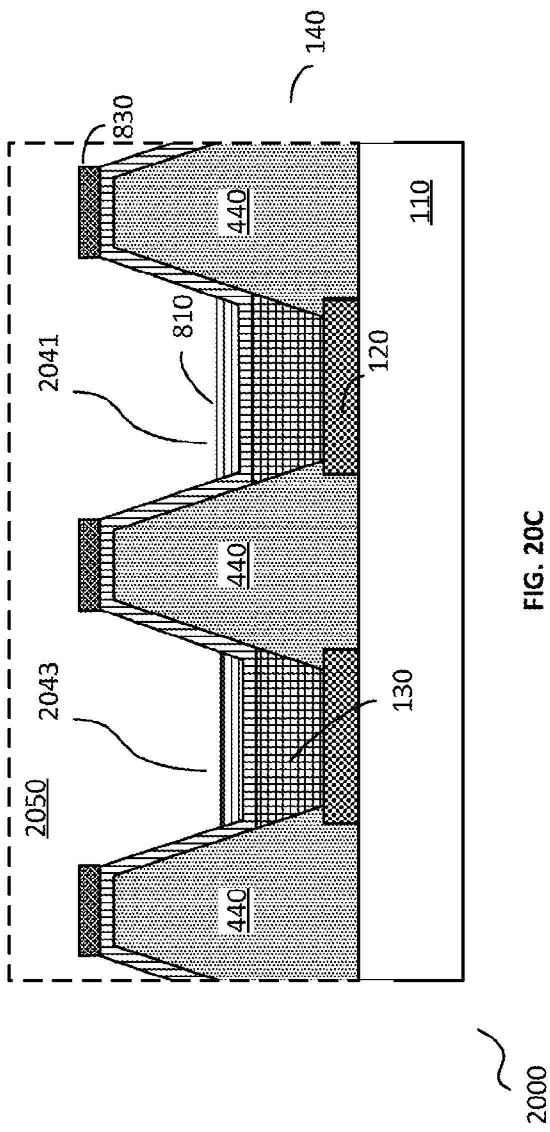
FIG. 20C is a schematic diagram illustrating an, example cross-sectional view of the device of FIG. 20A taken along line 20C-20C.

Turning now to FIG. 20C, there is shown an example cross-sectional view of the device 2000, taken along line 20C-20C in FIG. 20A. In the FIGURE, the device 2000 is shown as comprising a substrate 110 and a plurality of elements of a first electrode 120, formed on an exposed layer surface 111 thereof. PDLs 440 are formed over the substrate 110 between elements of the first electrode 120, to define emissive region(s) 1910 over each element of the first electrode 120, separated by non-emissive region(s) 1920 comprising the PDL(s) 440. In the figure, the emissive region(s) 1910 correspond to the first group 2041 and to the third group 2043 in alternating fashion.

In some non-limiting examples, at least one semiconducting layer 130 is deposited on each element of the first electrode 120, between the surrounding PDLs 440.

In some non-limiting examples, a second electrode 140, which in some non-limiting examples, may be a common cathode, may be deposited over the emissive region(s) 1910 of the first group 2041 to form the R(ed) sub-pixel(s) 2641 thereof, over the emissive region(s) 1910 of the third group 2043 to form the B(lue) sub-pixel(s) 2643 thereof, and over the surrounding PDLs 440.

In some non-limiting examples, an NIC 810 is selectively deposited over the second electrode 140 across the lateral aspects 410 of the emissive region(s) 1910 of the first group 2041 of R(ed) sub-pixels 2641 and of the third group of B(lue) sub-pixels 2643 to allow selective deposition of a conductive coating 830 over parts of the second electrode 140 that is substantially devoid of the NIC 810, namely across the lateral aspects 420 of the non-emissive region(s) 1920 comprising the PDLs 440. In some non-limiting examples, the conductive coating 830 may tend to accumulate along the substantially planar parts of the PDLs 440, as the conductive coating 830 may not tend to remain on the inclined parts of the PDLs 440, but tends to descend to a base of such inclined parts, which are coated with the NIC 810. In some non-limiting examples, the conductive coating 830 on the substantially planar parts of the PDLs 440 may form at least one auxiliary electrode 1750 that may be electrically coupled to the second electrode 140.

Figure 21:
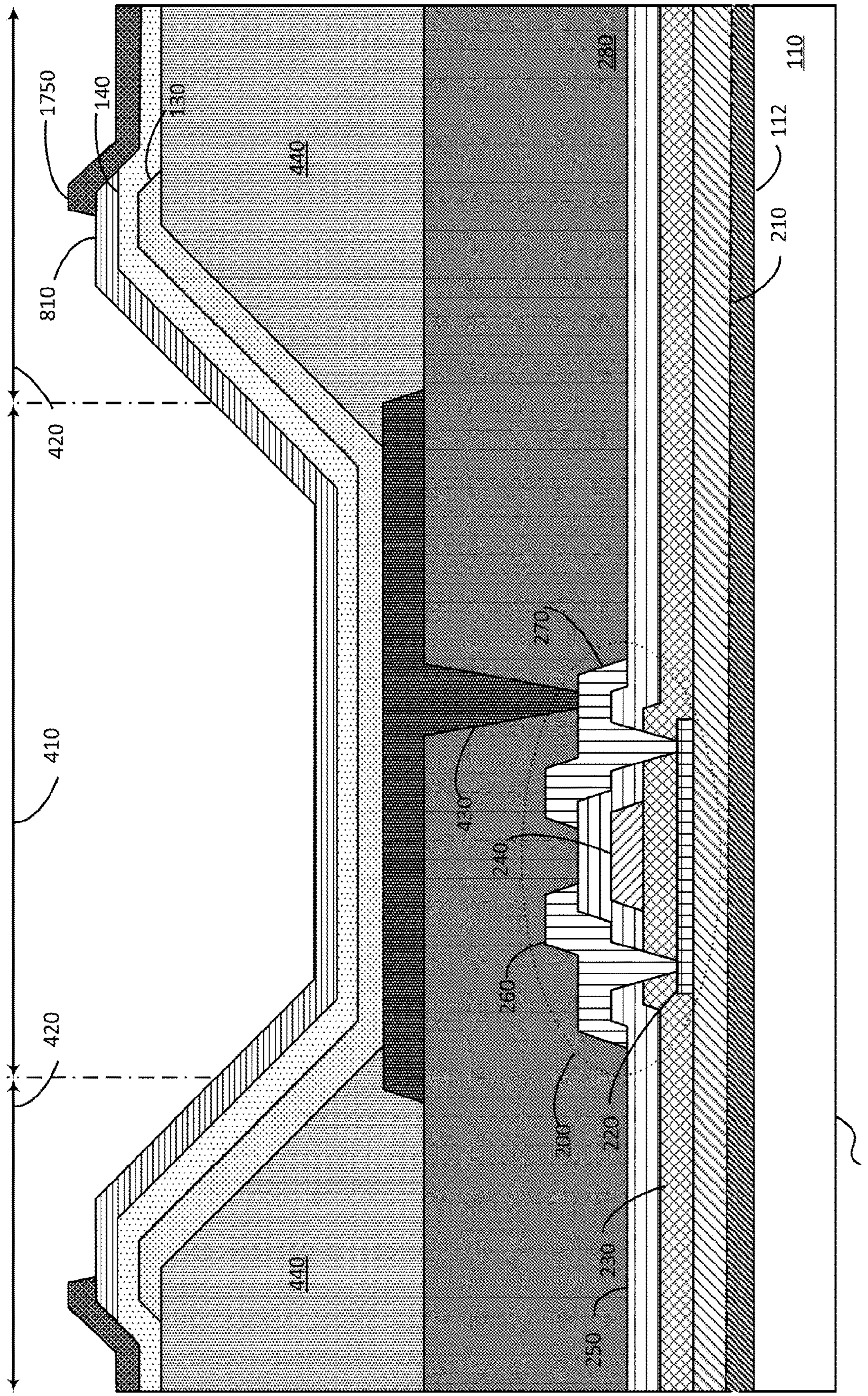
FIG. 21 is a schematic diagram illustrating an example cross-sectional view of an example version of the device of FIG. 4 with additional example deposition steps according to an example in the present disclosure.

Turning now to FIG. 21, there is shown an example version 2100 of the device 100, which encompasses the device 100 shown in cross-sectional view in FIG. 4, but with a number of additional deposition steps that are described herein.

The device 2100 shows an NIC 810 selectively deposited over the exposed layer surface 111 of the underlying material, in the FIGURE, the second electrode 140, within a first portion of the device 2100, corresponding substantially to the lateral aspect 410 of emissive region(s) 1910 corresponding to (sub-)pixel(s) 340/264*x* and not within a second portion of the device 2100, corresponding substantially to the lateral aspect(s) 420 of non-emissive region(s) 1920 surrounding the first portion.

In some non-limiting examples, the NIC 810 may be selectively deposited using a shadow mask.

The NIC 810 provides, within the first portion, a surface with a relatively low initial sticking probability $S_0$ for a conductive coating 830 to be thereafter deposited on form an auxiliary electrode 1750.

After selective deposition of the NIC 810, the conductive coating 830 is deposited over the device 2100 but remains substantially only within the second portion, which is substantially devoid of NIC 810, to form the auxiliary electrode 1750.

In some non-limiting examples, the conductive coating 830 may be deposited using an open mask and/or a mask-free deposition process.

The auxiliary electrode 1750 is electrically coupled to the second electrode 140 so as to reduce a sheet resistance of the second electrode 140, including, as shown, by lying above and in physical contact with the second electrode 140 across the second portion that is substantially devoid of NIC 810.

In some non-limiting examples, the conductive coating 830 may comprise substantially the same material as the second electrode 140, to ensure a high initial sticking probability $S_0$ for the conductive coating 830 in the second portion.

In some non-limiting examples, the second electrode 140 may comprise substantially pure Mg and/or an alloy of Mg and another metal, including without limitation, Ag. In some non-limiting examples, an Mg:Ag alloy composition may range from about 1:9 to about 9:1 by volume. In some non-limiting examples, the second electrode 140 may comprise metal oxides, including without limitation, ternary metal oxides, such as, without limitation, ITO and/or IZO, and/or a combination of metals and/or metal oxides.

In some non-limiting examples, the conductive coating 830 used to form the auxiliary electrode 1750 may comprise substantially pure Mg.

Figure 22:
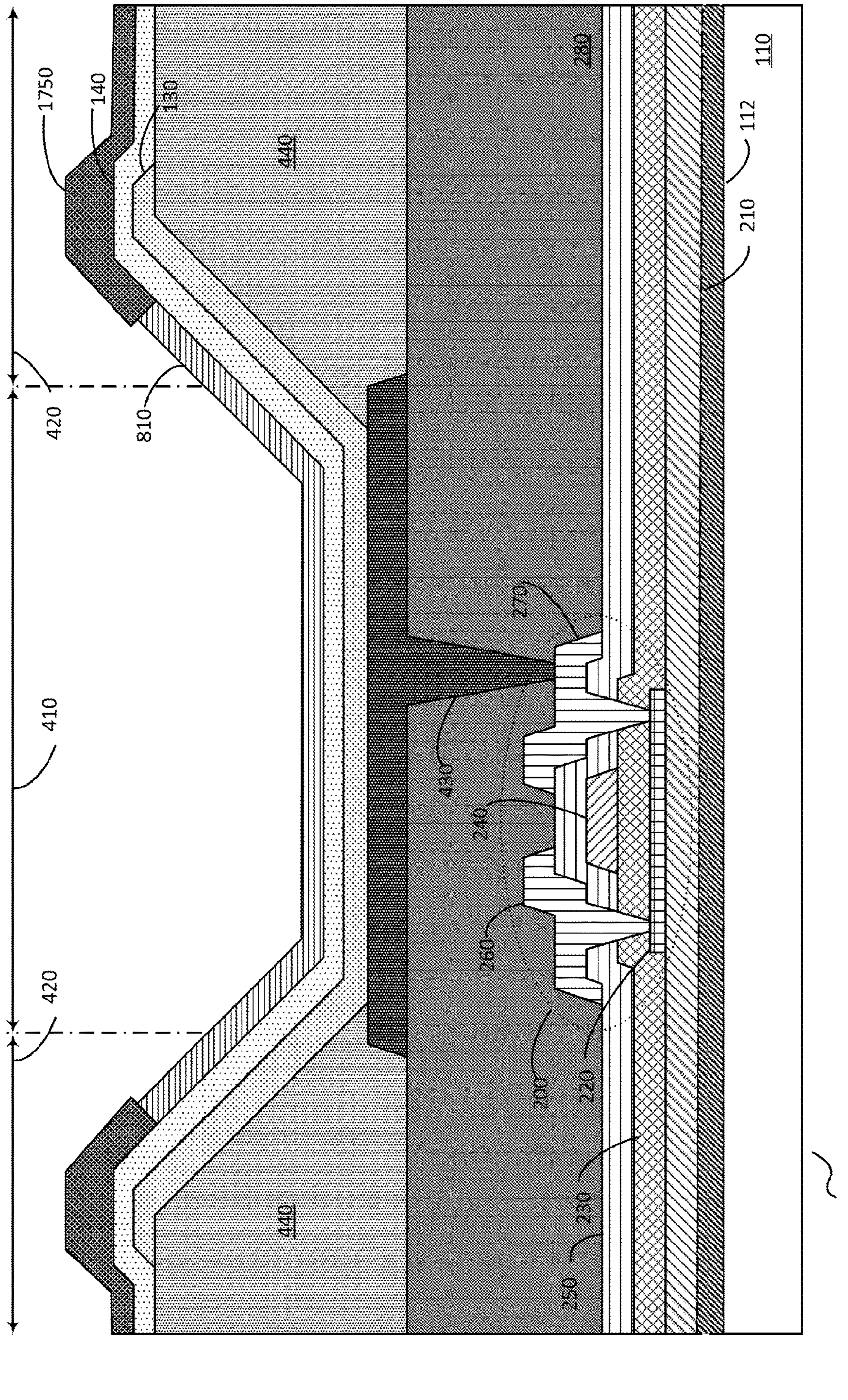
FIG. 22 is a schematic diagram illustrating an example cross-sectional view of an example version of the device of FIG. 4 with additional example deposition steps according to an example in the present disclosure.

Turning now to FIG. 22, there is shown an example version 2200 of the device 100, which encompasses the device 100 shown in cross-sectional view in FIG. 4, but with a number of additional deposition steps that are described herein.

The device 2200 shows an NIC 810 selectively deposited over the exposed layer surface 111 of the underlying material, in the FIGURE, the second electrode 140, within a first portion of the device 2200, corresponding substantially to a part of the lateral aspect 410 of emissive region(s) 1910 corresponding to (sub-) pixel(s) 340/264*x*, and not within a second portion. In the FIGURE, the first portion extends partially along the extent of an inclined part of the PDLs 440 defining the emissive region(s) 1910.

In some non-limiting examples, the NIC 810 may be selectively deposited using a shadow mask.

The NIC 810 provides, within the first portion, a surface with a relatively low initial sticking probability $S_0$ for a conductive coating 830 to be thereafter deposited on form an auxiliary electrode 1750.

After selective deposition of the NIC 810, the conductive coating 830 is deposited over the device 2200 but remains substantially only within the second portion, which is substantially devoid of NIC 810, to form the auxiliary electrode 1750. As such, in the device 2200, the auxiliary electrode 1750 extends partly across the inclined part of the PDLs 440 defining the emissive region(s) 1910.

In some non-limiting examples, the conductive coating 830 may be deposited using an open mask and/or a mask-free deposition process.

The auxiliary electrode 1750 is electrically coupled to the second electrode 140 so as to reduce a sheet resistance of the second electrode 140, including, as shown, by lying above and in physical contact with the second electrode 140 across the second portion that is substantially devoid of NIC 810.

In some non-limiting examples, the material of which the second electrode 140 may be comprised, may not have a high initial sticking probability $S_0$ for the conductive coating 830.

Figure 23:
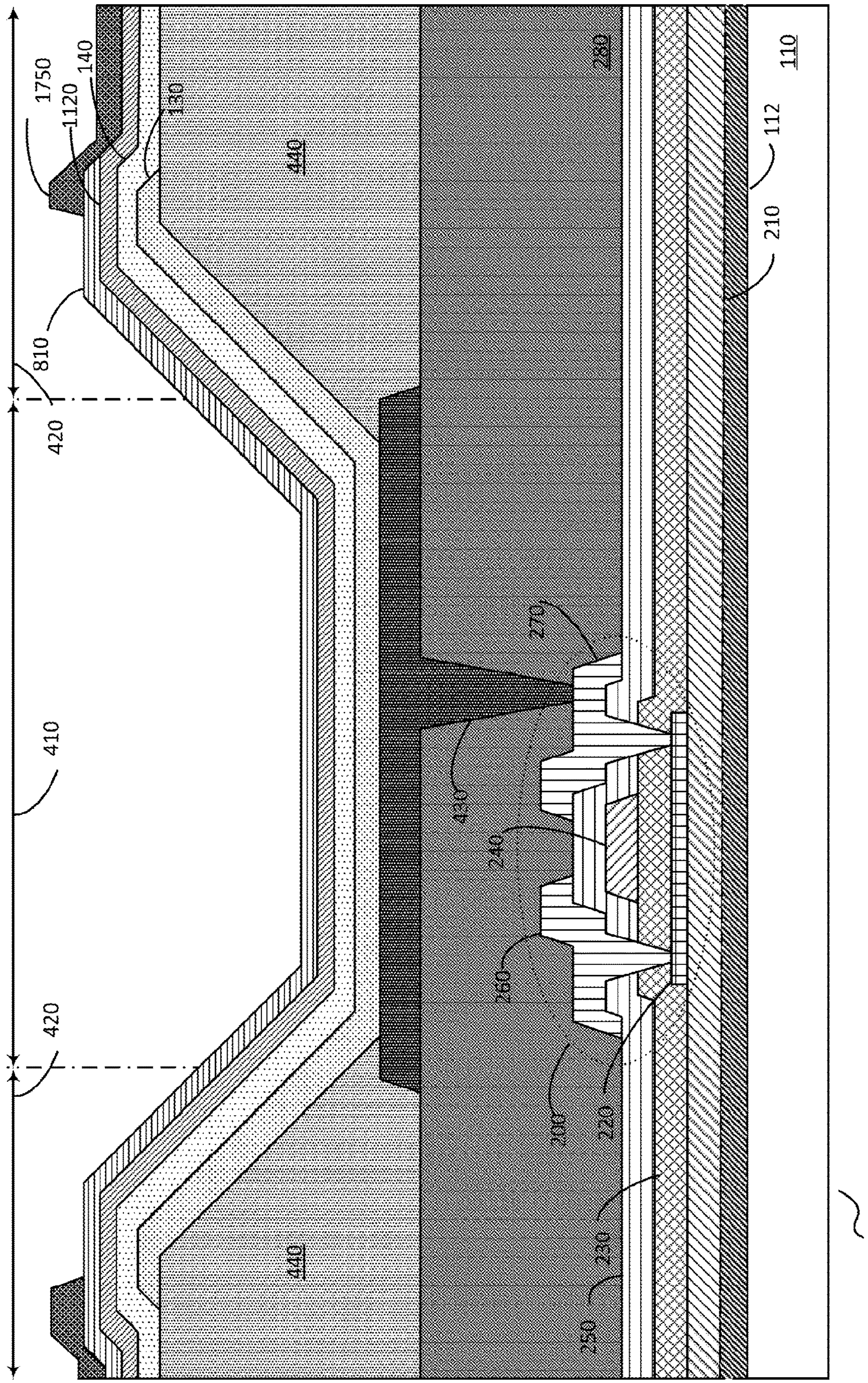
FIG. 23 is a schematic diagram illustrating an example cross-sectional view of an example version of the device of FIG. 4 with additional example deposition steps according to an example in the present disclosure.

FIG. 23 illustrates such a scenario, in which there is shown an example version 2300 of the device 100, which encompasses the device 100 shown in cross-sectional view in FIG. 4, but with a number of additional deposition steps that are described herein.

The device 2300 shows an NPC 1120 deposited over the exposed layer surface 111 of the underlying material, in the FIGURE, the second electrode 140.

In some non-limiting examples, the NPC 1120 may be deposited using an open mask and/or a mask-free deposition process.

Thereafter, an NIC 810 is deposited selectively deposited over the exposed layer surface 111 of the underlying material, in the FIGURE, the NPC 1120, within a first portion of the device 2300, corresponding substantially to a part of the lateral aspect 410 of emissive region(s) 1910 corresponding to (sub-)pixel(s) 340/264*x*, and not within a second portion of the device 2300, corresponding substantially to the lateral aspect(s) 420 of non-emissive region(s) 1920 surrounding the first portion.

In some non-limiting examples, the NIC 810 may be selectively deposited using a shadow mask.

The NIC 810 provides, within the first portion, a surface with a relatively low initial sticking probability $S_0$ for a conductive coating 830 to be thereafter deposited on form an auxiliary electrode 1750.

After selective deposition of the NIC 810, the conductive coating 830 is deposited over the device 2300 but remains substantially only within the second portion, which is substantially devoid of NIC 810, to form the auxiliary electrode 1750.

In some non-limiting examples, the conductive coating 830 may be deposited using an open mask and/or a mask-free deposition process.

The auxiliary electrode 1750 is electrically coupled to the second electrode 140 so as to reduce a sheet resistance thereof. While, as shown, the auxiliary electrode 1750 is not lying above and in physical contact with the second electrode 140, those having ordinary skill in the relevant art will nevertheless appreciate that the auxiliary electrode 1750 may be electrically coupled to the second electrode 140 by a number of well-understood mechanisms. By way of non-limiting example, the presence of a relatively thin film (in some non-limiting examples, of up to about 50 nm) of an NIC 810 and/or an NPC 1120 may still allow a current to pass therethrough, thus allowing a sheet resistance of the second electrode 140 to be reduced.

Figure 24:
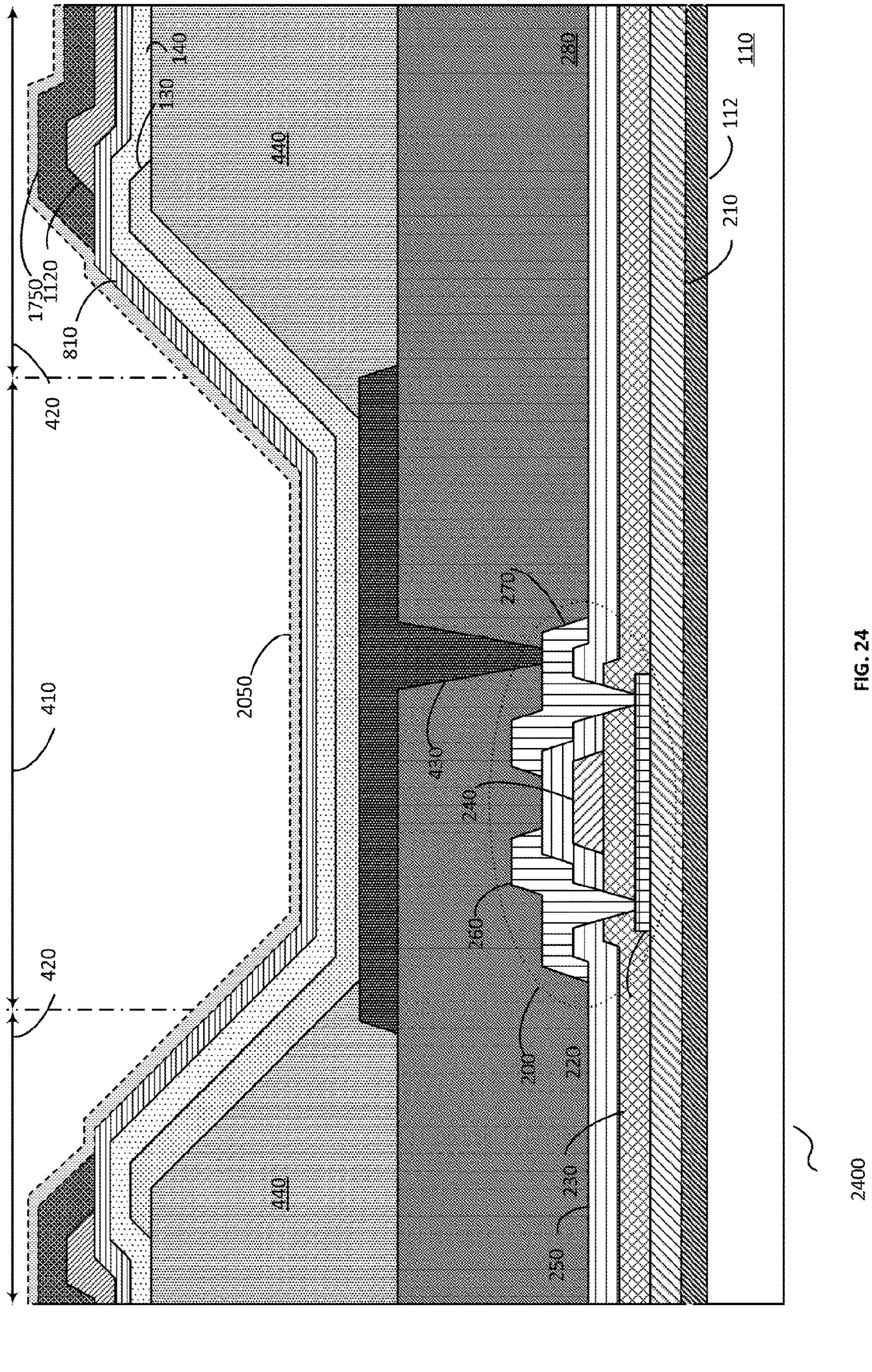
FIG. 24 is a schematic diagram illustrating an example cross-sectional view of an example version of the device of FIG. 4 with additional example deposition steps according to an example in the present disclosure.

Turning now to FIG. 24, there is shown an example version 2400 of the device 100, which encompasses the device 100 shown in cross-sectional view in FIG. 4, but with a number of additional deposition steps that are described herein.

The device 2400 shows an NIC 810 deposited over the exposed layer surface 111 of the underlying material, in the FIGURE, the second electrode 140.

In some non-limiting examples, the NIC 810 may be deposited using an open mask and/or a mask-free deposition process.

The NIC 810 provides a surface with a relatively low initial sticking probability $S_0$ for a conductive coating 830 to be thereafter deposited on form an auxiliary electrode 1750.

After deposition of the NIC 810, an NPC 1120 is selectively deposited over the exposed layer surface 111 of the underlying material, in the FIGURE, the NIC 810, within a NPC portion of the device 2400, corresponding substantially to a part of the lateral aspect 420 of non-emissive region(s) 1920 surrounding a second portion of the device 2400, corresponding substantially to the lateral aspect(s) 410 of emissive region(s) 1910 corresponding to (sub-)pixel(s) 340/264*x*.

In some non-limiting examples, the NPC 1120 may be selectively deposited using a shadow mask.

The NPC 1120 provides, within the first portion, a surface with a relatively high initial sticking probability $S_0$ for a conductive coating 830 to be thereafter deposited on form an auxiliary electrode 1750.

After selective deposition of the NPC 1120, the conductive coating 830 is deposited over the device 2400 but remains substantially only within the NPC portion, in which the NIC 810 has been overlaid with the NPC 1120, to form the auxiliary electrode 1750.

In some non-limiting examples, the conductive coating 830 may be deposited using an open mask and/or a mask-free deposition process.

The auxiliary electrode 1750 is electrically coupled to the second electrode 140 so as to reduce a sheet resistance of the second electrode 140.

Removal of Selective Coatings

In some non-limiting examples, the NIC 810 may be removed subsequent to deposition of the conductive coating 830, such that at least a part of a previously exposed layer surface 111 of an underlying material covered by the NIC 810 may become exposed once again. In some non-limiting examples, the NIC 810 may be selectively removed by etching and/or dissolving the NIC 810 and/or by employing plasma and/or solvent processing techniques that do not substantially affect or erode the conductive coating 830.

Figures 25A, 25B, 25C:
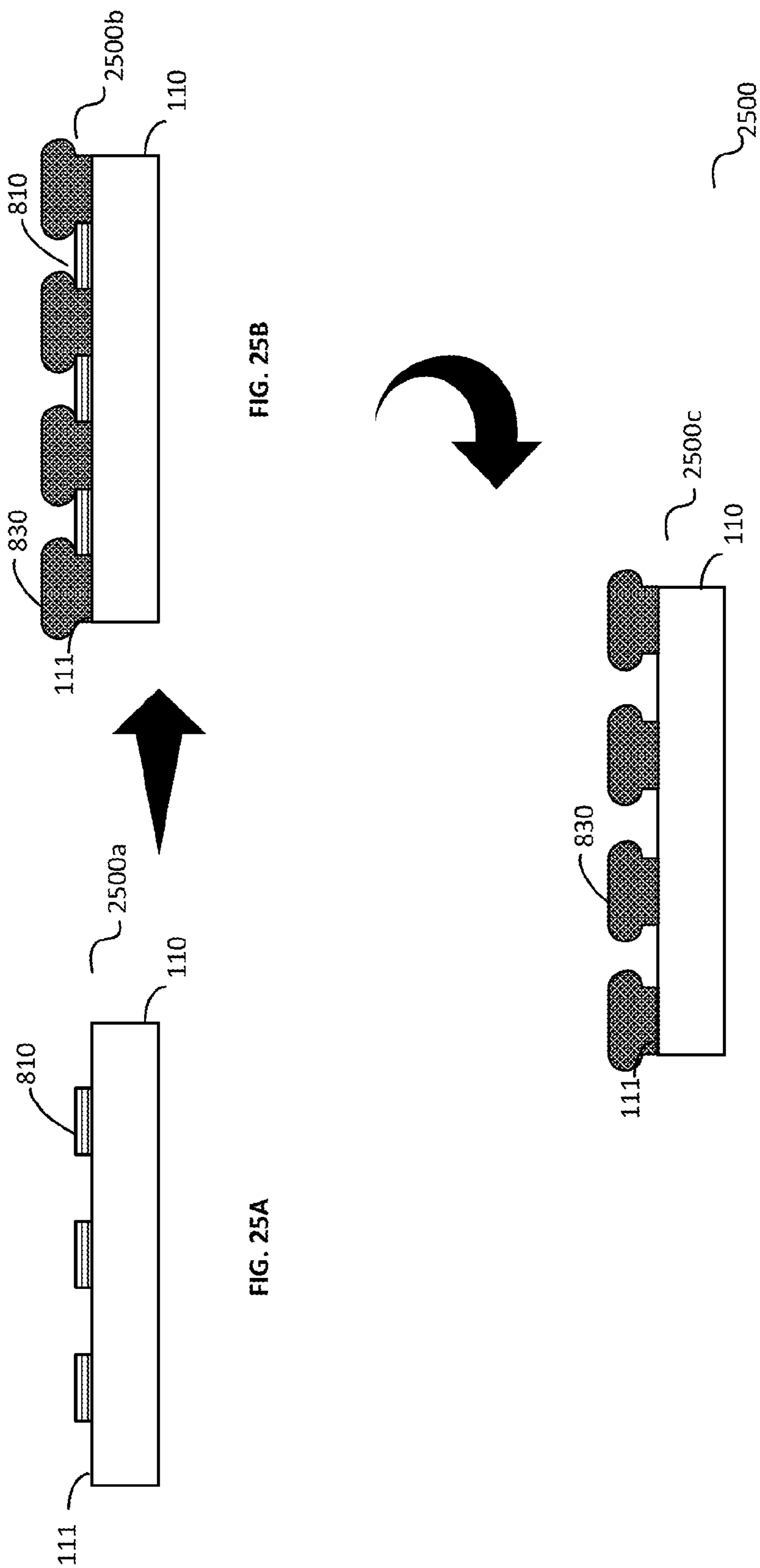
FIGS. 25A-25C are schematic diagrams that show example stages of an example process for depositing a conductive coating in a pattern on an exposed layer surface of an example version of the device of FIG. 1, by selective deposition and subsequent removal process, according to an example in the present disclosure.

Turning now to FIG. 25A, there is shown an example cross-sectional view of an example version 2500 of the device 100, at a deposition stage 2500*a*, in which an NIC 810 has been selectively deposited on a first portion of an exposed layer surface 111 of an underlying material. In the FIGURE, the underlying material may be the substrate 110.

In FIG. 25B, the device 2500 is shown at a deposition stage 2500*b*, in which a conductive coating 830 is deposited on the exposed layer surface 111 of the underlying material, that is, on both the exposed layer surface 111 of NIC 810 where the NIC 810 has been deposited during the stage 2500*a*, as well as the exposed layer surface 111 of the substrate 110 where that NIC 810 has not been deposited during the stage 2500*a*. Because of the nucleation-inhibiting properties of the first portion where the NIC 810 was disposed, the conductive coating 830 disposed thereon tends not to remain, resulting in a pattern of selective deposition of the conductive coating 830, that corresponds to a second portion, leaving the first portion substantially devoid of the conductive coating.

In FIG. 25C, the device 2500 is shown at a deposition stage 2500*c*, in which the NIC 810 has been removed from the first portion of the exposed layer surface 111 of the substrate 110, such that the conductive coating 830 deposited during the stage 2500*b* remains on the substrate 110 and regions of the substrate 110 on which the NIC 810 had been deposited during the stage 2500*a* are now exposed or uncovered.

In some non-limiting examples, the removal of the NIC 810 in the stage 2500*c* may be effected by exposing the device 2500 to a solvent and/or a plasma that reacts with and/or etches away the NIC 810 without substantially impacting the conductive coating 830.

Transparent OLED

Figure 26A:
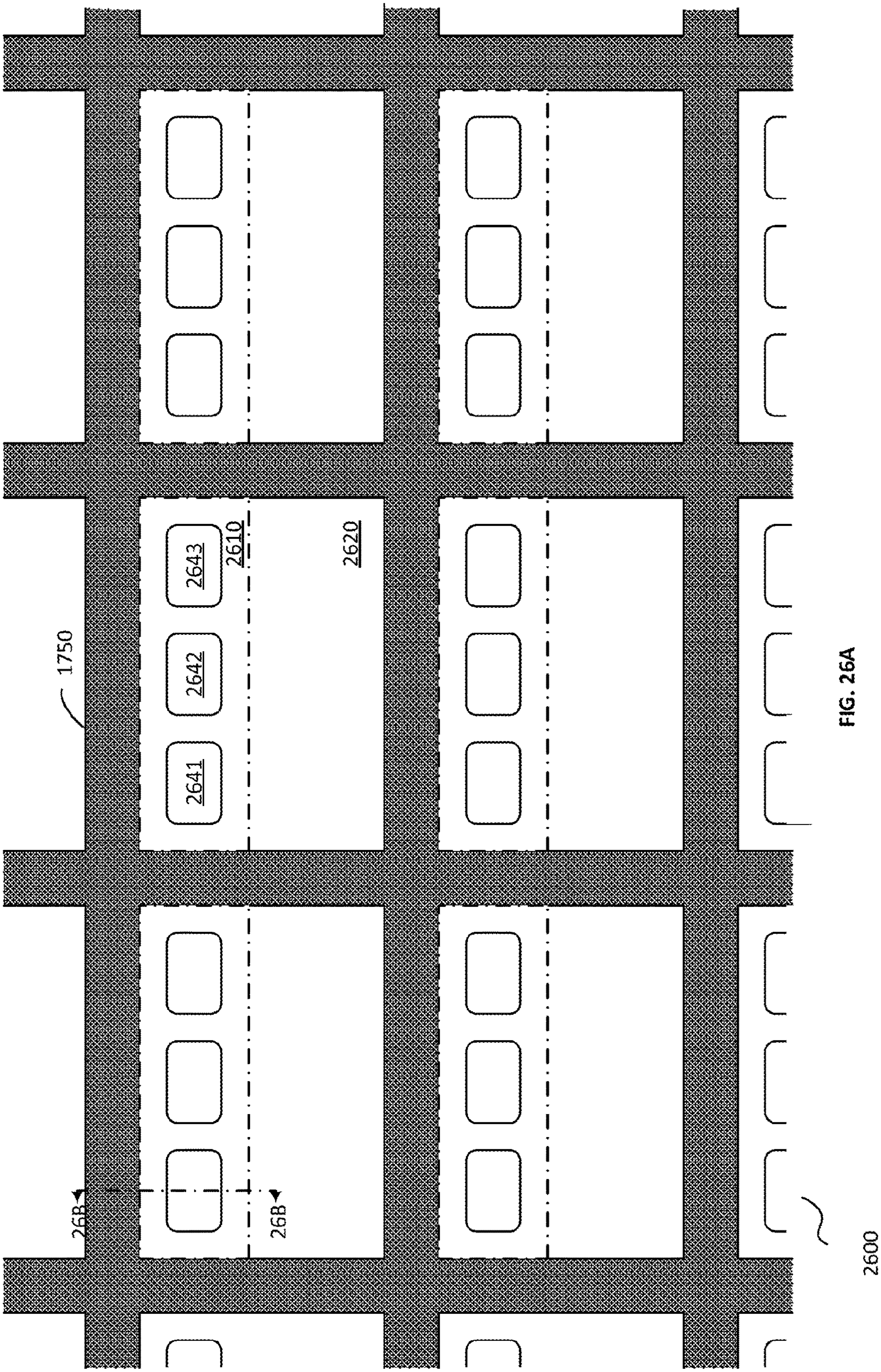
FIG. 26A is a schematic diagram illustrating, in plan view, an example of a transparent version of the device of FIG. 1 comprising at least one example pixel region and at least one example light-transmissive region, with at least one auxiliary electrode according to an example in the present disclosure.

Turning now to FIG. 26A, there is shown an example plan view of a transmissive (transparent) version, shown generally at 2600, of the device 100. In some non-limiting examples, the device 2600 is an AMOLED device having a plurality of pixel regions 2610 and a plurality of transmissive regions 2620. In some non-limiting examples, at least one auxiliary electrode 1750 may be deposited on an exposed layer surface 111 of an underlying material between the pixel region(s) 2610 and/or the transmissive region(s) 2620.

In some non-limiting examples, each pixel region 2610 may comprise a plurality of emissive regions 1910 each corresponding to a sub-pixel 264*x*. In some non-limiting examples, the sub-pixels 264*x* may correspond to, respectively, R(ed) sub-pixels 2641, G(reen) sub-pixels 2642 and/or B(lue) sub-pixels 2643.

In some non-limiting examples, each transmissive region 2620 is substantially transparent and allows light to pass through the entirety of a cross-sectional aspect thereof.

Figure 26B:
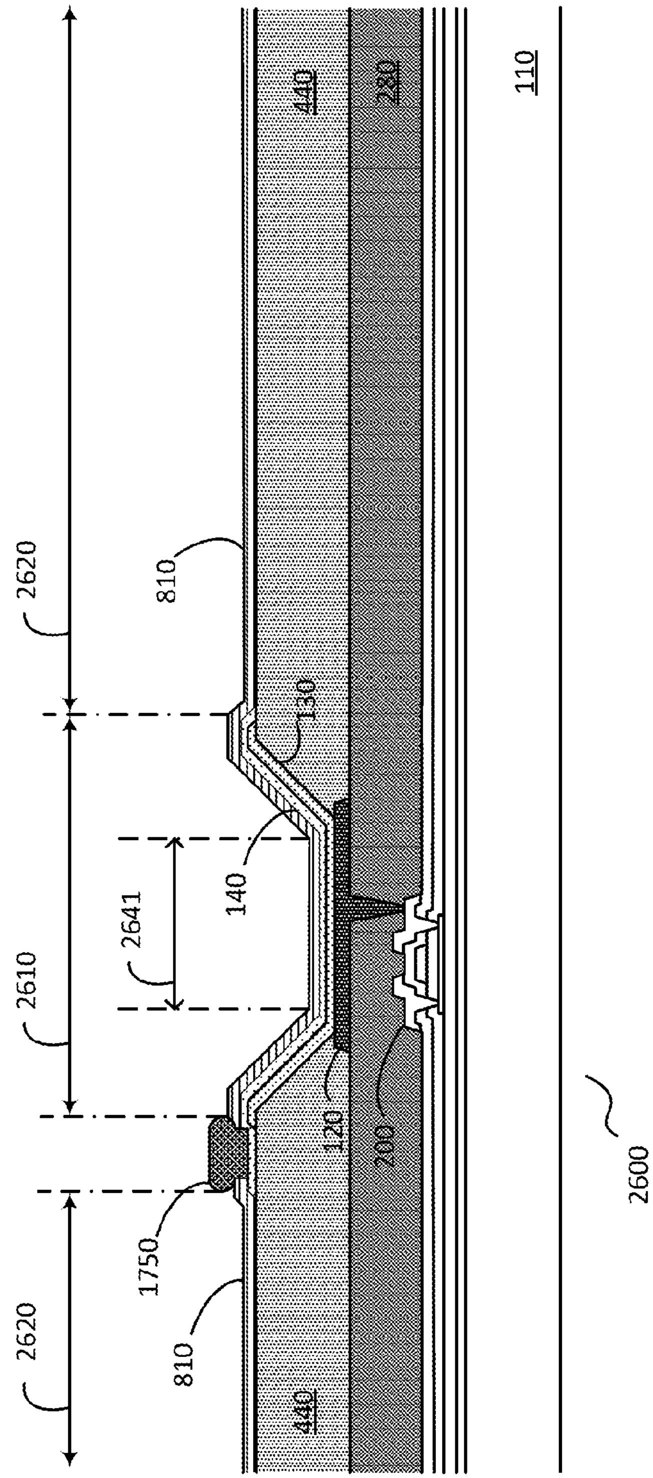
FIG. 26B is a schematic diagram illustrating an example cross-sectional view of the device of FIG. 26A taken along line 26B-26B.

Turning now to FIG. 26B, there is shown an example cross-sectional view of the device 2600, taken along line 26B-26B in FIG. 26A. In the FIGURE, the device 2600 is shown as comprising a substrate 110, a TFT insulating layer 280 and a first electrode 120 formed on a surface of the TFT insulating layer 280. The substrate 110 may comprise the base substrate 112 (not shown for purposes of simplicity of illustration) and/or at least one TFT structure 200, corresponding to and for driving each sub-pixel 264*x* positioned substantially thereunder and electrically coupled to the first electrode 120 thereof. PDL(s) 440 are formed in non-emissive regions 1920 over the substrate 110, to define emissive region(s) 1910 also corresponding to each sub-pixel 264*x*, over the first electrode 120 corresponding thereto. The PDL(s) 440 cover edges of the first electrode 120.

In some non-limiting examples, at least one semiconducting layer 130 is deposited over exposed region(s) of the first electrode 120 and, in some non-limiting examples, at least parts of the surrounding PDLs 440.

In some non-limiting examples, a second electrode 140 may be deposited over the at least one semiconducting layer(s) 130, including over the pixel region 2610 to form the sub-pixel(s) 264*x* thereof and, in some non-limiting examples, at least partially over the surrounding PDLs 440 in the transmissive region 2620.

In some non-limiting examples, an NIC 810 is selectively deposited over first portion(s) of the device 2600, comprising both the pixel region 2610 and the transmissive region 2620 but not the region of the second electrode 140 corresponding to the auxiliary electrode 1750.

In some non-limiting examples, the entire surface of the device 2600 is then exposed to a vapor flux of the conductive coating 830, which in some non-limiting examples may be Mg. The conductive coating 830 is selectively deposited over second portion(s) of the second electrode 140 that is substantially devoid of the NIC 810 to form an auxiliary electrode 1750 that is electrically coupled to and in some non-limiting examples, in physical contact with uncoated parts of the second electrode 140.

At the same time, the transmissive region 2620 of the device 2600 remains substantially devoid of any materials that may substantially affect the transmission of light therethrough. In particular, as shown in the FIGURE, the TFT structure 200 and the first electrode 120 are positioned, in a cross-sectional aspect, below the sub-pixel 264*x* corresponding thereto, and together with the auxiliary electrode 1750, lie beyond the transmissive region 2620. As a result, these components do not attenuate or impede light from being transmitted through the transmissive region 2620. In some non-limiting examples, such arrangement allows a viewer viewing the device 2600 from a typical viewing distance to see through the device 2600, in some non-limiting examples, when all of the (sub-) pixel(s) 340/264*x* are not emitting, thus creating a transparent AMOLED device 2600.

While not shown in the FIGURE, in some non-limiting examples, the device 2600 may further comprise an NPC 1120 disposed between the auxiliary electrode 1750 and the second electrode 140. In some non-limiting examples, the NPC 1120 may also be disposed between the NIC 810 and the second electrode 140.

In some non-limiting examples, the NIC 810 may be formed concurrently with the at least one semiconducting layer(s) 130. By way of non-limiting example, at least one material used to form the NIC 810 may also be used to form the at least one semiconducting layer(s) 130. In such non-limiting example, a number of stages for fabricating the device 2600 may be reduced.

Those having ordinary skill in the relevant art will appreciate that in some non-limiting examples, various other layers and/or coatings, including without limitation those forming the at least one semiconducting layer(s) 130 and/or the second electrode 140, may cover a part of the transmissive region 2620, especially if such layers and/or coatings are substantially transparent. In some non-limiting examples, the PDL(s) 440 may have a reduced thickness, including without limitation, by forming a well therein, which in some non-limiting examples is not dissimilar to the well defined for emissive region(s) 1910, to further facilitate light transmission through the transmissive region 2620.

Those having ordinary skill in the relevant art will appreciate that (sub-) pixel(s) 340/264*x* arrangements other than the arrangement shown in FIGS. 26A and 26B may, in some non-limiting examples, be employed.

Those having ordinary skill in the relevant art will appreciate that arrangements of the auxiliary electrode(s) 1750 other than the arrangement shown in FIGS. 26A and 26B may, in some non-limiting examples, be employed. By way of non-limiting example, the auxiliary electrode(s) 1750 may be disposed between the pixel region 2610 and the transmissive region 2620. By way of non-limiting example, the auxiliary electrode(s) 1750 may be disposed between sub-pixel(s) 264*x* within a pixel region 2610.

Figure 27A:
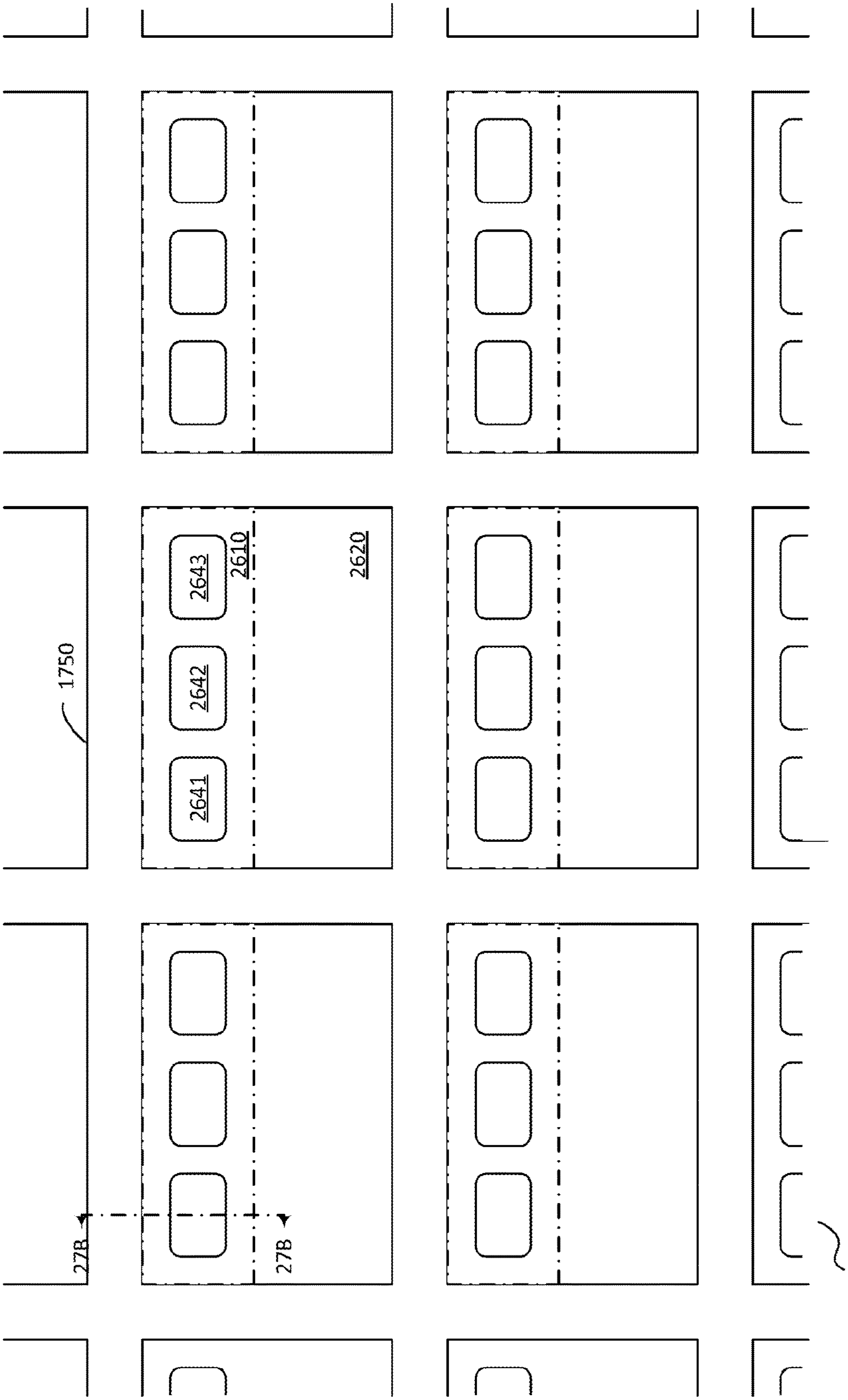
FIG. 27A is a schematic diagram illustrating, in plan view, an example of a transparent version of the device of FIG. 1 comprising at least one example pixel region and at least one example light-transmissive region according to an example in the present disclosure.

Turning now to FIG. 27A, there is shown an example plan view of a transparent version, shown generally at 2700 of the device 100. In some non-limiting examples, the device 2700 is an AMOLED device having a plurality of pixel regions 2610 and a plurality of transmissive regions 2620. The device 2700 differs from device 2600 in that no auxiliary electrode(s) 1750 lie between the pixel region(s) 2610 and/or the transmissive region(s) 2620.

In some non-limiting examples, each pixel region 2610 may comprise a plurality of emissive regions 1910 each corresponding to a sub-pixel 264*x*. In some non-limiting examples, the sub-pixels 264*x* may correspond to, respectively, R(ed) sub-pixels 2641, G(reen) sub-pixels 2642 and/or B(lue) sub-pixels 2643.

In some non-limiting examples, each transmissive region 2620 is substantially transparent and allows light to pass through the entirety of a cross-sectional aspect thereof.

Figure 27B:
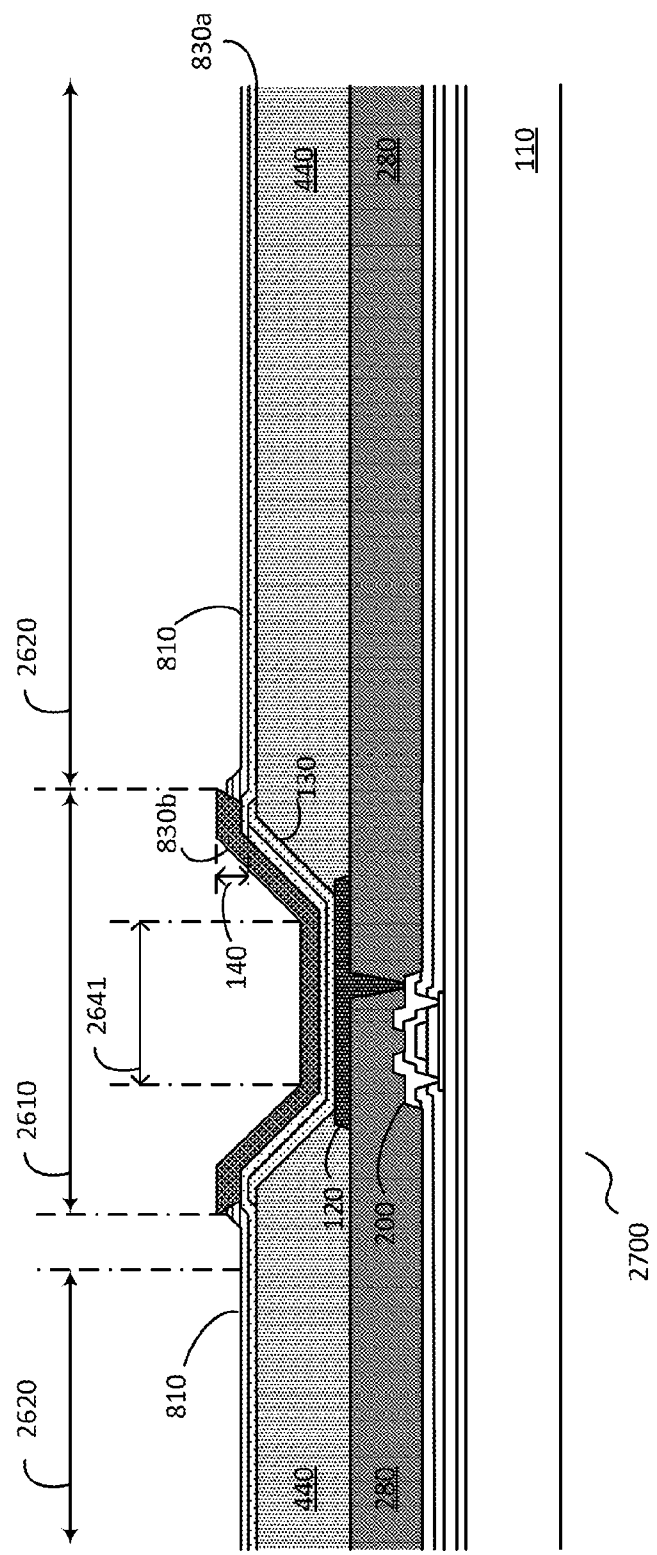
FIGS. 27B and 27C are schematic diagrams illustrating an example cross-sectional view of the device of FIG. 27A taken along line 27B-27B.

Turning now to FIG. 27B, there is shown an example cross-sectional view of the device 2700, taken along line 27B-27B in FIG. 27A. In the FIGURE, the device 2700 is shown as comprising a substrate 110, a TFT insulating layer 280 and a first electrode 120 formed on a surface of the TFT insulating layer 280. The substrate 110 may comprise the base substrate 112 (not shown for purposes of simplicity of illustration) and/or at least one TFT structure 200 corresponding to and for driving each sub-pixel 264*x* positioned substantially thereunder and electrically coupled to the first electrode 120 thereof. PDL(s) 440 are formed in non-emissive regions 1920 over the substrate 110, to define emissive region(s) 1910 also corresponding to each sub-pixel 264*x*, over the first electrode 120 corresponding thereto. The PDL(s) 440 cover edges of the first electrode 120.

In some non-limiting examples, at least one semiconducting layer 130 is deposited over exposed region(s) of the first electrode 120 and, in some non-limiting examples, at least parts of the surrounding PDLs 440.

In some non-limiting examples, a first conductive coating 830*a* may be deposited over the at least one semiconducting layer(s) 130, including over the pixel region 2610 to form the sub-pixel(s) 264*x* thereof and over the surrounding PDLs 440 in the transmissive region 2620. In some non-limiting examples, the thickness of the first conductive coating 830*a* may be relatively thin such that the presence of the first conductive coating 830*a* across the transmissive region 2620 does not substantially attenuate transmission of light therethrough. In some non-limiting examples, the first conductive coating 830*a* may be deposited using an open mask and/or mask-free deposition process.

In some non-limiting examples, an NIC 810 is selectively deposited over first portions of the device 2700, comprising the transmissive region 2620.

In some non-limiting examples, the entire surface of the device 2700 is then exposed to a vapor flux of the conductive coating 830, which in some non-limiting examples may be Mg to selectively deposit a second conductive coating 830*b* over second portion(s) of the first conductive coating 830*a* that are substantially devoid of the NIC 810, in some examples, the pixel region 2610, such that the second conductive coating 830*b* is electrically coupled to and in some non-limiting examples, in physical contact with uncoated parts of the first conductive coating 830*a*, to form the second electrode 140.

In some non-limiting examples, a thickness of the first conductive coating 830*a* may be less than a thickness of the second conductive coating 830*b*. In this way, relatively high transmittance may be maintained in the transmissive region 2620, over which only the first conductive coating 830*a* extends. In some non-limiting examples, the thickness of the first conductive coating 830*a* may be less than about 30 nm, less than about 25 nm, less than about 20 nm, less than about 15 nm, less than about 10 nm, less than about 8 nm, and/or less than about 5 nm. In some non-limiting examples, the thickness of the second conductive coating 830*b* may be less than about 30 nm, less than about 25 nm, less than about 20 nm, less than about 15 nm, less than about 10 nm and/or less than about 8 nm.

Thus, in some non-limiting examples, a thickness of the second electrode 140 may be less than about 40 nm, and/or in some non-limiting examples, between about 5 nm and 30 nm, between about 10 nm and about 25 nm and/or between about 15 nm and about 25 nm.

In some non-limiting examples, the thickness of the first conductive coating 830*a* may be greater than the thickness of the second conductive coating 830*b*. In some non-limiting examples, the thickness of the first conductive coating 830*a* and the thickness of the second conductive coating 830*b* may be substantially the same.

In some non-limiting examples, at least one material used to form the first conductive coating 830*a* may be substantially the same as at least one material used to form the second conductive coating 830*b*. In some non-limiting examples, such at least one material may be substantially as described herein in respect of the first electrode 120, the second electrode 140, the auxiliary electrode 1750 and/or a conductive coating 830 thereof.

In some non-limiting examples, the transmissive region 2620 of the device 2700 remains substantially devoid of any materials that may substantially affect the transmission of light therethrough. In particular, as shown in the FIGURE, the TFT structure 200 and/or the first electrode 120 are positioned, in a cross-sectional aspect below the sub-pixel 264*x* corresponding thereto and beyond the transmissive region 2620. As a result, these components do not attenuate or impede light from being transmitted through the transmissive region 2620. In some non-limiting examples, such arrangement allows a viewer viewing the device 2700 from a typical viewing distance to see through the device 2700, in some non-limiting examples, when all of the (sub-)pixel(s) 340/264*x* are not emitting, thus creating a transparent AMOLED device 2700.

While not shown in the FIGURE, in some non-limiting examples, the device 2700 may further comprise an NPC 1120 disposed between the second conductive coating 830*b* and the first conductive coating 830*a*. In some non-limiting examples, the NPC 1120 may also be disposed between the NIC 810 and the first conductive coating 830*a*.

In some non-limiting examples, the NIC 810 may be formed concurrently with the at least one semiconducting layer(s) 130. By way of non-limiting example, at least one material used to form the NIC 810 may also be used to form the at least one semiconducting layer(s) 130. In such non-limiting example, a number of stages for fabricating the device 2700 may be reduced.

Those having ordinary skill in the relevant art will appreciate that in some non-limiting examples, various other layers and/or coatings, including without limitation those forming the at least one semiconducting layer(s) 130 and/or the first conductive coating 830*a*, may cover a part of the transmissive region 2620, especially if such layers and/or coatings are substantially transparent. In some non-limiting examples, the PDL(s) 440 may have a reduced thickness, including without limitation, by forming a well therein, which in some non-limiting examples is not dissimilar to the well defined for emissive region(s) 1910, to further facilitate light transmission through the transmissive region 2620.

Those having ordinary skill in the relevant art will appreciate that (sub-) pixel(s) 340/264*x* arrangements other than the arrangement shown in FIGS. 27A and 27B may, in some non-limiting examples, be employed.

Figure 27C:
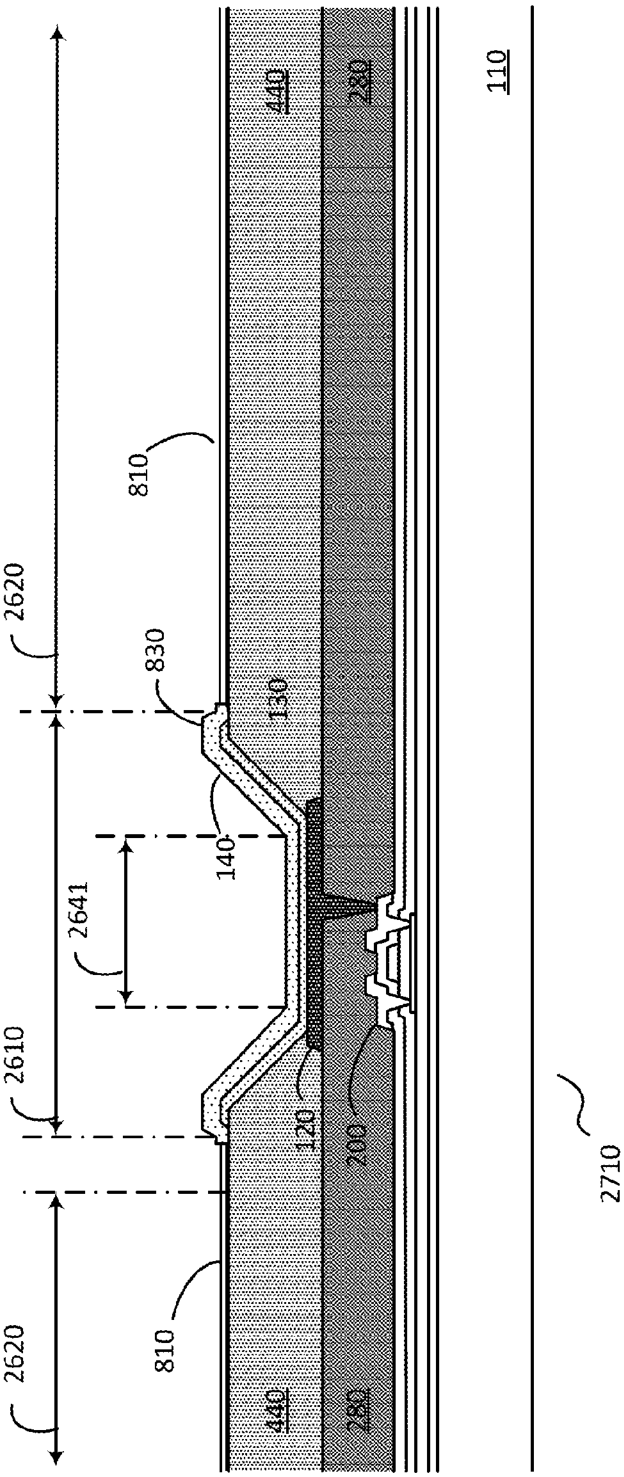

Turning now to FIG. 27C, there is shown an example cross-sectional view of a different version of the device 100, shown as device 1910, taken along the same line 27B-27B in FIG. 27A. In the FIGURE, the device 1910 is shown as comprising a substrate 110, a TFT insulating layer 280 and a first electrode 120 formed on a surface of the TFT insulating layer 280. The substrate 110 may comprise the base substrate 112 (not shown for purposes of simplicity of illustration) and/or at least one TFT structure 200 corresponding to and for driving each sub-pixel 264*x* positioned substantially thereunder and electrically coupled to the first electrode 120 thereof. PDL(s) 440 are formed in non-emissive regions 1920 over the substrate 110, to define emissive region(s) 1910 also corresponding to each sub-pixel 264*x*, over the first electrode 120 corresponding thereto. The PDL(s) 440 cover edges of the first electrode 120.

In some non-limiting examples, at least one semiconducting layer 130 is deposited over exposed region(s) of the first electrode 120 and, in some non-limiting examples, at least parts of the surrounding PDLs 440.

In some non-limiting examples, an NIC 810 is selectively deposited over first portions of the device 2700, comprising the transmissive region 2620.

In some non-limiting examples, a conductive coating 830 may be deposited over the at least one semiconducting layer(s) 130, including over the pixel region 2610 to form the sub-pixel(s) 264*x* thereof but not over the surrounding PDLs 440 in the transmissive region 2620. In some non-limiting examples, the first conductive coating 830*a* may be deposited using an open mask and/or mask-free deposition process. In some non-limiting examples, such deposition may be effected by exposing the entire surface of the device 1910 to a vapour flux of the conductive coating 830, which in some non-limiting examples may be Mg to selectively deposit the conductive coating 830 over second portions of the at least one semiconducting layer(s) 130 that are substantially devoid of the NIC 810, in some examples, the pixel region 2610, such that the conductive coating 830 is deposited on the at least one semiconducting layer(s) 130 to form the second electrode 140.

In some non-limiting examples, the transmissive region 2620 of the device 1910 remains substantially devoid of any materials that may substantially affect the transmission of light therethrough. In particular, as shown in the FIGURE, the TFT structure 200 and/or the first electrode 120 are positioned, in a cross-sectional aspect below the sub-pixel 264*x* corresponding thereto and beyond the transmissive region 2620. As a result, these components do not attenuate or impede light from being transmitted through the transmissive region 2620. In some non-limiting examples, such arrangement allows a viewer viewing the device 2700 from a typical viewing distance to see through the device 2700, in some non-limiting examples, when all of the (sub-)pixel(s) 340/264*x* are not emitting, thus creating a transparent AMOLED device 1910.

By providing a transmissive region 2620 that is free and/or substantially devoid of any conductive coating 830, the transmittance in such region may, in some non-limiting examples, be favorably enhanced, by way of non-limiting example, by comparison to the device 2700 of FIG. 27B.

While not shown in the FIGURE, in some non-limiting examples, the device 1910 may further comprise an NPC 1120 disposed between the conductive coating 830 and the at least one semiconducting layer(s) 130. In some non-limiting examples, the NPC 1120 may also be disposed between the NIC 810 and the PDL(s) 440.

In some non-limiting examples, the NIC 810 may be formed concurrently with the at least one semiconducting layer(s) 130. By way of non-limiting example, at least one material used to form the NIC 810 may also be used to form the at least one semiconducting layer(s) 130. In such non-limiting example, a number of stages for fabricating the device 1910 may be reduced.

Those having ordinary skill in the relevant art will appreciate that in some non-limiting examples, various other layers and/or coatings, including without limitation those forming the at least one semiconducting layer(s) 130 and/or the conductive coating 830, may cover a part of the transmissive region 2620, especially if such layers and/or coatings are substantially transparent. In some non-limiting examples, the PDL(s) 440 may have a reduced thickness, including without limitation, by forming a well therein, which in some non-limiting examples is not dissimilar to the well defined for emissive region(s) 1910, to further facilitate light transmission through the transmissive region 2620.

Those having ordinary skill in the relevant art will appreciate that (sub-) pixel(s) 340/264*x* arrangements other than the arrangement shown in FIGS. 27A and 27C may, in some non-limiting examples, be employed.

Selective Deposition of a Conductive Coating Over Emissive Region(s)

As discussed above, modulating the thickness of an electrode 120, 140, 1750, 4150 in and across a lateral aspect 410 of emissive region(s) 1910 of a (sub-)pixel 340/264*x* may impact the microcavity effect observable. In some non-limiting examples, selective deposition of at least one conductive coating 830 through deposition of at least one selective coating 710, such as an NIC 810 and/or an NPC 1120, in the lateral aspects 410 of emissive region(s) 1910 corresponding to different sub-pixel(s) 264*x* in a pixel region 2610 may allow the optical microcavity effect in each emissive region 1910 to be controlled and/or modulated to optimize desirable optical microcavity effects on a sub-pixel 264*x* basis, including without limitation, an emission spectrum, a luminous intensity and/or an angular dependence of a brightness and/or a color shift of emitted light.

Such effects may be controlled by modulating the thickness of the selective coating 710, such as an NIC 810 and/or an NPC 1120, disposed in each emissive region 1910 of the sub-pixel(s) 264*x* independently of one another. By way of non-limiting example, the thickness of an NIC 810 disposed over a blue sub-pixel 2643 may be less than the thickness of an NIC 810 disposed over a green sub-pixel 2642, and the thickness of the NIC disposed over a green sub-pixel 2642 may be less than the thickness of an NIC 810 disposed over a red sub-pixel 2641.

In some non-limiting examples, such effects may be controlled to an even greater extent by independently modulating the thickness of not only the selective coating 710, but also the conductive coating 830 deposited in part(s) of each emissive region 1910 of the sub-pixel(s) 264*x*.

Such a mechanism is illustrated in the schematic diagrams of FIGS. 28A-28D. These diagrams illustrate various stages of manufacturing an example version, shown generally at 2800, of the device 100.

Figure 28A:
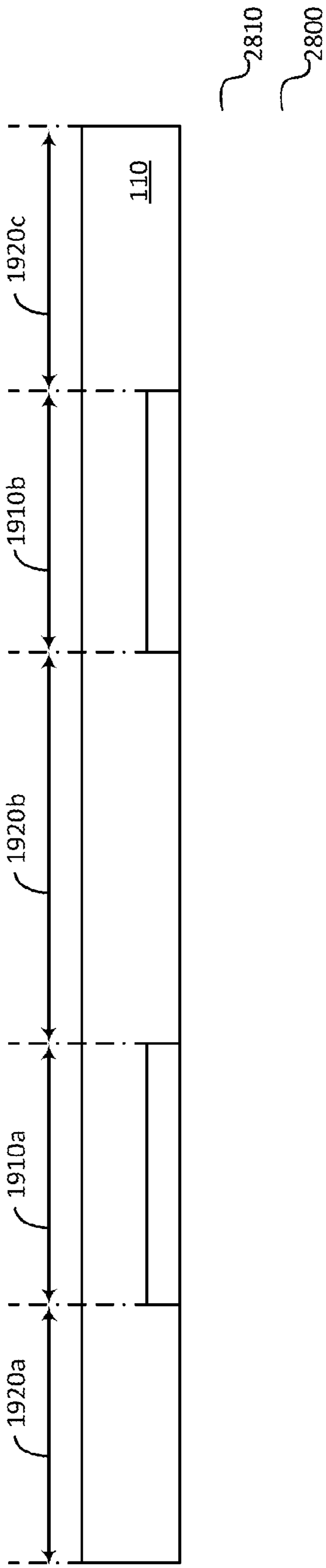
FIGS. 28A-28D are schematic diagrams that show example stages of an example process for manufacturing an example version of the device of FIG. 1 to provide emissive region having a second electrode of different thickness according to an example in the present disclosure.

FIG. 28A shows a stage 2810 of manufacturing the device 2800. In the stage 2810, a substrate 110 is provided. The substrate 110 comprises a first emissive region 1910*a* and a second emissive region 1910*b*. In some non-limiting examples, the first emissive region 1910*a* and/or the second emissive region 1910*b* may be surrounded and/or spaced-apart by at least one non-emissive region 1920*a*-1920*c*. In some non-limiting examples, the first emissive region 1910*a* and/or the second emissive region 1910*b* may each correspond to a (sub-)pixel 340/264*x*.

Figure 28B:
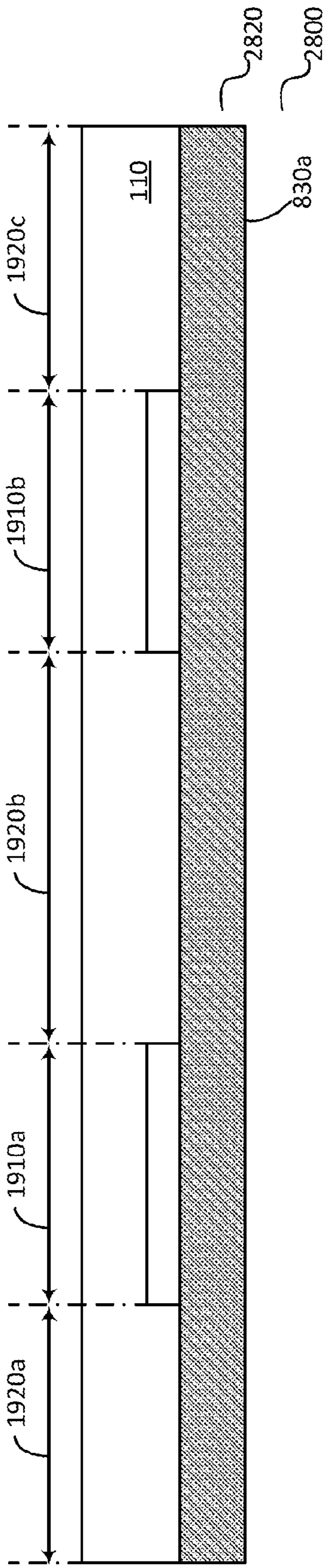

FIG. 28B shows a stage 2820 of manufacturing the device 2800. In the stage 2820, a first conductive coating 830*a* is deposited on an exposed layer surface 111 of an underlying material, in this case the substrate 110. The first conductive coating 830*a* is deposited across the first emissive region 1910*a* and the second emissive region 1910*b*. In some non-limiting examples, the first conductive coating 830*a* is deposited across at least one of the non-emissive regions 1920*a*-1920*c*.

In some non-limiting examples, the first conductive coating 830*a* may be deposited using an open mask and/or a mask-free deposition process.

Figure 28C:
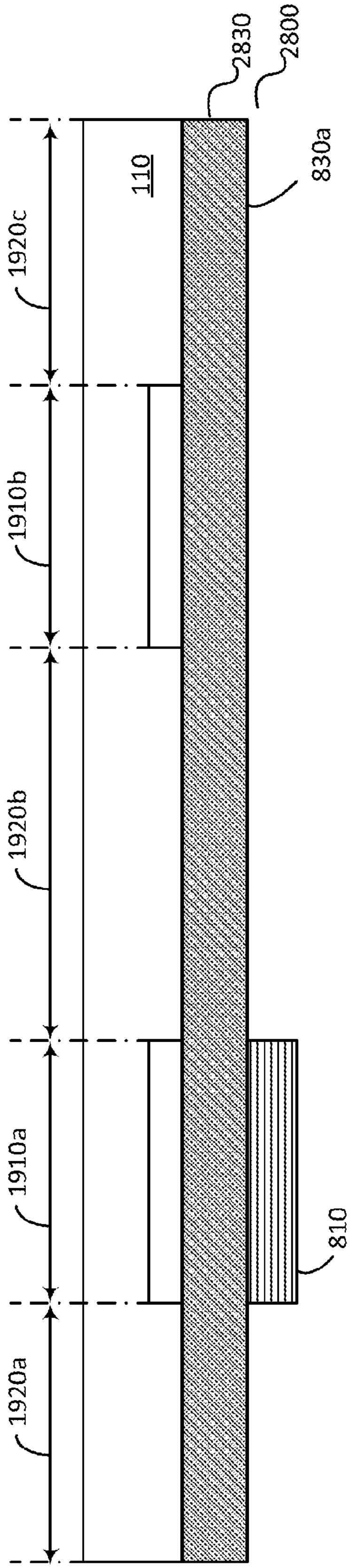

FIG. 28C shows a stage 2830 of manufacturing the device 2800. In the stage 2830, an NIC 810 is selectively deposited over a first portion of the first conductive coating 830*a*. As shown in the FIGURE, in some non-limiting examples, the NIC 810 is deposited across the first emissive region 1910*a*, while in some non-limiting examples, the second emissive region 1910*b* and/or in some non-limiting examples, at least one of the non-emissive regions 1920*a*-1920*c* are substantially devoid of the NIC 810.

Figure 28D:
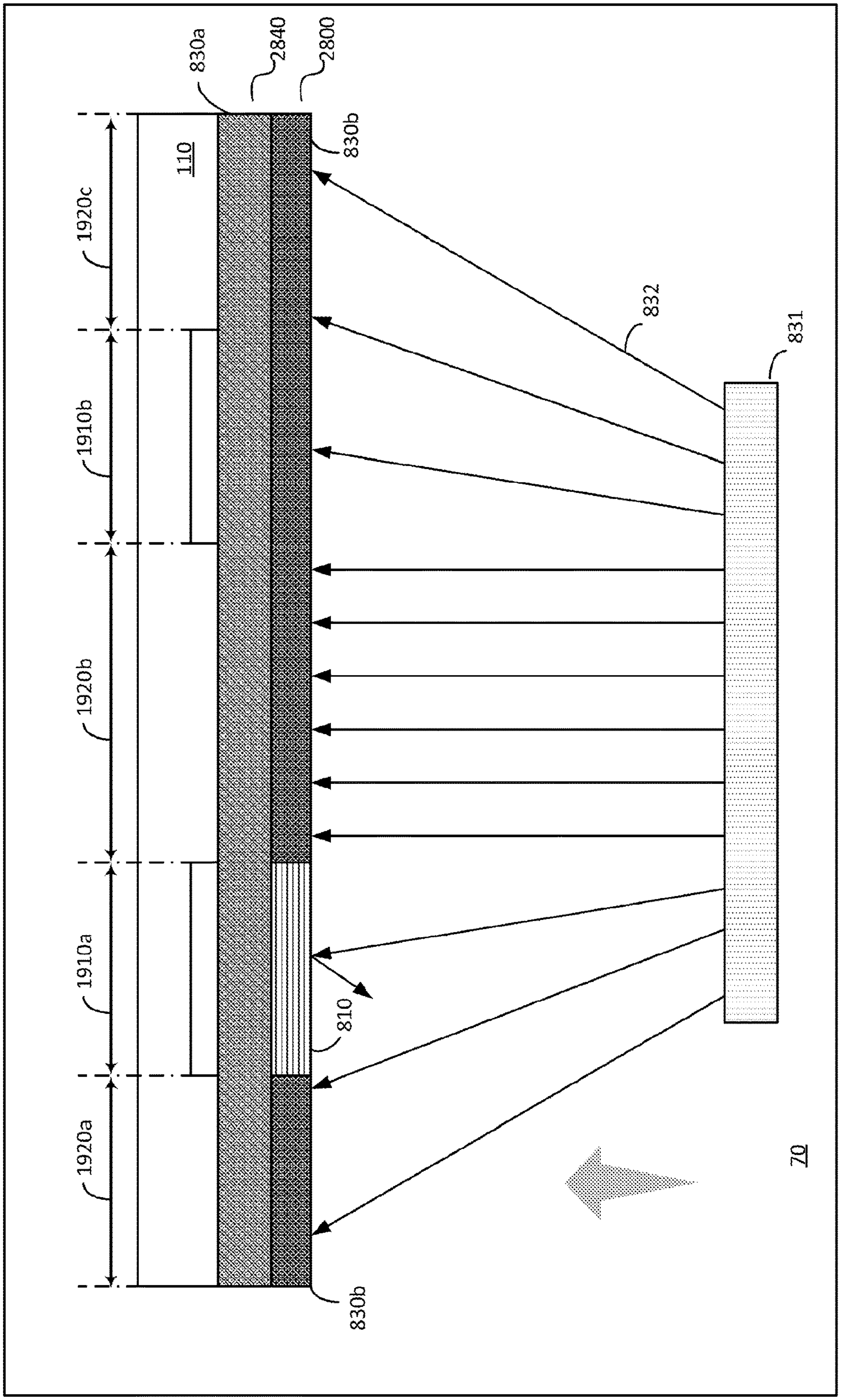

FIG. 28D shows a stage 2840 of manufacturing the device 2800. In the stage 2840, a second conductive coating 830*b* may be deposited across those second portions of the device 2800 that is substantially devoid of the NIC 810. In some non-limiting examples, the second conductive coating 830*b* may be deposited across the second emissive region 1910*b* and/or, in some non-limiting examples, at least one of the non-emissive region 1920*a*-1920*c*.

Those having ordinary skill in the relevant art will appreciate that the evaporative process shown in FIG. 28D and described in detail in connection with any one or more of FIGS. 7-8, 11A-11B and/or 12A-12C may, although not shown, for simplicity of illustration, equally be deposited in any one or more of the preceding stages described in FIGS. 28A-28C.

Those having ordinary skill in the relevant art will appreciate that the manufacture of the device 2800 may in some non-limiting examples, encompass additional stages that are not shown for simplicity of illustration. Such additional stages may include, without limitation, depositing one or more NICs 810, depositing one or more NPCs 1120, depositing one or more additional conductive coatings 830, depositing an outcoupling coating and/or encapsulation of the device 2800.

Those having ordinary skill in the relevant art will appreciate that while the manufacture of the device 2800 has been described and illustrated in connection with a first emissive region 1910*a* and a second emissive region 1910*b*, in some non-limiting examples, the principles derived therefrom may equally be deposited on the manufacture of devices having more than two emissive regions 1910.

In some non-limiting examples, such principles may be deposited on deposit conductive coating(s) of varying thickness for emissive region(s) 1910 corresponding to sub-pixel(s) 264*x*, in some non-limiting examples, in an OLED display device 100, having different emission spectra. In some non-limiting examples, the first emissive region 1910*a* may correspond to a sub-pixel 264*x* configured to emit light of a first wavelength and/or emission spectrum and/or in some non-limiting examples, the second emissive region 1910*b* may correspond to a sub-pixel 264*x* configured to emit light of a second wavelength and/or emission spectrum. In some non-limiting examples, the device 2800 may comprise a third emissive region 1910*c* (FIG. 29A) that may correspond to a sub-pixel 264*x* configured to emit light of a third wavelength and/or emission spectrum.

In some non-limiting examples, the first wavelength may be less than, greater than, and/or equal to at least one of the second wavelength and/or the third wavelength. In some non-limiting examples, the second wavelength may be less than, greater than, and/or equal to at least one of the first wavelength and/or the third wavelength. In some non-limiting examples, the third wavelength may be less than, greater than and/or equal to at least one of the first wavelength and/or the second wavelength.

In some non-limiting examples, the device 2800 may also comprise at least one additional emissive region 1910 (not shown) that may in some non-limiting examples be configured to emit light having a wavelength and/or emission spectrum that is substantially identical to at least one of the first emissive region 1910*a*, the second emissive region 1910*b* and/or the third emissive region 1910*c*.

In some non-limiting examples, the NIC 810 may be selectively deposited using a shadow mask that may also have been used to deposit the at least one semiconducting layer 130 of the first emissive region 1910*a*. In some non-limiting examples, such shared use of a shadow mask may allow the optical microcavity effect(s) to be tuned for each sub-pixel 264*x* in a cost-effective manner.

The use of such mechanism to create an example version 2900 of the device 100 having sub-pixel(s) 264*x* of a given pixel 340 with modulated microcavity effects is described in FIGS. 29A-29D.

Figure 29A:
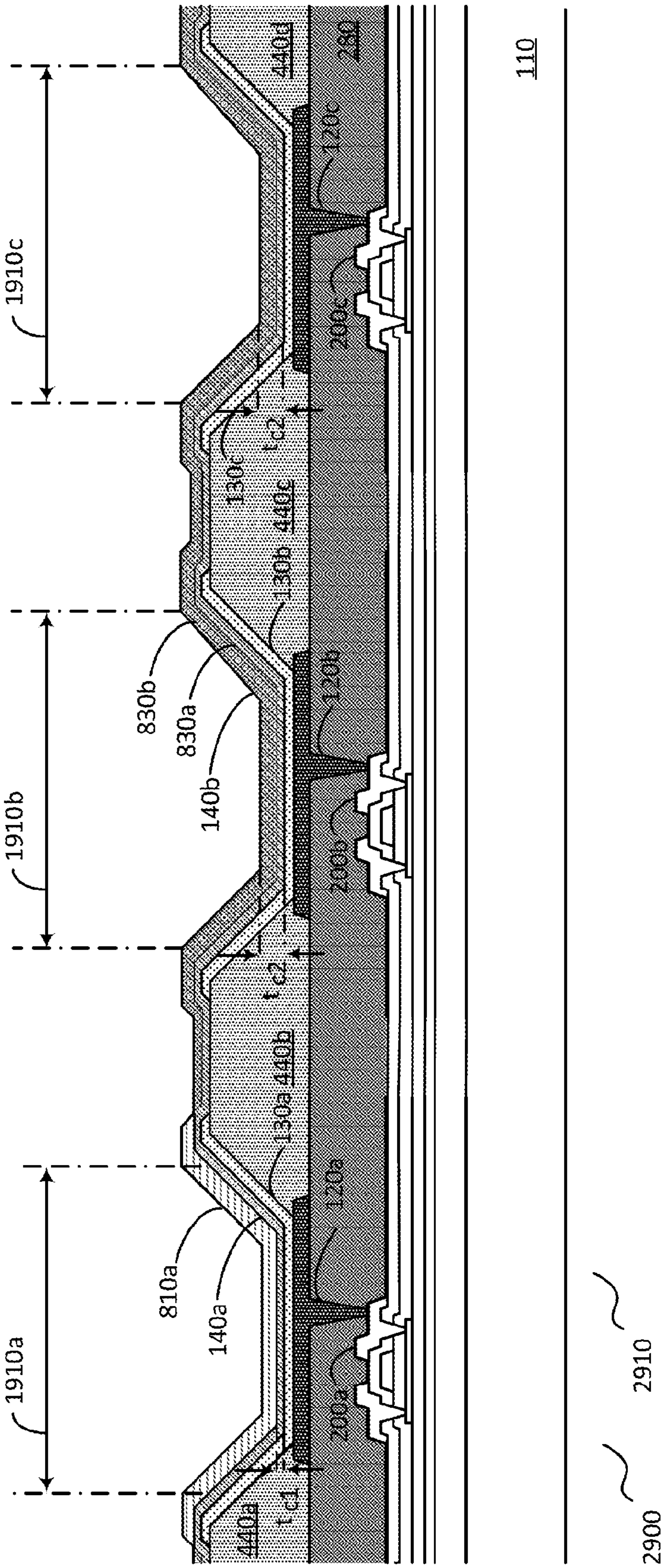
FIGS. 29A-29D are schematic diagrams that show example stages of an example process for manufacturing an example version of the device of FIG. 1 having sub-pixel regions having a second electrode of different thickness according to an example in the present disclosure.

In FIG. 29A, a stage 2810 of manufacture of the device 2900 is shown as comprising a substrate 110, a TFT insulating layer 280 and a plurality of first electrodes 120*a*-120*c*, formed on a surface of the TFT insulating layer 280.

The substrate 110 may comprise the base substrate 112 (not shown for purposes of simplicity of illustration) and/or at least one TFT structure 200*a*-200*c* corresponding to and for driving an emissive region 1910*a*-1910*c* each having a corresponding sub-pixel 264*x*, positioned substantially thereunder and electrically coupled to its associated first electrode 120*a*-120*c*. PDL(s) 440*a*-440*d* are formed over the substrate 110, to define emissive region(s) 830*a*-1910*c*. The PDL(s) 440*a*-440*d* cover edges of their respective first electrodes 120*a*-120*c*.

In some non-limiting examples, at least one semiconducting layer 130*a*-130*c* is deposited over exposed region(s) of their respective first electrodes 120*a*-120*c* and, in some non-limiting examples, at least parts of the surrounding PDLs 440*a*-440*d*.

In some non-limiting examples, a first conductive coating 830*a* may be deposited over the at least one semiconducting layer(s) 130*a*-130*c*. In some non-limiting examples, the first conductive coating 830*a* may be deposited using an open mask and/or mask-free deposition process. In some non-limiting examples, such deposition may be effected by exposing the entire exposed layer surface 111 of the device 2900 to a vapor flux of the first conductive coating 830*a*, which in some non-limiting examples may be Mg, to deposit the first conductive coating 830*a* over the at least one semiconducting layer(s) 130*a*-130*c* to form a first layer of the second electrode 140*a* (not shown), which in some non-limiting examples may be a common electrode, at least for the first emissive region 1910*a*. Such common electrode has a first thickness $t_{c1}$ in the first emissive region 1910*a*. The first thickness $t_{c1}$ may correspond to a thickness of the first conductive coating 830*a*.

In some non-limiting examples, a first NIC 810*a* is selectively deposited over first portions of the device 2810, comprising the first emissive region 1910*a*.

In some non-limiting examples, a second conductive coating 830*b* may be deposited over the device 2900. In some non-limiting examples, the second conductive coating 830*b* may be deposited using an open mask and/or mask-free deposition process. In some non-limiting examples, such deposition may be effected by exposing the entire exposed layer surface 111 of the device 2810 to a vapour flux of the second conductive coating 830*b*, which in some non-limiting examples may be Mg, to deposit the second conductive coating 830*b* over the first conductive coating 830*a* that is substantially devoid of the first NIC 810*a*, in some examples, the second and third emissive region 1910*b*, 1910*c* and/or at least part(s) of the non-emissive region(s) 1920 in which the PDLs 440*a*-440*d* lie, such that the second conductive coating 830*b* is deposited on the second portion(s) of the first conductive coating 830*a* that are substantially devoid of the first NIC 810*a* to form a second layer of the second electrode 140$b$ (not shown), which in some non-limiting examples, may be a common electrode, at least for the second emissive region 1910$b$. Such common electrode has a second thickness $t_{c2}$ in the second emissive region 1910$b$. The second thickness $t_{c2}$ may correspond to a combined thickness of the first conductive coating 830$a$ and of the second conductive coating 830$b$ and may in some non-limiting examples be greater than the first thickness $t_{c1}$.

Figure 29B:
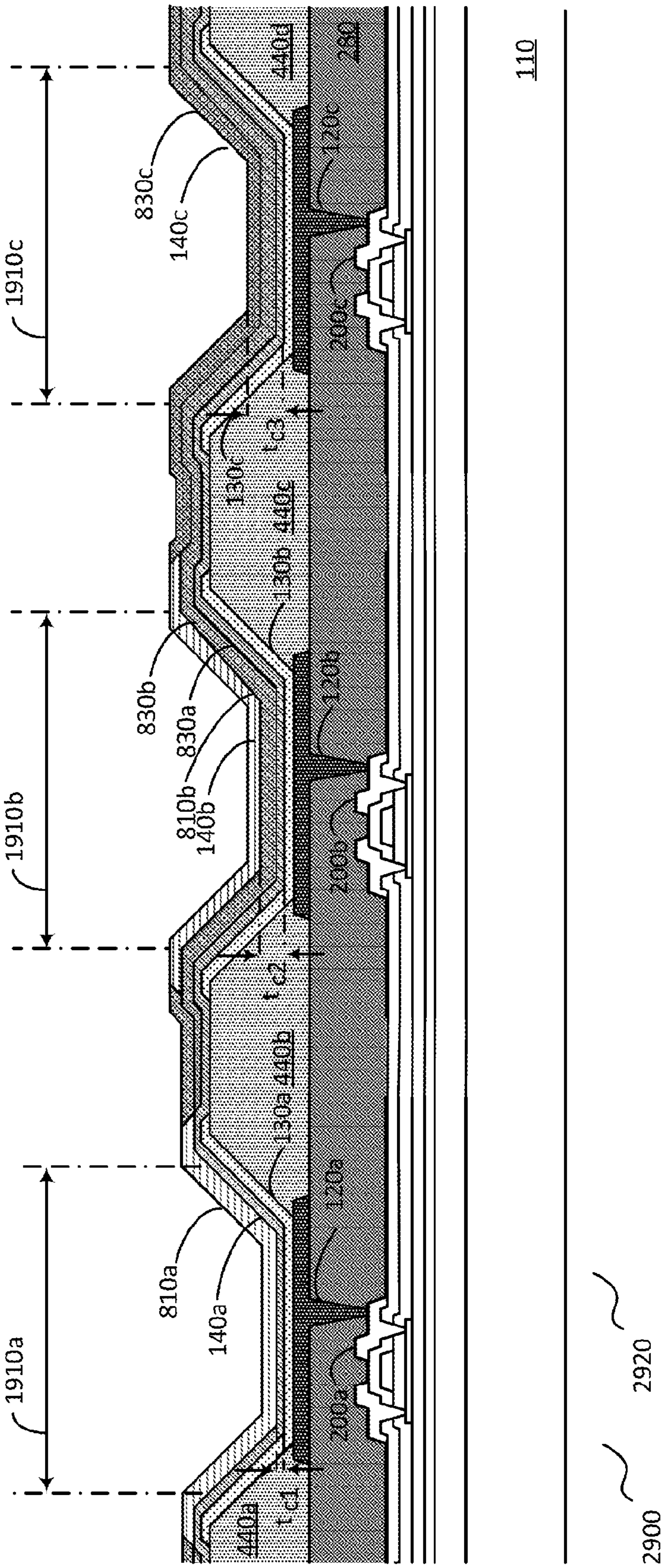

In FIG. 29B, a stage 2920 of manufacture of the device 2900 is shown.

In some non-limiting examples, a second NIC 810$b$ is selectively deposited over further first portions of the device 2900, comprising the second emissive region 1910$b$.

In some non-limiting examples, a third conductive coating 830$c$ may be deposited over the device 2900. In some non-limiting examples, the third conductive coating 830$c$ may be deposited using an open mask and/or mask-free deposition process. In some non-limiting examples, such deposition may be effected by exposing the entire exposed layer surface 111 of the device 2900 to a vapour flux of the third conductive coating 830$c$, which in some non-limiting examples may be Mg, to deposit the third conductive coating 830$c$ over the second conductive coating 830$b$ that is substantially devoid of either the first NIC 810$a$ or the second NIC 810$b$, in some examples, the third emissive region 1910$c$ and/or at least part(s) of the non-emissive region 1920 in which the PDLs 440$a$-440$d$ lie, such that the third conductive coating 830$c$ is deposited on the further second portion(s) of the second conductive coating 830$b$ that are substantially devoid of the second NIC 810$b$ to form a third layer of the second electrode 140$c$ (not shown), which in some non-limiting examples, may be a common electrode, at least for the third emissive region 1910$c$. Such common electrode has a third thickness $t_{c3}$ in the third emissive region 1910$c$. The third thickness $t_{c3}$ may correspond to a combined thickness of the first conductive coating 830$a$, the second conductive coating 830$b$ and the third conductive coating 830$c$ and may in some non-limiting examples be greater than either or both of the first thickness $t_{c1}$ and the second thickness $t_{c2}$.

In FIG. 28C, a stage 2830 of manufacture of the device 2900 is shown.

In some non-limiting examples, a third NIC 810$c$ is selectively deposited over additional first portions of the device 2900, comprising the third emissive region 1910$b$.

Figure 29C:
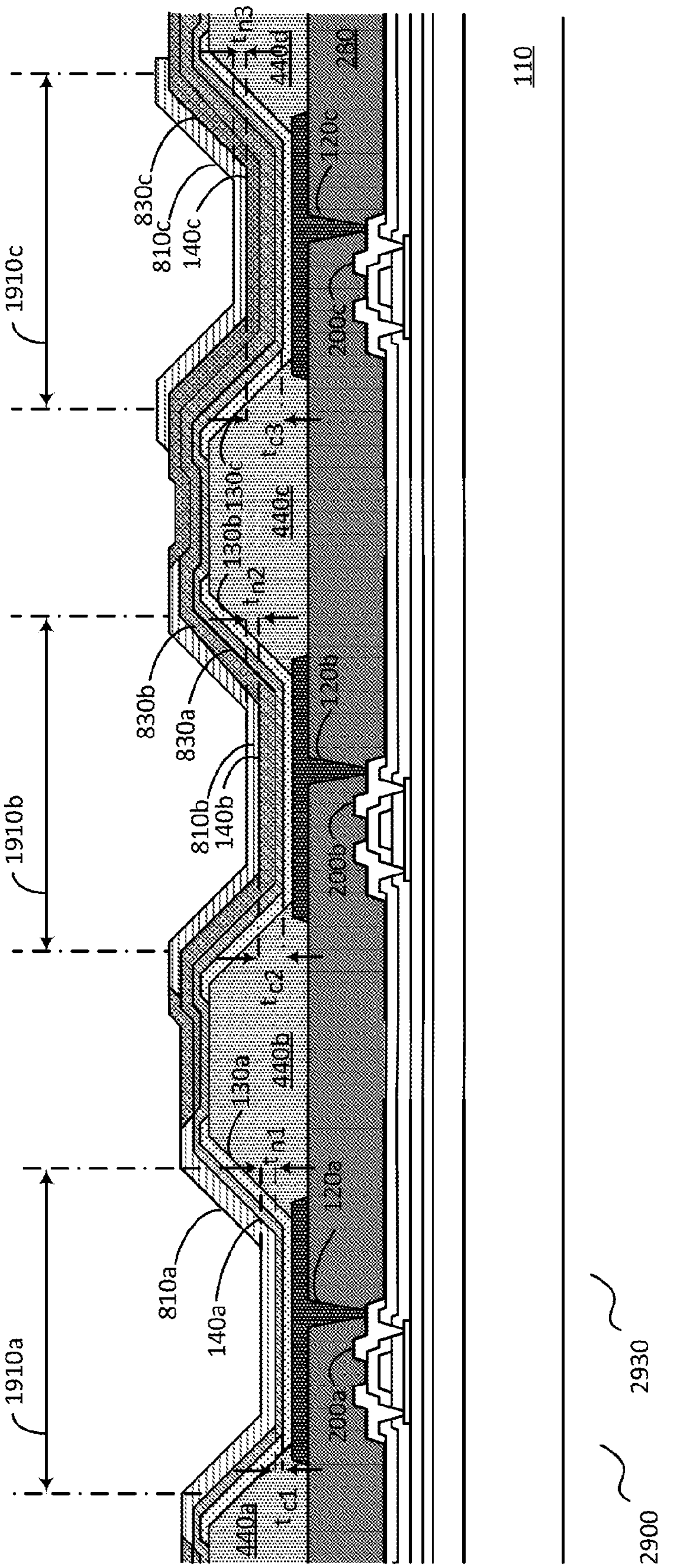
Figure 29D:
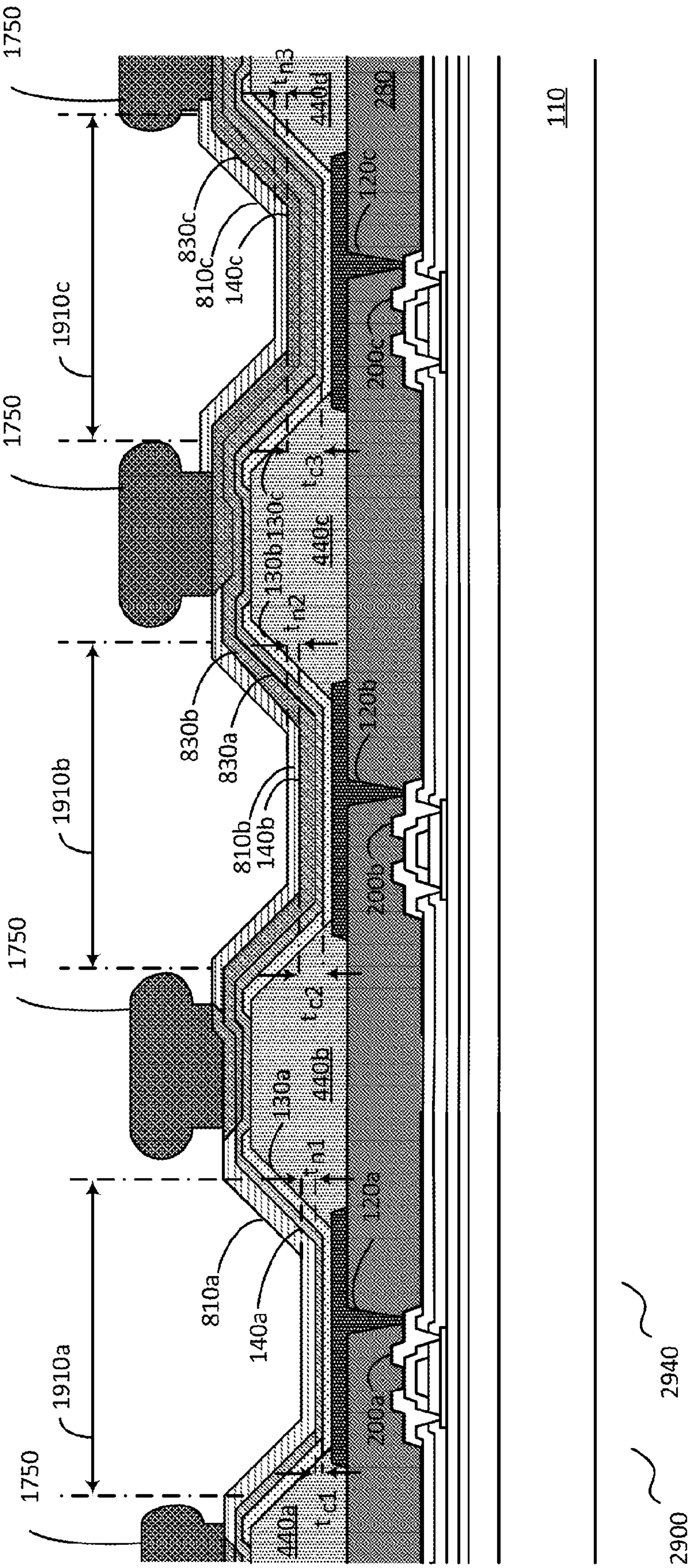

In FIG. 29D, a stage 2940 of manufacture of the device 2900 is shown.

In some non-limiting examples, at least one auxiliary electrode 1750 is disposed in the non-emissive region(s) 1920 of the device 2900 between neighbouring emissive region 1910$a$-1910$c$ thereof and in some non-limiting examples, over the PDLs 440$a$-440$d$. In some non-limiting examples, the conductive coating 830 used to deposit the at least one auxiliary electrode 1750 may be deposited using an open mask and/or mask-free deposition process. In some non-limiting examples, such deposition may be effected by exposing the entire exposed layer surface 111 of the device 2900 to a vapour flux of the conductive coating 830, which in some non-limiting examples may be Mg, to deposit the conductive coating 830 over the exposed parts of the first conductive coating 830$a$, the second conductive coating 830$b$ and the third conductive coating 830$c$ that is substantially devoid of any of the first NIC 810$a$ the second NIC 810$b$ and/or the third NIC 810$c$, such that the conductive coating 830 is deposited on an additional second portion comprising the exposed part(s) of the first conductive coating 830$a$, the second conductive coating 830$b$ and/or the third conductive coating 830$c$ that are substantially devoid of any of the first NIC 810$a$, the second NIC 810$b$ and/or the third NIC 810$c$ to form the at least one auxiliary electrode 1750. Each of the at least one auxiliary electrode 1750 is electrically coupled to a respective one of the second electrodes 140$a$-140$c$. In some non-limiting examples, each of the at least one auxiliary electrode 1750 is in physical contact with such second electrode 140$a$-140$c$.

In some non-limiting examples, the first emissive region 1910$a$, the second emissive region 1910$b$ and the third emissive region 1910$c$ may be substantially devoid of the material used to form the at least one auxiliary electrode 1750.

In some non-limiting examples, at least one of the first conductive coating 830$a$, the second conductive coating 830$b$ and/or the third conductive coating 830$c$ may be transmissive and/or substantially transparent in at least a part of the visible wavelength range of the electromagnetic spectrum. Thus, if the second conductive coating 830$b$ and/or the third conductive coating 830$a$ (and/or any additional conductive coating(s) 830) is disposed on top of the first conductive coating 830$a$ to form a multi-coating electrode 120, 140, 1750 that may also be transmissive and/or substantially transparent in at least a part of the visible wavelength range of the electromagnetic spectrum. In some non-limiting examples, the transmittance of any one or more of the first conductive coating 830$a$, the second conductive coating 830$b$, the third conductive coating 830$c$, any additional conductive coating(s) 830, and/or the multi-coating electrode 120, 140, 1750 may be greater than about 30%, greater than about 40% greater than about 45%, greater than about 50%, greater than about 60%, greater than about 70%, greater than about 75%, and/or greater than about 80% in at least a part of the visible wavelength range of the electromagnetic spectrum.

In some non-limiting examples, a thickness of the first conductive coating 830$a$, the second conductive coating 830$b$ and/or the third conductive coating 830$c$ may be made relatively thin to maintain a relatively high transmittance. In some non-limiting examples, the thickness of the first conductive coating 830$a$ may be about 5 to 30 nm, about 8 to 25 nm, and/or about 10 to 20 nm. In some non-limiting examples, the thickness of the second conductive coating 830$b$ may be about 1 to 25 nm, about 1 to 20 nm, about 1 to 15 nm, about 1 to 10 nm, and/or about 3 to 6 nm. In some non-limiting examples, the thickness of the third conductive coating 830$c$ may be about 1 to 25 nm, about 1 to 20 nm, about 1 to 15 nm, about 1 to 10 nm, and/or about 3 to 6 nm. In some non-limiting examples, the thickness of a multi-coating electrode formed by a combination of the first conductive coating 830$a$, the second conductive coating 830$b$, the third conductive coating 830$c$ and/or any additional conductive coating(s) 830 may be about 6 to 35 nm, about 10 to 30 nm, about 10 to 25 nm and/or about 12 to 18 nm.

In some non-limiting examples, a thickness of the at least one auxiliary electrode 1750 may be greater than the thickness of the first conductive coating 830$a$, the second conductive coating 830$b$, the third conductive coating 830$c$ and/or a common electrode. In some non-limiting examples, the thickness of the at least one auxiliary electrode 1750 may be greater than about 50 nm, greater than about 80 nm, greater than about 100 nm, greater than about 150 nm, greater than about 200 nm, greater than about 300 nm, greater than about 400 nm, greater than about 500 nm, greater than about 700 nm, greater than about 800 nm, greater than about 1 μm, greater than about 1.2 μm, greater than about 1.5 μm, greater than about 2 μm, greater than about 2.5 μm, and/or greater than about 3 μm.

In some non-limiting examples, the at least one auxiliary electrode 1750 may be substantially non-transparent and/or opaque. However, since the at least one auxiliary electrode 1750 may be in some non-limiting examples provided in a non-emissive region 1920 of the device 2900, the at least one auxiliary electrode 1750 may not cause or contribute to significant optical interference. In some non-limiting examples, the transmittance of the at least one auxiliary electrode 1750 may be less than about 50%, less than about 70%, less than about 80%, less than about 85%, less than about 90%, and/or less than about 95% in at least a part of the visible wavelength range of the electromagnetic spectrum.

In some non-limiting examples, the at least one auxiliary electrode 1750 may absorb light in at least a part of the visible wavelength range of the electromagnetic spectrum.

In some non-limiting examples, a thickness of the first NIC 810*a*, the second NIC 810*b*, and/or the third NIC 810*c* disposed in the first emissive region 1910*a*, the second emissive region 1910*b* and/or the third emissive region 1910*c* respectively, may be varied according to a colour and/or emission spectrum of light emitted by each emissive region 1910*a*-1910*c*. As shown in FIGS. 29C-29D, the first NIC 810*a* may have a first NIC thickness $t_{n1}$, the second NIC 810*b* may have a second NIC thickness $t_{n2}$ and/or the third NIC 810*c* may have a third NIC thickness $t_{n3}$. In some non-limiting examples, the first NIC thickness $t_{n1}$, the second NIC thickness $t_{n2}$ and/or the third NIC thickness $t_{n3}$ may be substantially the same as one another. In some non-limiting examples, the first NIC thickness $t_{n1}$, the second NIC thickness $t_{n2}$ and/or the third NIC thickness $t_{n3}$ may be different from one another.

In some non-limiting examples, the device 2900 may also comprise any number of emissive regions 1910*a*-1910*c* and/or (sub-)pixel(s) 340/264*x* thereof. In some non-limiting examples, a device may comprise a plurality of pixels 340, wherein each pixel 340 comprises two, three or more sub-pixel(s) 264*x*.

Those having ordinary skill in the relevant art will appreciate that the specific arrangement of (sub-)pixel(s) 340/264*x* may be varied depending on the device design. In some non-limiting examples, the sub-pixel(s) 264*x* may be arranged according to known arrangement schemes, including without limitation, RGB side-by-side, diamond and/or PenTile®.

Figure 30:
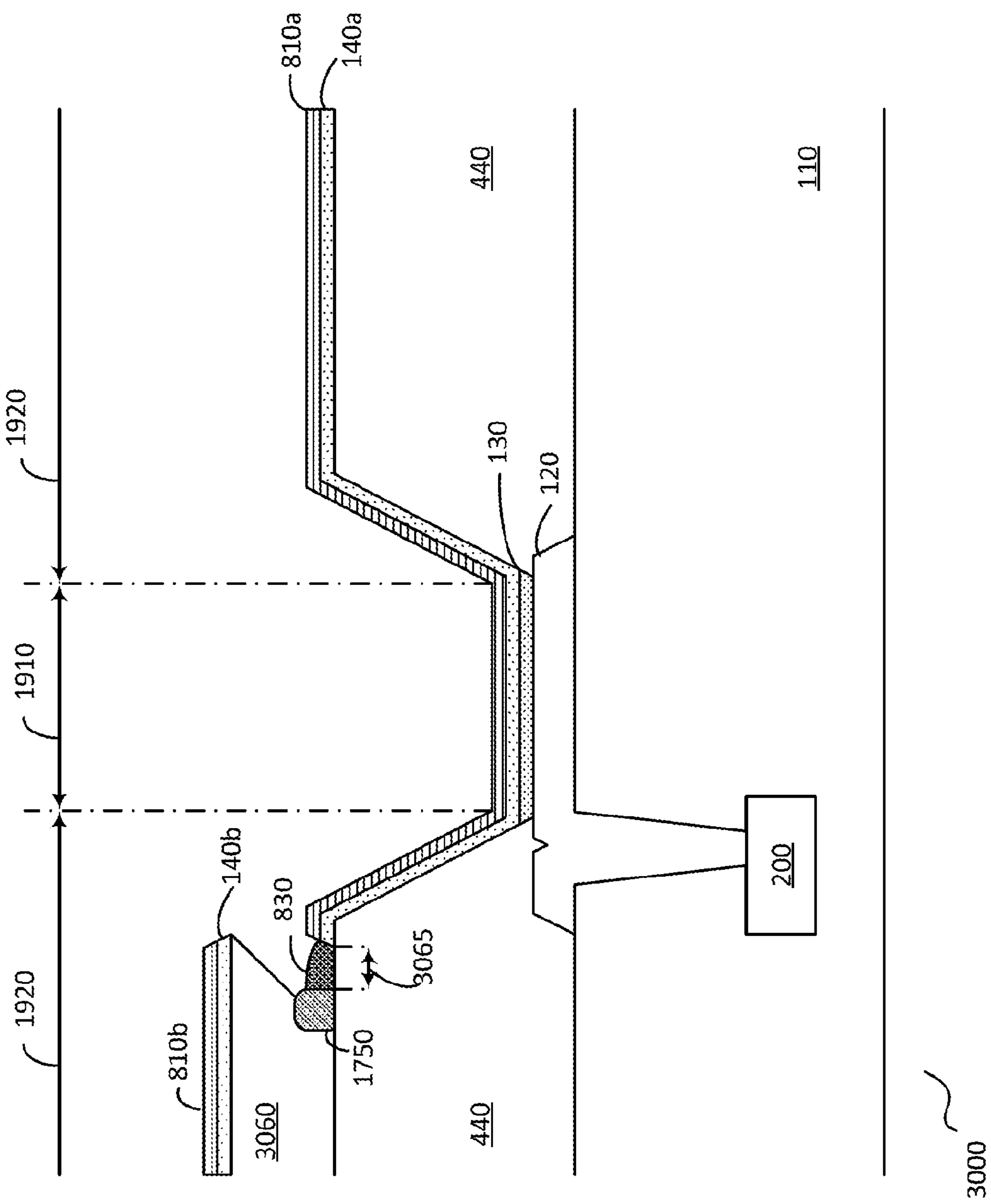
FIG. 30 is a schematic diagram illustrating an example cross-sectional view of an example version of the device of FIG. 1 in which a second electrode is coupled to an auxiliary electrode according to an example in the present disclosure.

Conductive Coating for Electrically Coupling an Electrode to an Auxiliary Electrode Turning to FIG. 30, there is shown a cross-sectional view of an example version 3000 of the device 100. The device 3000 comprises in a lateral aspect, an emissive region 1910 and an adjacent non-emissive region 1920.

In some non-limiting examples, the emissive region 1910 corresponds to a sub-pixel 264*x* of the device 3000. The emissive region 1910 has a substrate 110, a first electrode 120, a second electrode 140 and at least one semiconducting layer 130 arranged therebetween.

The first electrode 120 is disposed on an exposed layer surface 111 of the substrate 110. The substrate 110 comprises a TFT structure 200, that is electrically coupled to the first electrode 120. The edges and/or perimeter of the first electrode 120 is generally covered by at least one PDL 440.

The non-emissive region 1920 has an auxiliary electrode 1750 and a first part of the non-emissive region 1920 has a projecting structure 3060 arranged to project over and overlap a lateral aspect of the auxiliary electrode 1750. The projecting structure 3060 extends laterally to provide a sheltered region 3065. By way of non-limiting example, the projecting structure 3060 may be recessed at and/or near the auxiliary electrode 1750 on at least one side to provide the sheltered region 3065. As shown, the sheltered region 3065 may in some non-limiting examples, correspond to a region on a surface of the PDL 440 that overlaps with a lateral projection of the projecting structure 3060. The non-emissive region 1920 further comprises a conductive coating 830 disposed in the sheltered region 3065. The conductive coating 830 electrically couples the auxiliary electrode 1750 with the second electrode 140.

An NIC 810*a* is disposed in the emissive region 1910 over the exposed layer surface 111 of the second electrode 140. In some non-limiting examples, an exposed layer surface 111 of the projecting structure 3060 is coated with a residual thin conductive film 3040 from deposition of a thin conductive film to form the second electrode 140. In some non-limiting examples, a surface of the residual thin conductive film 3040 is coated with a residual NIC 810*b* from deposition of the NIC 810.

However, because of the lateral projection of the projecting structure 3060 over the sheltered region 3065, the sheltered region 3065 is substantially devoid of NIC 810. Thus, when a conductive coating 830 is deposited on the device 3000 after deposition of the NIC 810, the conductive coating 830 is deposited on and/or migrates to the sheltered region 3065 to couple the auxiliary electrode 1750 to the second electrode 140.

Those having ordinary skill in the relevant art will appreciate that a non-limiting example has been shown in FIG. 30 and that various modifications may be apparent. By way of non-limiting example, the projecting structure 3060 may provide a sheltered region 3065 along at least two of its sides. In some non-limiting examples, the projecting structure 3060 may be omitted and the auxiliary electrode 1750 may include a recessed portion that defines the sheltered region 3065. In some non-limiting examples, the auxiliary electrode 1750 and the conductive coating 830 may be disposed directly on a surface of the substrate 110, instead of the PDL 440.

Selective Deposition of Optical Coating

In some non-limiting examples, a device 100 (not shown), which in some non-limiting examples may be an opto-electronic device, comprises a substrate 110, an NIC 810 and an optical coating. The NIC 810 covers a first lateral portion of the substrate 110. The optical coating covers a second lateral portion of the substrate. At least a part of the NIC 810 is substantially devoid of the optical coating.

In some non-limiting examples, the optical coating may be used to modulate optical properties of light being transmitted, emitted and/or absorbed by the device 100, including without limitation, plasmon modes. By way of non-limiting example, the optical coating may be used as an optical filter, index-matching coating, optical out-coupling coating, scattering layer, diffraction grating, and/or parts thereof.

In some non-limiting examples, the optical coating may be used to modulate at least one optical microcavity effect in the device 100 by, without limitation, tuning the total optical path length and/or the refractive index thereof. At least one optical property of the device 100 may be affected by modulating at least one optical microcavity effect including without limitation, the output light, including without limitation, an angular dependence of a brightness and/or a color shift thereof. In some non-limiting examples, the optical coating may be a non-electrical component, that is, the optical coating may not be configured to conduct and/or transmit electrical current during normal device operations.

In some non-limiting examples, the optical coating may be formed of any material used as a conductive coating 830 and/or employing any mechanism of depositing a conductive coating 830 as described herein.

Edge Effects of NICs and Conductive Coatings

FIGS. 31A-31I describe various potential behaviours of NICs 810 at a deposition interface with conductive coatings 830.

Figure 31A:
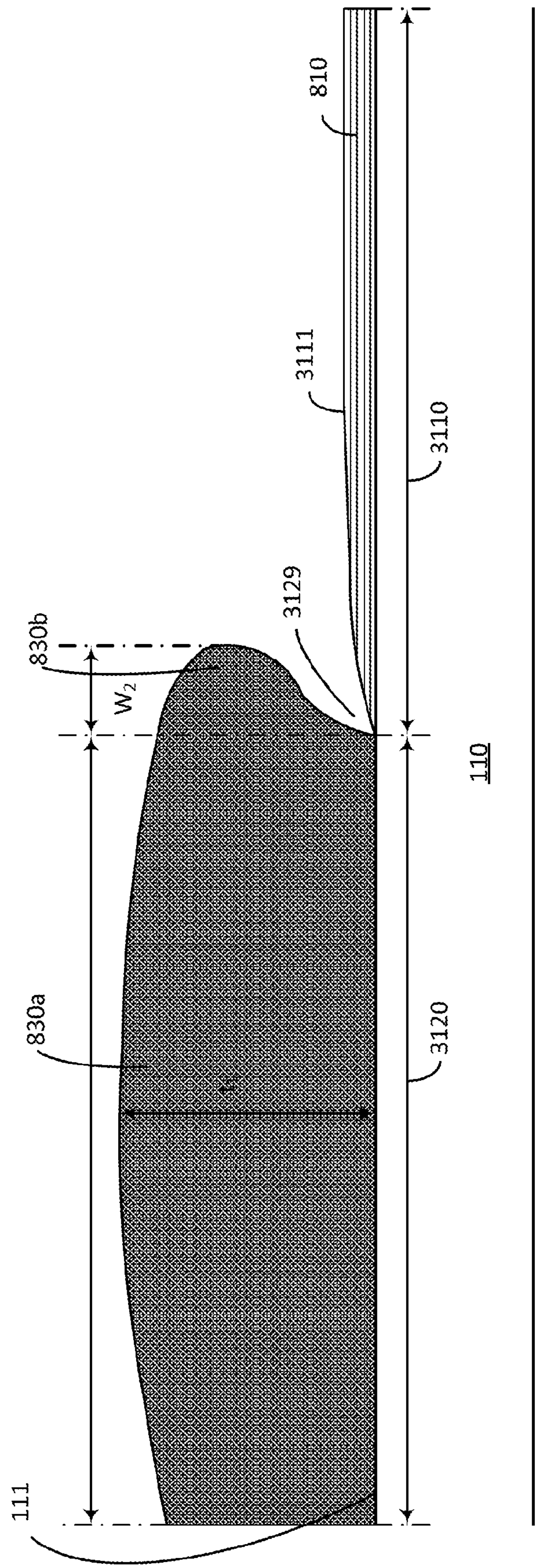
FIGS. 31A-31I are schematic diagrams that show various potential behaviours of an NIC at a deposition interface with a conductive coating in an example version of the device of FIG. 1, according to various examples in the present disclosure.

Turning to FIG. 31A, there is shown a first example of a part of an example version 3100 of the device 100 at an NIC deposition boundary. The device 3100 comprises a substrate 110 having a layer surface 111. An NIC 810 is deposited over a first portion 3110 of the layer surface 111. A conductive coating 830 is deposited over a second portion 3120 of the layer surface 111. As shown, by way of non-limiting example, the first portion 3110 and the second portion 3120 are distinct and non-overlapping portions of the layer surface 111.

The conductive coating 830 comprises a first part 830*a* and a remaining part 830*b*. As shown, by way of non-limiting example, the first part 830*a* of the conductive coating 830 substantially covers the second portion 3120 and the second part 830*b* of the conductive coating 830 partially projects over and/or overlaps a first part of the NIC 810.

In some non-limiting examples, since the NIC 810 is formed such that its surface 3111 exhibits a relatively low affinity or initial sticking probability $S_0$ for a material used to form the conductive coating 830, there is a gap 3129 formed between the projecting and/or overlapping second part 830*b* of the conductive coating 830 and the surface 3111 of the NIC 810. As a result, the second part 830*b* is not in physical contact with the NIC 810 but is spaced-apart therefrom by the gap 3129 in a cross-sectional aspect. In some non-limiting examples, the first part 830*a* of the conductive coating 830 may be in physical contact with the NIC 810 at an interface and/or boundary between the first portion 3110 and the second portion 3120.

In some non-limiting examples, the projecting and/or overlapping second part 830*b* of the conductive coating 830 may extend laterally over the NIC 810 by a comparable extent as a thickness $t_1$ of the conductive coating 830. By way of non-limiting example, as shown, a width $w_2$ of the second part 830*b* may be comparable to the thickness $t_1$. In some non-limiting examples, a ratio of $w_2$:$t_1$ may be in a range of about 1:1 to about 1:3, about 1:1 to about 1:1.5, and/or about 1:1 to about 1:2. While the thickness $t_1$ may in some non-limiting examples be relatively uniform across the conductive coating 830, in some non-limiting examples, the extent to which the second part 830*b* projects and/or overlaps with the NIC 810 (namely $w_2$) may vary to some extent across different parts of the layer surface 111.

Figure 31B:
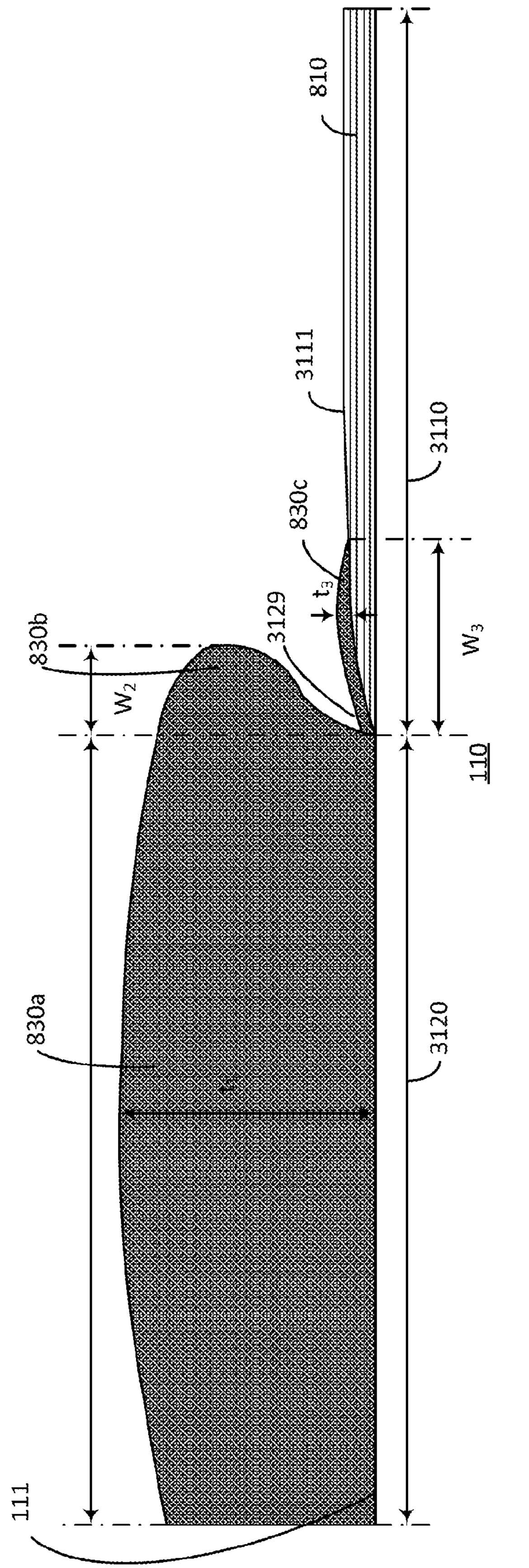

Turning now to FIG. 31B, the conductive coating 830 is shown to include a third part 830*c* disposed between the second part 830*b* and the NIC 810. As shown, the second part 830*b* of the conductive coating 830 extends laterally over and is spaced apart from the third part 830*c* of the conductive coating 830 and the third part 830*c* may be in physical contact with the surface 3111 of the NIC 810. A thickness $t_3$ of the third part 830*c* of the conductive coating 830 may be less and in some non-limiting examples, substantially less than the thickness $t_1$ of the first part 830*a* thereof. In some non-limiting examples, a width $w_3$ of the third part 830*c* may be greater than the width $w_2$ of the second part 830*b*. In some non-limiting examples, the third part 830*c* may extend laterally to overlap the NIC 810 to a greater extent than the second part 830*b*. In some non-limiting examples, a ratio of $w_3$:$t_1$ may be in a range of about 1:2 to about 3:1 and/or about 1:1.2 to about 2.5:1. While the thickness $t_1$ may in some non-limiting examples be relatively uniform across the conductive coating 830, in some non-limiting examples, the extent to which the third part 830*c* projects and/or overlaps with the NIC 810 (namely $w_3$) may vary to some extent across different parts of the layer surface 111.

The thickness $t_3$ of the third part 830*c* may be no greater than and/or less than about 5% of the thickness $t_1$ of the first part 830*a*. By way of non-limiting example, $t_3$ may be no greater than and/or less than about 4%, no greater than and/or less than about 3%, no greater than and/or less than about 2%, no greater than and/or less than about 1%, and/or no greater than and/or less than about 0.5% of $t_1$. Instead of, and/or in addition to, the third part 830*c* being formed as a thin film, as shown, the material of the conductive coating 830 may form as islands and/or disconnected clusters on a part of the NIC 810. By way of non-limiting example, such islands and/or disconnected clusters may comprise features that are physically separated from one another, such that the islands and/or clusters do not form a continuous layer.

Figure 31C:
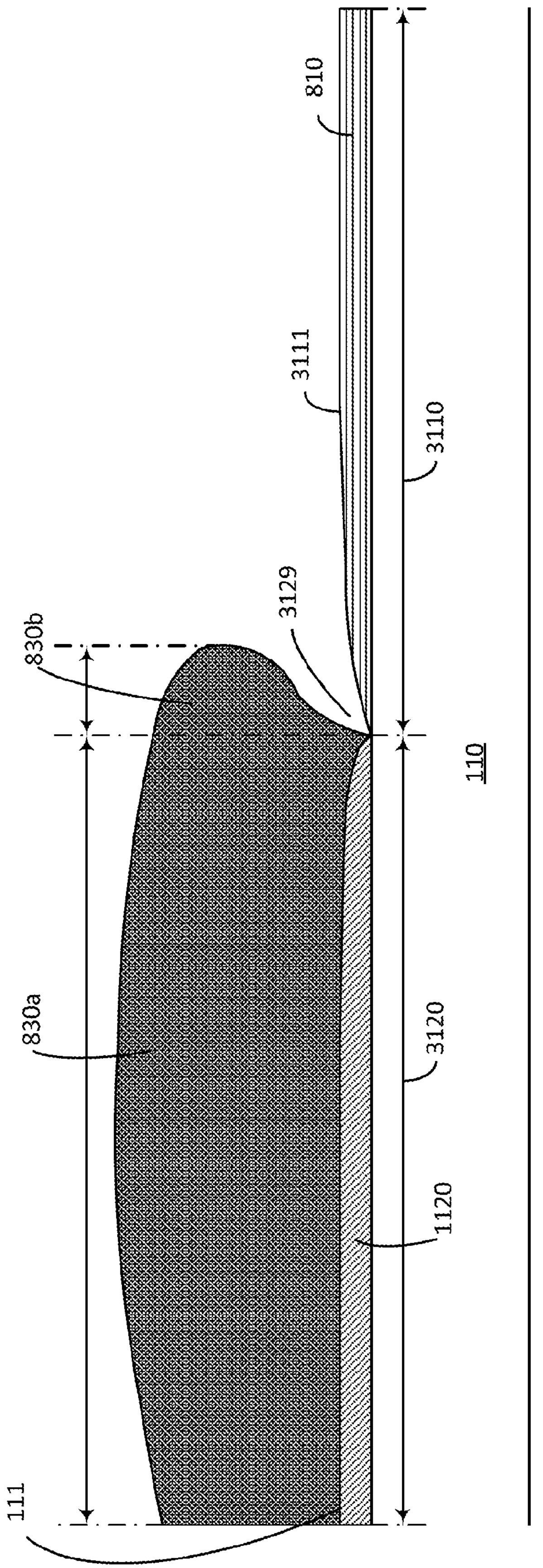

Turning now to FIG. 31C, an NPC 1120 is disposed between the substrate 110 and the conductive coating 830. The NPC 1120 is disposed between the first part 830*a* of the conductive coating 830 and the second portion 3120 of the substrate 110. The NPC 1120 is illustrated as being disposed on the second portion 3120 and not on the first portion 3110, where the NIC 810 has been deposited. The NPC 1120 may be formed such that, at an interface and/or boundary between the NPC 1120 and the conductive coating 830, a surface of the NPC 1120 exhibits a relatively high affinity or initial sticking probability $S_0$ for the material of the conductive coating 830. As such, the presence of the NPC 1120 may promote the formation and/or growth of the conductive coating 830 during deposition.

Figure 31D:
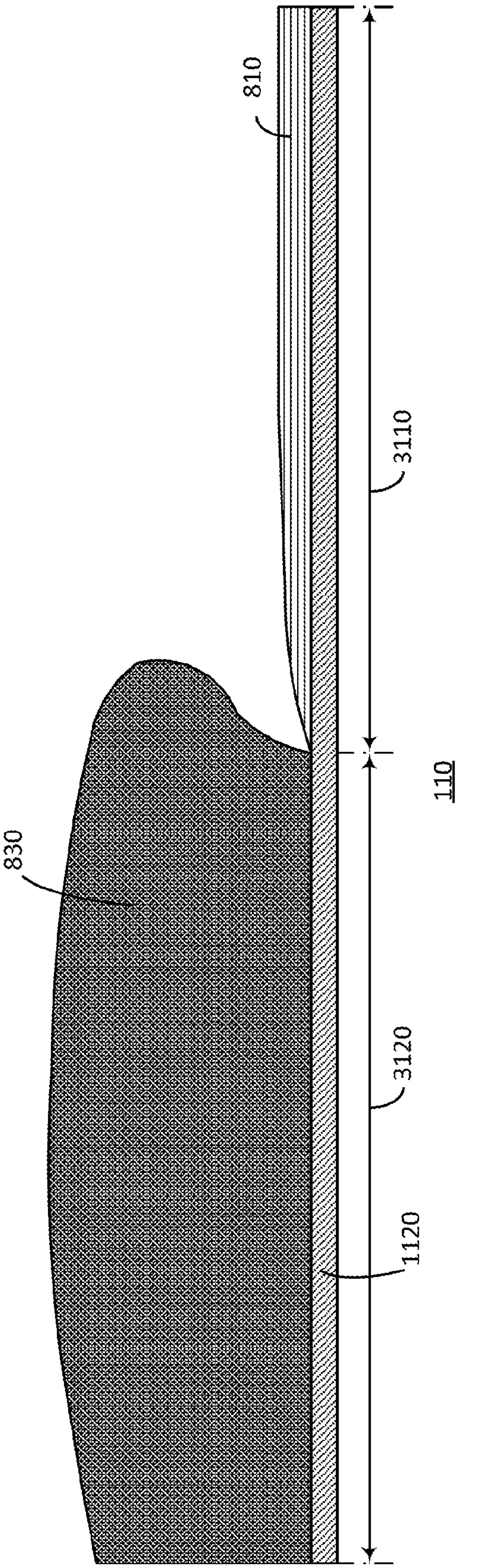

Turning now to FIG. 31D, the NPC 1120 is disposed on both the first portion 3110 and the second portion 3120 of the substrate 110 and the NIC 810 covers a part of the NPC 1120 disposed on the first portion 3110. Another part of the NPC 1120 is substantially devoid of the NIC 810 and the conductive coating 830 covers such part of the NPC 1120.

Figure 31E:
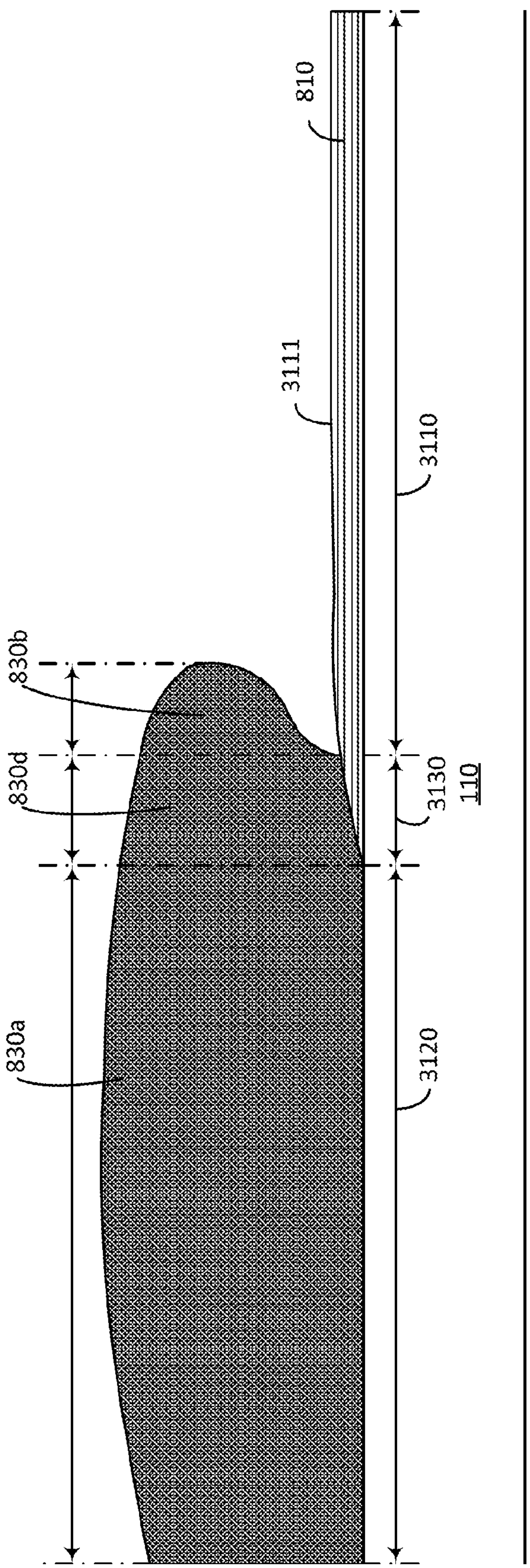

Turning now to FIG. 31E, the conductive coating 830 is shown to partially overlap a part of the NIC 810 in a third portion 3130 of the substrate 110. In some non-limiting examples, in addition to the first part 830*a* and the second part 830*b*, the conductive coating 830 further includes a fourth part 830*d*. As shown, the fourth part 830*d* of the conductive coating 830 is disposed between the first part 830*a* and the second part 830*b* of the conductive coating 830 and the fourth part 830*d* may be in physical contact with the layer surface 3111 of the NIC 810. In some non-limiting examples, the overlap in the third portion 3130 may be formed as a result of lateral growth of the conductive coating 830 during an open mask and/or mask-free deposition process. In some non-limiting examples, while the layer surface 3111 of the NIC 810 may exhibit a relatively low initial sticking probability $S_0$ for the material of the conductive coating 830, and thus the probability of the material nucleating the layer surface 3111 is low, as the conductive coating 830 grows in thickness, the conductive coating 830 may also grow laterally and may cover a subset of the NIC 810 as shown.

Figure 31F:
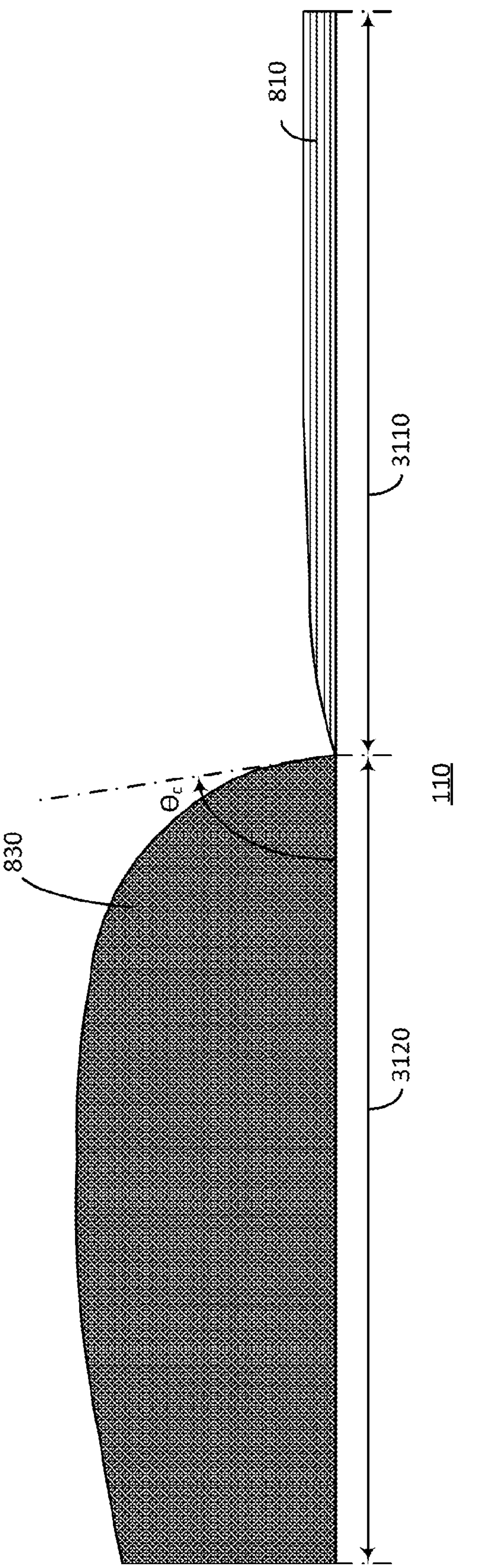

Turning now to FIG. 31F the first portion 3110 of the substrate 110 is coated with the NIC 810 and the second portion 3120 adjacent thereto is coated with the conductive coating 830. In some non-limiting examples, it has been observed that conducting an open mask and/or mask-free deposition of the conductive coating 830 may result in the conductive coating 830 exhibiting a tapered cross-sectional profile at and/or near an interface between the conductive coating 830 and the NIC 810.

In some non-limiting examples, a thickness of the conductive coating 830 at and/or near the interface may be less than an average thickness of the conductive coating 830. While such tapered profile is shown as being curved and/or arched, in some non-limiting examples, the profile may, in some non-limiting examples be substantially linear and/or non-linear. By way of non-limiting example, the thickness of the conductive coating 830 may decrease, without limitation, in a substantially linear, exponential and/or quadratic fashion in a region proximal to the interface.

It has been observed that a contact angle $\theta_c$ of the conductive coating 830 at and/or near the interface between the conductive coating 830 and the NIC 810 may vary, depending on properties of the NIC 810, such as a relative affinity and/or an initial sticking probability $S_0$. It is further postulated that the contact angle $\theta_c$ of the nuclei may in some non-limiting examples, dictate the thin film contact angle of the conductive coating 830 formed by deposition. Referring to FIG. 31F by way of non-limiting example, the contact angle $\theta_c$ may be determined by measuring a slope of a tangent of the conductive coating 830 at or near the interface between the conductive coating 830 and the NIC 810. In some non-limiting examples, where the cross-sectional taper profile of the conductive coating 830 is substantially linear, the contact angle $\theta_c$ may be determined by measuring the slope of the conductive coating 830 at and/or near the interface. As will be appreciated by those having ordinary skill in the relevant art, the contact angle $\theta_c$ may be generally measured relative to an angle of the underlying surface. In the present disclosure, for purposes of simplicity of illustration, the coatings 810, 830 are shown deposited on a planar surface. However, those having ordinary skill in the relevant art will appreciate that such coatings 810, 830 may be deposited on non-planar surfaces.

Figure 31G:
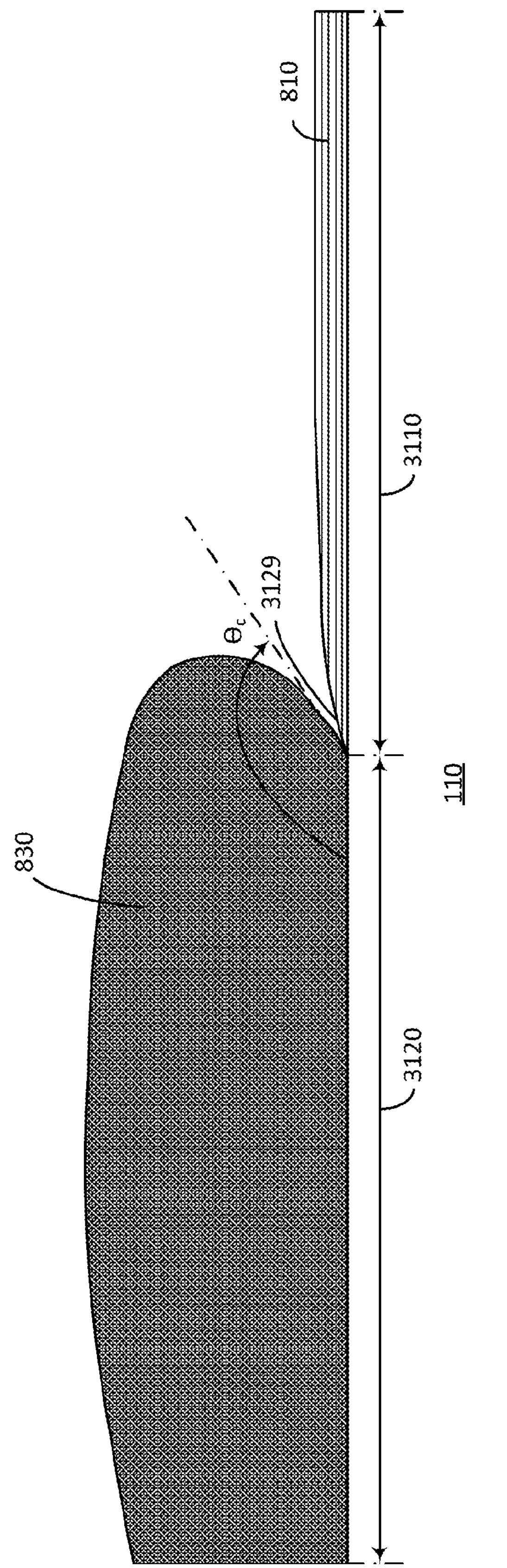

In some non-limiting examples, the contact angle $\theta_c$ of the conductive coating 830 may be greater than about 90°. Referring now to FIG. 31G, by way of non-limiting example, the conductive coating 830 is shown as including a part extending past the interface between the NIC 810 and the conductive coating 830 and is spaced apart from the NIC by a gap 3129. In such non-limiting scenario, the contact angle $\theta_c$ may, in some non-limiting examples, be greater than about 90°.

In some non-limiting examples, it may be advantageous to form a conductive coating 830 exhibiting a relatively high contact angle $\theta_c$. By way of non-limiting example, the contact angle $\theta_c$ may be greater than about 10°, greater than about 15°, greater than about 20°, greater than about 25°, greater than about 30°, greater than about 35°, greater than about 40°, greater than about 50°, greater than about 70°, greater than about 70°, greater than about 75°, and/or greater than about 80°. By way of non-limiting example, a conductive coating 830 having a relatively high contact angle $\theta_c$ may allow for creation of finely patterned features while maintaining a relatively high aspect ratio. By way of non-limiting example, it may be desirable to form a conductive coating 830 exhibiting a contact angle $\theta_c$ greater than about 90°. By way of non-limiting example, the contact angle $\theta_c$ may be greater than about 90°, greater than about 95°, greater than about 100°, greater than about 105°, greater than about 110° greater than about 120°, greater than about 130°, greater than about 135°, greater than about 140°, greater than about 145°, greater than about 150° and/or greater than about 170°.

Figure 31H:
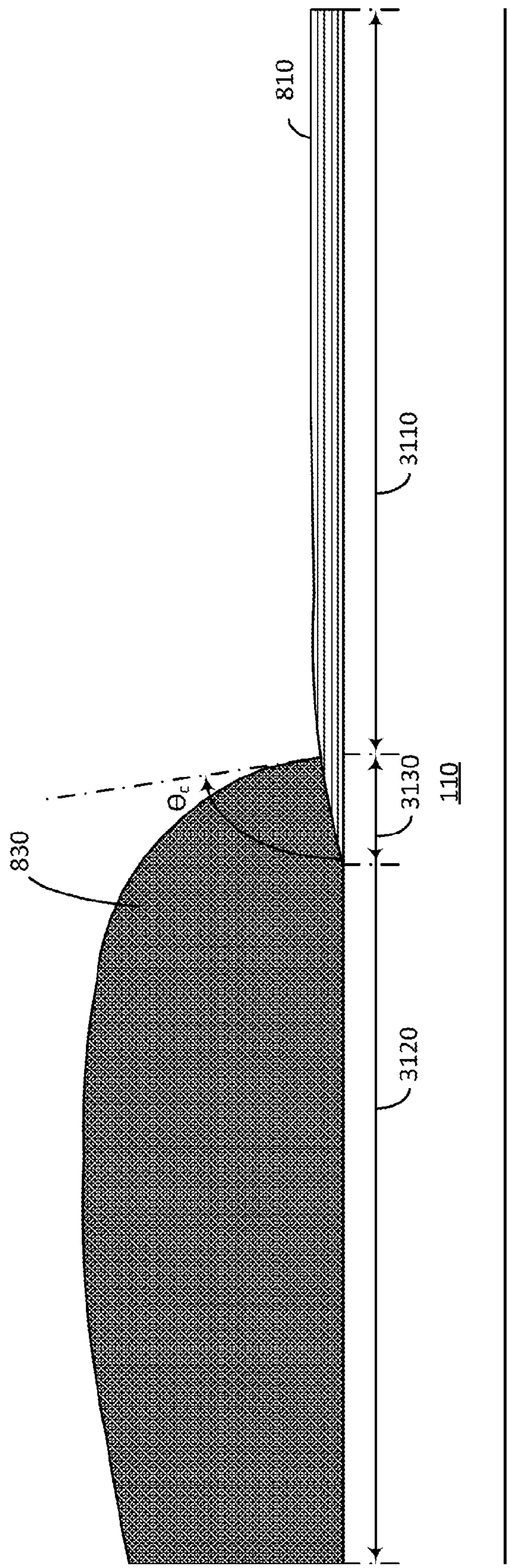
Figure 31I:
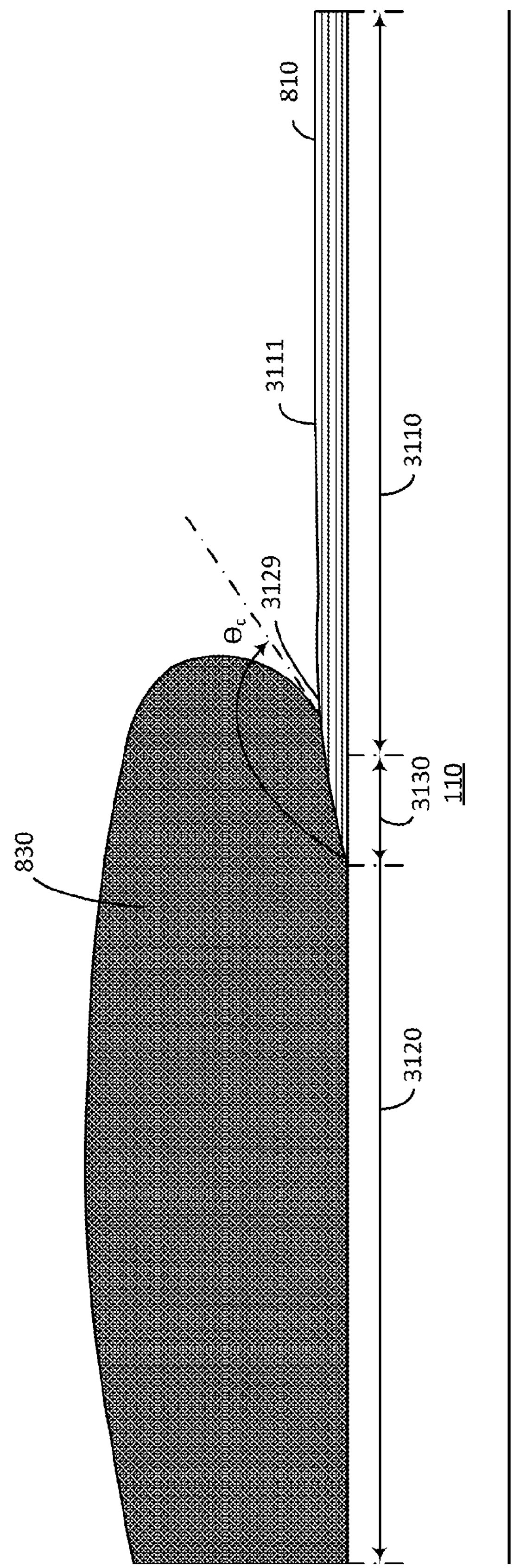

Turning now to FIGS. 31H-31I, the conductive coating 830 partially overlaps a part of the NIC 810 in the third portion 3130 of the substrate 100, which is disposed between the first portion 3110 and the second portion 3120 thereof. As shown, the subset of the conductive coating 830 partially overlapping a subset of the NIC 810 may be in physical contact with the surface 3111 thereof. In some non-limiting examples, the overlap in the third region 3130 may be formed as a result of lateral growth of the conductive coating 830 during an open mask and/or mask-free deposition process. In some non-limiting examples, while the surface 3111 of the NIC 810 may exhibit a relatively low affinity or initial sticking probability $S_0$ for the material of the conductive coating 830 and thus the probability of the material nucleating on the layer surface 3111 is low, as the conductive coating 830 grows in thickness, the conductive coating 830 may also grow laterally and may cover a subset of the NIC 810.

In the case of FIGS. 31H-31I, the contact angle $\theta_c$ of the conductive coating 830 may be measured at an edge thereof near the interface between it and the NIC 810, as shown. In FIG. 31I, the contact angle $\theta_c$ may be greater than about 90°, which may in some non-limiting examples result in a subset of the conductive coating 830 being spaced apart from the NIC 810 by a gap 3129.

Partition and Recess

Figure 32:
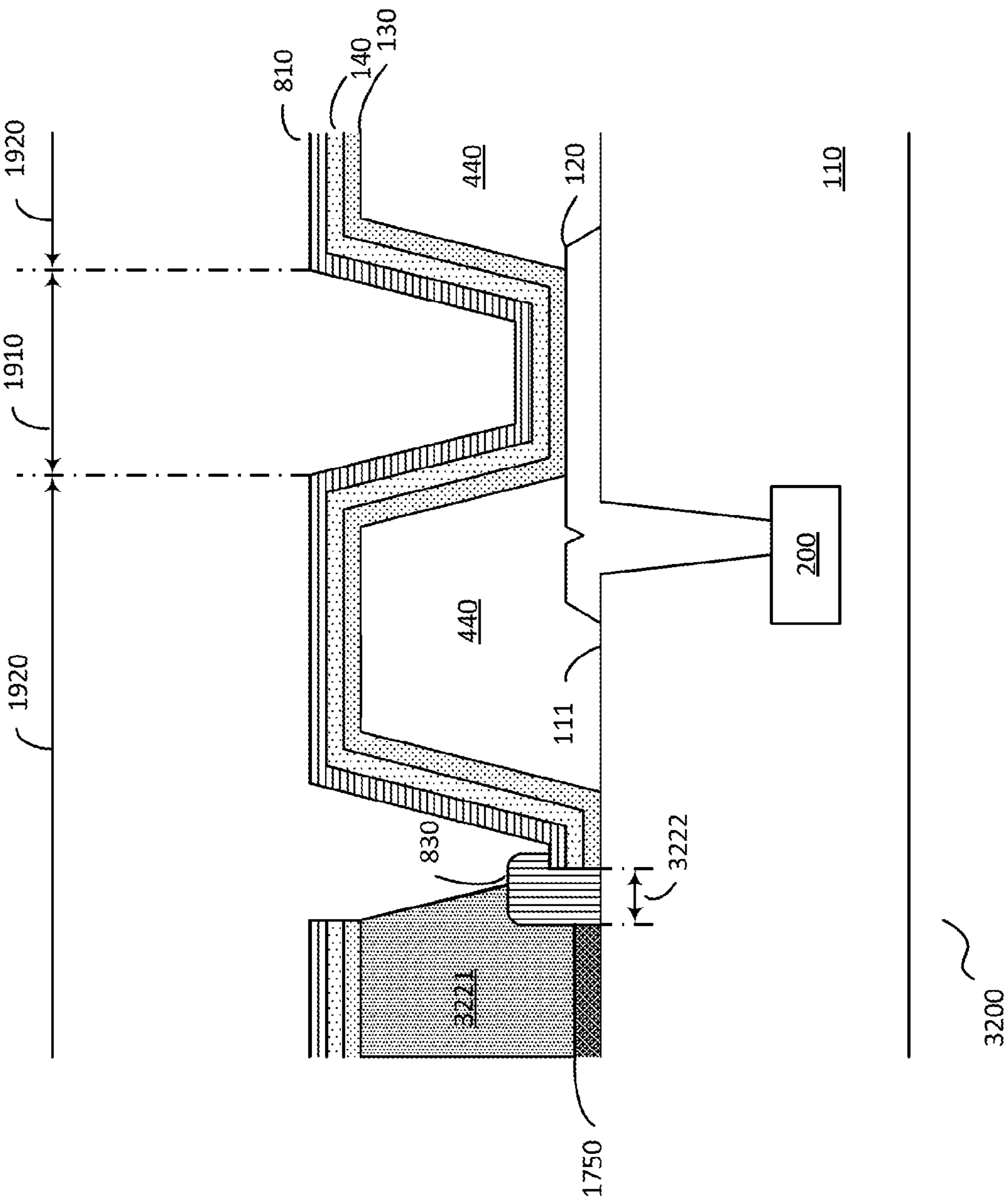
FIG. 32 is a schematic diagram illustrating an example cross-sectional view of an example version of the device of FIG. 1 having a partition and a sheltered region, such as a recess, in a non-emissive region thereof according to an example in the present disclosure.

Turning to FIG. 32, there is shown a cross-sectional view of an example version 3200 of the device 100. The device 3200 comprises a substrate 110 having a layer surface 111. The substrate 110 comprises at least one TFT structure 200. By way of non-limiting example, the at least one TFT structure 200 may be formed by depositing and patterning a series of thin films when fabricating the substrate 110, in some non-limiting examples, as described herein.

The device 3200 comprises, in a lateral aspect, an emissive region 1910 having an associated lateral aspect 410 and at least one adjacent non-emissive region 1920, each having an associated lateral aspect 420. The layer surface 111 of the substrate 110 in the emissive region 1910 is provided with a first electrode 120, that is electrically coupled to the at least one TFT structure 200. A PDL 440 is provided on the layer surface 111, such that the PDL 440 covers the layer surface 111 as well as at least one edge and/or perimeter of the first electrode 120. The PDL 440 may, in some non-limiting examples, be provided in the lateral aspect 420 of the non-emissive region 1920. The PDL 440 defines a valley-shaped configuration that provides an opening that generally corresponds to the lateral aspect 410 of the emissive region 1910 through which a layer surface of the first electrode 120 may be exposed. In some non-limiting examples, the device 3200 may comprise a plurality of such openings defined by the PDLs 400, each of which may correspond to a (sub-) pixel 340/264*x* region of the device 3200.

As shown, in some non-limiting examples, a partition 3221 is provided on the layer surface 111 in the lateral aspect 420 of a non-emissive region 1920 and, as described herein, defines a sheltered region 3065, such as a recess 3222. In some non-limiting examples, the recess 3222 may be formed by an edge of a lower section 3323 (FIG. 33A) of the partition 3221 being recessed, staggered and/or offset with respect to an edge of an upper section 3324 (FIG. 33A) of the partition 3221 that overlaps and/or projects beyond the recess 3222.

In some non-limiting examples, the lateral aspect 410 of the emissive region 1910 comprises at least one semiconducting layer 130 disposed over the first electrode 120, a second electrode 140, disposed over the at least one semiconducting layer 130, and an NIC 810 disposed over the second electrode 140. In some non-limiting examples, the at least one semiconducting layer 130, the second electrode 140 and the NIC 810 may extend laterally to cover at least the lateral aspect 420 of a part of at least one adjacent non-emissive region 1920. In some non-limiting examples, as shown, the at least one semiconducting layer 130, the second electrode 140 and the NIC 810 may be disposed on at least a part of at least one PDL 440 and at least a part of the partition 3221. Thus, as shown, the lateral aspect 410 of the emissive region 1910, the lateral aspect 420 of a part of at least one adjacent non-emissive region 1920 and a part of at least one PDL 440 and at least a part of the partition 3221, together can make up a first portion, in which the second electrode 140 lies between the NIC 810 and the at least one semiconducting layer 130.

An auxiliary electrode 1750 is disposed proximate to and/or within the recess 3221 and a conductive coating 830 is arranged to electrically couple the auxiliary electrode 1750 to the second electrode 140. Thus as shown, the recess 3221 may comprise a second portion, in which the conductive coating 830 is disposed on the layer surface 111.

A non-limiting example of a method for fabricating the device 3200 is now described.

In a stage, the method provides the substrate 110 and at least one TFT structure 200. In some non-limiting examples, at least some of the materials for forming the at least one semiconducting layer 130 may be deposited using an open-mask and/or mask-free deposition process, such that the materials are deposited in and/or across both the lateral aspect 410 of both the emissive region 1910 and/or the lateral aspect 420 of at least a part of at least one non-emissive region 1920. Those having ordinary skill in the relevant art will appreciate that in some non-limiting examples, it may be appropriate to deposit the at least one semiconducting layer 130 in such manner so as to reduce any reliance on patterned deposition, which in some non-limiting examples, is performed using an FMM.

In a stage, the method deposits the second electrode 140 over the at least one semiconducting layer 130. In some non-limiting examples, the second electrode 140 may be deposited using an open-mask and/or mask-free deposition process. In some non-limiting examples, the second electrode 140 may be deposited by subjecting an exposed layer surface 111 of the at least one semiconducting layer 130 disposed in the lateral aspect 410 of the emissive region 1910 and/or the lateral aspect 420 of at least a part of at least one of the non-emissive region 1920 to an evaporated flux of a material for forming the second electrode 130.

In a stage, the method deposits the NIC 810 over the second electrode 140. In some non-limiting examples, the NIC 810 may be deposited using an open-mask and/or mask-free deposition process. In some non-limiting examples, the NIC 810 may be deposited by subjecting an exposed layer surface 111 of the second electrode 140 disposed in the lateral aspect 410 of the emissive region 1910 and/or the lateral aspect 420 of at least a part of at least one of the non-emissive region 1920 to an evaporated flux of a material for forming the NIC 810.

As shown, the recess 3222 is substantially free of, or is uncovered by the NIC 810. In some non-limiting examples, this may be achieved by masking, by the partition 3221, a recess 3222, in a lateral aspect thereof, such that the evaporated flux of a material for forming the NIC 810 is substantially precluded from being incident onto such recess 3222 of the layer surface 111. Accordingly, in such example, the recess 3222 of the layer surface 111 is substantially devoid of the NIC 810. By way of non-limiting example, a laterally projecting part of the partition 3221 may define the recess 3222 at a base of the partition 3221. In such example, at least one surface of the partition 3221 that defines the recess 3222 may also be substantially devoid of the NIC 810.

In a stage, the method deposits the conductive coating 830, in some non-limiting examples, after providing the NIC 810, on the device 3200. In some non-limiting examples, the conductive coating 830 may be deposited using an open-mask and/or mask-free deposition process. In some non-limiting examples, the conductive coating 830 may be deposited by subjecting the device 3200 to an evaporated flux of a material for forming the conductive coating 830. By way of non-limiting example, a source (not shown) of conductive coating 830 material may be used to direct an evaporated flux of material for forming the conductive coating 830 towards the device 3200, such that the evaporated flux is incident on such surface. However, in some non-limiting examples, the surface of the NIC 810 disposed in the lateral aspect 410 of the emissive region 1910 and/or the lateral aspect 420 of at least a part of at least one of the non-emissive region 1920 exhibits a relatively low initial sticking probability $S_0$, for the conductive coating 830, the conductive coating 830 may selectively deposit onto a second portion, including without limitation, the recessed portion of the device 3200, where the NIC 810 is not present.

In some non-limiting examples, at least a part of the evaporated flux of the material for forming the conductive coating 830 may be directed at a non-normal angle relative to a lateral plane of the layer surface 111. By way of non-limiting example, at least a part of the evaporated flux may be incident on the device 3200 at an angle of incidence that is, relative to such lateral plane of the layer surface 111, less than 90°, less than about 85°, less than about 80°, less than about 75°, less than about 70°, less than about 60°, and/or less than about 50°. By directing an evaporated flux of a material for forming the conductive coating 830, including at least a part thereof incident at a non-normal angle, at least one surface of and/or in the recess 3222 may be exposed to such evaporated flux.

In some non-limiting examples, a likelihood of such evaporated flux being precluded from being incident onto at least one surface of and/or in the recess 3222 due to the presence of the partition 3221, may be reduced since at least a part of such evaporated flux may be flowed at a non-normal angle of incidence.

In some non-limiting examples, at least a part of such evaporated flux may be non-collimated. In some non-limiting examples, at least a part of such evaporated flux may be generated by an evaporation source that is a point source, a linear source and/or a surface source.

In some non-limiting examples, the device 3200 may be displaced during deposition of the conductive coating 830. By way of non-limiting example, the device 3200 and/or the substrate 110 thereof and/or any layer(s) deposited thereon, may be subjected to a displacement that is angular, in a lateral aspect and/or in an aspect substantially parallel to the cross-sectional aspect.

In some non-limiting examples, the device 3200 may be rotated about an axis that substantially normal to the lateral plane of the layer surface 111 while being subjected to the evaporated flux.

In some non-limiting examples, at least a part of such evaporated flux may be directed toward the layer surface 111 of the device 3200 in a direction that is substantially normal to the lateral plane of the surface.

Without wishing to be bound by a particular theory, it is postulated that the material for forming the conductive coating 830 may nevertheless be deposited within the recess 3222 due to lateral migration and/or desorption of adatoms adsorbed onto the surface of the NIC 810. In some non-limiting examples, it is postulated that any adatoms adsorbed onto the surface of the NIC 810 may have a tendency to migrate and/or desorb from such surface due to unfavorable thermodynamic properties of the surface for forming a stable nucleus. In some non-limiting examples, it is postulated that at least some of the adatoms migrating and/or desorbing off such surface may be re-deposited onto the surfaces in the recess 3222 to form the conductive coating 830.

In some non-limiting examples, the conductive coating 830 may be formed such that the conductive coating 830 is electrically coupled to both the auxiliary electrode 1750 and the second electrode 140. In some non-limiting examples, the conductive coating 830 is in physical contact with at least one of the auxiliary electrode 1750 and/or the second electrode 140. In some non-limiting examples, an intermediate layer may be present between the conductive coating 830 and at least one of the auxiliary electrode 1750 and/or the second electrode 140. However, in such example, such intermediate layer may not substantially preclude the conductive coating 830 from being electrically coupled to the at least one of the auxiliary electrode 1750 and/or the second electrode 140. In some non-limiting examples, such intermediate layer may be relatively thin and be such as to permit electrical coupling therethrough. In some non-limiting examples, a sheet resistance of the conductive coating 830 may be equal to and/or less than a sheet resistance of the second electrode 140.

As shown in FIG. 32, the recess 3222 is substantially devoid of the second electrode 140. In some non-limiting examples, during the deposition of the second electrode 140, the recess 3222 is masked, by the partition 3221, such that the evaporated flux of the material for forming the second electrode 140 is substantially precluded form being incident on at least one surface of and/or in the recess 3222. In some non-limiting examples, at least a part of the evaporated flux of the material for forming the second electrode 140 is incident on at least one surface of and/or in the recess 3222, such that the second electrode 140 extends to cover at least a part of the recess 3222.

In some non-limiting examples, the auxiliary electrode 1750, the conductive coating 830 and/or the partition 3221 may be selectively provided in certain region(s) of a display panel. In some non-limiting examples, any of these features may be provided at and/or proximate to one or more edges of such display panel for electrically coupling at least one element of the frontplane 10, including without limitation, the second electrode 140, to at least one element of the backplane 20. In some non-limiting example, providing such features at and/or proximate to such edges may facilitate supplying and distributing electrical current to the second electrode 140 from an auxiliary electrode 1750 located at and/or proximate to such edges. In some non-limiting examples, such configuration may facilitate reducing a bezel size of the display panel.

In some non-limiting examples, the auxiliary electrode 1750, the conductive coating 830 and/or the partition 3221 may be omitted from certain regions(s) of such display panel. In some non-limiting examples, such features may be omitted from parts of the display panel, including without limitation, where a relatively high pixel density is to be provided, other than at and/or proximate to at least one edge thereof.

Figure 33A:
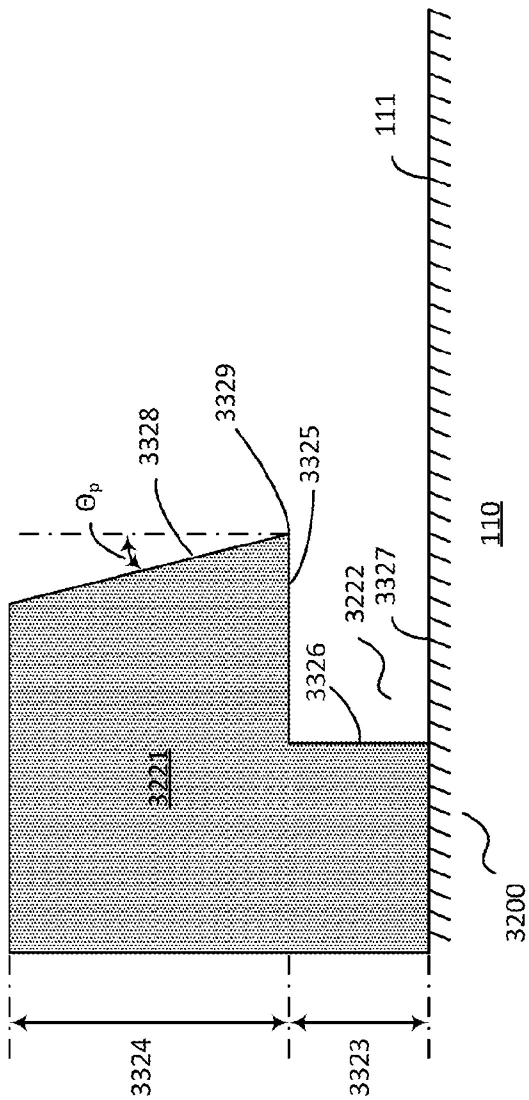
FIG. 33A is a schematic diagram that shows an example cross-sectional view of an example version of the device of FIG. 1 having a partition and a sheltered region, such as a recess, in a non-emissive region prior to deposition of a semiconducting layer thereon, according to an example in the present disclosure.

FIG. 33A shows a fragment of the device 3200 in a region proximal to the partition 3221 and at a stage prior to deposition of the at least one semiconducting layer 130. In some non-limiting examples, the partition 3221 comprises a lower section 3323 and an upper section 3324, with the upper section 3324 projecting over the lower section 3323, so as to form the recess 3222 where the lower section 3323 is laterally recessed relative to the upper section 3324. By way of non-limiting example, the recess 3222 may be formed such that it extends substantially laterally into the partition 3221. In some non-limiting examples, the recess 3221 may correspond to a space defined between a ceiling 3325 defined by the upper section 3324, a side 3326 of the lower section 3323 and a floor 3327 corresponding to the layer surface 111 of the substrate 110. In some non-limiting examples, the upper section 3324 comprises an angled section 3328. By way of non-limiting example, the angled section 3328 may be provided by a surface that is not substantially parallel to a lateral plane of the layer surface 111. By way of non-limiting example, the angled section may be tilted and/or offset from an axis that is substantially normal to the layer surface 111 by an angle $\theta_p$. A lip 3329 is also provided by the upper section 3324. In some non-limiting examples, the lip 3329 may be provided at or near an opening of the recess 3222. By way of non-limiting example, the lip 3329 may be provided at a junction of the angled section 3328 and the ceiling 3325. In some non-limiting examples, at least one of the upper section 3324, the side 3326 and the floor 3327 may be electrically conductive so as to form at least a part of the auxiliary electrode 1750.

In some non-limiting examples, the angle $\theta_p$, which represents the angle by which the angled section 3328 of the upper section 3324 is tilted and/or offset from the axis, may be less than or equal to about 60°. By way of non-limiting example, the angle may be less than or equal to about 50°, less than or equal to about 45°, less than or equal to about 40°, less than or equal to about 30°, less than or equal to about 25°, less than or equal to about 20°, less than or equal to about 15°, and/or less than or equal to about 10°. In some non-limiting examples, the angle may be between about 60° and about 25°, between about 60° and about 30° and/or between about 50° and about 30°. Without wishing to be bound by any particular theory, it may be postulated that providing an angled section 3328 may inhibit deposition of the material for forming the NIC 810 at or near the lip 3329, so as to facilitate the deposition of the material for forming the conductive coating 830 at or near the lip 3229.

Figure 33B:
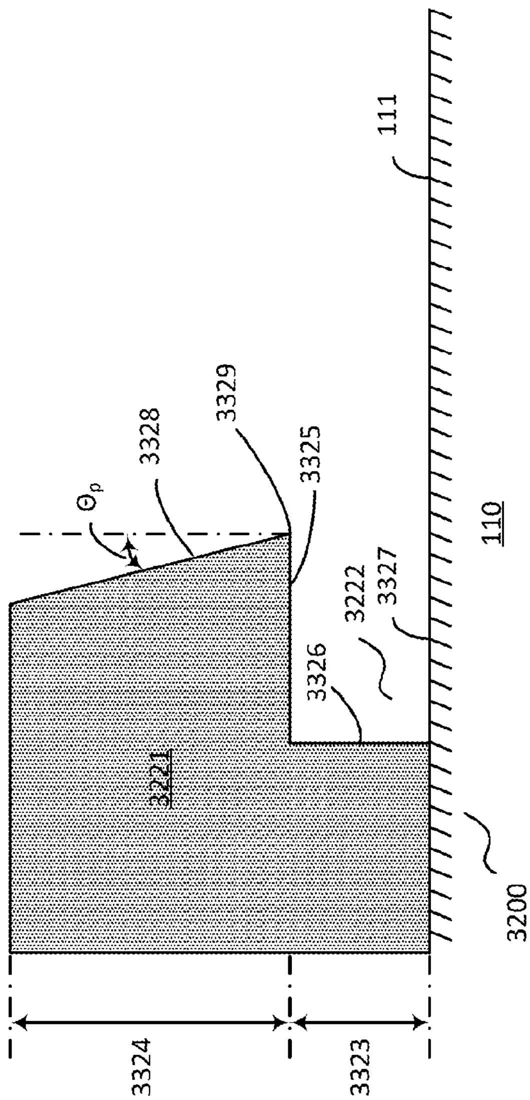
FIGS. 33B-33P are schematic diagrams that show various examples of interactions between the partition of FIG. 33A after deposition of a semiconducting layer, a second electrode and an NIC with a conductive coating deposited thereon, according to various examples in the present disclosure.
Figure 33C:
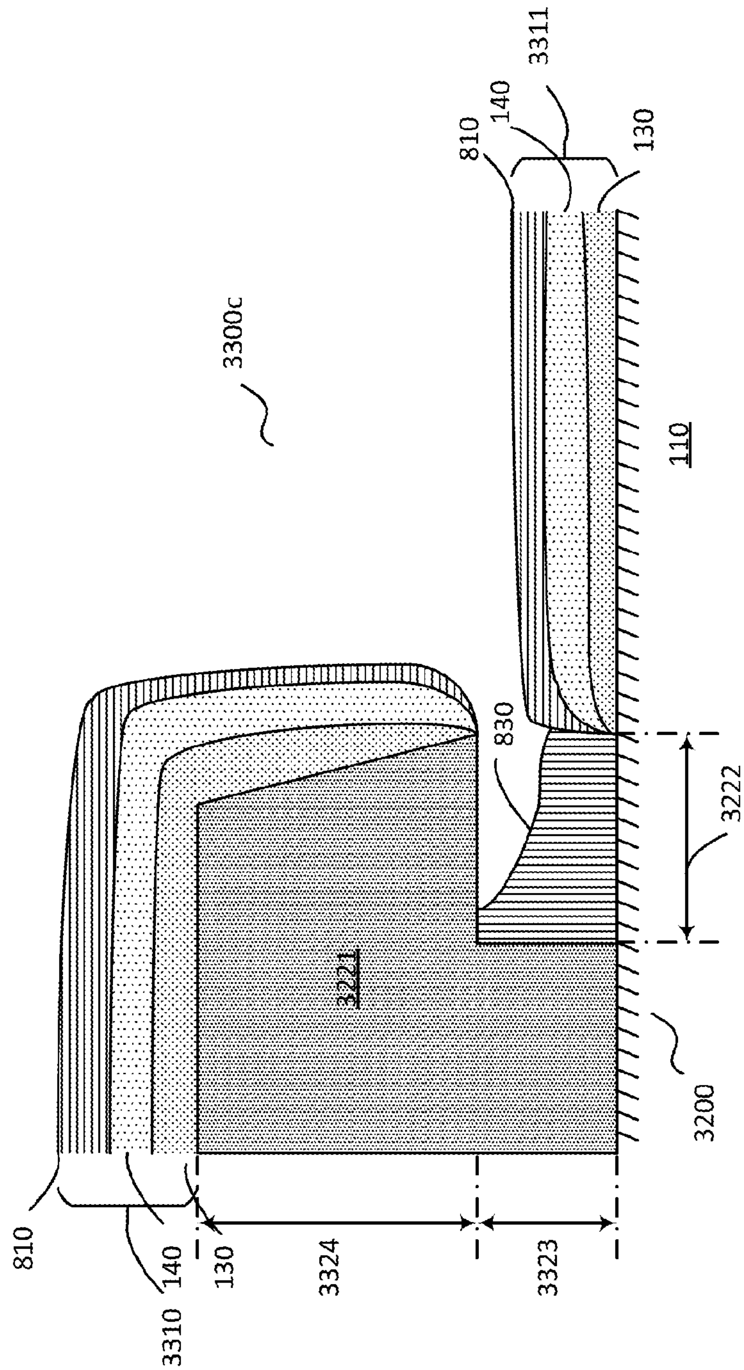
Figure 33D:
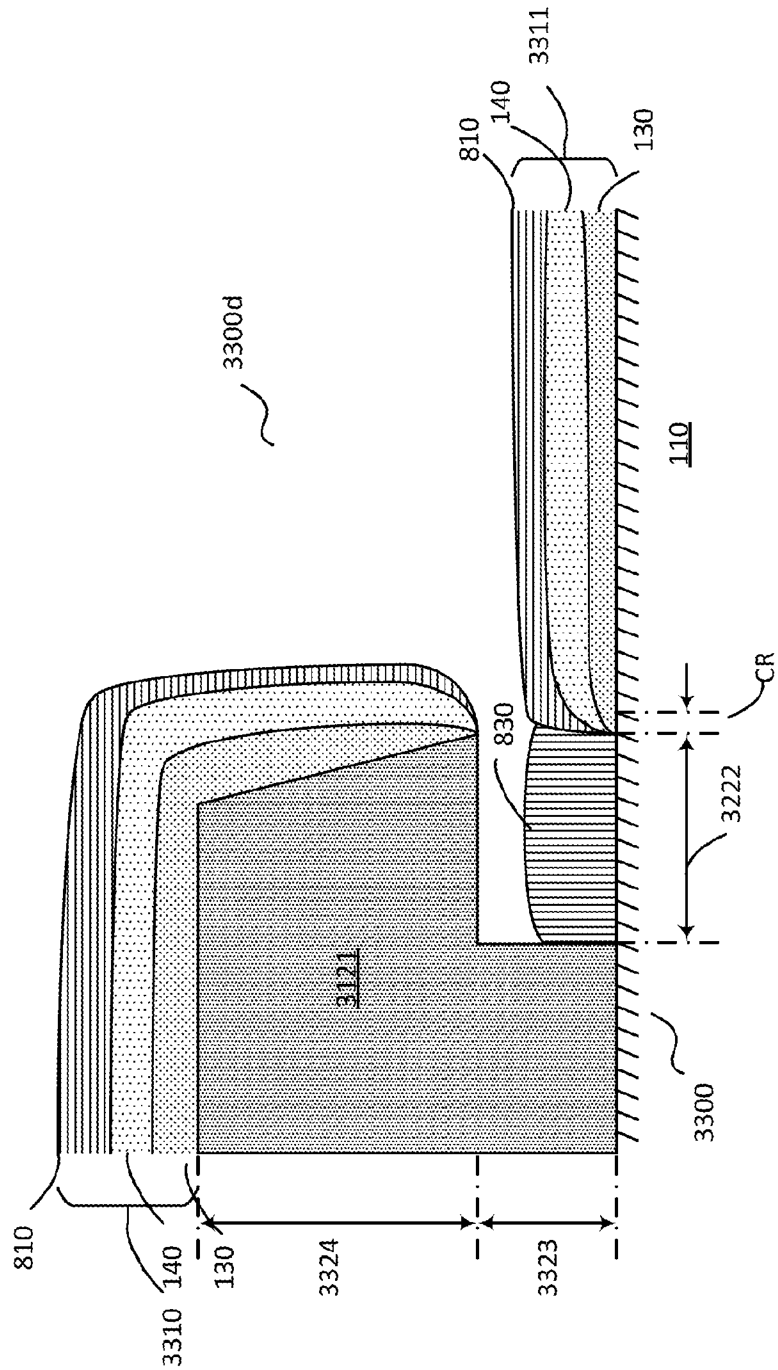
Figure 33E:
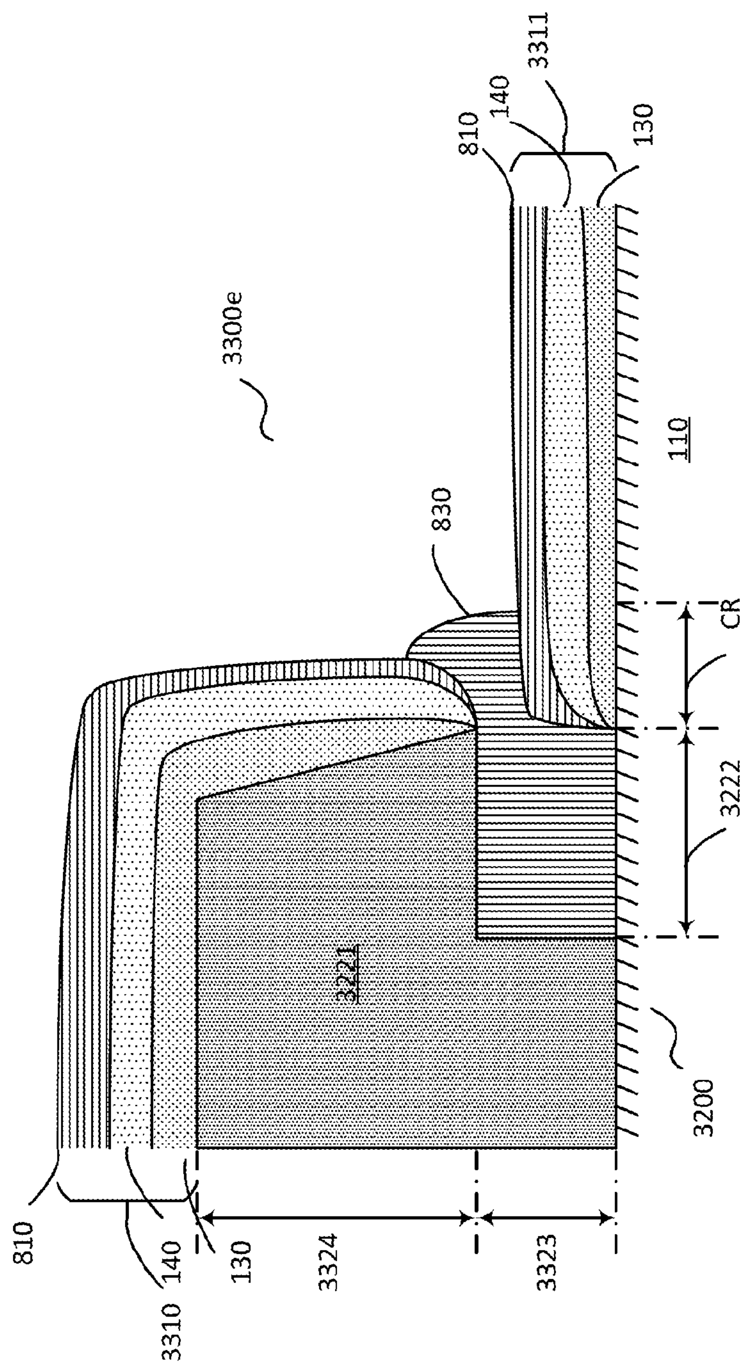
Figure 33F:
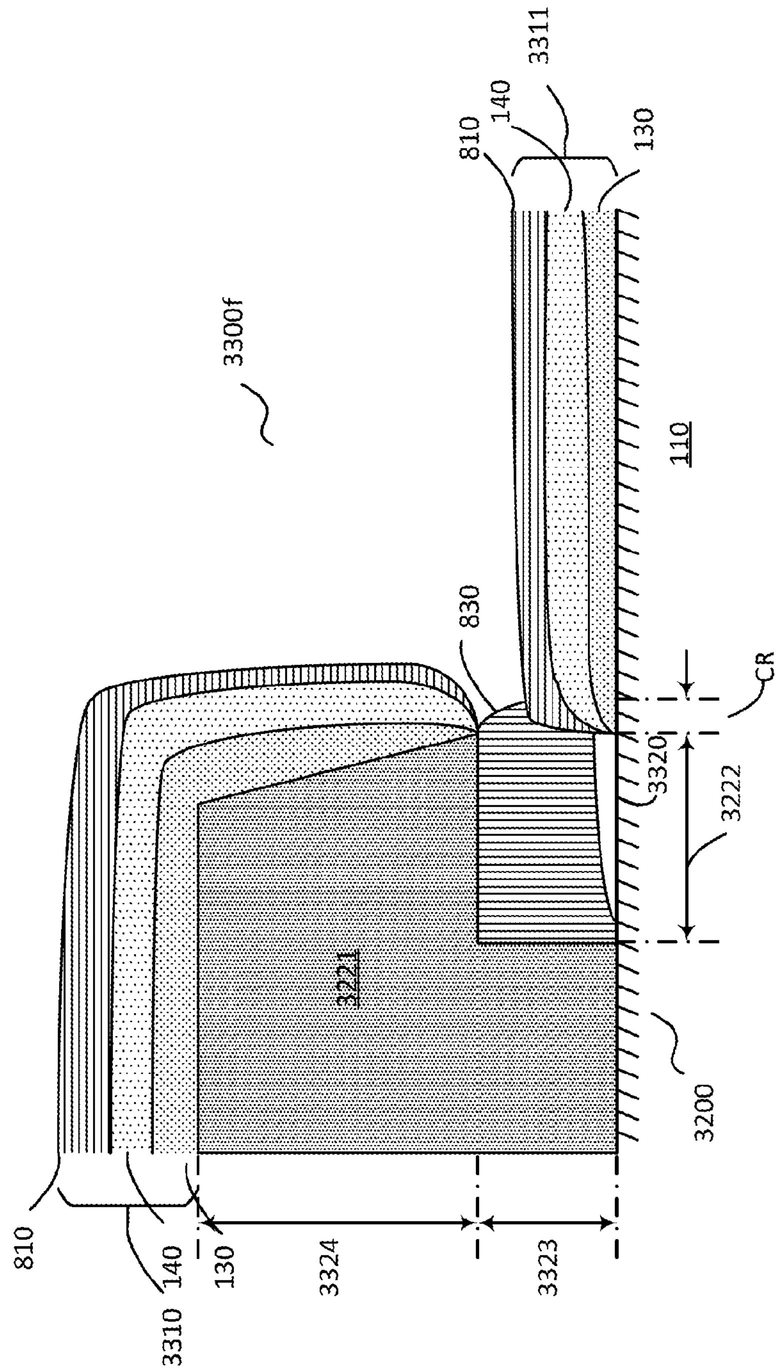
Figure 33G:
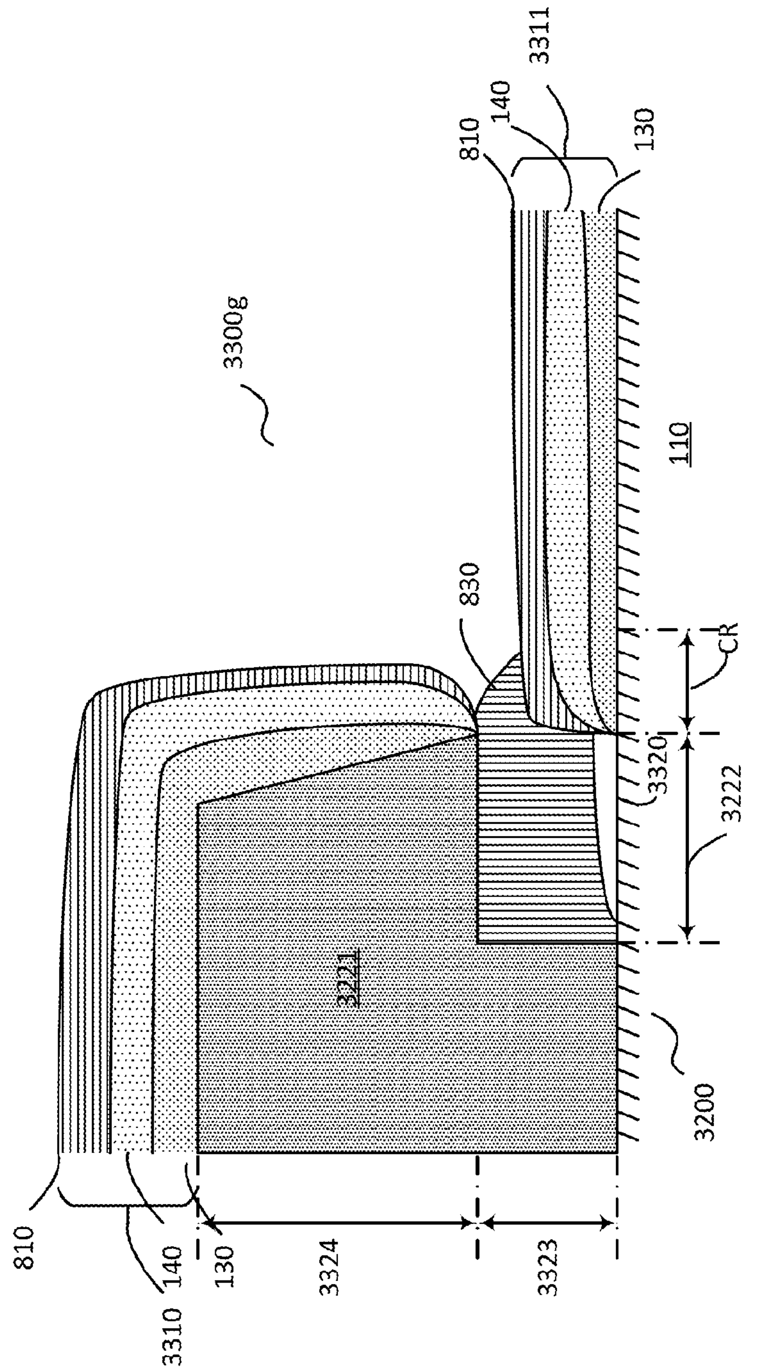
Figure 33H:
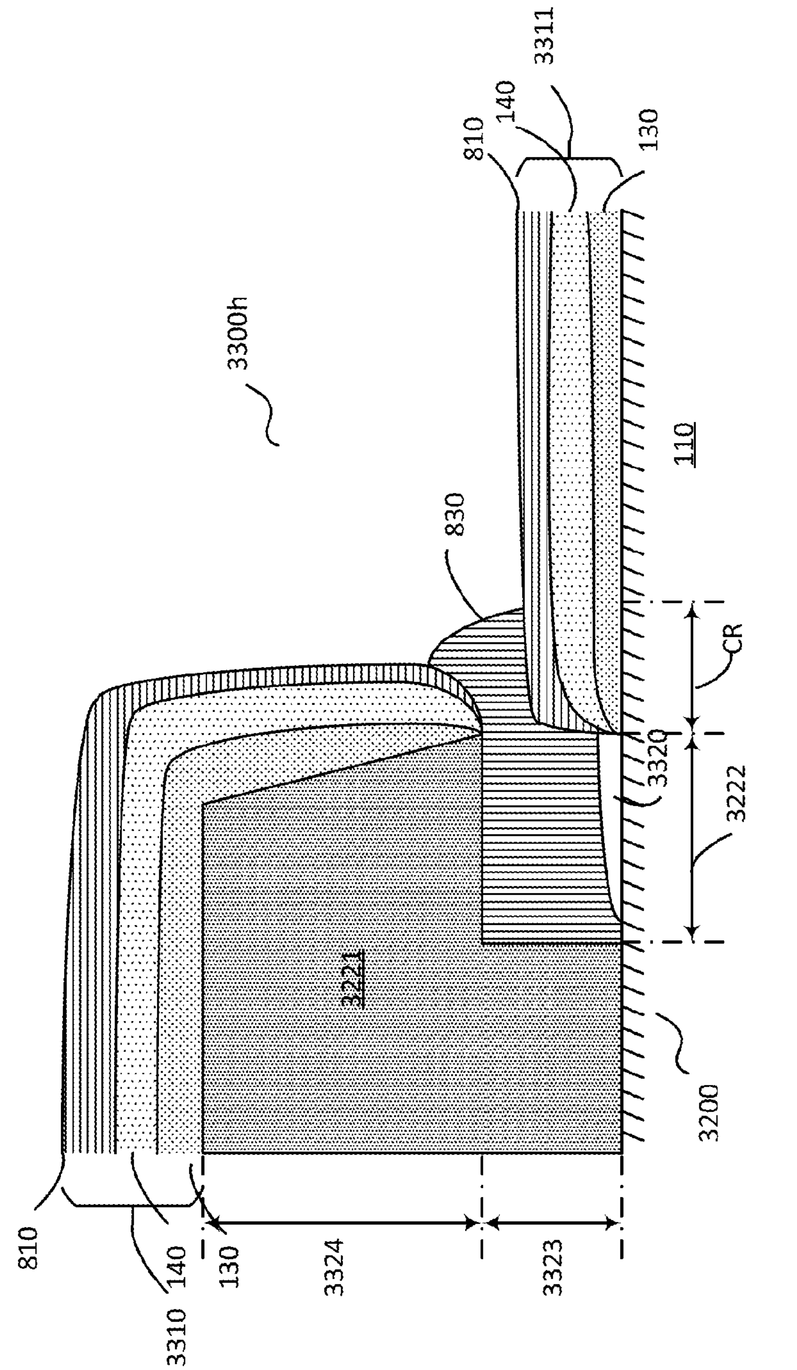
Figure 33I:
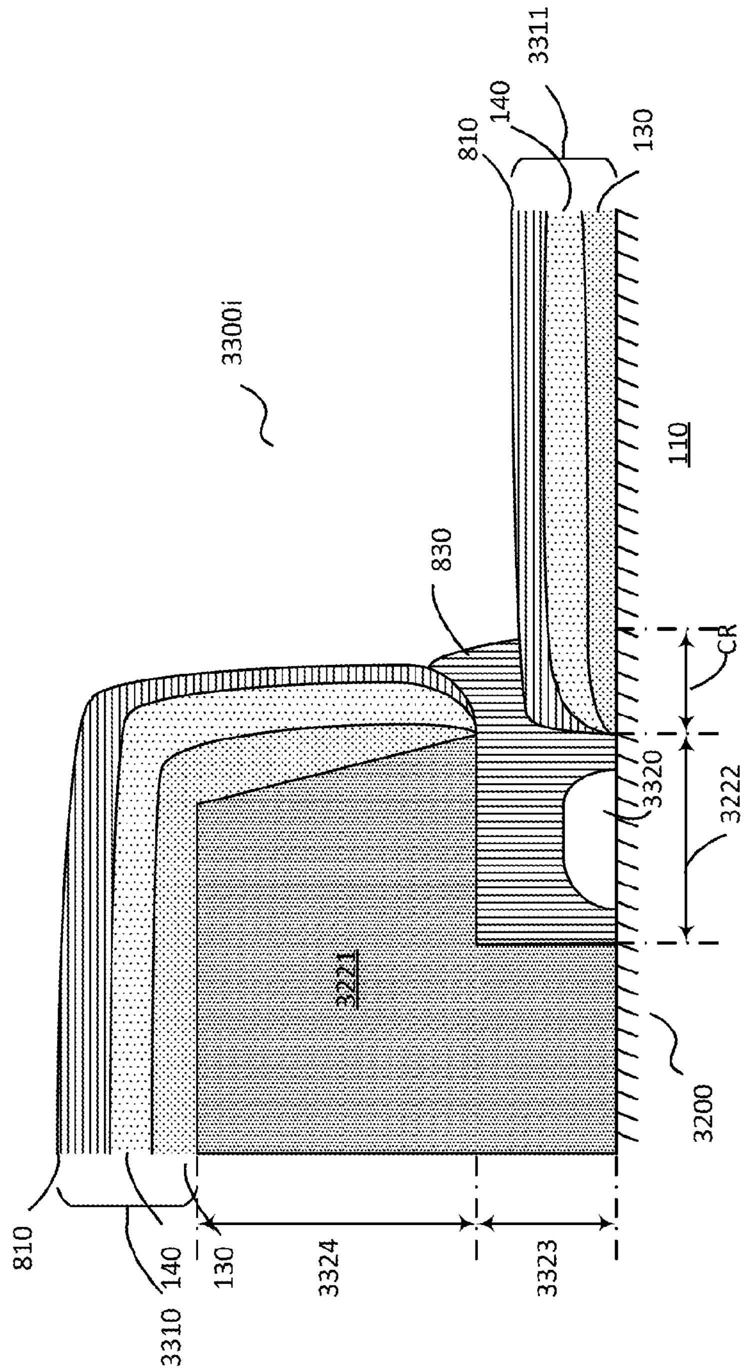
Figure 33J:
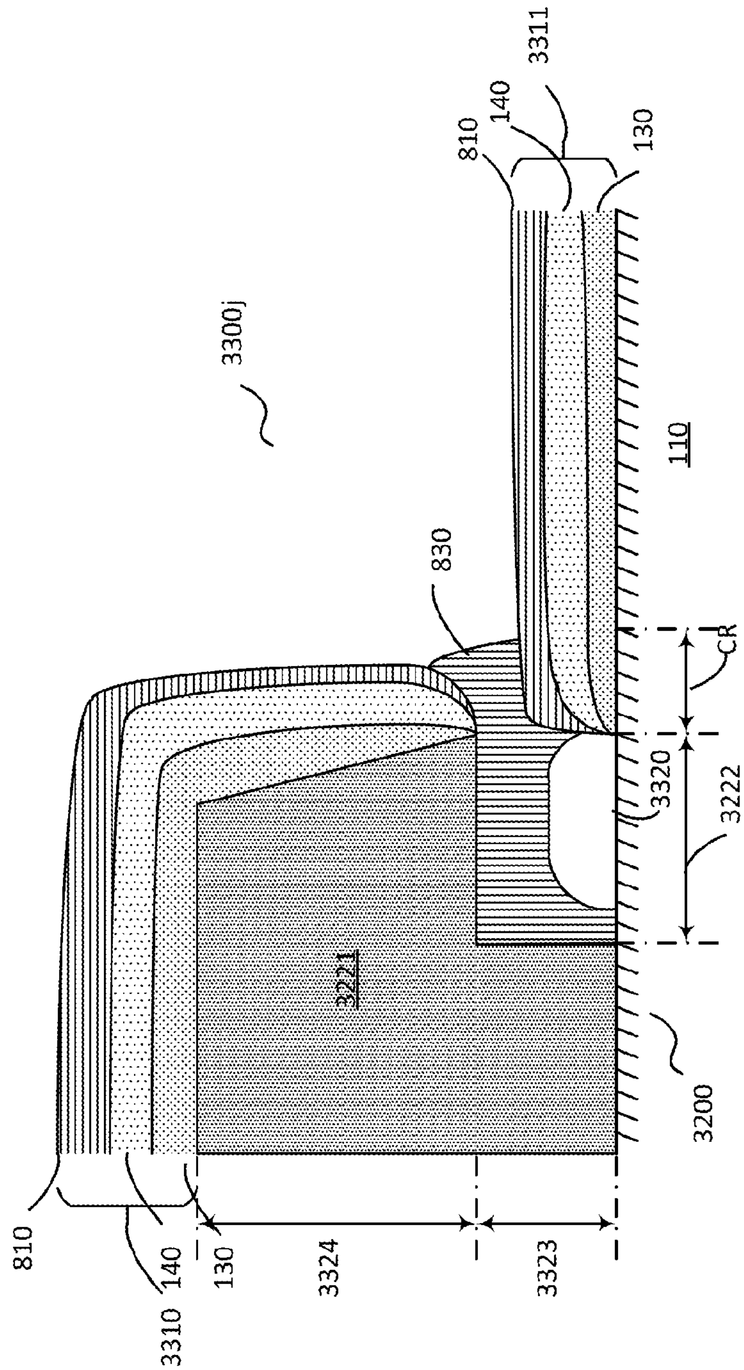
Figure 33K:
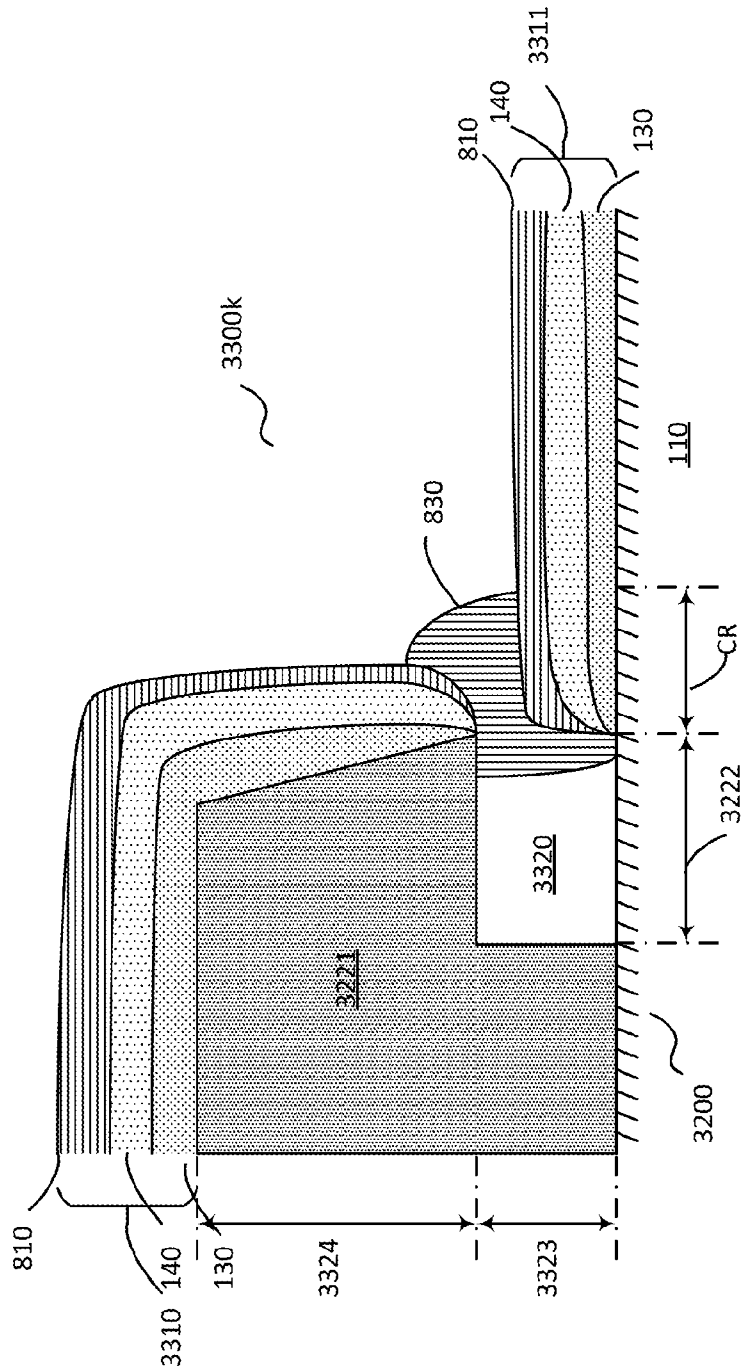
Figure 33L:
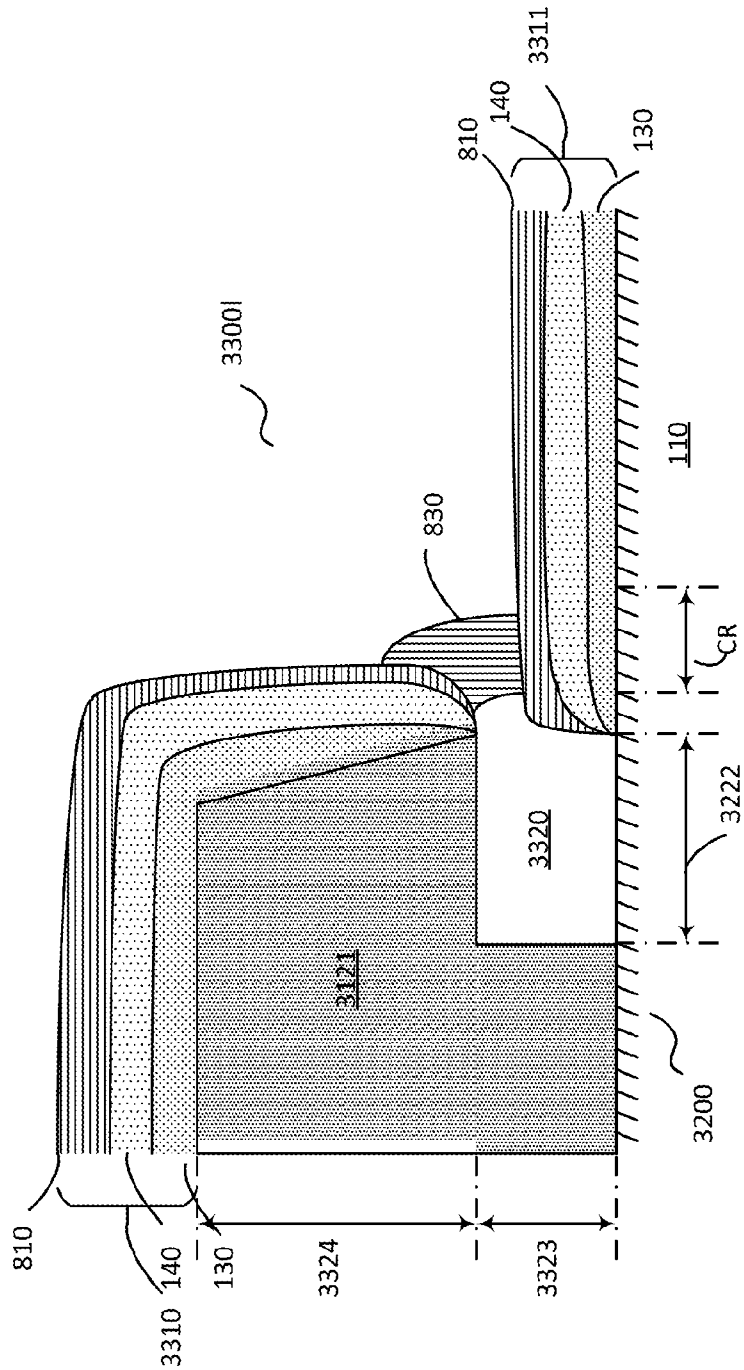
Figure 33M:
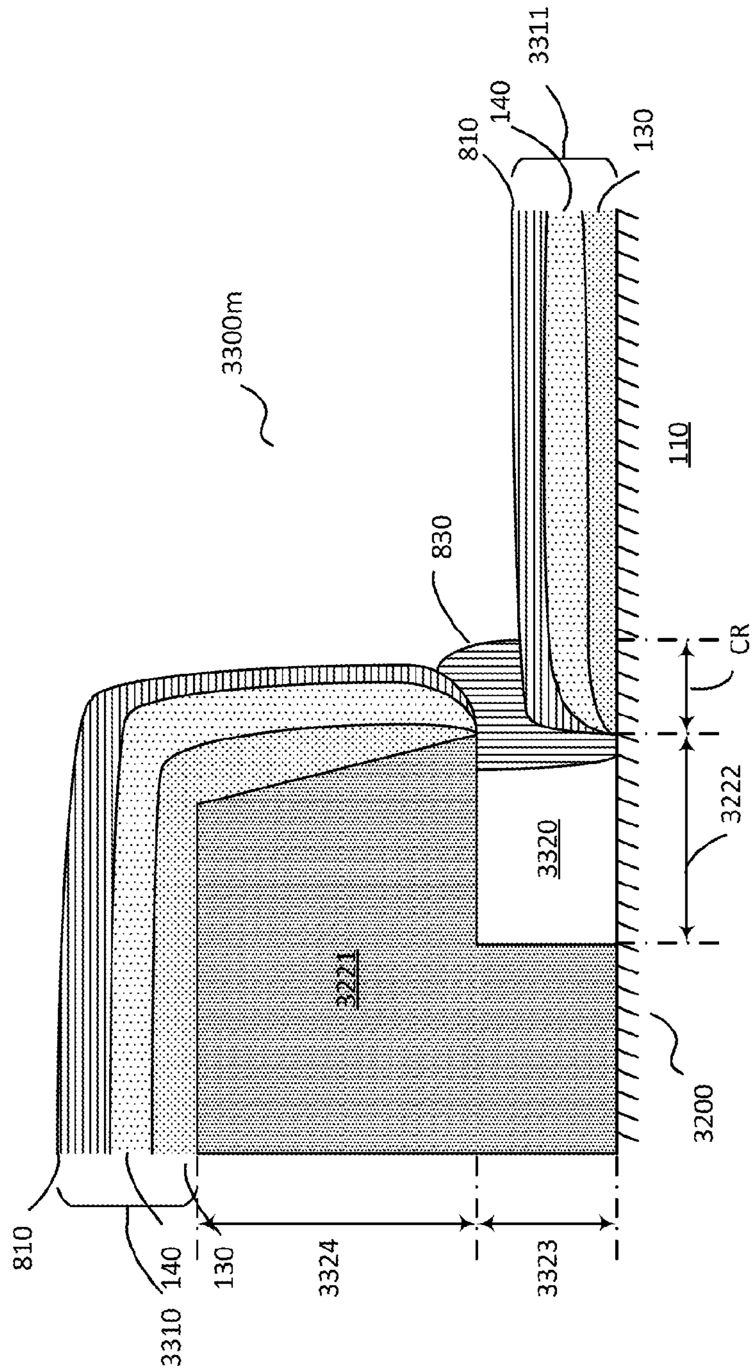
Figure 33N:
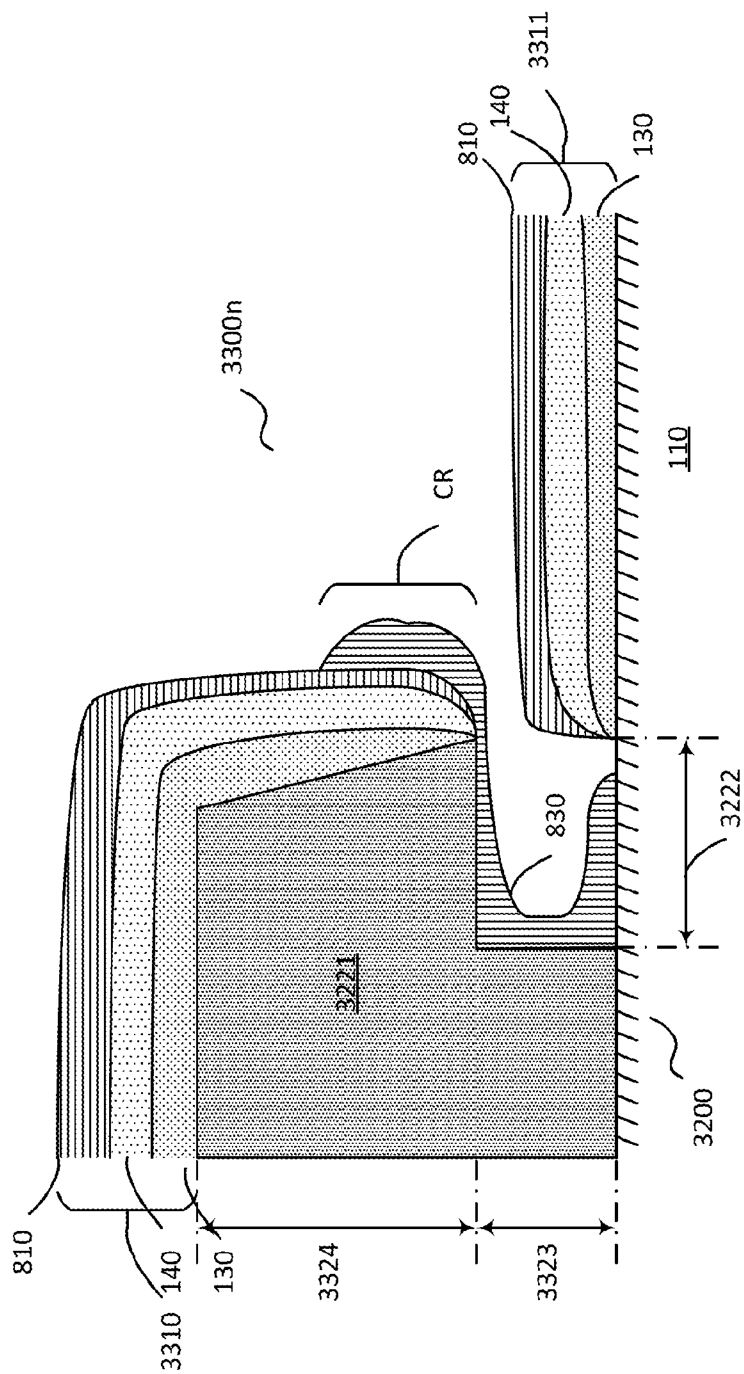
Figure 33O:
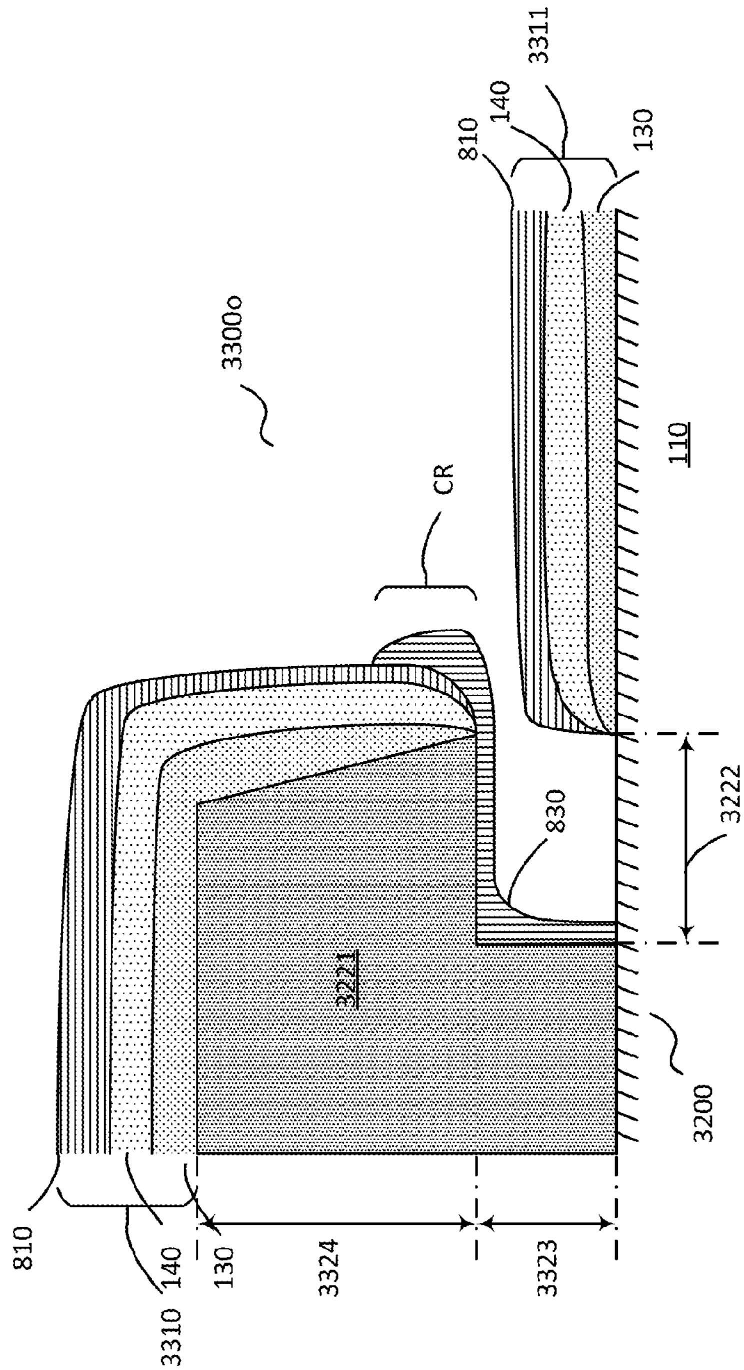
Figure 33P:
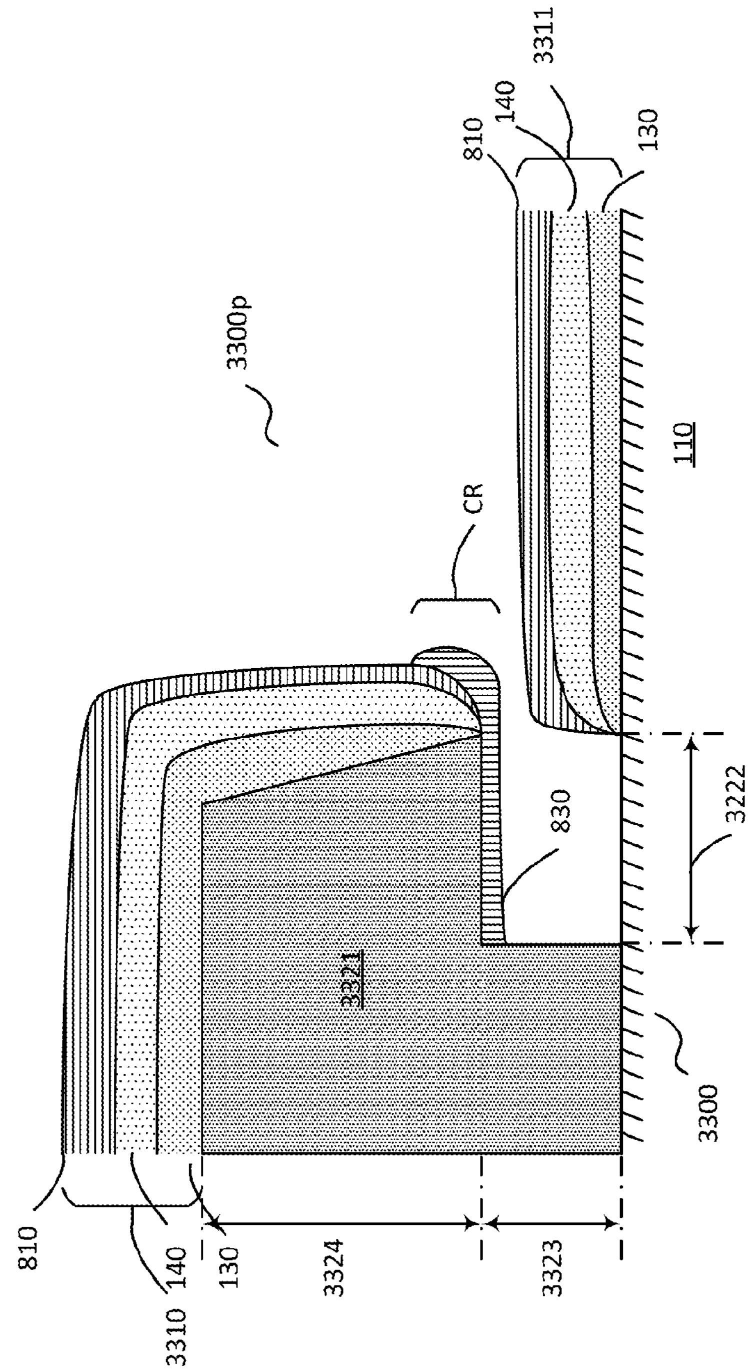

FIGS. 33B-33P show various non-limiting examples of the fragment of the device 3200 shown in FIG. 33A after the stage of depositing the conductive coating 830. In FIGS. 33B-33P, for purposes of simplicity of illustration, not all features of the partition 3221 and/or the recess 3222 as described in FIG. 33A may always be shown and the auxiliary electrode 1750 has been omitted, but it will be appreciated by those having ordinary skill in the relevant art, that such feature(s) and/or the auxiliary electrode 1750 may, in some non-limiting examples, nevertheless be present. It will be appreciated by those having ordinary skill in the relevant art that the auxiliary electrode 1750 may be present in any of the examples of FIGS. 33B-33P, in any form and/or position, including without limitation, those shown in any of the examples of FIGS. 34A-34G described herein.

In these FIGURES, a device stack 3310 is shown comprising the at least one semiconducting layer 130, the second electrode 140 and the NIC 810 deposited on the upper section 3324.

In these FIGURES, a residual device stack 3311 is shown comprising the at least one semiconducting layer 130, the second electrode 140 and the NIC 810 deposited on the substrate 100 beyond the partition 3221 and recess 3222. From comparison with FIG. 32, it may be seen that the residual device stack 3311 may, in some non-limiting examples, correspond to the semiconductor layer 130, second electrode 140 and the NIC 810 as it approaches the recess 3221 at and/or proximate to the lip 3329. In some non-limiting examples, the residual device stack 3311 may be formed when an open mask and/or mask-free deposition process is used to deposit various materials of the device stack 3310.

In a non-limiting example 3300*b* shown in FIG. 33B, the conductive coating 830 is substantially confined to and/or substantially fills all of the recess 3222. As such, in some non-limiting examples, the conductive coating 830 may be in physical contact with the ceiling 3325, the side 3326 and the floor 3327 and thus be electrically coupled to the auxiliary electrode 1750.

Without wishing to be bound by any particular theory, it may be postulated that substantially filling all of the recess 3222 may reduce a likelihood that any unwanted substances (including without limitation, gases) would be trapped within the recess 3222 during fabrication of the device 3200.

In some non-limiting examples, a coupling and/or contact region (CR) may correspond to a region of the device 3200 wherein the conductive coating 830 is in physical contact with the device stack 3310 in order to electrically couple the second electrode 140 with the conductive coating 830. In some non-limiting examples, the CR extends between about 50 nm and about 1500 nm from an edge of the device stack 3310 proximate to the partition 3221. By way of non-limiting examples, the CR may extend between about 50 nm and about 1000 nm, between about 100 nm and about 500 nm, between about 100 nm and about 350 nm, between about 100 nm and about 300 nm, between about 150 nm and about 300 nm, and/or between about 100 nm and about 200 nm. In some non-limiting examples, the CR may encroach on the device stack 3310 substantially laterally away from an edge thereof by such distance.

In some non-limiting examples, an edge of the residual device stack 3311 may be formed by the at least one semiconducting layer 130, the second electrode 140 and the NIC 810, wherein an edge of the second electrode 140 may be coated and/or covered by the NIC 810. In some non-limiting examples, the edge of the residual device stack 3311 may be formed in other configurations and/or arrangements. In some non-limiting examples, the edge of the NIC 810 may be recessed relative to the edge of the second electrode 140, such that the edge of the second electrode 140 may be exposed, such that the CR may include such exposed edge of the second electrode 140 in order that the second electrode 140 may be in physical contact with the conductive coating 830 to electrically couple them. In some non-limiting examples, the edges of the at least one semiconducting layer 130, the second electrode 140 and the NIC 810 may be aligned with one another, such that the edges of each layer is exposed. In some non-limiting examples, the edges of the second electrode 140 and of the NIC 810 may be recessed relative to the edge of the at least one semiconducting layer 130, such that the edge of the residual device stack 3311 is substantially provided by the semiconductor layer 130.

Additionally, as shown, in some non-limiting examples, within a small CR and arranged at and/or near the lip 3329 of the partition 3221, the conductive coating 830 extends to cover at least an edge of the NIC 810 within the residual device stack 3311 arranged closest to the partition 3221. In some non-limiting examples, the NIC 810 may comprise a semiconducting material and/or an insulating material.

While it has been described herein that direct deposition of the material for forming the conductive coating 830 on the surface of the NIC 810 is generally inhibited, in some non-limiting examples, it has been discovered that a part of the conductive coating 830 may nevertheless overlap at least a part of the NIC 810. By way of non-limiting example, during deposition of the conductive coating 830, the material for forming the conductive coating 830 may initial deposit within the recess 3221. Thereafter continuing to deposit the material for forming the conductive coating 830 may, in some non-limiting examples, cause the conductive coating 830 to extend laterally beyond the recess 830*a* and overlap at least a part of the NIC 810 within the residual device stack 3311.

Those having ordinary skill in the relevant art will appreciate that while the conductive coating 830 has been shown as overlapping a part of the NIC 810, the lateral extent 410 of the emissive region 1910 remains substantially devoid of the material for forming the conductive coating 830. In some non-limiting examples, the conductive coating 830 may be arranged within the lateral extent 420 of at least a part of at least one non-emissive region 1920 of the device 3200, in some non-limiting examples, without substantially interfering with emission of photons from emissive region(s) 1910 of the device 3200.

In some non-limiting examples, the conductive coating 830 may nevertheless be electrically coupled to the second electrode 140 despite the interposition of the NIC 810 therebetween so as to reduce an effective sheet resistance of the second electrode 140.

In some non-limiting examples, the NIC 810 may be formed using an electrically conductive material and/or otherwise exhibit a level of charge mobility that allows current to tunnel and/or pass therethrough.

In some non-limiting examples, the NIC 810 may have a thickness that allows current to pass therethrough. In some non-limiting examples, the thickness of the NIC 810 may be between about 3 nm and about 65 nm, between about 3 nm and about 50 nm, between about 5 nm and about 50 nm, between about 5 nm and about 30 nm, and/or between about 5 nm and about 15 nm, between about 5 nm and about 10 nm. In some non-limiting examples, the NIC 810 may be provided with a relatively low thickness (in some non-limiting examples, a thin coating thickness), in order to reduce contact resistance that may be created due to the presence of the NIC 810 in the path of such electric current.

Without wishing to be bound by any particular theory, it may be postulated that substantially filling all of the recess 3221 may, in some non-limiting examples, enhance reliability of electrical coupling between the conductive coating 830 and at least one of the second electrode 140 and the auxiliary electrode 1750.

Further, as shown, in some non-limiting examples, the conductive coating 830 extends to cover at least a part of the NIC 810 disposed on the upper section 3324 of the partition 3221. In some non-limiting examples, a part of the NIC 810 at and/or proximate to the lip 3329 may be covered by the conductive coating 830. In some non-limiting examples, the conductive coating 830 may nevertheless be electrically coupled to the second electrode 140 despite the interposition of the NIC 810 therebetween.

In a non-limiting example 3300*c* shown in FIG. 33C, the conductive coating 830 is substantially confined to and/or partially fills the recess 3222. As such, in some non-limiting examples, the conductive coating 830 may be in physical contact with the side 3326, the floor 3327 and, in some non-limiting examples, at least a part of the ceiling 3325 and thus be electrically coupled to the auxiliary electrode 1750.

As shown, in some non-limiting examples, at least a part of the ceiling 3325 is substantially devoid of the conductive coating 830. In some non-limiting examples, such part is proximate to the lip 3329.

Additionally, as shown, in some non-limiting examples, within the small CR arranged at and/or near the lip 3329 of the partition 3221, the conductive coating 830 extends to cover at least an edge of the NIC 810 within the residual device stack 3311 arranged closest to the partition 3221. In some non-limiting examples, the conductive coating 830 may nevertheless be electrically coupled to the second electrode 140 despite the interposition of the NIC 810 therebetween.

In a non-limiting example 3300*d* shown in FIG. 33D, the conductive coating 830 is substantially confined to and/or partially fills the recess 3222. As such, in some non-limiting examples, the conductive coating 830 may be in physical contact with the floor 3327 and in some non-limiting examples, at least a part of the side 3326 and thus be electrically coupled to the auxiliary electrode 1750.

As shown, in some non-limiting examples, the ceiling 3325 is substantially devoid of the conductive coating 830.

Additionally, as shown, in some non-limiting examples, within the small CR arranged at and/or near the lip 3329 of the partition 3221, the conductive coating 830 extends to cover at least an edge of the NIC 810 within the residual device stack 3311 arranged closest to the partition 3221. In some non-limiting examples, the conductive coating 830 may nevertheless be electrically coupled to the second electrode 140 despite the interposition of the NIC 810 therebetween.

In a non-limiting example 3300*e* shown in FIG. 33E, the conductive coating 830 substantially fills all of the recess 3221. As such, in some non-limiting examples, the conductive coating 830 may be in physical contact with the ceiling 3325, the side 3326 and the floor 3327 and thus be electrically coupled to the auxiliary electrode 1750.

Additionally, as shown, in some non-limiting examples, within the CR, the conductive coating 830 extends to cover at least a part of the NIC 810 within the residual device stack 3311 in order to electrically couple the second electrode 140 with the conductive coating 830.

Further, as shown, in some non-limiting examples, the conductive coating 830 extends to cover at least a part of the NIC 810 of the device stack 3310 disposed on the upper section 3324 of the partition 3221. In some non-limiting examples, a part of the NIC 810 at and/or proximate to the lip 3329 may be covered by the conductive coating 830. In some non-limiting examples, the conductive coating 830 may nevertheless be electrically coupled to the second electrode 140 despite the interposition of the NIC 810 therebetween.

In a non-limiting example 3300*f* shown in FIG. 33F, the conductive coating 830 is substantially confined to and/or partially fills the recess 3222. As such, in some non-limiting examples, the conductive coating 830 may be in physical contact with the ceiling 3325, the side 3326, and in some non-limiting examples, at least a part of the floor 3327 and thus be electrically coupled to the auxiliary electrode 1750.

As shown, in some non-limiting examples, a cavity 3320 may be formed between the conductive coating 830 and the floor 3327. In some non-limiting examples, the cavity 3320 may correspond to a gap separating the conductive coating 830 from at least a part of the floor 3327, such that the conductive coating 830 is not in physical contact therealong.

As shown, in some non-limiting examples, the cavity 3320 engages a part of the floor 3327 and a part of the residual device stack 3311 and has a relatively thin profile.

In some non-limiting examples, the cavity 3320 may correspond to a volume that is between about 1% and about 30%, between about 5% and about 25%, between about 5% and about 20% and/or between about 5% and about 10% of a volume of the recess 3222.

Additionally, as shown, in some non-limiting examples, within the CR, the conductive coating 830 extends to cover at least a part of the NIC 810 within the residual device stack 3311 in order to electrically couple the second electrode 140 with the conductive coating 830.

In a non-limiting example 3300*g* shown in FIG. 33G, the conductive coating 830 partially fills the recess 3222. As such, in some non-limiting examples, the conductive coating 830 may be in physical contact with the ceiling 3325, the side 3326 and in some non-limiting examples, at least a part of the floor 3327 and thus be electrically coupled to the auxiliary electrode 1750.

As shown, in some non-limiting examples, a cavity 3320 may be formed between the conductive coating 830 and the floor 3327. In some non-limiting examples, the cavity 3320 may correspond to a gap separating the conductive coating 830 from at least a part of the floor 3327, such that the conductive coating 830 is not in physical contact therealong.

As shown, in some non-limiting examples, the cavity 3320 engages a part of the floor 3327 and a part of the residual device stack 3311 and has a relatively thin profile.

In some non-limiting examples, the cavity 3320 may correspond to a volume that is between about 1% and about 30%, between about 5% and about 25%, between about 5% and about 20% and/or between about 5% and about 10% of a volume of the recess 3222.

Additionally, as shown, in some non-limiting examples, within the CR, the conductive coating 830 extends to cover at least a part of the NIC 810 within the residual device stack 3311 in order to electrically couple the second electrode 140 with the conductive coating 830.

In a non-limiting example 3300*h* shown in FIG. 33H, the conductive coating 830 partially fills the recess 3222. As such, in some non-limiting examples, the conductive coating 830 may be in physical contact with the ceiling 3325, the side 3326 and, in some non-limiting examples, at least a part of the floor 3327.

As shown, in some non-limiting examples, a cavity 3320 may be formed between the conductive coating 830 and the floor 3327. In some non-limiting examples, the cavity 3320 may correspond to a gap separating the conductive coating 830 from at least a part of the floor 3327, such that the conductive coating 830 is not in physical contact therealong.

As shown, in some non-limiting examples, the cavity 3320 engages a part of the floor 3327 and a part of the residual device stack 3311 and has a relatively thin profile.

In some non-limiting examples, the cavity 3320 may correspond to a volume that is between about 1% and about 30%, between about 5% and about 25%, between about 5% and about 20% and/or between about 5% and about 10% of a volume of the recess 3222.

Additionally, as shown, in some non-limiting examples, within the CR, the conductive coating 830 extends to cover at least a part of the NIC 810 within the residual device stack 3311. In some non-limiting examples, the conductive coating 830 may nevertheless be electrically coupled to the second electrode 140 despite the interposition of the NIC 810 therebetween.

Further, as shown, in some non-limiting examples, the conductive coating 830 extends to cover at least a part of the NIC 810 of the device stack 3310 disposed on the upper section 3324 of the partition 3221. In some non-limiting examples, a part of the NIC 810 at and/or proximate to the lip 3329 may be covered by the conductive coating 830. In some non-limiting examples, the conductive coating 830 may nevertheless be electrically coupled to the second electrode 140 despite the interposition of the NIC 810 therebetween.

In a non-limiting example 3300*i* shown in FIG. 33I, the conductive coating 830 partially fills the recess 3222. As such, in some non-limiting examples, the conductive coating 830 may be in physical contact with the ceiling 3325, the side 3326 and, in some non-limiting examples, at least a part of the floor 3327.

As shown, in some non-limiting examples, a cavity 3320 may be formed between the conductive coating 830 and the floor 3327. In some non-limiting examples, the cavity 3320 may correspond to a gap separating the conductive coating 830 from at least a part of the floor 3327, such that the conductive coating 830 is not in physical contact therealong.

As shown, in some non-limiting examples, the cavity 3320 engages a part of the floor 3327 and has a relatively thicker profile than the cavity 3320 shown in examples 3300*f*-3300*h*.

In some non-limiting examples, the cavity 3320 may correspond to a volume that is between about 10% and about 80%, between about 10% and about 70%, between about 20% and about 60%, between about 10% and about 30%, between about 25% and about 50%, between about 50% and about 80% and/or between about 70% and about 95% of a volume of the recess 3222.

Additionally, as shown, in some non-limiting examples, within the CR, the conductive coating 830 extends to cover at least a part of the NIC 810 within the residual device stack 3311. In some non-limiting examples, the conductive coating 830 may nevertheless be electrically coupled to the second electrode 140 despite the interposition of the NIC 810 therebetween.

Further, as shown, in some non-limiting examples, the conductive coating 830 extends to cover at least a part of the NIC 810 of the device stack 3310 disposed on the upper section 3324 of the partition 3221. In some non-limiting examples, a part of the NIC 810 at and/or proximate to the lip 3329 may be covered by the conductive coating 830. In some non-limiting examples, the conductive coating 830 may nevertheless be electrically coupled to the second electrode 140 despite the interposition of the NIC 810 therebetween.

In a non-limiting example 3300*j* shown in FIG. 33J, the conductive coating 830 partially fills the recess 3222. As such, in some non-limiting examples, the conductive coating 830 may be in physical contact with the ceiling 3325, the side 3326 and, in some non-limiting examples, at least a part of the floor 3327.

As shown, in some non-limiting examples, a cavity 3320 may be formed between the conductive coating 830 and the floor 3327. In some non-limiting examples, the cavity 3320 may correspond to a gap separating the conductive coating 830 from at least a part of the floor 3327, such that the conductive coating 830 is not in physical contact therealong.

As shown, in some non-limiting examples, the cavity 3320 engages a part of the floor 3327 and a [art of the residual device stack 3311 and has a relatively thicker profile than the cavity 3320 shown in examples 3300*f*-3300*h*.

In some non-limiting examples, the cavity 3320 may correspond to a volume that is between about 10% and about 80%, between about 10% and about 70%, between about 20% and about 60%, between about 10% and about 30%, between about 25% and about 50%, between about 50% and about 80% and/or between about 70% and about 95% of a volume of the recess 3222.

Additionally, as shown, in some non-limiting examples, within the CR, the conductive coating 830 extends to cover at least a part of the NIC 810 within the residual device stack 3311. In some non-limiting examples, the conductive coating 830 may nevertheless be electrically coupled to the second electrode 140 despite the interposition of the NIC 810 therebetween.

Further, as shown, in some non-limiting examples, the conductive coating 830 extends to cover at least a part of the NIC 810 of the device stack 3310 disposed on the upper section 3324 of the partition 3221. In some non-limiting examples, a part of the NIC 810 at and/or proximate to the lip 3329 may be covered by the conductive coating 830. In some non-limiting examples, the conductive coating 830 may nevertheless be electrically coupled to the second electrode 140 despite the interposition of the NIC 810 therebetween.

In a non-limiting example 3300*k* shown in FIG. 33K, the conductive coating 830 partially fills the recess 3222. As such, in some non-limiting examples, the conductive coating 830 may be in physical contact with, in some non-limiting examples, at least a part of the ceiling 3325 and, in some non-limiting examples, at least a part of the floor 3327.

As shown, in some non-limiting examples, a cavity 3320 may be formed between the conductive coating 830 and the side 3326, in some non-limiting examples, at least a part of the ceiling 3325 and in some non-limiting examples, at least a part of the floor 3327. In some non-limiting examples, the cavity 3320 may correspond to a gap separating the conductive coating 830 from the side 3326, in some non-limiting examples, at least a part of the ceiling 3325 and, in some non-limiting examples, at least a part of the floor 3327, such that the conductive coating 830 is not in physical contact therealong.

As shown, in some non-limiting examples, the cavity 3320 occupies substantially all of the recess 3222.

In some non-limiting examples, the cavity 3320 may correspond to a volume that is between about 10% and about 80%, between about 10% and about 70%, between about 20% and about 60%, between about 10% and about 30%, between about 25% and about 50%, between about 50% and about 80% and/or between about 70% and about 95% of a volume of the recess 3222.

Additionally, as shown, in some non-limiting examples, within the CR, the conductive coating 830 extends to cover at least a part of the NIC 810 within the residual device stack 3311. In some non-limiting examples, the conductive coating 830 may nevertheless be electrically coupled to the second electrode 140 despite the interposition of the NIC 810 therebetween.

Further, as shown, in some non-limiting examples, the conductive coating 830 extends to cover at least a part of the NIC 810 of the device stack 3310 disposed on the upper section 3324 of the partition 3221. In some non-limiting examples, a part of the NIC 810 at and/or proximate to the lip 3329 may be covered by the conductive coating 830. In some non-limiting examples, the conductive coating 830 may nevertheless be electrically coupled to the second electrode 140 despite the interposition of the NIC 810 therebetween.

In a non-limiting example **3300*l* shown in FIG. 33L, the conductive coating 830 partially fills the recess 3222**.

As shown, in some non-limiting examples, a cavity 3320 may be formed between the conductive coating 830 and the side 3326, the floor 3327 and the ceiling 3325. In some non-limiting examples, the cavity 3320 may correspond to a gap separating the conductive coating 830 from the side 3326, the floor 3327 and the ceiling 3325, such that the conductive coating 830 is not in physical contact therealong.

As shown, in some non-limiting examples, the cavity 3320 occupies substantially all of the recess 3222.

In some non-limiting examples, the cavity 3320 may correspond to a volume that is greater than about 80% of a volume of the recess 3222.

Additionally, as shown, in some non-limiting examples, within the CR, the conductive coating 830 extends to cover at least a part of the NIC 810 within the residual device stack 3311. In some non-limiting examples, the conductive coating 830 may nevertheless be electrically coupled to the second electrode 140 despite the interposition of the NIC 810 therebetween.

Further, as shown, in some non-limiting examples, the conductive coating 830 extends to cover at least a part of the NIC 810 of the device stack 3310 disposed on the upper section 3324 of the partition 3221. In some non-limiting examples, a part of the NIC 810 at and/or proximate to the lip 3329 may be covered by the conductive coating 830. In some non-limiting examples, the conductive coating 830 may nevertheless be electrically coupled to the second electrode 140 despite the interposition of the NIC 810 therebetween.

In a non-limiting example **3300*m* shown in FIG. 33M, the conductive coating 830 is substantially confined to and/or partially fills the recess 3222. As such, in some non-limiting examples, the conductive coating 830 may be in physical contact with, in some non-limiting examples, at least a part of the ceiling 3325 and in some non-limiting examples, at least a part of the floor 3327**.

As shown, in some non-limiting examples, a cavity 3320 may be formed between the conductive coating 830 and the side 3326, in some non-limiting examples, at least a part of the ceiling 3325 and in some non-limiting examples, at least a part of the floor 3327. In some non-limiting examples, the cavity 3320 may correspond to a gap separating the conductive coating 830 from the side, in some non-limiting examples, at least a part of the ceiling 3325 and, in some non-limiting examples, at least a part of the floor 3327, such that the conductive coating 830 is not in physical contact therealong.

As shown, in some non-limiting examples, the cavity 3320 occupies substantially all of the recess 3222.

In some non-limiting examples, the cavity 3320 may correspond to a volume that is between about 10% and about 80%, between about 10% and about 70%, between about 20% and about 60%, between about 10% and about 30%, between about 25% and about 50%, between about 50% and about 80% and/or between about 70% and about 95% of a volume of the recess 3222.

Additionally, as shown, in some non-limiting examples, within the CR, the conductive coating 830 extends to cover at least a part of the NIC 810 within the residual device stack 3311. In some non-limiting examples, the conductive coating 830 may nevertheless be electrically coupled to the second electrode 140 despite the interposition of the NIC 810 therebetween.

Further, as shown, in some non-limiting examples, the conductive coating 830 extends to cover at least a part of the NIC 810 of the device stack 3310 disposed on the upper section 3324 of the partition 3221. In some non-limiting examples, a part of the NIC 810 at and/or proximate to the lip 3329 may be covered by the conductive coating 830. In some non-limiting examples, the conductive coating 830 may nevertheless be electrically coupled to the second electrode 140 despite the interposition of the NIC 810 therebetween.

In a non-limiting example **3300*n* shown in FIG. 33N, the conductive coating 830 partially fills the recess 3222. As such, in some non-limiting examples, the conductive coating 830 may be in physical contact with the ceiling 3325, the side 3326 and, in some non-limiting examples, at least a part of the floor 3327**.

Additionally, as shown, in some non-limiting examples, the conductive coating 830 extends to cover at least a part of the NIC 810 of the device stack 3310 disposed on the upper section 3324 of the partition 3221. In some non-limiting examples, a part of the NIC 810 at and/or proximate to the lip 3329 may be covered by the conductive coating 830. In some non-limiting examples, the conductive coating 830 may nevertheless be electrically coupled to the second electrode 140 despite the interposition of the NIC 810 therebetween.

In a non-limiting example **3300*o* shown in FIG. 33O, the conductive coating 830 partially fills the recess 3222. As such, in some non-limiting examples, the conductive coating 830 may be in physical contact with the ceiling 3325, the side 3326 and, in some non-limiting examples, at least a part of the floor 3327**.

Additionally, as shown, in some non-limiting examples, the conductive coating 830 extends to cover at least a part of the NIC 810 of the device stack 3310 disposed on the upper section 3324 of the partition 3221. In some non-limiting examples, a part of the NIC 810 at and/or proximate to the lip 3329 may be covered by the conductive coating 830. In some non-limiting examples, the conductive coating 830 may nevertheless be electrically coupled to the second electrode 140 despite the interposition of the NIC 810 therebetween.

In a non-limiting example **3300*p* shown in FIG. 33P, the conductive coating 830 partially fills the recess 3222. As such, in some non-limiting examples, the conductive coating 830 may be in physical contact with the ceiling 3325, in some non-limiting examples, at least a part of the side 3326**.

Additionally, as shown, in some non-limiting examples, the conductive coating 830 extends to cover at least a part of the NIC 810 of the device stack 3310 disposed on the upper section 3324 of the partition 3221. In some non-limiting examples, a part of the NIC 810 at and/or proximate to the lip 3329 may be covered by the conductive coating 830. In some non-limiting examples, the conductive coating 830 may nevertheless be electrically coupled to the second electrode 140 despite the interposition of the NIC 810 therebetween.

FIGS. 34A-34G show various non-limiting examples of different locations of the auxiliary electrode 1750 throughout the fragment of the device 3200 shown in FIG. 33A, again at a stage prior to deposition of the at least one semiconducting layer 130. Accordingly, in FIGS. 34A-34G, the at least one semiconducting layer 130, the second electrode 140 and the NIC 810, whether or not as part of the residual device stack 3311, and the conductive coating 830 are not shown. Nevertheless, it will be appreciated by those having ordinary skill in the relevant art, that such feature(s) and/or layer(s) may be present, after deposition, in any of the examples of FIGS. 34A-34G, in any form and/or position, including without limitation, those shown in any of the examples of FIGS. 33B-33P.

Figure 34A:
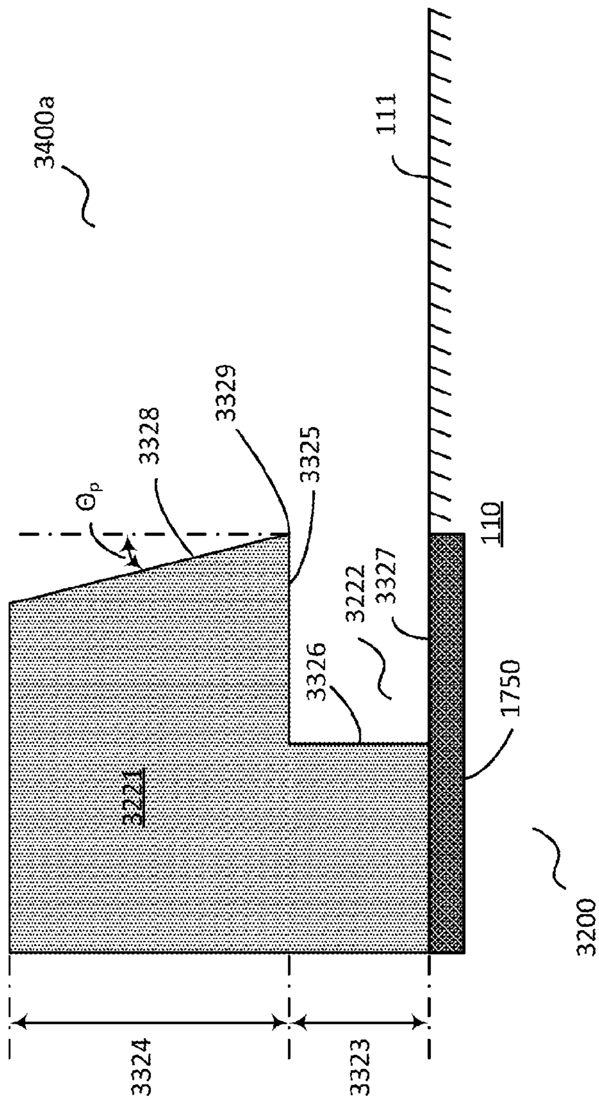
FIGS. 34A-34G are schematic diagrams that show various examples of an auxiliary electrode within the device of FIG. 33A, according to various examples in the present disclosure.

In a non-limiting example 3400*a* shown in FIG. 34A, the auxiliary electrode 1750 is arranged adjacent to and/or within the substrate 110 such that a surface of the auxiliary electrode 1750 is exposed in the recess 3222. As shown, in some non-limiting examples, such surface of the auxiliary electrode 1750 is provided in and/or may form and/or provide at least a part of the floor 3327. By way of non-limiting example, the auxiliary electrode 1750 may be arranged to be disposed adjacent to the partition 3221. In some non-limiting examples, the auxiliary electrode 1750 may be formed of at least one electrically conductive material. In some non-limiting examples, the partition 3221 may be formed of at least one substantially insulating material including without limitation, photoresist. In some non-limiting examples, various features of the device 3200, including without limitation, the partition 3221 and/or the auxiliary electrode 1750, may be formed using techniques including without limitation, photolithography.

Figure 34B:
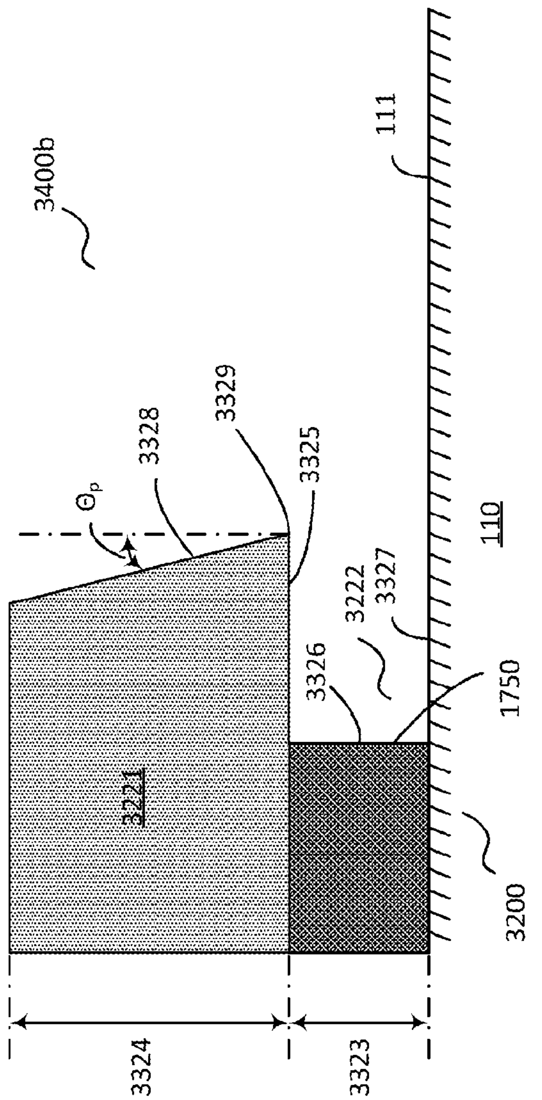

In a non-limiting example 3400*b* shown in FIG. 34B, the auxiliary electrode 1750 is formed integrally with and/or as part of the partition 3221 such that a surface of the auxiliary electrode 1750 is exposed in the recess 3222. As shown, in some non-limiting examples, such surface of the auxiliary electrode 1750 is provided in and/or may form and/or provide at least a part of the side 3326. By way of non-limiting example, the auxiliary electrode 1750 may be arranged to correspond to the lower section 3323. In some non-limiting examples, the auxiliary electrode 1750 may be formed of at least one electrically conductive material. In some non-limiting examples, the upper section 3324 may be formed of at least one substantially insulating material including without limitation, photoresist. In some non-limiting examples, various features of the device 3200, including without limitation, the upper section 3324 and/or the auxiliary electrode 1750, may be formed using techniques including without limitation, photolithography.

Figure 34C:
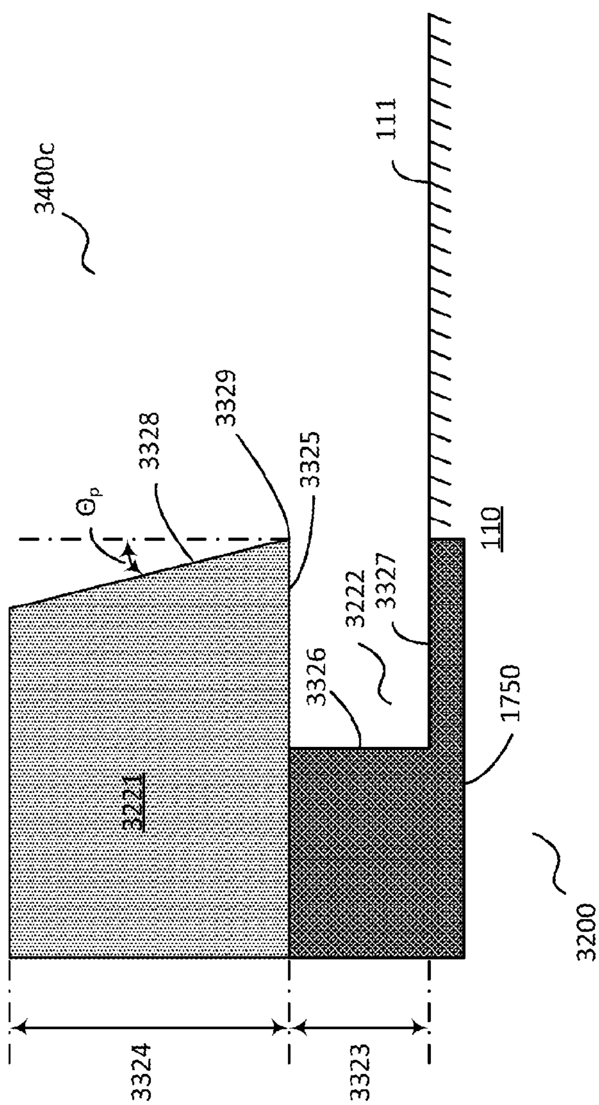

In a non-limiting example 3400*c* shown in FIG. 34C, the auxiliary electrode 1750 is arranged both adjacent to and/or within the substrate 110 and integrally with and/or as part of the partition 3221 such that a surface of the auxiliary electrode 1750 is exposed in the recess 3222. As shown, in some non-limiting examples, such surface of the auxiliary electrode 1750 is provided in and/or may form and/or provide at least a part of the side 3326 and/or at least a part of the floor 3327. By way of non-limiting example, the auxiliary electrode 1750 may be arranged to be disposed adjacent to the partition 3221 and/or to correspond to the lower section 3323. In some non-limiting examples, the part of the auxiliary electrode 1750 disposed adjacent to the partition 3221 may be electrically coupled and/or in physical contact with the part thereof that corresponds to the lower section 3323. In some non-limiting examples, such parts may be formed continuously and/or integrally with one another. In some non-limiting examples, the auxiliary electrode 1750 may be formed of at least one electrically conductive material. In some non-limiting examples, the parts thereof may be formed of different materials. In some non-limiting examples, the partition 3221 and/or the upper section 3324 thereof may be formed of at least one substantially insulating material including without limitation, photoresist. In some non-limiting examples, various features of the device 3200, including without limitation, the partition 3221, the upper section 3324 and/or the auxiliary electrode 1750, may be formed using techniques including without limitation, photolithography.

Figure 34D:
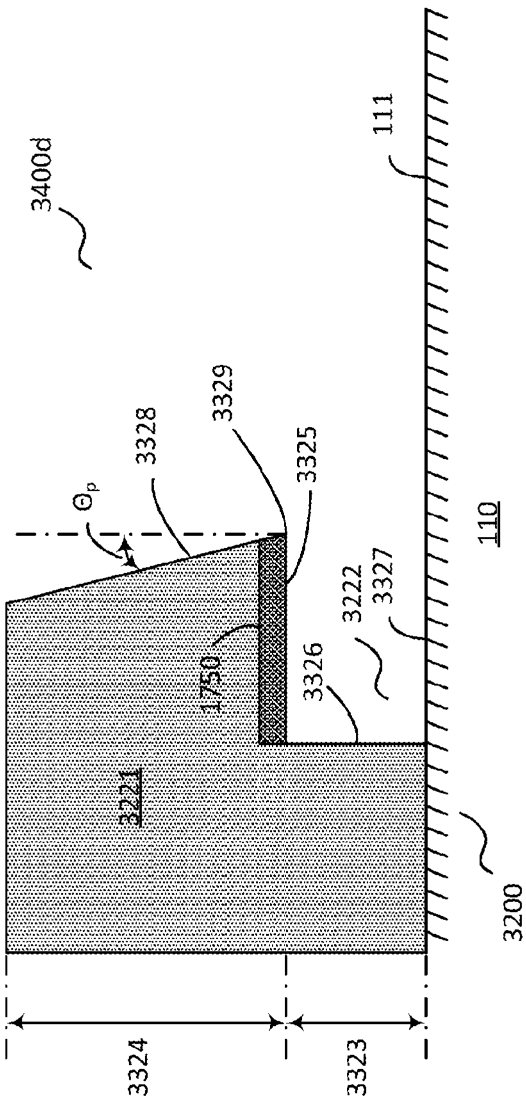

In a non-limiting example 3400*d* shown in FIG. 34D, the auxiliary electrode 1750 is arranged adjacent to and/or within the upper section 3324 such that a surface of the auxiliary electrode 1750 is exposed within the recess 3222. As shown, in some non-limiting examples, such surface of the auxiliary electrode 1750 is provided in and/or may form and/or provide at least a part of the ceiling 3325. By way of non-limiting example, the auxiliary electrode 1750 may be arranged to be disposed adjacent to the upper section 3324. In some non-limiting examples, the auxiliary electrode 1750 may be formed of at least one electrically conductive material. In some non-limiting examples, the partition 3221 may be formed of at least one substantially insulating material including without limitation, photoresist. In some non-limiting examples, various features of the device 3200, including without limitation, the partition 3221 and/or the auxiliary electrode 1750, may be formed using techniques including without limitation, photolithography.

Figure 34E:
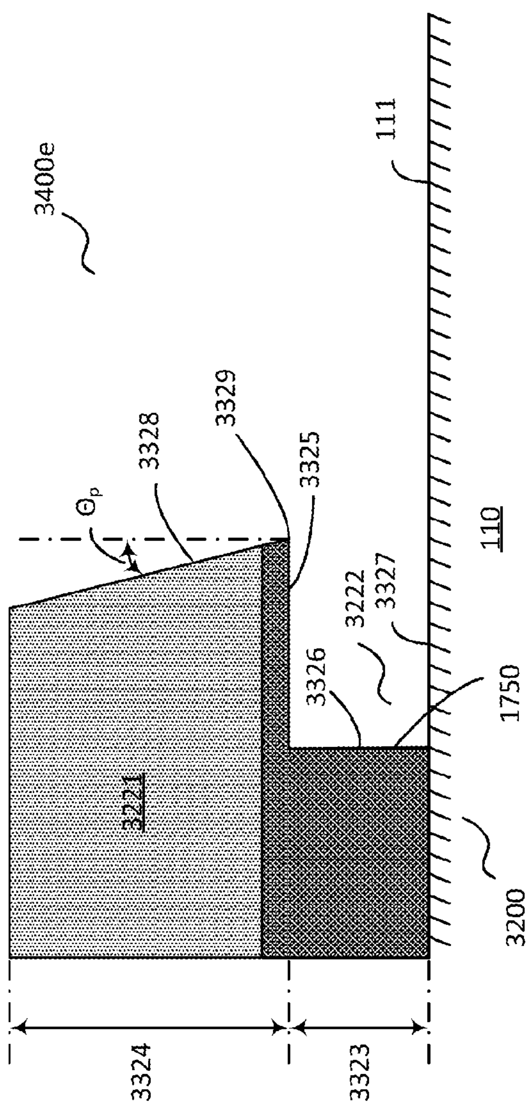

In a non-limiting example 3400*e* shown in FIG. 34E, the auxiliary electrode 1750 is arranged both adjacent to and/or within the upper section 3324 and integrally with and/or as part of the partition 3221 such that a surface of the auxiliary electrode 1750 is exposed in the recess 3222. As shown, in some non-limiting examples, such surface of the auxiliary electrode 1750 is provided in and/or may form and/or provide at least a part of the ceiling 3325 and/or at least a part of the side 3326. By way of non-limiting example, the auxiliary electrode 1750 may be arranged to be disposed adjacent to the upper section 3324 and/or to correspond to the lower section 3323. In some non-limiting examples, the part of the auxiliary electrode 1750 disposed adjacent to the upper section 3324 may be electrically coupled and/or in physical contact with the part thereof that corresponds to the lower section 3323. In some non-limiting examples, such part may be formed continuously and/or integrally with one another. In some non-limiting examples, the auxiliary electrode 1750 may be formed of at least one electrically conductive material. In some non-limiting examples, the parts thereof may be formed of different materials. In some non-limiting examples, the upper section 3324 may be formed of at least one substantially insulating material including without limitation, photoresist. In some non-limiting examples, various features of the device 3200, including without limitation, the upper section 3324 and/or the auxiliary electrode 1750, may be formed using techniques including without limitation, photolithography.

Figure 34F:
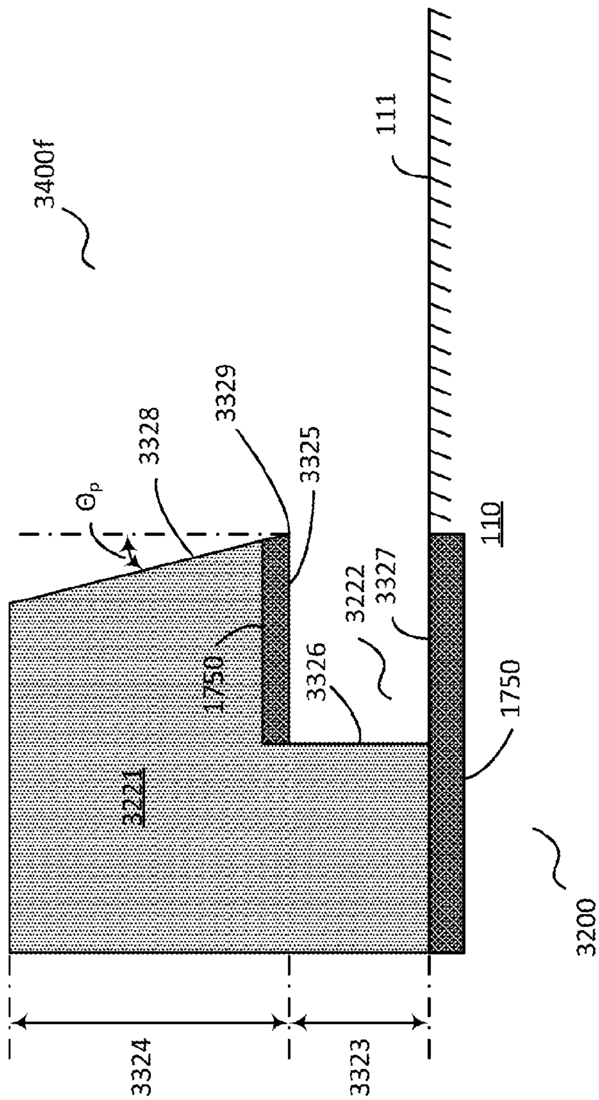

In a non-limiting example 3400*f* shown in FIG. 34F, the auxiliary electrode 1750 is arranged both adjacent to and/or within the substrate 110 and adjacent to and/or within the upper section 3324 such that a surface of the auxiliary electrode 1750 is exposed within the recess 3222. As shown, in some non-limiting examples, such surface of the auxiliary electrode 1750 is provided in and/or may form and/or provide at least a part of the ceiling 3325 and/or at least a part of the floor 3327. By way of non-limiting example, the auxiliary electrode 1750 may be arranged to be disposed adjacent to the partition 3221 and/or adjacent to the upper section 3324 thereof. In some non-limiting examples, the part of the auxiliary electrode 1750 disposed adjacent to the partition may be electrically coupled to the part thereof that corresponds to the ceiling 3325. In some non-limiting examples, the auxiliary electrode 1750 may be formed of at least one electrically conductive material. In some non-limiting examples, the part thereof may be formed of different materials. In some non-limiting examples, the partition 3221 and/or the upper section 3324 thereof may be formed of at least one substantially insulating material including without limitation, photoresist. In some non-limiting examples, various features of the device 3200, including without limitation, the partition 3221, the upper section 3324 and/or the auxiliary electrode 1750, may be formed using techniques including without limitation, photolithography.

Figure 34G:
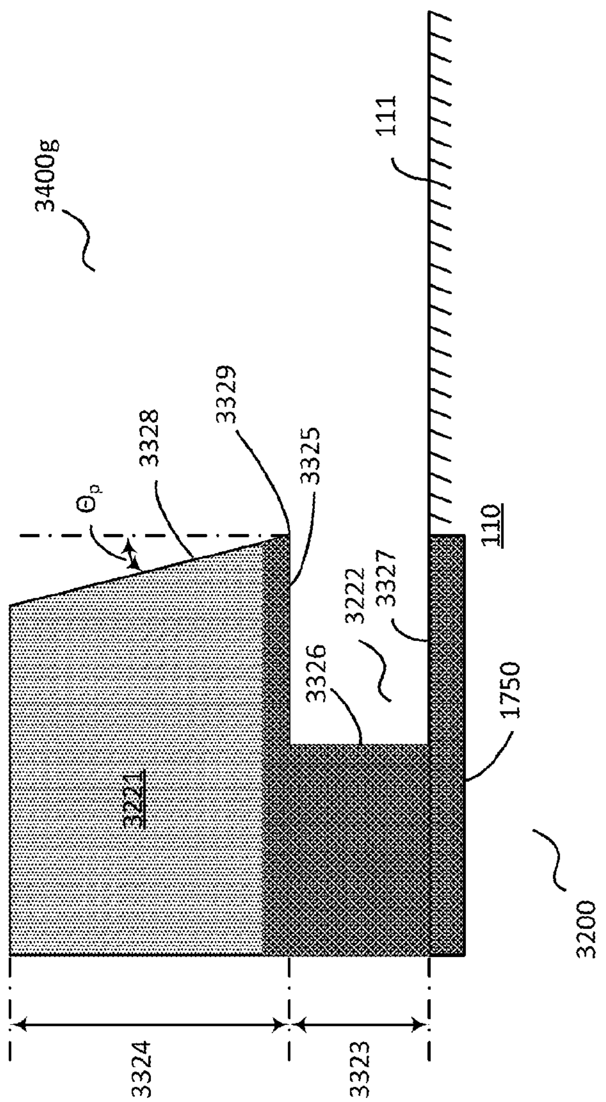

In a non-limiting example 3400*g* shown in FIG. 34G the auxiliary electrode 1750 is arranged both adjacent to and/or within the substrate 110, integrally with and/or as part of the partition 3221 and/or adjacent to and/or within the upper section 3324 such that a surface of the auxiliary electrode 1750 is exposed within the recess 3222. As shown, in some non-limiting examples, such surface of the auxiliary electrode 1750 is provided in and/or may form and/or provide at least a part of the ceiling 3325, at least a part of the side 3326 and/or at least a part of the floor 3327. By way of non-limiting example, the auxiliary electrode 1750 may be arranged to be disposed adjacent to the partition 3221, to correspond to the lower section 3323 and/or adjacent to the upper section 3324 thereof. In some non-limiting examples, the part of the auxiliary electrode 1750 disposed adjacent to the partition 3221 may be electrically coupled to at least one of the parts thereof that correspond to the lower section 3323 and/or to the ceiling 3325. In some non-limiting examples, the part of the auxiliary electrode 1750 that corresponds to the lower section 3323 may be electrically coupled to at least one of the parts thereof disposed adjacent to the partition 3221 and/or to the ceiling 3325. In some non-limiting examples, the part of the auxiliary electrode 1750 that corresponds to the ceiling 3325 may be electrically coupled to at least one of the parts thereof disposed adjacent to the partition and/or to the lower section 3323. In some non-limiting examples, the part of the auxiliary electrode 1750 that corresponds to the lower section 3323 may be in physical contact with at least one of the parts thereof disposed adjacent to the partition 3221 and/or that corresponds to the upper section 3324. In some non-limiting examples, the auxiliary electrode 1750 may be formed of at least one electrically conductive material. In some non-limiting examples, the parts thereof may be formed of different materials. In some non-limiting examples, the partition 3221, the lower section 3323 and/or the upper section 3324 thereof may be formed of at least one substantially insulating material including without limitation, photoresist. In some non-limiting examples, various features of the device 3200, including without limitation, the partition 3221, the lower section 3323 and/or the upper section 3324 thereof and/or the auxiliary electrode 1750, may be formed using techniques including without limitation, photolithography.

In some non-limiting examples, various features described in relation to FIGS. 33B-33P may be combined with various features described in relation to FIGS. 34A-34GH. In some non-limiting examples, the residual device stack 3311 and the conductive coating 830 according to any one of FIGS. 33B, 33C, 33E, 33F, 33G, 33H, 33I and/or 33J may be combined together with the partition 3221 and the auxiliary electrode 1750 according to any one of FIGS. 34A-34G. In some non-limiting examples, any one of FIGS. 33K-33M may be independently combined with any one of FIGS. 34D-34G. In some non-limiting examples, any one of FIGS. 33C-33D may be combined with any one of FIGS. 34A, 34C, 34F and/or 34G.

Aperture in Non-Emissive Region

Figure 35A:
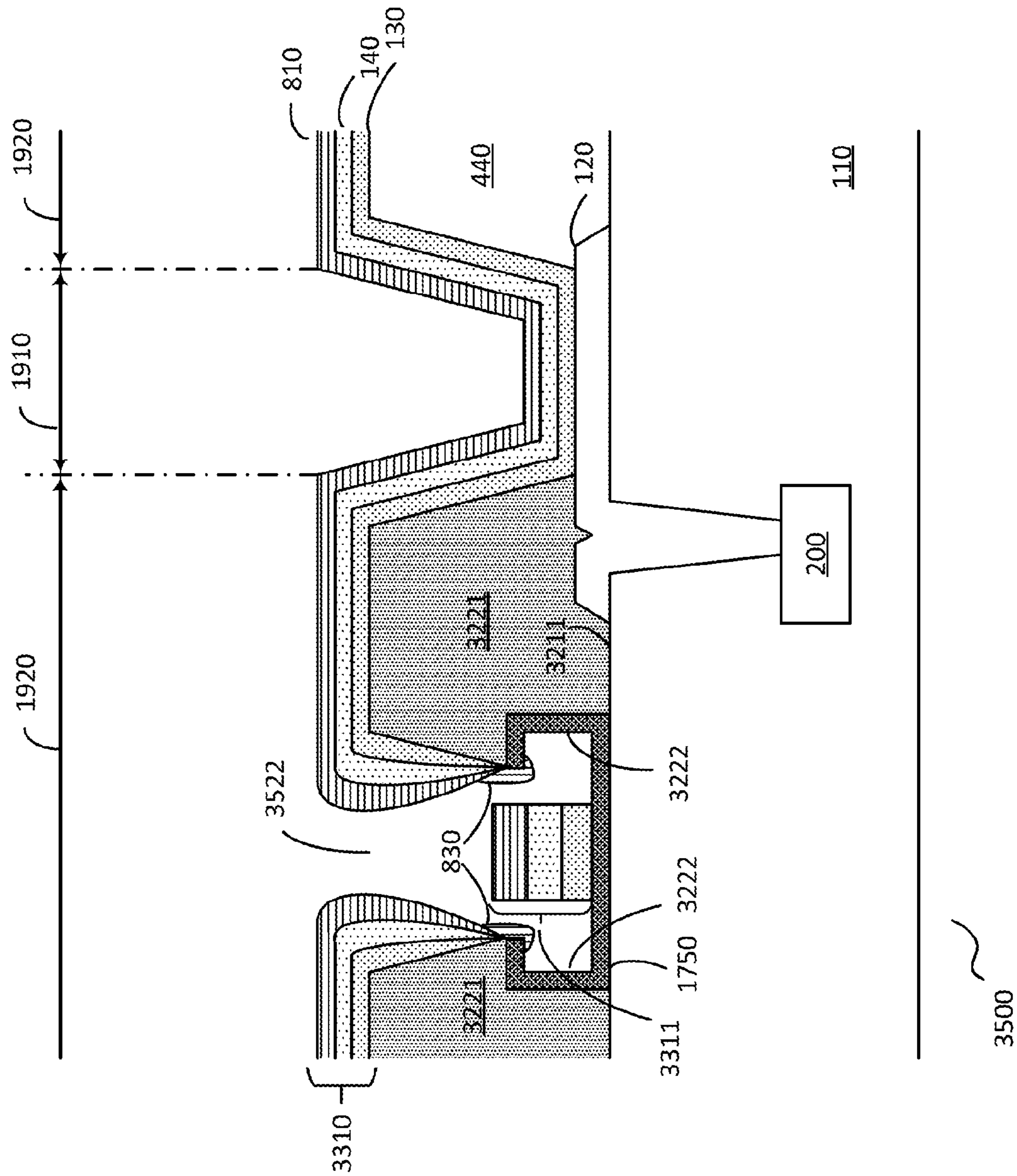
FIGS. 35A-35B are schematic diagrams that show example cross-sectional views of an example version of the device of FIG. 1 having a partition and a sheltered region, such as an aperture, in a non-emissive region, according to various examples in the present disclosure.

Turning now to FIG. 35A, there is shown a cross-sectional view of an example version 3500 of the device 100. The device 3500 differs from the device 3200 in that a pair of partitions 3221 in the non-emissive region 1920 are disposed in a facing arrangement to define a sheltered region 3065, such as an aperture 3522, therebetween. As shown, in some non-limiting examples, at least one of the partitions 3221 may function as a PDL 440 that covers at least an edge of the first electrode 120 and that defines at least one emissive region 1910. In some non-limiting examples, at least one of the partitions 3221 may be provided separately from a PDL 440.

A sheltered region 3065, such as the recess 3222, is defined by at least one of the partitions 3221. In some non-limiting examples, the recess 3222 may be provided in a part of the aperture 3522 proximal to the substrate 110. In some non-limiting examples, the aperture 3522 may be substantially elliptical when viewed in plan view. In some non-limiting examples, the recess 3222 may be substantially annular when viewed in plan view and surround the aperture 3522.

In some non-limiting examples, the recess 3222 may be substantially devoid of materials for forming each of the layers of the device stack 3310 and/or of the residual device stack 3311.

In some non-limiting examples, the residual device stack 3311 may be disposed within the aperture 3522. In some non-limiting examples, evaporated materials for forming each of the layers of the device stack 3310 may be deposited within the aperture 3522 to form the residual device stack 3311 therein.

In some non-limiting examples, the auxiliary electrode 1750 is arranged such that at least a part thereof is disposed within the recess 3222. By way of non-limiting example, the auxiliary electrode 1750 may be disposed relative to the recess 3222 by any one of the examples shown in FIGS. 34A-34G. As shown, in some non-limiting examples, the auxiliary electrode 1750 is arranged within the aperture 3522, such that the residual device stack 3311 is deposited onto a surface of the auxiliary electrode 1750.

A conductive coating 830 is disposed within the aperture 3522 for electrically coupling the electrode 140 to the auxiliary electrode 1750. By way of non-limiting example, at least a part of the conductive coating 830 is disposed within the recess 3222. By way of non-limiting example, the conductive coating 830 may be disposed relative to the recess 3222 by any one of the examples shown in FIGS. 33A-33P. By way of non-limiting example, the arrangement shown in FIG. 35A may be seen to be a combination of the example shown in FIG. 33P in combination with the example shown in FIG. 34C.

Figure 35B:
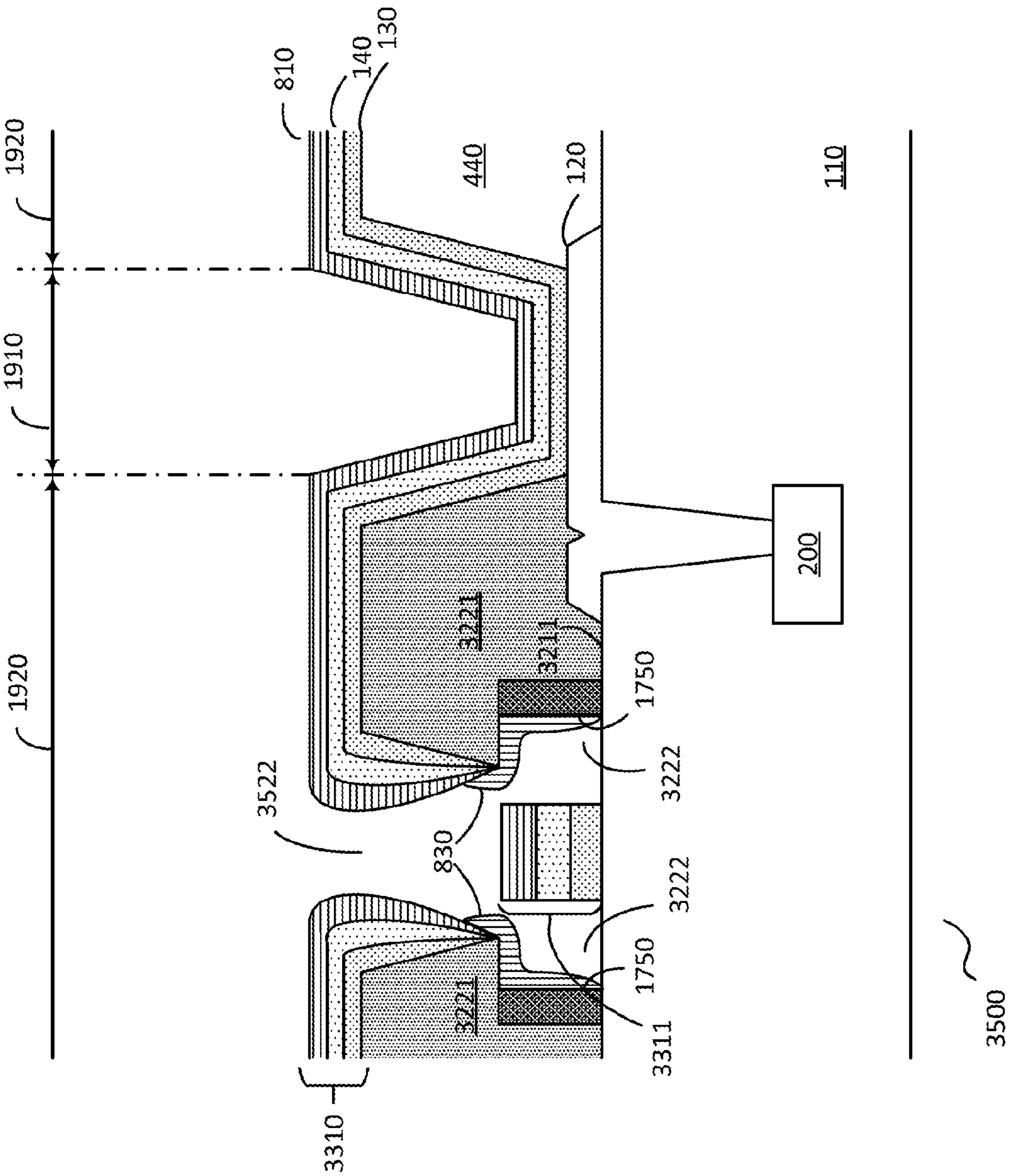

Turning now to FIG. 35B, there is shown a cross-sectional view of a further example of the device 3500. As shown, the auxiliary electrode 1750 is arranged to form at least a part of the side 3326. As such, the auxiliary electrode 1750 may be substantially annular when viewed in plan view and surround the aperture 3522. As shown, in some non-limiting examples, the residual device stack 3311 is deposited onto an exposed layer surface 111 of the substrate 110.

By way of non-limiting examples, the arrangement shown in FIG. 35B may be seen to be a combination of the example shown in FIG. 33O in combination with the example shown in FIG. 34B.

In the present disclosure, the terms "overlap" and/or "overlapping" may refer generally to two or more layers and/or structures arranged to intersect a cross-sectional axis extending substantially normally away from a surface onto which such layers and/or structures may be disposed.

NPCs

Without wishing to be bound by a particular theory, it is postulated that providing an NPC 1120 may facilitate deposition of the conductive coating 830 onto certain surfaces.

Non-limiting examples of suitable materials for forming an NPC 1120 include without limitation, at least one of metals, including without limitation, alkali metals, alkaline earth metals, transition metals and/or post-transition metals, metal fluorides, metal oxides and/or fullerene.

In the present disclosure, the term "fullerene" may refer generally to a material including carbon molecules. Non-limiting examples of fullerene molecules include carbon cage molecules, including without limitation, a three-dimensional skeleton that includes multiple carbon atoms that form a closed shell and which may be, without limitation, spherical and/or semi-spherical in shape. In some non-limiting examples, a fullerene molecule can be designated as $C_n$, where n is an integer corresponding to a number of carbon atoms included in a carbon skeleton of the fullerene molecule. Non-limiting examples of fullerene molecules include where n is in the range of 50 to 250, such as, without limitation, $C_{70}$, $C_{70}$, $C_{72}$, $C_{74}$, $C_{76}$, $C_{78}$, $C_{80}$, $C_{82}$, and $C_{84}$. Additional non-limiting examples of fullerene molecules include carbon molecules in a tube and/or a cylindrical shape, including without limitation, single-walled carbon nanotubes and/or multi-walled carbon nanotubes.

Non-limiting examples of such materials include Ca, Ag, Mg, Yb, ITO, IZO, ZnO, ytterbium fluoride ($YbF_3$), magnesium fluoride ($MgF_2$) and/or cesium fluoride (CsF).

Based on findings and experimental observations, it is postulated that nucleation promoting materials, including without limitation, fullerenes, metals, including without limitation, Ag and/or Yb, and/or metal oxides, including without limitation, ITO and/or IZO, as discussed further herein, may act as nucleation sites for the deposition of a conductive coating 830, including without limitation Mg.

In some non-limiting examples, the NPC 1120 may be provided by a part of the at least one semiconducting layer 130. By way of non-limiting example, a material for forming the EIL 139 may be deposited using an open mask and/or mask-free deposition process to result in deposition of such material in both an emissive region 1910 and/or a non-emissive region 1920 of the device 100. In some non-limiting examples, a part of the at least one semiconducting layer 130, including without limitation the EIL 139, may be deposited to coat one or more surfaces in the sheltered region 3065. Non-limiting examples of such materials for forming the EIL 139 include at least one or more of alkali metals, including without limitation, Li, alkaline earth metals, fluorides of alkaline earth metals, including without limitation, $MgF_2$, fullerene, Yb, $YbF_3$, and/or CsF.

In some non-limiting examples, the NPC 1120 may be provided by the second electrode 140 and/or a portion, layer and/or material thereof. In some non-limiting examples, the second electrode 140 may extend laterally to cover the layer surface 3111 arranged in the sheltered region 3065. In some non-limiting examples, the second electrode 140 may comprise a lower layer thereof and a second layer thereof, wherein the second layer thereof is deposited on the lower layer thereof. In some non-limiting examples, the lower layer of the second electrode 140 may comprise an oxide such as, without limitation, ITO, IZo and/or ZnO, In some non-limiting examples, the upper layer of the second electrode 140 may comprise a metal such as, without limitation, at least one of Ag, Mg, Mg:Ag, Yb/Ag, other alkali metals and/or other alkali earth metals.

In some non-limiting examples, the lower layer of the second electrode 140 may extend laterally to cover a surface of the sheltered region 3065, such that it forms the NPC 1120. In some non-limiting examples, one or more surfaces defining the sheltered region 3065 may be treated to form the NPC 1020. In some non-limiting examples, such NPC 1120 may be formed by chemical and/or physical treatment, including without limitation, subjecting the surface(s) of the sheltered region 3065 to a plasma, UV and/or UV-ozone treatment.

Without wishing to be bound to any particular theory, it is postulated that such treatment may chemically and/or physically alter such surface(s) to modify at least one property thereof. By way of non-limiting example, such treatment of the surface(s) may increase a concentration of C—O and/or C—OH bonds on such surface(s), increase a roughness of such surface(s) and/or increase a concentration of certain species and/or functional groups, including without limitation, halogens, nitrogen-containing functional groups and/or oxygen-containing functional groups to thereafter act as an NPC 1120.

In some non-limiting examples, the partition 830*a* includes and/or if formed by an NPC 1120. By way of non-limiting examples, the auxiliary electrode 1750 may act as an NPC 1120.

In some non-limiting examples, suitable materials for use to form an NPC 1120, may include those exhibiting or characterized as having an initial sticking probability $S_0$ for a material of a conductive coating 830 of at least about 0.4 (or 40%), at least about 0.5, at least about 0.6, at least about 0.7, at least about 0.75, at least about 0.8, at least about 0.9, at least about 0.93, at least about 0.95, at least about 0.98, and/or at least about 0.99.

By way of non-limiting example, in scenarios where Mg is deposited using without limitation, an evaporation process on a fullerene-treated surface, in some non-limiting examples, the fullerene molecules may act as nucleation sites that may promote formation of stable nuclei for Mg deposition.

In some non-limiting examples, less than a monolayer of an NPC 1120, including without limitation, fullerene, may be provided on the treated surface to act as nucleation sites for deposition of Mg.

In some non-limiting examples, treating a surface by depositing several monolayers of an NPC 1120 thereon may result in a higher number of nucleation sites and accordingly, a higher initial sticking probability $S_0$.

Those having ordinary skill in the relevant art will appreciate than an amount of material, including without limitation, fullerene, deposited on a surface, may be more, or less than one monolayer. By way of non-limiting example, such surface may be treated by depositing 0.1 monolayer, 1 monolayer, 10 monolayers, or more of a nucleation promoting material and/or a nucleation inhibiting material.

In some non-limiting examples, a thickness of the NPC 1120 deposited on an exposed layer surface 111 of underlying material(s) may be between about 1 nm and about 5 nm and/or between about 1 nm and about 3 nm.

While the present disclosure discusses thin film formation, in reference to at least one layer and/or coating, in terms of vapor deposition, those having ordinary skill in the relevant art will appreciate that, in some non-limiting examples, various components of the electro-luminescent device 100 may be deposited using a wide variety of techniques, including without limitation, evaporation (including without limitation, thermal evaporation and/or electron beam evaporation), photolithography, printing (including without limitation, ink jet and/or vapor jet printing, reel-to-reel printing and/or micro-contact transfer printing), PVD (including without limitation, sputtering), CVD (including without limitation, PECVD and/or OVPD), laser annealing, LITI patterning, ALD, coating (including without limitation, spin coating, dip coating, line coating and/or spray coating), and/or combinations of any two or more thereof. Such processes may be used in combination with a shadow mask to achieve various patterns.

NICs

Without wishing to be bound by a particular theory, it is postulated that, during thin film nucleation and growth at and/or near an interface between the exposed layer surface 111 of the substrate 110 and the NIC 810, a relatively high contact angle $\theta_c$ between the edge of the film and the substrate 110 be observed due to "dewetting" of the solid surface of the thin film by the NIC 810. Such dewetting property may be driven by minimization of surface energy between the substrate 110, thin film, vapor 7 and the NIC 810 layer. Accordingly, it may be postulated that the presence of the NIC 810 and the properties thereof may have, in some non-limiting examples, an effect on nuclei formation and a growth mode of the edge of the conductive coating 830.

Without wishing to be bound by a particular theory, it is postulated that, in some non-limiting examples, the contact angle $\theta_c$ of the conductive coating 830 may be determined, based at least partially on the properties (including, without limitation, initial sticking probability $S_0$) of the NIC 810 disposed adjacent to the area onto which the conductive coating 830 is formed. Accordingly, NIC 810 material that allow selective deposition of conductive coatings 830 exhibiting relatively high contact angles $\theta_c$ may provide some benefit.

Figure 36:
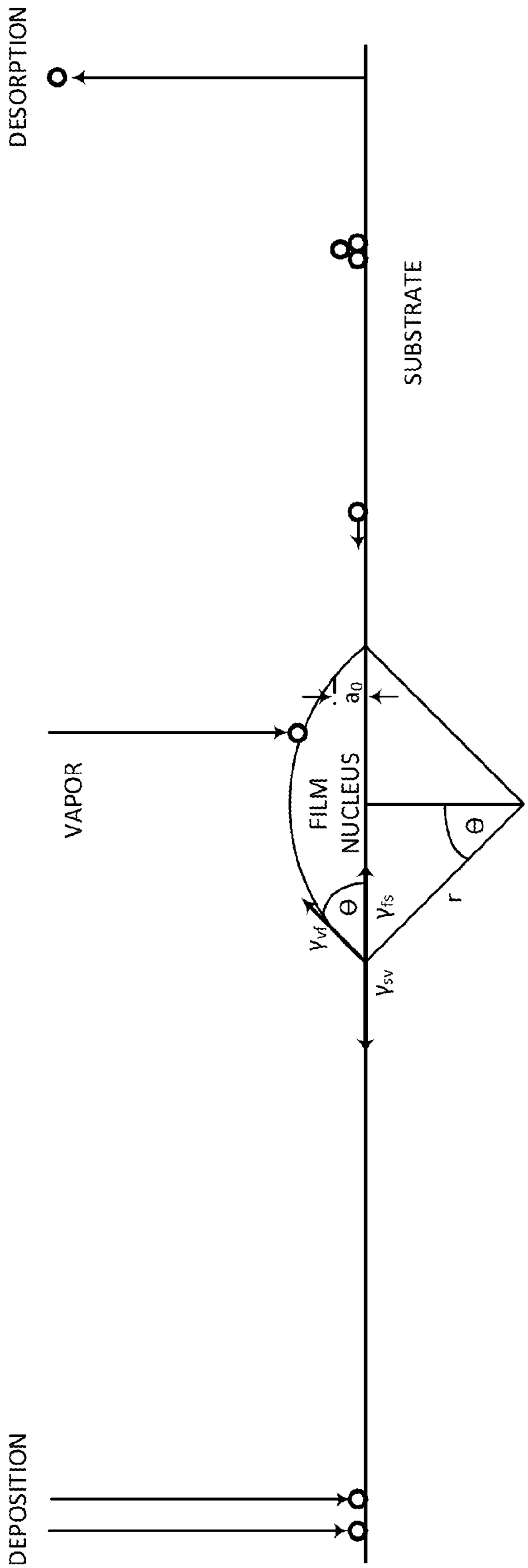
FIG. 36 is a schematic diagram illustrating the formation of a film nucleus according to an example in the present disclosure.

Without wishing to be bound by a particular theory, it is postulated that, in some non-limiting examples, the relationship between various interfacial tensions present during nucleation and growth may be dictated according to Young's equation in capillarity theory:

$$\gamma_{sv} = \gamma_{fs} + \gamma_{vf}\cos\theta$$

wherein $\gamma_{sv}$ corresponds to the interfacial tension between substrate 110 and vapor, $\gamma_{fs}$ corresponds to the interfacial tension between the thin film and the substrate 110, $\gamma_{vf}$ corresponds to the interfacial tension between the vapor and the film, and $\theta$ is the film nucleus contact angle. FIG. 36 illustrates the relationship between the various parameters represented in this equation.

On the basis of Young's equation, it may be derived that, for island growth, the film nucleus contact angle $\theta$ is greater than 0 and therefore $\theta_{sv}<\theta_{fs}+\theta_{vf}$.

For layer growth, where the deposited film "wets" the substrate 110, the nucleus contact angle $\theta=0$, and therefore $\theta_{sv}=\theta_{fs}+\theta_{vf}$.

For Stranski-Krastanov (S-K) growth, where the strain energy per unit area of the film overgrowth is large with respect to the interfacial tension between the vapor and the film, $\theta_{sv}>\theta_{fs}+\theta_{vf}$.

It may be postulated that the nucleation and growth mode of the conductive coating 830 at an interface between the NIC 810 and the exposed layer surface 111 of the substrate 110 may follow the island growth model, where $\theta>0$. Particularly in cases where the NIC 810 exhibits a relatively low affinity and/or low initial sticking probability $S_0$ (i.e. dewetting) towards the material used to form the conductive coating 830, resulting in a relatively high thin film contact angle of the conductive coating 830. On the contrary, when a conductive coating 830 is selectively deposited on a surface without the use of an NIC 810, by way of non-limiting example, by employing a shadow mask, the nucleation and growth mode of the conductive coating 830 may differ. In particular, it has been observed that the conductive coating 830 formed using a shadow mask patterning process may, at least in some non-limiting examples, exhibit relatively low thin film contact angle of less than about 10°.

Those having ordinary skill in the relevant art will appreciate that, while not explicitly illustrated, a material used to form the NIC 810 may also be present to some extent at an interface between the conductive coating 830 and an underlying surface (including without limitation, a surface of a NPC 1120 layer and/or the substrate 110). Such material may be deposited as a result of a shadowing effect, in which a deposited pattern is not identical to a pattern of a mask and may, in some non-limiting examples, result in some evaporated material being deposited on a masked part of a target surface 111. By way of non-limiting examples, such material may form as islands and/or disconnected clusters, and/or as a thin film having a thickness that may be substantially less than an average thickness of the NIC 810.

In some non-limiting examples, it may be desirable for the activation energy for desorption ($E_{des}$ 631) to be less than about 2 times the thermal energy ($k_BT$), less than about 1.5 times the thermal energy ($k_BT$), less than about 1.3 times the thermal energy ($k_BT$), less than about 1.2 times the thermal energy ($k_BT$), less than the thermal energy ($k_BT$), less than about 0.8 times the thermal energy ($k_BT$), and/or less than about 0.5 times the thermal energy ($k_BT$). In some non-limiting examples, it may be desirable for the activation energy for surface diffusion ($E_s$ 621) to be greater than the thermal energy ($k_BT$), greater than about 1.5 times the thermal energy ($k_BT$), greater than about 1.8 times the thermal energy ($k_BT$), greater than about 2 times the thermal energy ($k_BT$), greater than about 3 times the thermal energy ($k_BT$), greater than about 5 times the thermal energy ($k_BT$), greater than about 7 times the thermal energy ($k_BT$), and/or greater than about 10 times the thermal energy ($k_BT$).

In some non-limiting examples, suitable materials for use to form an NIC 810, may include those exhibiting and/or characterized as having an initial sticking probability $S_0$ for a material of a conductive coating 830 of no greater than and/or less than about 0.3 (or 30%), no greater than and/or less than about 0.2, no greater than and/or less than about 0.1, no greater than and/or less than about 0.05, no greater than and/or less than 0.03, no greater than and/or less than 0.02, no greater than and/or less than 0.01, no greater than and/or less than about 0.08, no greater than and/or less than about 0.005, no greater than and/or less that about 0.003, no greater than and/or less than about 0.001, no greater than and/or less than about 0.0008, no greater than and/or less than about 0.0005, and/or no greater than and/or less than about 0.0001.

In some non-limiting examples, suitable materials for use to form an NIC 810 include those exhibiting and/or characterized has having initial sticking probability $S_0$ for a material of a conductive coating 830 of between about 0.03 and about 0.0001, between about 0.03 and about 0.0003, between about 0.03 and about 0.0005, between about 0.03 and about 0.0008, between about 0.03 and about 0.001, between about 0.03 and about 0.005, between about 0.03 and about 0.008, between about 0.03 and about 0.01, between about 0.02 and about 0.0001, between about 0.02 and about 0.0003, between about 0.02 and about 0.0005, between about 0.02 and about 0.0008, between about 0.02 and about 0.0005, between about 0.02 and about 0.0008, between about 0.02 and about 0.001, between about 0.02 and about 0.005, between about 0.02 and about 0.008, between about 0.02 and about 0.01, between about 0.01 and about 0.0001, between about 0.01 and about 0.0003, between about 0.01 and about 0.0005, between about 0.01 and about 0.0008, between about 0.01 and about 0.001, between about 0.01 and about 0.005, between about 0.01 and about 0.008, between about 0.008 and about 0.0001, between about 0.008 and about 0.0003, between about 0.008 and about 0.0005, between about 0.008 and about 0.0008, between about 0.008 and about 0.001, between about 0.008 and about 0.005, between about 0.005 and about 0.0001, between about 0.005 and about 0.0003, between about 0.005 and about 0.0005, between about 0.005 and about 0.0008, and/or between about 0.005 and about 0.001.

In some non-limiting examples, suitable materials for use to form an NIC 810, may include organic materials, such as small molecule organic materials and/or organic polymers.

Non-limiting examples of suitable materials for use to form an NIC 810 include at least one material described in at least one of U.S. Pat. No. 10,270,033, PCT International Application No. PCT/IB2018/052881, PCT International Application No. PCT/IB2019/053706 and/or PCT International Application No. PCT/IB2019/050839.

In some embodiments, the NIC comprises a compound of Formulae (I), (II), (III), (IV), (V), (VI), (VII), (VIII), (IX), (X), (XI), (XII), (XIII), (XIV), (XV), (XVI), (XVII), (XVIII), (XIX) and/or (XX).

Formula (I)

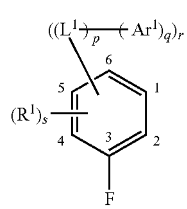

Formula (II)

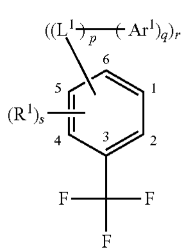

-continued

Formula (III)

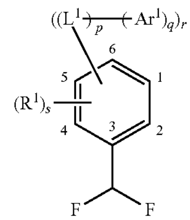

Formula (IV)

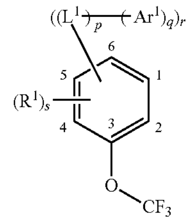

Formula (V)

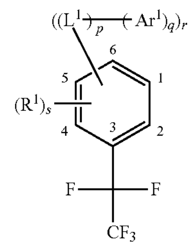

Formula (VI)

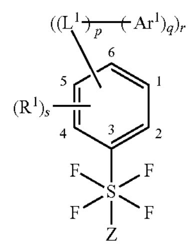

Formula (VII)

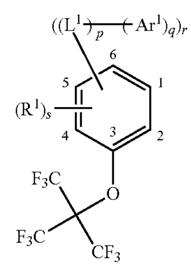

Formula (VIII)

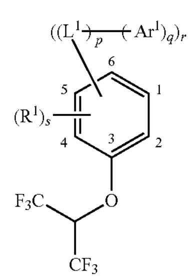

-continued
Formula (IX)
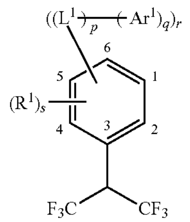
Formula (X)
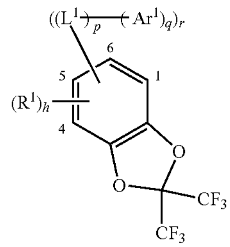
Formula (XI)
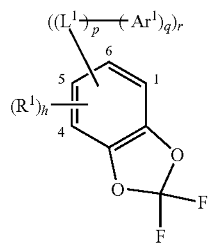
Formula (XII)
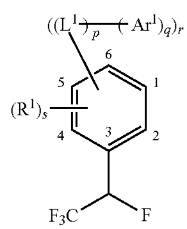
Formula (XIII)
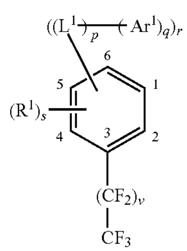
Formula (XIV)
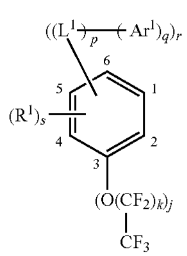
-continued
Formula (XV)
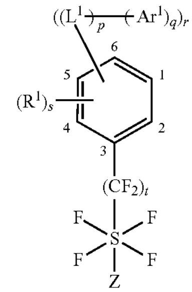
Formula (XVI)
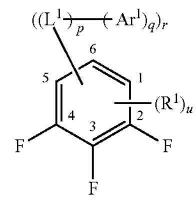
Formula (XVII)
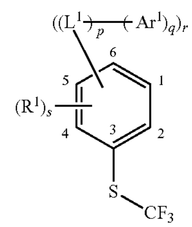
Formula (XVIII)
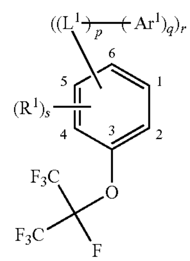
Formula (XIX)
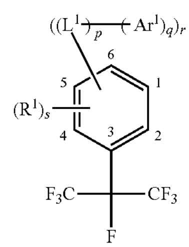
Formula (XX)
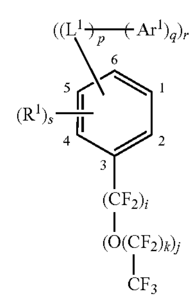

In Formulae (I), (II), (III), (IV), (V), (VI), (VII), (VIII), (IX), (X), (XI), (XII), (XIII), (XIV), (XV), (XVI), (XVII), (XVIII), (XIX) and/or (XX):

$L^1$ represents C, $CR^2$, $CR^2R^3$, N, $NR^3$, S, O, substituted or unsubstituted cycloalkylene having 3-6 carbon atoms, substituted or unsubstituted arylene group having 5-60 carbon atoms, or a substituted or unsubstituted heteroarylene group having 4-60 carbon atoms. Example of cycloalkylene include, but are not limited to cyclopropylene, cyclopentylene and cyclohexylene. Examples of arylene group include, but are not limited to, the following: phenylene, indenylene, naphthylene, fluorenylene, anthracylene, phenanthrylene, pyrylene, and chrysenylene. Other examples of $L_1$ may include cyclopentylene. For example, $L^1$ may be an arylene group having 5-30 carbon atoms. Examples of heteroarylene group include, but are not limited to, heteroarylene groups derived by replacing one, two, three, four, or more ring carbon atom(s) of arylene groups with a corresponding number of heteroatom(s). For example, one or more such heteroatom(s) may be individually selected from: nitrogen, oxygen, and sulphur. For example, $L^1$ may be a heteroarylene group having 4-30 carbon atoms. In some embodiments, $L^1$ optionally includes one or more substituents. Examples of such substituents include but are not limited to the following: H, D (deutero), F, Cl, alkyl including C1-C6 alkyl, cycloaklyl including C3-C6 cycloalkyl, alkoxy including C1-C6 alkoxy, fluoroalkyl, haloaryl, heteroaryl, haloalkoxy, fluoroaryl, fluoroalkoxy, fluoroalkylsulfanyl, fluoromethyl, difluoromethyl, trifluoromethyl, difluoromethoxy, trifluoromethoxy, fluoroethyl, polyfluoroethyl, 4-fluorophenyl, 3,4,5-trifluorophenyl, polyfluoroaryl, 4-(trifluoromethoxy)phenyl, $SF_4Cl$, $SF_5$, $(O(CF_2)_b)_dCF_3$, $(CF_2)_e(O(CF_2)_b)_d)CF_3$, $(CF_2)_aSF_5$, $(Ob)(CF_2)_dCF_3$, and trifluoromethylsulfanyl.

$Ar^1$ represents a substituted or unsubstituted aryl group having 5 to 60 carbon atoms, a substituted or unsubstituted haloaryl group having 5 to 60 carbon atoms, or a substituted or unsubstituted heteroaryl group having 4 to 60 carbon atoms. Examples of $Ar^1$ include, but are not limited to, the following: cyclopentadienyl, phenyl; 1-naphthyl; 2-naphthyl; 1-phenanthryl; 2-phenanthryl; 9-phenanthryl; 10-phenanthryl; 1-anthracenyl; 2-anthracenyl; 3-anthracenyl; 9-anthracenyl; benzanthracenyl (including 5-, 6-, 7-, 8- and 9-benzathracenyl); pyrenyl (including 1-, 2-, and 4-pyrenyl), chrysenyl (including 3-, 4-, 5-, 6-, 9-, and 10-chrysenyl), fluorenyl (including 2-, 4-, 5-, 6-, and 9-fluorenyl), and pentacenyl. $Ar^1$ may be substituted with one or more substituents. Examples of such substituents include but are not limited to the following: H, D (deutero), F, Cl, alkyl including C1-C6 alkyl, cycloaklyl including C3-C6 cycloalkyl, alkoxy including C1-C6 alkoxy, fluoroalkyl, haloaryl, heteroaryl, haloalkoxy, fluoroaryl, fluoroalkoxy, fluoroalkylsulfanyl, fluoromethyl, difluoromethyl, trifluoromethyl, difluoromethoxy, trifluoromethoxy, fluoroethyl, polyfluoroethyl, 4-fluorophenyl, 3,4,5-trifluorophenyl, polyfluoroaryl, 4-(trifluoromethoxy)phenyl, $SF_4Cl$, $SF_5$, $(CF_2)_aSF_5$, $(O(CF_2)_b)_dCF_3$, $(CF_2)_e(O(CF_2)_b)_d)CF_3$, and trifluoromethylsulfanyl.

$R^1$ individually represents H, D (deutero), F, Cl, alkyl including C1-C6 alkyl, cycloaklyl including C3-C6 cycloalkyl, alkoxy including C1-C6 alkoxy, fluoroalkyl, haloaryl, heteroaryl, haloalkoxy, fluoroaryl, fluoroalkoxy, fluoroalkylsulfanyl, fluoromethyl, difluoromethyl, trifluoromethyl, difluoromethoxy, trifluoromethoxy, fluoroethyl, polyfluoroethyl, 4-fluorophenyl, 3,4,5-trifluorophenyl, polyfluoroaryl, 4-(trifluoromethoxy)phenyl, $SF_4Cl$, $SF_5$, $(CF_2)_aSF_5$, $(O(CF_2)_b)_dCF_3$, $(CF_2)_e(O(CF_2)_b)_d)CF_3$, and trifluoromethylsulfanyl.

s represents an integer of 0 to 4.

r represents an integer of 1 to 3, or an integer of 1 to 2.

p represents an integer of 0 to 6, an integer of 0 to 5, an integer of 0 to 4, an integer of 0 to 3, or an integer of 0 to 2.

q represents an integer of 0 to 8, an integer of 0 to 6, an integer of 0 to 5, an integer of 0 to 4, an integer of 0 to 3, or an integer of 0 to 2. In some embodiments, q represents an integer of 1 to 8, an integer of 1 to 6, an integer of 1 to 5, an integer of 1 to 4, an integer of 1 to 3, or an integer of 1 to 2.

The sum of r and s is 5. The sum of r and u is 3.

In Formula (VI) and (XV), Z represents F or Cl.

In Formula (X) and (XI), h represents and integer of 0 to 3, or an integer of 0 to 2. The sum of r and h is 4.

In Formula (XIII), v represents an integer of 2 to 4, or an integer of 2 to 3.

In Formula (XIV), j represents an integer of 1 to 3, and k represents an integer of 1 to 4.

In Formula (XV), t represents an integer of 2 to 6, or an integer of 2 to 4.

In Formula (XVI), u represents an integer of 0 to 2.

In Formula (XX), i represents an integer of 1 to 4, or 1 to 3, or 1 to 2.

In all Formulae herein, it is assumed that if a particular position is not substituted with a non-hydrogen atom, a hydrogen atom is included at that position to include proper valence considerations.

In some embodiments, the sum of s and r is less than or equal to 5 in each instance of $(L^1)_p$-$(Ar^1)_q$ group. For example, the sum of s and r may be less than or equal to 4, or less than or equal to 3. In some embodiments, the sum of p and q is equal to or greater than 1. For example, in each $(L^1)_p$-$(Ar^1)_q$ group, at least one of p and q is a non-zero integer.

In some embodiments, in each instance of $(L^1)_p$-$(Ar^1)_q$ group, $L^1$, or if p=0, $Ar^1$, is bonded to at least one of 1-, 2-, 4-, 5-, and/or 6-position of the substituted phenyl as indicated in the each formulae above. For example, in cases wherein r is 1, $L^1$ or $Ar^1$ of the $(L^1)_p$-$(Ar^1)_q$ group is bonded to 1-, 2-, 4-, 5-, and/or 6-position of the substituted phenyl. In other non-limiting examples wherein r is 2, $L^1$ or $Ar^1$ from each $(L^1)_p$-$(Ar^1)_q$ group is bonded at, for example, 1- and 4-positions, 1- and 5-positions, 2- and 4-positions, 2- and 5-positions, 2- and 6-positions, or 4- and 6-positions. In other non-limiting examples wherein r is 3, $L^1$ or $Ar^1$ from each $(L^1)_p$-$(Ar^1)_q$ group is bonded to the substituted phenyl at 2-, 4-, and 6-positions. For example, one or more $R^1$ groups may be bonded to any available bonding site(s) of the substituted phenyl.

In some embodiments wherein r is 1, p is 1 or greater, and q is 1 or greater. For example, p is an integer of 1 to 5, an integer of 1 to 4, an integer of 1 to 3, or an integer of 1 to 2, and q is an integer of 1 to 6, an integer of 1 to 5, an integer of 1 to 4, an integer of 1 to 3, or an integer of 1 to 2.

In some embodiments wherein r is 2 or 3, p represents zero (0) or a non-zero integer in each instance, and q represents zero (0) or a non-zero integer in each instance, provided however that at least one instance of p is a non-zero integer, and at least one instance of q is a non-zero integer. It will generally be understood that, if p is 0 for a given instance, $Ar^1$ associated with such instance may be bonded directly to the substituted phenyl group. In some embodiments wherein r is 2 or 3, and at least one instance of p is 0, q associated with such at least one instance is 1.

In some embodiments wherein s is 2 or greater, two or more $R^1$ groups may bind to each other to form a ring or an aromatic structure.

In various embodiments described herein, a substituent group is indicated as $R^x$ wherein x represents an integer. It will be appreciated that features generally described herein in relation to $R^x$ may apply to any such substituent group, including but not limited to substituent groups represented as $R^1$, $R^2$, $R^3$, $R^4$, $R^5$, unless otherwise specified.

In reference with regard to some embodiments of the substituent groups $R^x$, a represents an integer of 2 to 6 or an integer of 2 to 4. In some embodiments, b represents an integer of 1 to 4, or an integer of 1 to 3. In some embodiments, d represents an integer of 1 to 3, or an integer of 1 to 2. In some embodiments, e represents an integer of 1 to 4, or an integer of 1 to 3.

In some embodiments wherein two or more substituent groups, $R^x$, having the same value of x are provided in any single molecule, such two or more substituent groups may be fused to form one or more aryl groups or heteroaryl groups. For example, in a molecule containing two (s=2) $R^1$ substituent groups, the two $R^1$ may fuse together to form one or more aryl groups or heteroaryl groups, which may be bonded to the substituted phenyl of Formulae (I), (II), (III), (IV), (V), (VI), (VII), (VIII), (IX), (X), (XI), (XII), (XIII), (XIV), (XV), (XVI), (XVII), (XVIII), (XIX) and/or (XX) at two or more bonding positions due to the substituent groups being fused.

In some non-limiting examples, a $(L^1)_p$-$(Ar^1)_q$ group is represented by a formula according to the following table. In any Formula containing two or more of $L^1$ and/or $Ar^1$ groups, the presence of each such group is indicated using a subscript for differentiation.

Formula (D-1)

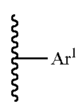

p = 0, q = 1

Formula (D-2)

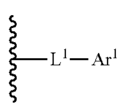

p = 1, q = 1

Formula (D-3)

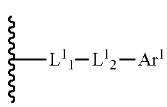

p = 2, q = 1

Formula (D-4)

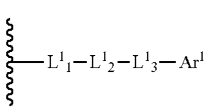

p = 3, q = 1

Formula (D-5)

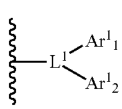

p = 1, q = 2

-continued

Formula (D-6)

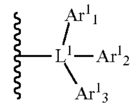

p = 1, q = 3

Formula (D-7)

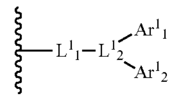

p = 2, q = 2

Formula (D-8)

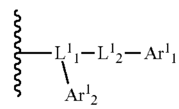

Formula (D-9)

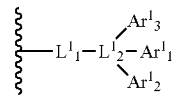

p = 2, q = 3

Formula (D-10)

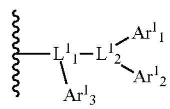

Formula (D-11)

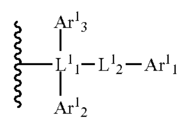

Formula (D-12)

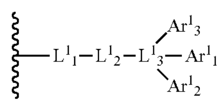

p = 3, q = 3

Formula (D-13)

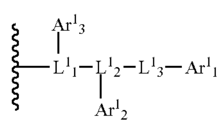

Formula (D-14)

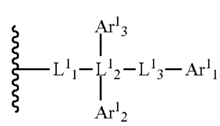

Formula (D-15)

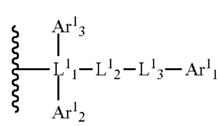

Formula (D-16)

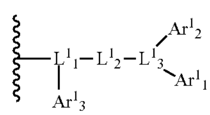

Formula (D-17)

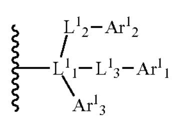

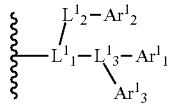

Formula (D-18)

In various embodiments described herein, a molecule may include a substituted or unsubstituted aryl and/or a substituted or unsubstituted heteroaryl group. In some non-limiting example, $L^1$, $Ar^1$, and/or $R^x$ may contain such aryl or heteroaryl group. In some embodiments, such aryl and heteroaryl group are represented by any of the following.

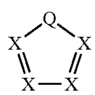

Formula (AR-1)

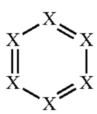

Formula (AR-2)

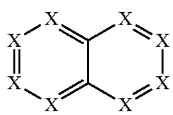

Formula (AR-3)

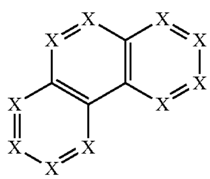

Formula (AR-4)

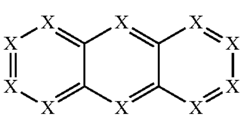

Formula (AR-5)

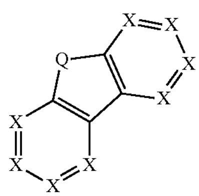

Formula (AR-6)

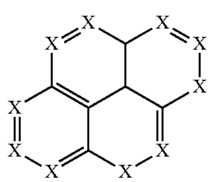

Formula (AR-7)

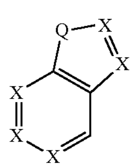

Formula (AR-8)

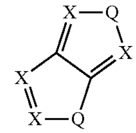

Formula (AR-9)

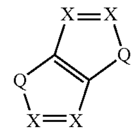

Formula (AR-10)

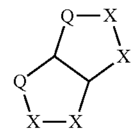

Formula (AR-11)

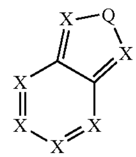

Formula (AR-12)

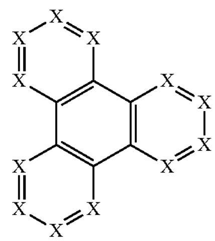

Formula (AR-13)

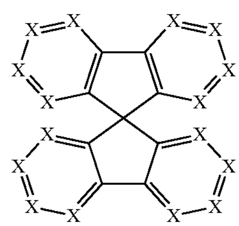

Formula (AR-14)

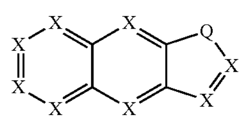

Formula (AR-15)

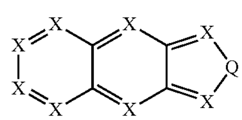

Formula (AR-16)

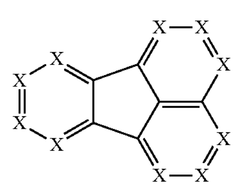

Formula (AR-17)

-continued
Formula (AR-18)
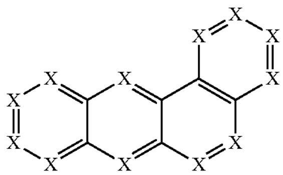
Formula (AR-19)
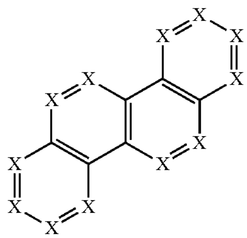
Formula (AR-20)
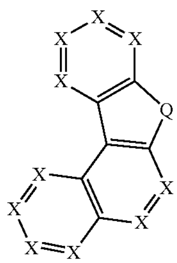
Formula (AR-21)
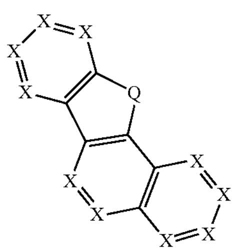
Formula (AR-22)
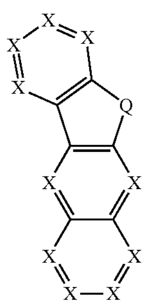
Formula (AR-23)
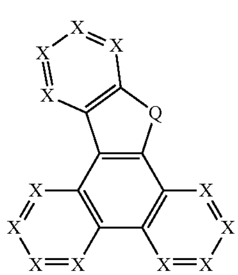
-continued
Formula (AR-24)
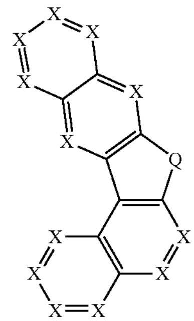
Formula (AR-25)
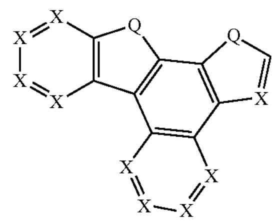
Formula (AR-26)
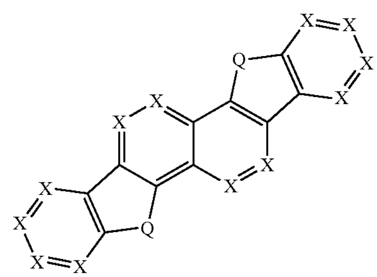
Formula (AR-27)
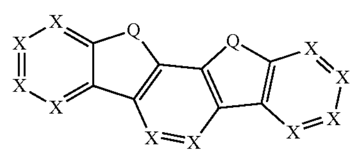
Formula (AR-28)
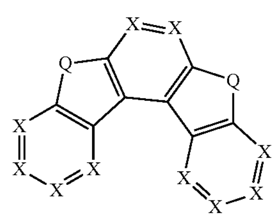
Formula (AR-29)
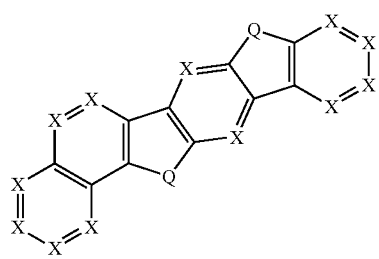

Formula (AR-30)

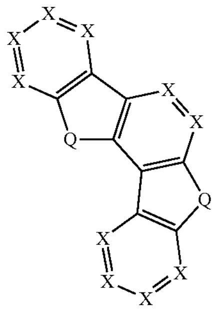

Formula (AR-31)

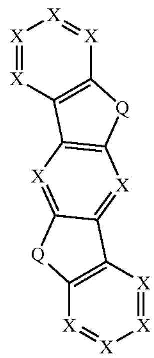

In each of Formula (AR-1) to (AR-31):

X independently represents N or $CR^4$.

Q independently represents $CR^4R^5$, $NR^4$, S, O, or $SiR^4R^5$.

$R^4$ and $R^5$ each independently represents H, D (deutero), F, Cl, alkyl including C1-C6 alkyl, cycloaklyl including C3-C6 cycloalkyl, alkoxy including C1-C6 alkoxy, aryl, fluoroalkyl, haloaryl, heteroaryl, haloalkoxy, fluoroaryl, fluoroalkoxy, fluoroalkylsulfanyl, fluoromethyl, difluoromethyl, trifluoromethyl, difluoromethoxy, trifluoromethoxy, fluoroethyl, polyfluoroethyl, 4-fluorophenyl, 3,4,5-trifluorophenyl, polyfluoroaryl, 4-(trifluoromethoxy)phenyl, $SF_4Cl$, $SF_5$, $(CF_2)_aSF_5$, $(O(CF_2)_b)_dCF_3$, $(CF_2)_e(O(CF_2)_b)_d)CF_3$, trifluoromethylsulfanyl, and a bond between the aryl or heteroaryl group and a part of the molecule to which the aryl or heteroaryl group is attached.

Some non-limiting examples of aryl and heteroaryl groups include the following.

Formula (AN-1)

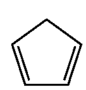

Formula (AN-2)

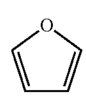

Formula (AN-3)

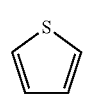

Formula (AN-4)

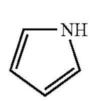

Formula (AN-5)

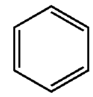

Formula (AN-6)

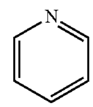

Formula (AN-7)

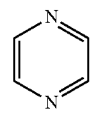

Formula (AN-8)

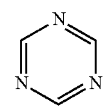

Formula (AN-9)

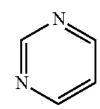

Formula (AN-10)

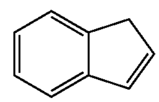

Formula (AN-11)

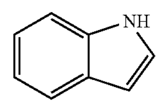

Formula (AN-12)

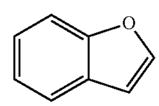

Formula (AN-13)

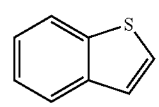

Formula (AN-14)

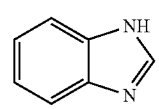

Formula (AN-15)

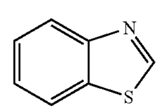

Formula (AN-16)

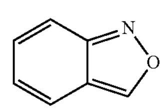

Formula (AN-17)

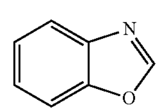

Formula (AN-18)

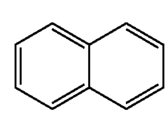

-continued
Formula (AN-19)
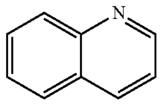
Formula (AN-20)
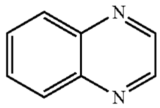
Formula (AN-21)
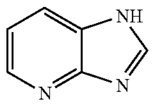
Formula (AN-22)
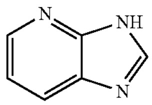
Formula (AN-23)
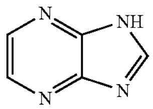
Formula (AN-24)
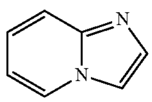
Formula (AN-25)
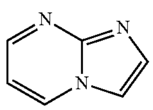
Formula (AN-26)
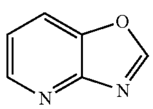
Formula (AN-27)
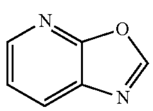
Formula (AN-28)
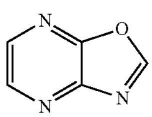
Formula (AN-29)
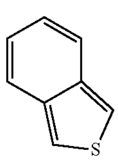
Formula (AN-30)
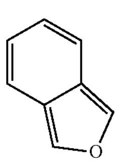
-continued
Formula (AN-31)
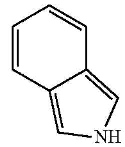
Formula (AN-32)
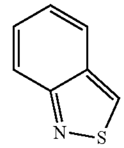
Formula (AN-33)
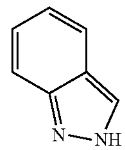
Formula (AN-34)
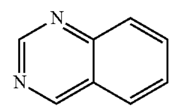
Formula (AN-35)
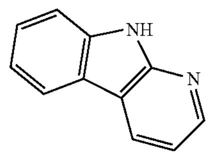
Formula (AN-36)
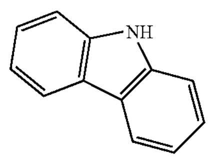
Formula (AN-37)
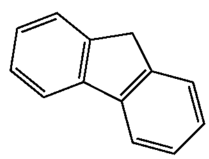
Formula (AN-38)
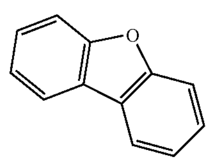
Formula (AN-39)
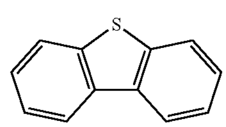
Formula (AN-40)
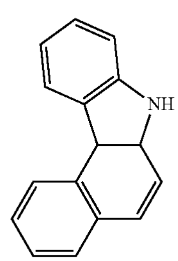

Formula (AN-41)
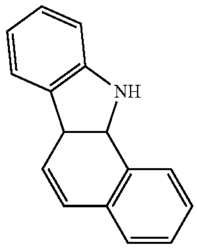
Formula (AN-42)
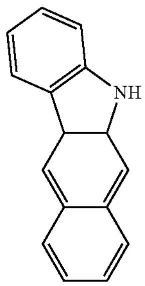
Formula (AN-43)
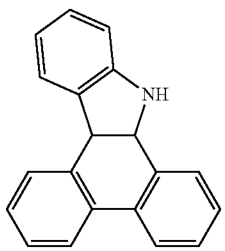
Formula (AN-44)
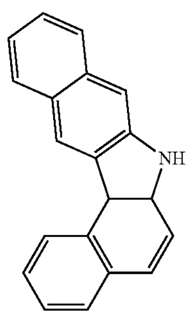
Formula (AN-45)
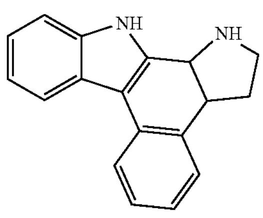
Formula (AN-46)
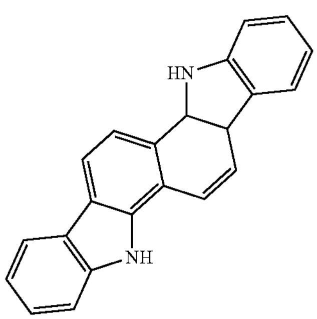
Formula (AN-47)
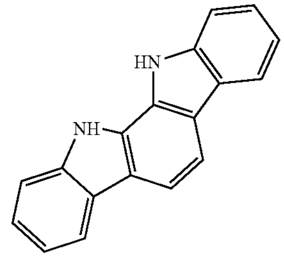
Formula (AN-48)
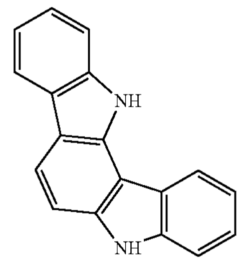
Formula (AN-49)
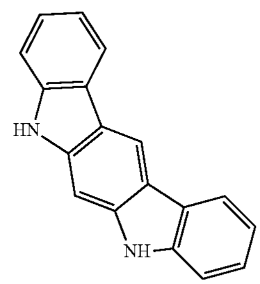
Formula (AN-50)
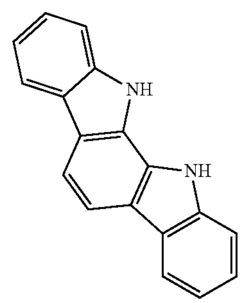
Formula (AN-51)
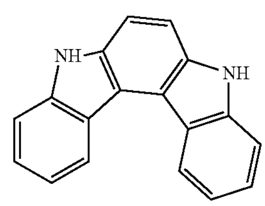
Formula (AN-52)
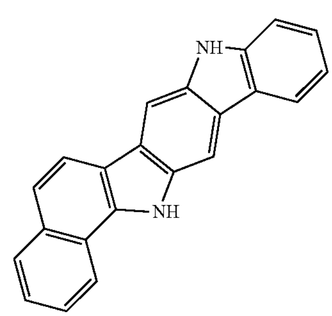

-continued

Formula (AN-53)

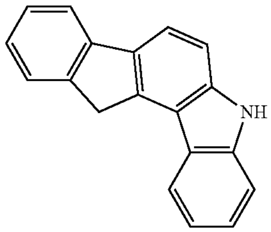

Formula (AN-54)

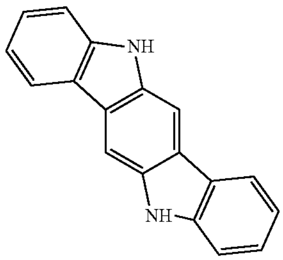

Formula (AN-55)

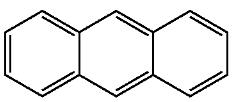

Formula (AN-56)

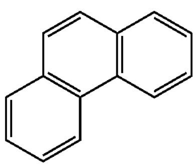

Formula (AN-57)

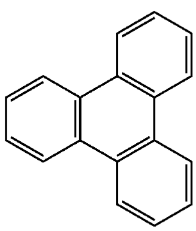

Formula (AN-58)

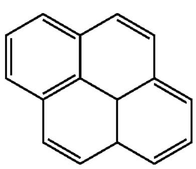

Formula (AN-59)

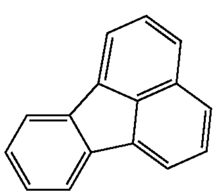

Formula (AN-60)

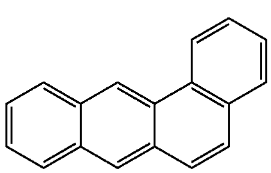

-continued

Formula (AN-61)

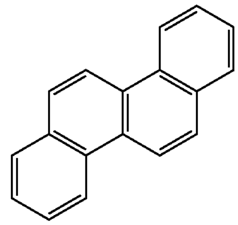

Formula (AN-62)

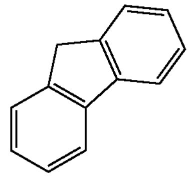

Formula (AN-63)

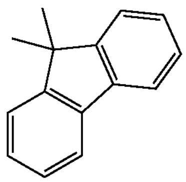

Formula (AN-64)

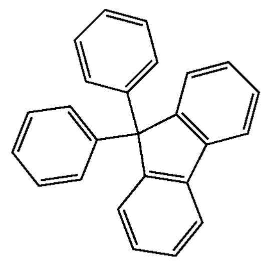

Formula (AN-65)

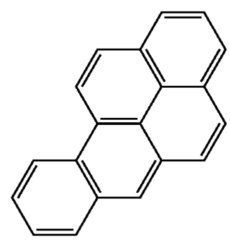

Formula (AN-66)

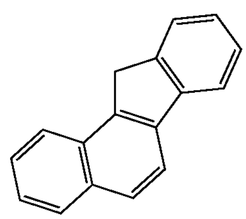

It will be appreciated that any of the aryl or heteroaryl group according to Formulae (AN-1) to (AN-66), when representing $L^1$, $Ar^1$, and/or $R^x$, would be bonded to another part of the molecule at any carbon or heteroatom site available for formation of such bond(s). For example, in formulae containing a NH group, the hydrogen may be replaced with a "bond" to another part of the molecule such that, for example, a N—C bond is formed between the nitrogen of the heteroaryl group and a carbon of another part of the molecule.

In some embodiments, cycloalkyl may be represented by cyclopropyl, cyclobutyl, cyclopentyl, and/or cyclohexyl.

In some non-limiting examples, $Ar^1$ and/or $R^x$ may include an aryl and/or a heteroaryl group represented by above Formulae (AR-1) to (AR-31) and (AN-1) to (AN-66).

In some non-limiting examples, substituted or unsubstituted arylene and/or substituted or unsubstituted heteroarylene according to various embodiments described herein may be represented by suitable substitutions of groups represented by any of Formulae (AR-1) to (AR-31) and (AN-1) to (AN-66). In some non-limiting examples, $L_1$ may include such arylene and/or heteroarylene groups.

In some embodiments, $L^1$ is independently selected from the following:

Formula (LR-1)

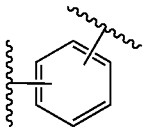

Formula (LR-2)

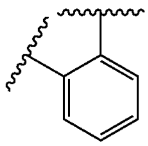

Formula (LR-3)

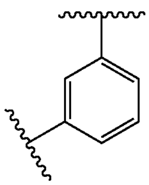

Formula (LR-4)

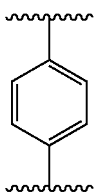

Formula (LR-5)

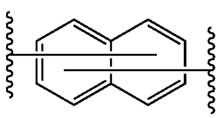

Formula (LR-6)

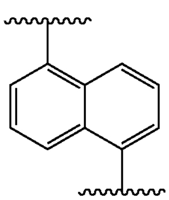

Formula (LR-7)

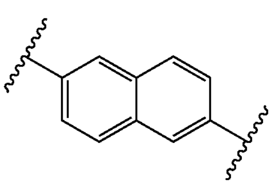

-continued

Formula (LR-8)

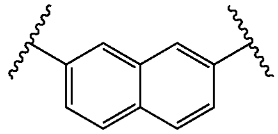

Formula (LR-9)

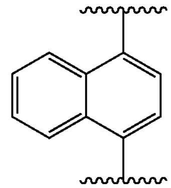

Formula (LR-10)

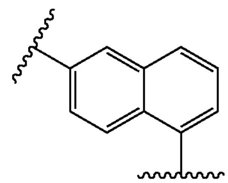

Formula (LR-11)

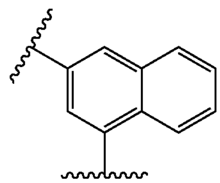

Formula (LR-12)

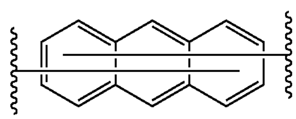

Formula (LR-13)

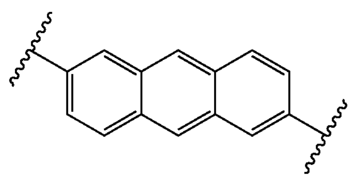

Formula (LR-14)

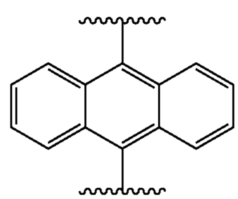

Formula (LR-15)

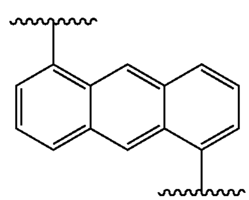

Formula (LR-16)

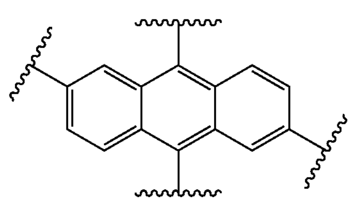

Formula (LR-17)
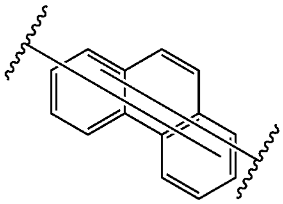
Formula (LR-18)
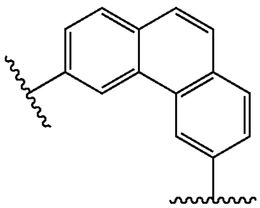
Formula (LR-19)
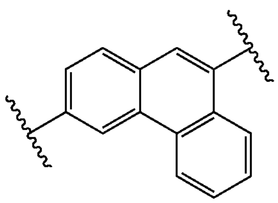
Formula (LR-20)
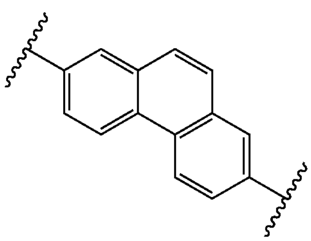
Formula (LR-21)
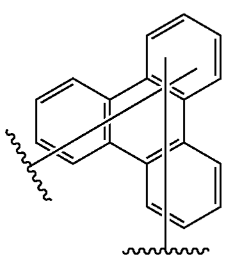
Formula (LR-22)
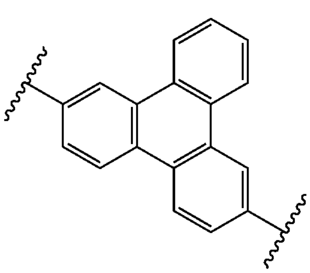
Formula (LR-23)
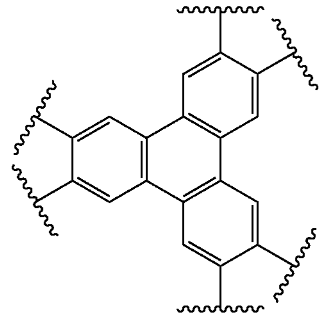
Formula (LR-24)
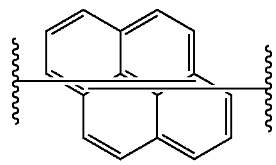
Formula (LR-25)
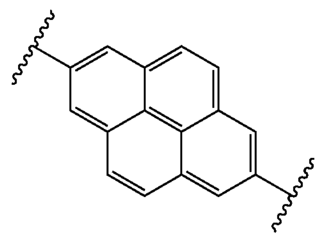
Formula (LR-26)
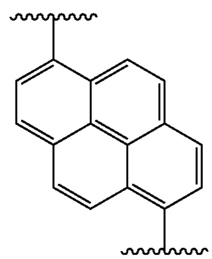
Formula (LR-27)
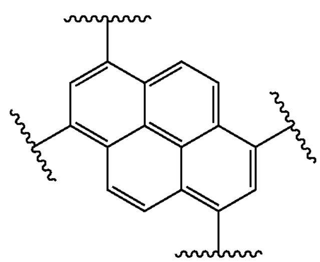
Formula (LR-28)
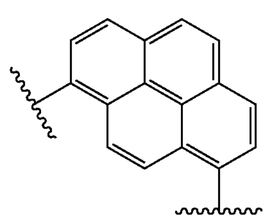

-continued
Formula (LR-29)
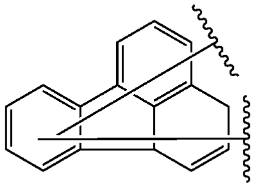
Formula (LR-30)
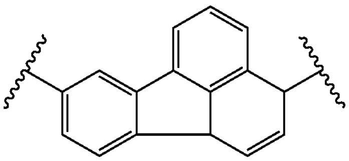
Formula (LR-31)
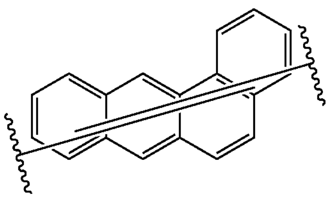
Formula (LR-32)
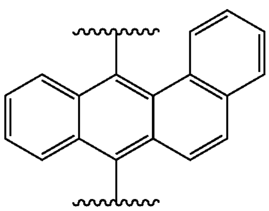
Formula (LR-33)
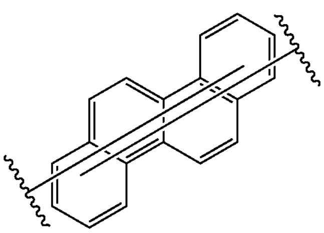
Formula (LR-34)
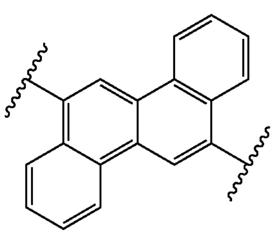
Formula (LR-35)
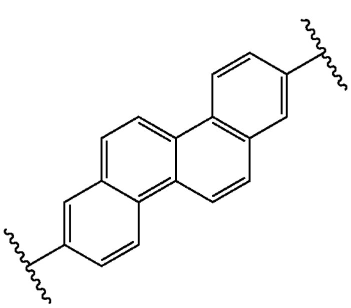
-continued
Formula (LR-36)
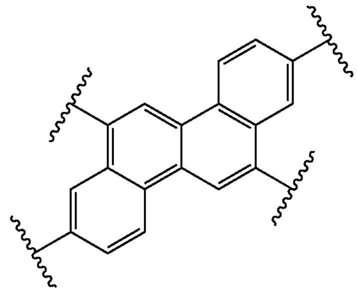
Formula (LR-37)
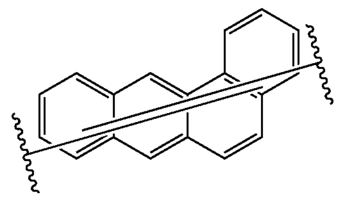
Formula (LR-38)
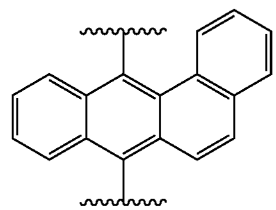
Formula (LR-39)
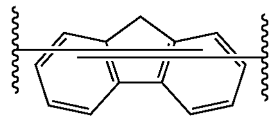
Formula (LR-40)
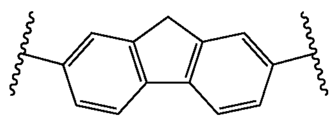
Formula (LR-41)
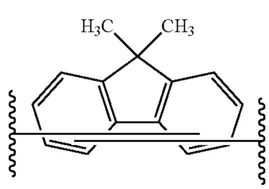
Formula (LR-42)
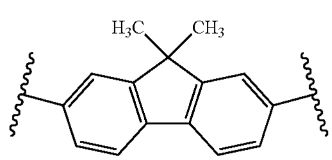
Formula (LR-43)
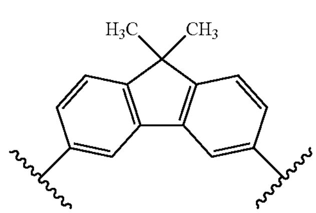

-continued
Formula (LR-44)
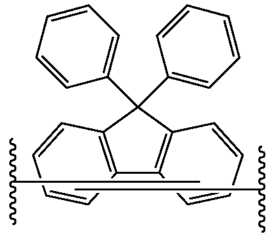
Formula (LR-45)
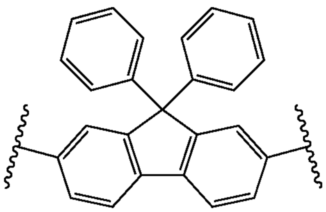
Formula (LR-46)
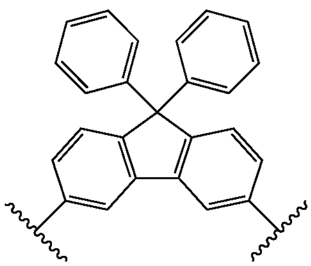
Formula (LR-47)
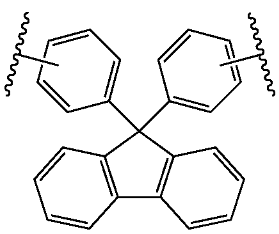
Formula (LR-48)
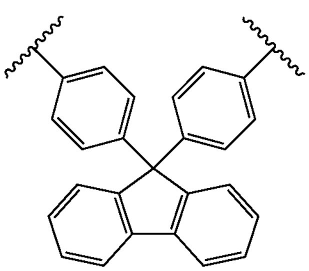
Formula (LR-49)
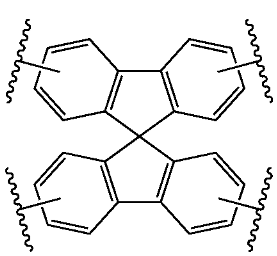
-continued
Formula (LR-50)
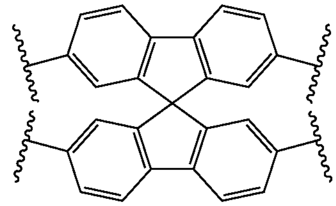
Formula (LR-51)
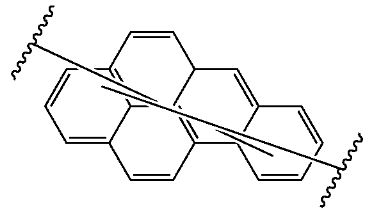
Formula (LR-51)
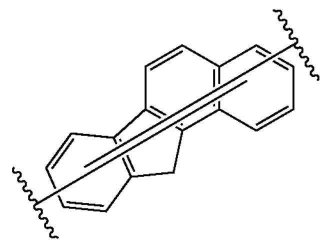
Formula (LR-52)
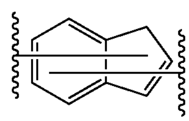
Formula (LR-53)
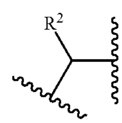
Formula (LR-54)
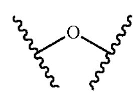
Formula (LR-55)
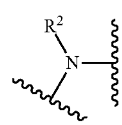
Formula (LR-56)
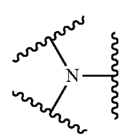
Formula (LR-57)
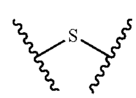
Formula (LR-58)
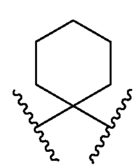

Formula (LR-59)

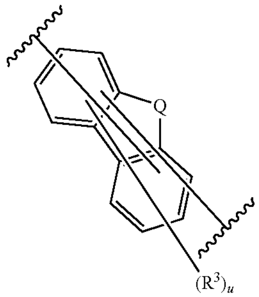

Formula (LR-60)

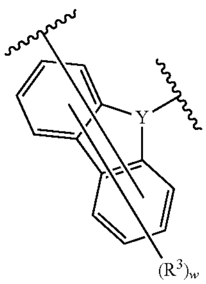

Formula (LR-61)

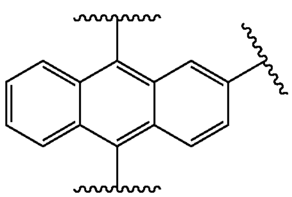

Formula (LR-62)

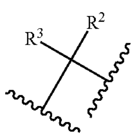

In Formula (LR-53), (LR-55), (LR-59), (LR-60) and (LR-62), $R^2$ and $R^3$ each independently represents H, D (deutero), F, Cl, alkyl including C1-C6 alkyl, cycloaklyl including C3-C6 cycloalkyl, alkoxy including C1-C6 alkoxy, fluoroalkyl, haloaryl, heteroaryl, haloalkoxy, fluoroaryl, fluoroalkoxy, fluoroalkylsulfanyl, fluoromethyl, difluoromethyl, trifluoromethyl, difluoromethoxy, trifluoromethoxy, fluoroethyl, polyfluoroethyl, 4-fluorophenyl, 3,4,5-trifluorophenyl, polyfluoroaryl, 4-(trifluoromethoxy)phenyl, $SF_4Cl$, $SF_5$, $(CF_2)_aSF_5$, $(O(CF_2)_b)_dCF_3$, $(CF_2)_e(O(CF_2)_b)_d)CF_3$, or trifluoromethylsulfanyl.

In Formula (LR-59) and (LR-60), u represents an integer of 0 to 7, Q represents $CR^4R^5$, $NR^4$, S, O, or $SiR^4R^5$, and Y represents $CR^4$, N, or $SiR^4$. In some embodiments, w represents an integer of 0 to 6.

In some embodiments, $Ar^1$ is selected from the following:

Formula (AX-1)

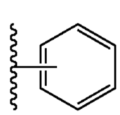

Formula (AX-2)

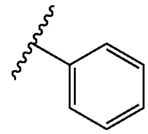

Formula (AX-3)

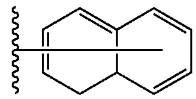

Formula (AX-4)

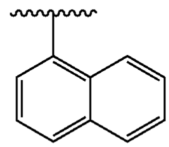

Formula (AX-5)

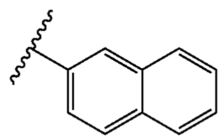

Formula (AX-6)

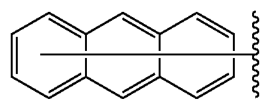

Formula (AX-7)

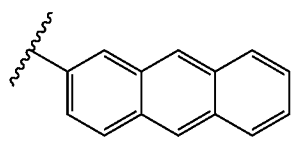

Formula (AX-8)

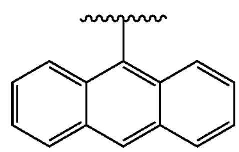

Formula (AX-9)

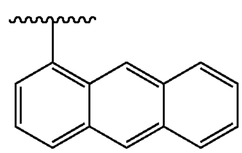

Formula (AX-10)

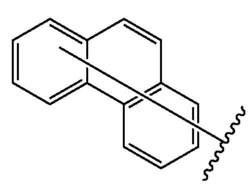

Formula (AX-11)

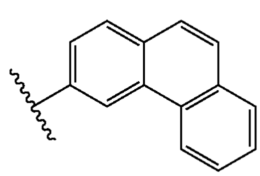

Formula (AX-12)
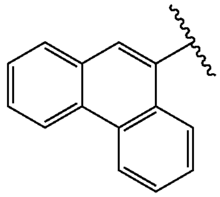
Formula (AX-13)
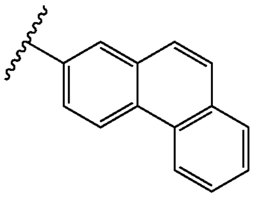
Formula (AX-14)
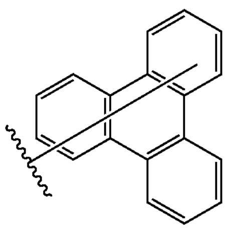
Formula (AX-15)
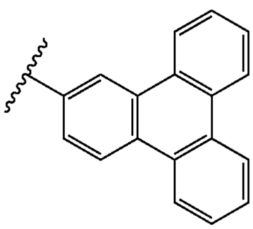
Formula (AX-16)
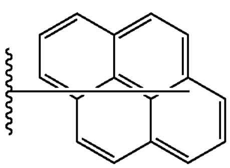
Formula (AX-17)
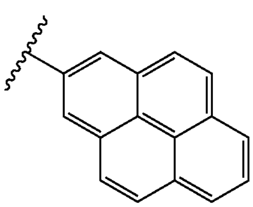
Formula (AX-18)
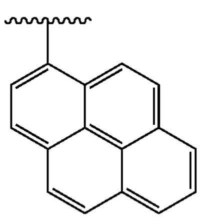
Formula (AX-19)
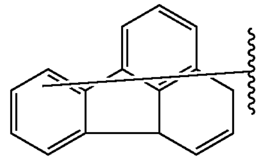
Formula (AX-20)
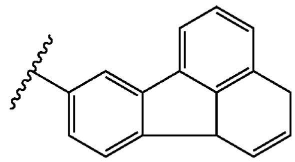
Formula (AX-21)
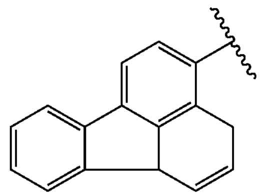
Formula (AX-22)
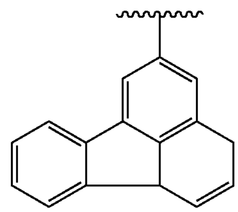
Formula (AX-23)
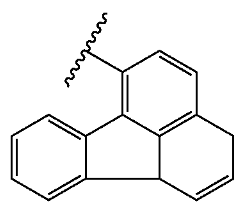
Formula (AX-24)
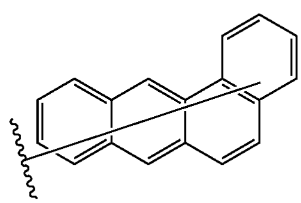
Formula (AX-25)
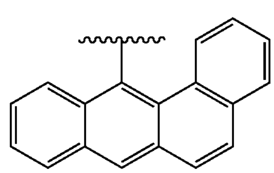
Formula (AX-26)
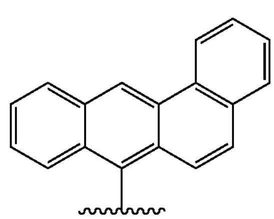

-continued
Formula (AX-27)
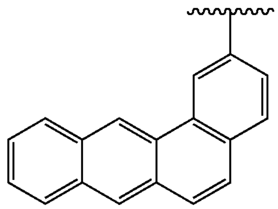
Formula (AX-28)
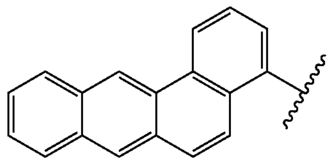
Formula (AX-29)
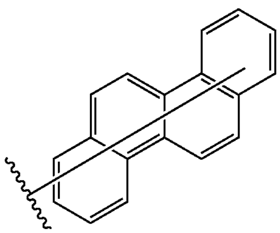
Formula (AX-30)
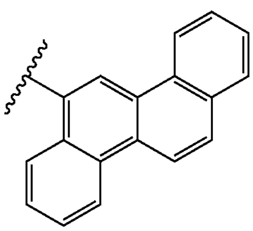
Formula (AX-31)
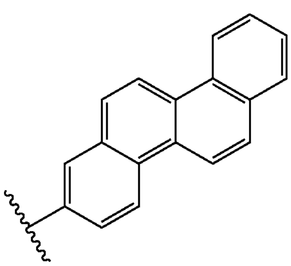
Formula (AX-32)
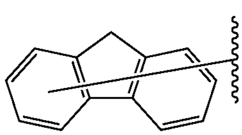
Formula (AX-33)
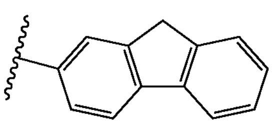
Formula (AX-34)
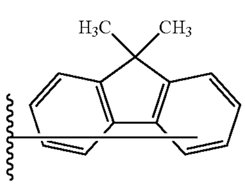
-continued
Formula (AX-35)
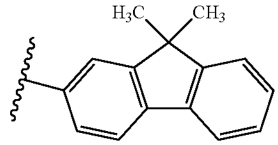
Formula (AX-36)
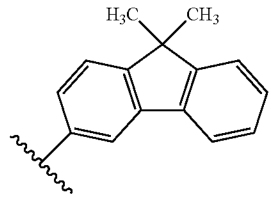
Formula (AX-37)
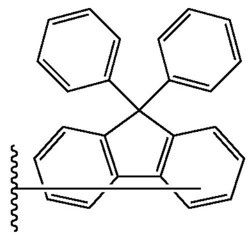
Formula (AX-38)
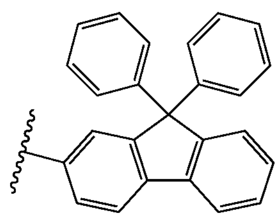
Formula (AX-39)
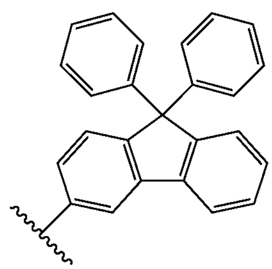
Formula (AX-40)
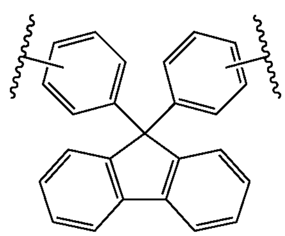
Formula (AX-41)
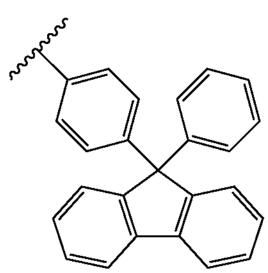

-continued
Formula (AX-42)
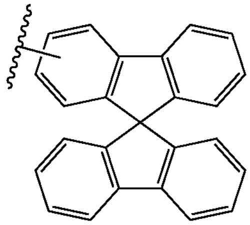
Formula (AX-43)
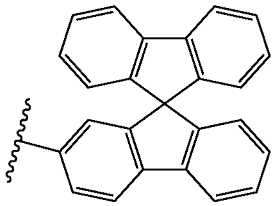
Formula (AX-44)
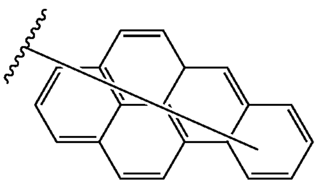
Formula (AX-45)
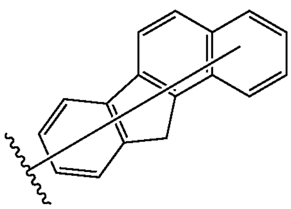
Formula (AX-46)
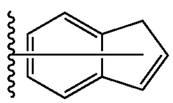
Formula (AX-47)
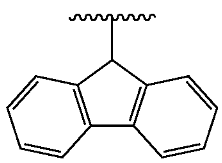
In some embodiments, $R^x$ is independently selected from the following:
Formula (RB-1)
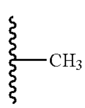
Formula (RB-2)
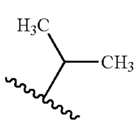
Formula (RB-3)
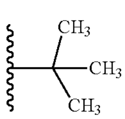
-continued
Formula (RB-4)
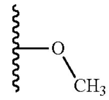
Formula (RB-5)
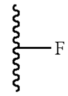
Formula (RB-6)
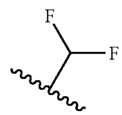
Formula (RB-7)
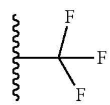
Formula (RB-8)
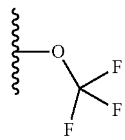
Formula (RB-9)
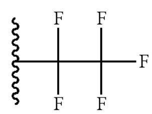
Formula (RB-10)
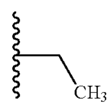
Formula (RB-11)
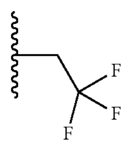
Formula (RB-12)
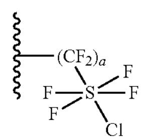
Formula (RB-13)
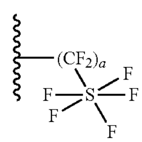
Formula (RB-14)
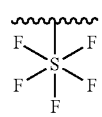
Formula (RB-15)
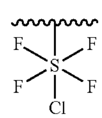
Formula (RB-16)
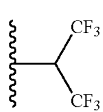

-continued

Formula (RB-17)

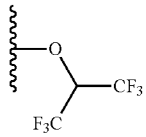

Formula (RB-18)

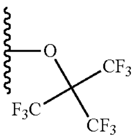

Formula (RB-19)

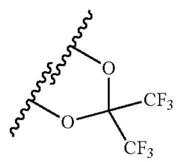

Formula (RB-20)

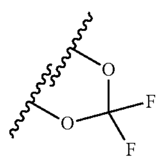

Formula (RB-21)

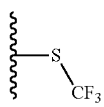

Formula (RB-22)

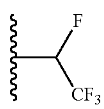

Formula (RB-23)

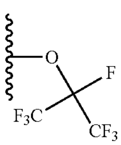

Formula (RB-24)

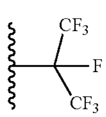

It will be appreciated that, in each of the $L^1$, $Ar^1$, and $R^x$ groups illustrated above, additional substituents and/or additional bonds to such groups may be provided in some examples.

It will be appreciated that, in some embodiments wherein the molecule includes two or more of the same groups as represented in any of the formulae provided herein, such as for example, a molecule represented by a formula including two or more $L^1$ groups, two or more $Ar^1$ groups, and/or two or more $R^x$ groups, each such group may be individually selected in each instance unless otherwise specified herein.

In some embodiments, a $(L^1)_p$-$(Ar^1)_q$ group is represented by Formula (D-2). In some further embodiments, the bonding position of the $(L^1)_p$-$(Ar^1)_q$ group to the substituted phenyl, $L^1$ and $Ar^1$ are selected from the following:

| Example Number | Bonding Position | $L^1$ | $Ar^1$ |
|---|---|---|---|
| D-2-1 | 1 | (LR-14) | (AX-12) |
| D-2-2 | 1 | (LR-14) | (AX-2) |
| D-2-3 | 1 | (LR-14) | (AX-4) |
| D-2-4 | 1 | (LR-14) | (AX-47) |
| D-2-5 | 1 | (LR-14) | (AX-5) |
| D-2-6 | 1 | (LR-14) | (AX-8) |
| D-2-7 | 1 | (LR-25) | (AX-12) |
| D-2-8 | 1 | (LR-25) | (AX-2) |
| D-2-9 | 1 | (LR-25) | (AX-4) |
| D-2-10 | 1 | (LR-25) | (AX-47) |
| D-2-11 | 1 | (LR-25) | (AX-5) |
| D-2-12 | 1 | (LR-25) | (AX-8) |
| D-2-13 | 1 | (LR-26) | (AX-12) |
| D-2-14 | 1 | (LR-26) | (AX-2) |
| D-2-15 | 1 | (LR-26) | (AX-4) |
| D-2-16 | 1 | (LR-26) | (AX-47) |
| D-2-17 | 1 | (LR-26) | (AX-5) |
| D-2-18 | 1 | (LR-26) | (AX-8) |
| D-2-19 | 1 | (LR-34) | (AX-2) |
| D-2-20 | 1 | (LR-34) | (AX-4) |
| D-2-21 | 1 | (LR-34) | (AX-47) |
| D-2-22 | 1 | (LR-34) | (AX-47) |
| D-2-23 | 1 | (LR-34) | (AX-5) |
| D-2-24 | 1 | (LR-34) | (AX-8) |
| D-2-25 | 6 | (LR-14) | (AX-12) |
| D-2-26 | 6 | (LR-14) | (AX-2) |
| D-2-27 | 6 | (LR-14) | (AX-4) |
| D-2-28 | 6 | (LR-14) | (AX-47) |
| D-2-29 | 6 | (LR-14) | (AX-5) |
| D-2-30 | 6 | (LR-14) | (AX-8) |
| D-2-31 | 6 | (LR-25) | (AX-12) |
| D-2-32 | 6 | (LR-25) | (AX-2) |
| D-2-33 | 6 | (LR-25) | (AX-4) |
| D-2-34 | 6 | (LR-25) | (AX-47) |
| D-2-35 | 6 | (LR-25) | (AX-5) |
| D-2-36 | 6 | (LR-25) | (AX-8) |
| D-2-37 | 6 | (LR-26) | (AX-12) |
| D-2-38 | 6 | (LR-26) | (AX-2) |
| D-2-39 | 6 | (LR-26) | (AX-4) |
| D-2-40 | 6 | (LR-26) | (AX-47) |
| D-2-41 | 6 | (LR-26) | (AX-5) |
| D-2-42 | 6 | (LR-26) | (AX-8) |
| D-2-43 | 6 | (LR-34) | (AX-12) |
| D-2-44 | 6 | (LR-34) | (AX-2) |
| D-2-45 | 6 | (LR-34) | (AX-4) |
| D-2-46 | 6 | (LR-34) | (AX-47) |
| D-2-47 | 6 | (LR-34) | (AX-5) |
| D-2-48 | 6 | (LR-34) | (AX-8) |

In some embodiments, a $(L^1)_p$-$(Ar^1)_q$ group is represented by Formula (D-3). In some further embodiments, the bonding position of the $(L^1)_p$-$(Ar^1)_q$ group to the substituted phenyl, $L^1$ and $Ar^1$ are selected from the following:

| Example Number | Bonding Position | $L^1_1$ | $L^1_2$ | $Ar^1$ |
|---|---|---|---|---|
| D-3-1 | 1 | (LR-14) | (LR-3) | (AX-2) |
| D-3-2 | 1 | (LR-14) | (LR-3) | (AX-4) |
| D-3-3 | 1 | (LR-14) | (LR-4) | (AX-2) |
| D-3-4 | 1 | (LR-14) | (LR-54) | (AX-2) |
| D-3-5 | 1 | (LR-25) | (LR-3) | (AX-2) |
| D-3-6 | 1 | (LR-25) | (LR-3) | (AX-4) |
| D-3-7 | 1 | (LR-25) | (LR-4) | (AX-2) |
| D-3-8 | 1 | (LR-25) | (LR-54) | (AX-2) |
| D-3-9 | 1 | (LR-26) | (LR-3) | (AX-12) |
| D-3-10 | 1 | (LR-26) | (LR-3) | (AX-2) |
| D-3-11 | 1 | (LR-26) | (LR-4) | (AX-2) |
| D-3-12 | 1 | (LR-26) | (LR-54) | (AX-2) |
| D-3-13 | 1 | (LR-3) | (LR-14) | (AX-12) |
| D-3-14 | 1 | (LR-3) | (LR-14) | (AX-4) |
| D-3-15 | 1 | (LR-3) | (LR-14) | (AX-47) |
| D-3-16 | 1 | (LR-3) | (LR-14) | (AX-47) |
| D-3-17 | 1 | (LR-3) | (LR-25) | (AX-12) |
| D-3-18 | 1 | (LR-3) | (LR-25) | (AX-2) |

-continued

| Example Number | Bonding Position | $L^1_1$ | $L^1_2$ | $Ar^1$ |
|---|---|---|---|---|
| D-3-19 | 1 | (LR-3) | (LR-25) | (AX-4) |
| D-3-20 | 1 | (LR-3) | (LR-25) | (AX-47) |
| D-3-21 | 1 | (LR-3) | (LR-25) | (AX-5) |
| D-3-22 | 1 | (LR-3) | (LR-25) | (AX-8) |
| D-3-23 | 1 | (LR-3) | (LR-26) | (AX-12) |
| D-3-24 | 1 | (LR-3) | (LR-26) | (AX-2) |
| D-3-25 | 1 | (LR-3) | (LR-26) | (AX-4) |
| D-3-26 | 1 | (LR-3) | (LR-26) | (AX-47) |
| D-3-27 | 1 | (LR-3) | (LR-26) | (AX-5) |
| D-3-28 | 1 | (LR-3) | (LR-26) | (AX-8) |
| D-3-29 | 1 | (LR-3) | (LR-34) | (AX-12) |
| D-3-30 | 1 | (LR-3) | (LR-34) | (AX-2) |
| D-3-31 | 1 | (LR-3) | (LR-34) | (AX-4) |
| D-3-32 | 1 | (LR-3) | (LR-34) | (AX-47) |
| D-3-33 | 1 | (LR-3) | (LR-34) | (AX-5) |
| D-3-34 | 1 | (LR-3) | (LR-34) | (AX-8) |
| D-3-35 | 1 | (LR-34) | (LR-3) | (AX-2) |
| D-3-36 | 1 | (LR-34) | (LR-3) | (AX-4) |
| D-3-37 | 1 | (LR-34) | (LR-4) | (AX-2) |
| D-3-38 | 1 | (LR-34) | (LR-54) | (AX-2) |
| D-3-39 | 1 | (LR-4) | (LR-14) | (AX-12) |
| D-3-40 | 1 | (LR-4) | (LR-14) | (AX-2) |
| D-3-41 | 1 | (LR-4) | (LR-14) | (AX-2) |
| D-3-42 | 1 | (LR-4) | (LR-14) | (AX-4) |
| D-3-43 | 1 | (LR-4) | (LR-14) | (AX-47) |
| D-3-44 | 1 | (LR-4) | (LR-14) | (AX-5) |
| D-3-45 | 1 | (LR-4) | (LR-14) | (AX-5) |
| D-3-46 | 1 | (LR-4) | (LR-14) | (AX-8) |
| D-3-47 | 1 | (LR-4) | (LR-14) | (AX-8) |
| D-3-48 | 1 | (LR-4) | (LR-25) | (AX-12) |
| D-3-49 | 1 | (LR-4) | (LR-25) | (AX-2) |
| D-3-50 | 1 | (LR-4) | (LR-25) | (AX-4) |
| D-3-51 | 1 | (LR-4) | (LR-25) | (AX-47) |
| D-3-52 | 1 | (LR-4) | (LR-25) | (AX-5) |
| D-3-53 | 1 | (LR-4) | (LR-25) | (AX-8) |
| D-3-54 | 1 | (LR-4) | (LR-26) | (AX-12) |
| D-3-55 | 1 | (LR-4) | (LR-26) | (AX-2) |
| D-3-56 | 1 | (LR-4) | (LR-26) | (AX-4) |
| D-3-57 | 1 | (LR-4) | (LR-26) | (AX-47) |
| D-3-58 | 1 | (LR-4) | (LR-26) | (AX-5) |
| D-3-59 | 1 | (LR-4) | (LR-26) | (AX-8) |
| D-3-60 | 1 | (LR-4) | (LR-34) | (AX-12) |
| D-3-61 | 1 | (LR-4) | (LR-34) | (AX-2) |
| D-3-62 | 1 | (LR-4) | (LR-34) | (AX-4) |
| D-3-63 | 1 | (LR-4) | (LR-34) | (AX-47) |
| D-3-64 | 1 | (LR-4) | (LR-34) | (AX-5) |
| D-3-65 | 1 | (LR-4) | (LR-34) | (AX-8) |
| D-3-66 | 6 | (LR-14) | (LR-3) | (AX-2) |
| D-3-67 | 6 | (LR-14) | (LR-3) | (AX-4) |
| D-3-68 | 6 | (LR-14) | (LR-4) | (AX-2) |
| D-3-69 | 6 | (LR-14) | (LR-54) | (AX-2) |
| D-3-70 | 6 | (LR-25) | (LR-3) | (AX-2) |
| D-3-71 | 6 | (LR-25) | (LR-3) | (AX-4) |
| D-3-72 | 6 | (LR-25) | (LR-4) | (AX-2) |
| D-3-73 | 6 | (LR-25) | (LR-54) | (AX-2) |
| D-3-74 | 6 | (LR-26) | (LR-3) | (AX-2) |
| D-3-75 | 6 | (LR-26) | (LR-3) | (AX-4) |
| D-3-76 | 6 | (LR-26) | (LR-4) | (AX-2) |
| D-3-77 | 6 | (LR-26) | (LR-54) | (AX-12) |
| D-3-78 | 6 | (LR-34) | (LR-3) | (AX-2) |
| D-3-79 | 6 | (LR-34) | (LR-3) | (AX-4) |
| D-3-80 | 6 | (LR-34) | (LR-4) | (AX-2) |
| D-3-81 | 6 | (LR-34) | (LR-54) | (AX-2) |
| D-3-82 | 6 | (LR-4) | (LR-14) | (AX-12) |
| D-3-83 | 6 | (LR-4) | (LR-14) | (AX-2) |
| D-3-84 | 6 | (LR-4) | (LR-14) | (AX-4) |
| D-3-85 | 6 | (LR-4) | (LR-14) | (AX-47) |
| D-3-86 | 6 | (LR-4) | (LR-14) | (AX-5) |
| D-3-87 | 6 | (LR-4) | (LR-14) | (AX-8) |
| D-3-88 | 6 | (LR-4) | (LR-25) | (AX-12) |
| D-3-89 | 6 | (LR-4) | (LR-25) | (AX-2) |
| D-3-90 | 6 | (LR-4) | (LR-25) | (AX-4) |
| D-3-91 | 6 | (LR-4) | (LR-25) | (AX-47) |
| D-3-92 | 6 | (LR-4) | (LR-25) | (AX-5) |
| D-3-93 | 6 | (LR-4) | (LR-25) | (AX-8) |
| D-3-94 | 6 | (LR-4) | (LR-26) | (AX-12) |

-continued

| Example Number | Bonding Position | $L^1_1$ | $L^1_2$ | $Ar^1$ |
|---|---|---|---|---|
| D-3-95 | 6 | (LR-4) | (LR-26) | (AX-2) |
| D-3-96 | 6 | (LR-4) | (LR-26) | (AX-4) |
| D-3-97 | 6 | (LR-4) | (LR-26) | (AX-47) |
| D-3-98 | 6 | (LR-4) | (LR-26) | (AX-5) |
| D-3-99 | 6 | (LR-4) | (LR-26) | (AX-8) |
| D-3-100 | 6 | (LR-4) | (LR-34) | (AX-12) |
| D-3-101 | 6 | (LR-4) | (LR-34) | (AX-2) |
| D-3-102 | 6 | (LR-4) | (LR-34) | (AX-4) |
| D-3-103 | 6 | (LR-4) | (LR-34) | (AX-47) |
| D-3-104 | 6 | (LR-4) | (LR-34) | (AX-5) |
| D-3-105 | 6 | (LR-4) | (LR-34) | (AX-8) |

In some embodiments, a $(L^1)_p$-$(Ar^1)_q$ group is represented by Formula (D-4). In some further embodiments, the bonding position of the $(L^1)_p$-$(Ar^1)_q$ group to the substituted phenyl, $L^1$ and $Ar^1$ are selected from the following:

| Example Number | Bonding Position | $L^1_1$ | $L^1_2$ | $L^1_3$ | $Ar^1$ |
|---|---|---|---|---|---|
| D-4-1 | 1 | (LR-3) | (LR-14) | (LR-3) | (AX-4) |
| D-4-2 | 1 | (LR-3) | (LR-14) | (LR-4) | (AX-2) |
| D-4-3 | 1 | (LR-3) | (LR-14) | (LR-54) | (AX-2) |
| D-4-4 | 1 | (LR-3) | (LR-25) | (LR-3) | (AX-2) |
| D-4-5 | 1 | (LR-3) | (LR-25) | (LR-3) | (AX-4) |
| D-4-6 | 1 | (LR-3) | (LR-25) | (LR-4) | (AX-2) |
| D-4-7 | 1 | (LR-3) | (LR-25) | (LR-54) | (AX-2) |
| D-4-8 | 1 | (LR-3) | (LR-26) | (LR-3) | (AX-2) |
| D-4-9 | 1 | (LR-3) | (LR-26) | (LR-3) | (AX-4) |
| D-4-10 | 1 | (LR-3) | (LR-26) | (LR-4) | (AX-2) |
| D-4-11 | 1 | (LR-3) | (LR-26) | (LR-54) | (AX-2) |
| D-4-12 | 1 | (LR-3) | (LR-34) | (LR-3) | (AX-2) |
| D-4-13 | 1 | (LR-3) | (LR-34) | (LR-3) | (AX-4) |
| D-4-14 | 1 | (LR-3) | (LR-34) | (LR-4) | (AX-2) |
| D-4-15 | 1 | (LR-3) | (LR-34) | (LR-54) | (AX-2) |
| D-4-16 | 1 | (LR-4) | (LR-14) | (LR-3) | (AX-2) |
| D-4-17 | 1 | (LR-4) | (LR-14) | (LR-3) | (AX-4) |
| D-4-18 | 1 | (LR-4) | (LR-14) | (LR-4) | (AX-2) |
| D-4-19 | 1 | (LR-4) | (LR-14) | (LR-54) | (AX-2) |
| D-4-20 | 1 | (LR-4) | (LR-25) | (LR-3) | (AX-2) |
| D-4-21 | 1 | (LR-4) | (LR-25) | (LR-3) | (AX-4) |
| D-4-22 | 1 | (LR-4) | (LR-25) | (LR-4) | (AX-2) |
| D-4-23 | 1 | (LR-4) | (LR-25) | (LR-54) | (AX-2) |
| D-4-24 | 1 | (LR-4) | (LR-26) | (LR-3) | (AX-2) |
| D-4-25 | 1 | (LR-4) | (LR-26) | (LR-3) | (AX-4) |
| D-4-26 | 1 | (LR-4) | (LR-26) | (LR-4) | (AX-2) |
| D-4-27 | 1 | (LR-4) | (LR-26) | (LR-54) | (AX-2) |
| D-4-28 | 1 | (LR-4) | (LR-34) | (LR-3) | (AX-2) |
| D-4-29 | 1 | (LR-4) | (LR-34) | (LR-3) | (AX-4) |
| D-4-30 | 1 | (LR-4) | (LR-34) | (LR-4) | (AX-2) |
| D-4-31 | 1 | (LR-4) | (LR-34) | (LR-54) | (AX-2) |
| D-4-32 | 6 | (LR-4) | (LR-14) | (LR-3) | (AX-2) |
| D-4-33 | 6 | (LR-4) | (LR-14) | (LR-3) | (AX-4) |
| D-4-34 | 6 | (LR-4) | (LR-14) | (LR-4) | (AX-2) |
| D-4-35 | 6 | (LR-4) | (LR-14) | (LR-54) | (AX-2) |
| D-4-36 | 6 | (LR-4) | (LR-25) | (LR-3) | (AX-2) |
| D-4-37 | 6 | (LR-4) | (LR-25) | (LR-3) | (AX-4) |
| D-4-38 | 6 | (LR-4) | (LR-25) | (LR-4) | (AX-2) |
| D-4-39 | 6 | (LR-4) | (LR-25) | (LR-54) | (AX-2) |
| D-4-40 | 6 | (LR-4) | (LR-26) | (LR-3) | (AX-2) |
| D-4-41 | 6 | (LR-4) | (LR-26) | (LR-3) | (AX-4) |
| D-4-42 | 6 | (LR-4) | (LR-26) | (LR-4) | (AX-2) |
| D-4-43 | 6 | (LR-4) | (LR-26) | (LR-54) | (AX-2) |
| D-4-44 | 6 | (LR-4) | (LR-34) | (LR-3) | (AX-2) |
| D-4-45 | 6 | (LR-4) | (LR-34) | (LR-3) | (AX-4) |
| D-4-46 | 6 | (LR-4) | (LR-34) | (LR-4) | (AX-2) |
| D-4-47 | 6 | (LR-4) | (LR-34) | (LR-54) | (AX-2) |

In some non-limiting examples, the NIC contains a compound having the structure derived by bonding any of the $(L^1)_p$-$(Ar^1)_q$ group listed above to the substituted phenyl according to any of Formulae (I), (II), (III), (IV), (V), (VI), (VII), (VIII), (IX), (X), (XI), (XII), (XIII), (XIV), (XV), (XVI), (XVII), (XVIII), (XIX) and/or (XX). In some further non-limiting examples, $R^1$ is independently selected from: H, D, F, trifluoromethyl, and trifluoromethoxy. In some further non-limiting examples, any $R^1$ present is selected from H and D. In some embodiments, r is 2. In some other embodiments, r is 1.

In some embodiments, the molecular weight of the compound is less than or equal to about 2200 g/mol. For example, the molecular weight of the compound may be less than about 2000 g/mol, less than about 1900 g/mol, less than about 1800 g/mol, less than about 1750 g/mol, less than about 1600 g/mol, less than about 1500 g/mol, less than about 1400 g/mol, less than about 1300 g/mol, less than about 1200 g/mol, less than about 1100 g/mol, less than about 1000 g/mol, less than about 900 g/mol, or less than about 800 g/mol.

In some embodiments, the molecular weight of the compound is greater than or equal to about 200 g/mol. For example, the molecular weight of the compound may be greater than or equal to about 250 g/mol, greater than or equal to about 300 g/mol, greater than or equal to about 330 g/mol, greater than or equal to about 350 g/mol, greater than or equal to about 400 g/mol, greater than or equal to about 450 g/mol, or greater than or equal to about 500 g/mol.

In some embodiments, the molecular weight of the compound is from about 200 g/mol to about 2200 g/mol. For example, the molecular weight of the compound may be from about 250 g/mol to about 2000 g/mol, from about 250 g/mol to about 1750 g/mol, from about 250 g/mol to about 1600 g/mol, from about 250 g/mol to about 1500 g/mol, from about 300 g/mol to about 1500 g/mol, from about 250 g/mol to about 1300 g/mol, from about 330 g/mol to about 1200 g/mol, from about 350 g/mol to about 1100 g/mol, or from about 350 g/mol to about 1000 g/mol.

In some embodiments, the molecular weight of the compound is from about 400 g/mol to about 1200 g/mol. For example, the molecular weight of the compound may be from about 400 g/mol to about 1000 g/mol, from about 400 g/mol to about 950 g/mol, from about 400 g/mol to about 900 g/mol, from about 400 g/mol to about 850 g/mol, from about 400 g/mol to about 800 g/mol, from about 400 g/mol to about 750 g/mol, from about 400 g/mol to about 700 g/mol, from about 450 g/mol to about 1200 g/mol, from about 450 g/mol to 1000 g/mol, from about 450 g/mol to about 900 g/mol, from about 450 g/mol to 800 g/mol, from about 450 g/mol to 750 g/mol, from about 450 g/mol to 700 g/mol, from about 500 g/mol to 1200 g/mol from about 500 g/mol to 1000 g/mol, from about 600 g/mol to 1200 g/mol, from about 600 g/mol to 1000 g/mol, from about 700 g/mol to 1200 g/mol, from about 700 g/mol to 1000 g/mol or from about 700 g/mol to 900 g/mol.

For example, the ratio of the number of fluorine atoms to the number of carbon atoms in a given molecular structure of a compound may be referred to as "fluorine:carbon" ratio or as "F:C". In some embodiments, NIC contains a compound having an F:C of between about 1:50 and about 1:2. In some embodiments, the F:C is between about 1:45 and about 1:3, between about 1:40 and about 1:4, between about 1:35 and about 1:5, between about 1:30 and about 1:5, between about 1:25 and about 1:5, between about 1:20 and about 1:5, between about 1:15 and about 1:5, between about 1:10 and about 1:5, between about 1:20 and about 1:3, between about 1:11 and about 1:2, between about 1:9 and about 1:4, or between 1:8 and about 1:5. In some embodiments, F:C is between 1:7 and about 1:6.

In some embodiments wherein the NIC contains a compound according to Formula (VI) and/or (XV), the ratio of the number of sulphur atoms to the number of fluorine atoms in a given molecule may be represented as "sulphur to fluorine ratio" or as "S:F". In some embodiments, S:F is between about 1:35 and about 1:2. In some embodiments, S:F is between about 1:33 and about 1:4. In some embodiments, S:F is between about 1:31 and about 1:5. In some embodiments, S:F is between about 1:29 and about 1:6. In some embodiments, S:F is between about 1:23 and about 1:7. In some embodiments, S:F is between 1:19 and about 1:8. In some embodiments, S:F is between 1:15 and about 1:9. In some embodiments, S:F is between 1:13 and about 1:11. In some further embodiments, the oxidation state of sulphur is 6+. In some embodiments, the ratio of the number of sulphur atoms in the oxidation state of 6+ to the number of fluorine atoms in a given molecule is between about 1:35 and about 1:2, between about 1:33 and about 1:4, between about 1:29 and about 1:5, between about 1:27 and about 1:6, between about 1:23 and about 1:7, between about 1:19 and about 1:8. between about 1:15 and about 1:9, or between about 1:13 and about 1:10.

For example, the ratio of the number of sulphur atoms to the number of carbon atoms in a given molecule may be represented as "sulphur to carbon ratio" or as "S:C". In some embodiments, S:C is between about 1:51 and about 1:11. In some embodiments, S:C is between about 1:49 and about 1:13. In some embodiments, S:C is between about 1:47 and about 1:15. In some embodiments, S:C is between about 1:45 and about 1:18. In some embodiments, S:C is between about 1:43 and about 1:23. In some embodiments, S:C is between about 1:41 and about 1:26. In some embodiments, S:C is between about 1:39 and about 1:29. In some embodiments, S:C is between about 1:37 and about 1:31. In some embodiments, S:C is between about 1:36 and about 1:33.

For example, the ratio of the number of sulphur atoms to the number of fluorine atoms to the number of carbon atoms in a given molecule may be represented as "sulphur to fluorine to carbon ratio" or as "S:F:C". In some embodiments, S:F:C is between about 1:35:51 and about 1:4:11. In some embodiments, S:F:C is between about 1:33:49 and about 1:5:12. In some embodiments, S:F:C is between about 1:31:47 and about 1:6:13. In some embodiments, S:F:C is between about 1:29:45 and about 1:7:15. In some embodiments, S:F:C is between about 1:27:43 and about 1:9:17. In some embodiments, S:F:C is between about 1:25:41 and about 1:11:19. In some embodiments, S:F:C is between about 1:23:39 and about 1:13:21. In some embodiments, S:F:C is between about 1:21:37 and about 1:15:23. In some embodiments, S:F:C is between about 1:19:35 and about 1:17:25. In some embodiments, S:F:C is between about 1:17:33 and about 1:18:23.

Various compounds described herein may be synthesised by carrying out various chemical reactions known in the art. One example of such reaction is Suzuki coupling reaction. It is a type of cross-coupling reaction where an aromatic halogen compound reacts with a boronic acid derivative using a palladium catalyst and a base. The boronic acid derivative may be used singly or in combination of two or more.

Suzuki coupling reaction is illustrated by the following Reaction Scheme 1.

Reaction Scheme 1

$$A—X' \xrightarrow{X''—T} A—B$$

In the above illustrated scheme, the aromatic halogen compound (A-X') reacts with boronic acid derivative (X"-T) to form A-B. A and B represent the organic compounds, X' represents a halogen, preferably bromo and X" is a $B(OH)_2$.

In few of the embodiments, A is represented by fluorinated derivative of phenyl of the above compounds represented by Formula (I) and B is represented by $L^1$-$Ar^1$ derivative of the Formula (I).

Other examples of reaction schemes which may be used in synthesis of various compounds are described, for example, in Savoie, Paul R., and John T. Welch. "Preparation and utility of organic pentafluorosulfanyl-containing compounds." Chemical reviews 115.2 (2015): 1130-1190.

In some non-limiting examples, the NIC 810 may act as an optical coating. In some non-limiting examples, the NIC 810 may modify at least property and/or characteristic of the light emitted from at least one emissive region 1910 of the device 100. In some non-limiting examples, the NIC 810 may exhibit a degree of haze, causing emitted light to be scattered. In some non-limiting examples, the NIC 810 may comprise a crystalline material for causing light transmitted therethrough to be scattered. Such scattering of light may facilitate enhancement of the outcoupling of light from the device in some non-limiting examples, In some non-limiting examples, the NIC 810 may initially be deposited as a substantially non-crystalline, including without limitation, substantially amorphous, coating, whereupon, after deposition thereof, the NIC 810 may become crystallized and thereafter serve as an optical coupling.

Where features or aspects of the present disclosure are described in terms of Markush groups, it will be appreciated by those having ordinary skill in the relevant art that the present disclosure is also thereby described in terms of any individual member of sub-group of members of such Markush group.

Aspects of some non-limiting examples will now be illustrated and described with reference to the following examples, which are not intended to limit the scope of the present disclosure in any way.

EXAMPLES

Synthesis of Compound Example 1: 4-(10-(phenanthren-9-yl)anthracen-9-yl)phenyl)pentafluoro Sulfane The following reagents were mixed in a 500 mL reaction vessel: 9-bromo-10-(phenanthrene-9-yl) anthracene (1.600 g, 3.69 mmol); tetrakis(triphenylphosphine)palladium (0) ($Pd(PPh_3)_4$, 0.0363 g, 0.03 mmol); potassium carbonate ($K_2CO_3$, 0.8679 g, 6.28 mmol); and 3.13 mmol of a boronic acid. In the present example, (4-(pentafluoro-16-sulfanyl) phenyl)boronic acid (0.777 g) was used as the boronic acid. The reaction vessel containing the mixture was placed on a heating plate mantle and stirred using a magnetic stirrer. The reaction vessel was also connected to a water condenser. A well stirred 150 mL solvent mixture containing a 9:1 volumetric ratio of N-ethyl-2-pyrrolidine (NMP) and water was added to the flask. The reaction mixture was then heated to 90° C. and left over-night to react. After cooling the flask to room temperature, The reaction mixture was precipitated in an aqueous solution of NaOH (0.2 M, 3.2 L) and stirred for 40 minutes. The resulting product was isolated by filtration, washed with water, followed by air drying at 75° C. The product was further purified using train sublimation. Yield after purification was 1.72 g (83.7%). The yield of the sublimation step was approximately 1.2 g (58.4%).

Synthesis of Compound Example 2: 4-(9,10-di(naphthalen-2-yl)anthracen-2-yl)phenyl)pentafluorosulfane The following reagents were mixed in a 500 mL reaction vessel: 9-bromo-9,10-dinaphthalen-2-yl) anthracene (1.996 g, 3.92 mmol); tetrakis(triphenylphosphine)palladium (0) ($Pd(PPh_3)_4$, 0.451 g, 0.39 mmol); potassium carbonate ($K_2CO_3$, 1.09 g, 7.89 mmol); and 5.20 mmol of a boronic acid. In the present example, (4-(pentafluoro-16-sulfanyl) phenyl)boronic acid (1.29 g) was used as the boronic acid. The reaction vessel containing the mixture was placed on a heating plate mantle and stirred using a magnetic stirrer. The reaction vessel was also connected to a water condenser. A well stirred 150 mL solvent mixture containing a 9:1 volumetric ratio of N-ethyl-2-pyrrolidine (NMP) and water was added to the flask. The reaction mixture was then heated to 90° C. and left over-night to react. After cooling the flask to room temperature, the reaction mixture was precipitated in an aqueous solution of NaOH (0.2 M, 3.2 L) and stirred for 40 minutes. The resulting product was isolated by filtration, washed with water, followed by air drying at 75° C. The product was further purified using train sublimation. Yield after purification was 1.3585 g (54.8%). The yield of the sublimation step was approximately 1.002 g 40.4%).

As used in the examples herein, a reference to a layer thickness of a material refers to an amount of the material deposited on a target surface (and/or target region(s) and/or portion(s) thereof of the surface in the case of selective deposition), which corresponds to an amount of the material to cover the target surface with a uniformly thick layer of the material having the referenced layer thickness. By way of example, depositing a layer thickness of 10 nm indicates that an amount of the material deposited on the surface corresponds to an amount of the material to form a uniformly thick layer of the material that is 10 nm thick. It will be appreciated that, by way of non-limiting example, due to possible stacking and/or clustering of molecules and/or atoms, an actual thickness of the deposited material may be non-uniform. By way of non-limiting example, depositing a layer thickness of 10 nm may yield some portions of the deposited material having an actual thickness greater than 10 nm, and/or other portions of the deposited material having an actual thickness less than 10 nm. A certain layer thickness of a material deposited on a surface can correspond to an average thickness of the deposited material across the surface.

A series of samples were fabricated by depositing an NIC 910 having a thickness of about 50 nm over a glass substrate. The surface of the NIC 910 was then subjected to open mask deposition of Mg. Each sample was subjected to an Mg vapor flux having an average evaporation rate of about 50 Å/s. In conducting the deposition of the Mg coating, a deposition time of about 100 seconds was used in order to obtain a reference layer thickness of Mg of about 500 nm.

Once the samples were fabricated, optical transmission measurements were taken to determine the relative amount of Mg deposited on the surface of the NIC 910. As will be appreciated, relatively thin Mg coatings having, by way of non-limiting example, thickness of less than a few nm are substantially transparent. However, light transmission decreases as the thickness of the Mg coating is increased. Accordingly, the relative performance of various NIC 910 materials may be assessed by measuring the light transmission through the samples, which directly correlates to the amount and/or thickness of Mg coating deposited thereon from the Mg deposition process. Upon accounting for any loss and/or absorption of light caused by the presence of the glass substrate and the NIC 910, it was found that both the sample prepared using Compound Example 1 as the NIC and another sample prepared using Compound Example 2 as the NIC exhibited relatively high transmission of greater than about 90% across the visible portion of the electromagnetic spectrum. High optical transmission can directly be attributed to a relatively small amount of Mg coating, if any, being present on the surface of the NIC 910 to absorb the light being transmitted through the sample. Accordingly, these NIC 910 materials generally exhibit relatively low affinity and/or initial sticking probability $S_0$ to Mg and thus may be particularly useful for achieving selective deposition and patterning of Mg coating in certain applications.

As used in this and other examples described herein, a reference layer thickness refers to a layer thickness of Mg that is deposited on a reference surface exhibiting a high initial sticking probability $S_0$ (e.g., a surface with an initial sticking probability $S_0$ of about and/or close to 1.0). Specifically, for these examples, the reference surface was a surface of a quartz crystal positioned inside a deposition chamber for monitoring a deposition rate and the reference layer thickness. In other words, the reference layer thickness does not indicate an actual thickness of Mg deposited on a target surface (i.e., a surface of the NIC 910). Rather, the reference layer thickness refers to the layer thickness of Mg that would be deposited on the reference surface upon subjecting the target surface and reference surface to identical Mg vapor flux for the same deposition period (i.e. the surface of the quartz crystal). As would be appreciated, in the event that the target surface and reference surface are not subjected to identical vapor flux simultaneously during deposition, an appropriate tooling factor may be used to determine and monitor the reference thickness.

Terminology

References in the singular form include the plural and vice versa, unless otherwise noted.

As used herein, relational terms, such as "first" and "second", and numbering devices such as "a", "b" and the like, may be used solely to distinguish one entity or element from another entity or element, without necessarily requiring or implying any physical or logical relationship or order between such entities or elements.

The terms "including" and "comprising" are used expansively and in an open-ended fashion, and thus should be interpreted to mean "including, but not limited to". The terms "example" and "exemplary" are used simply to identify instances for illustrative purposes and should not be interpreted as limiting the scope of the invention to the stated instances. In particular, the term "exemplary" should not be interpreted to denote or confer any laudatory, beneficial or other quality to the expression with which it is used, whether in terms of design, performance or otherwise.

The terms "couple" and "communicate" in any form are intended to mean either a direct connection or indirect connection through some interface, device, intermediate component or connection, whether optically, electrically, mechanically, chemically, or otherwise.

The terms "on" or "over" when used in reference to a first component relative to another component, and/or "covering" or which "covers" another component, may encompass situations where the first component is direct on (including without limitation, in physical contact with) the other component, as well as cases where one or more intervening components are positioned between the first component and the other component.

Directional terms such as "upward", "downward", "left" and "right" are used to refer to directions in the drawings to which reference is made unless otherwise stated. Similarly, words such as "inward" and "outward" are used to refer to directions toward and away from, respectively, the geometric center of the device, area or volume or designated parts thereof. Moreover, all dimensions described herein are intended solely to be by way of example of purposes of illustrating certain embodiments and are not intended to limit the scope of the disclosure to any embodiments that may depart from such dimensions as may be specified.

As used herein, the terms "substantially", "substantial", "approximately" and/or "about" are used to denote and account for small variations. When used in conjunction with an event or circumstance, such terms can refer to instances in which the event or circumstance occurs precisely, as well as instances in which the event or circumstance occurs to a close approximation. By way of non-limiting example, when used in conjunction with a numerical value, such terms may refer to a range of variation of less than or equal to ±10% of such numerical value, such as less than or equal to ±5%, less than or equal to ±4%, less than or equal to ±3%, less than or equal to ±2%, less than or equal to ±1%, less than or equal to ±0.5%, less than or equal to ±0.1%, and/or less than equal to ±0.05%.

As used herein, the phrase "consisting substantially of" will be understood to include those elements specifically recited and any additional elements that do not materially affect the basic and novel characteristics of the described technology, while the phrase "consisting of" without the use of any modifier, excludes any element not specifically recited.

As will be understood by those having ordinary skill in the relevant art, for any and all purposes, particularly in terms of providing a written description, all ranges disclosed herein also encompass any and all possible sub-ranges and/or combinations of sub-ranges thereof. Any listed range may be easily recognized as sufficiently describing and/or enabling the same range being broken down at least into equal fractions thereof, including without limitation, halves, thirds, quarters, fifths, tenths etc. As a non-limiting example, each range discussed herein may be readily be broken down into a lower third, middle third and/or upper third, etc.

As will also be understood by those having ordinary skill in the relevant art, all language and/or terminology such as "up to", "at least", "greater than", "less than", and the like, may include and/or refer the recited range(s) and may also refer to ranges that may be subsequently broken down into sub-ranges as discussed herein.

As will be understood by those having ordinary skill in the relevant art, a range includes each individual member of the recited range.

General

The purpose of the Abstract is to enable the relevant patent office or the public generally, and specifically, persons of ordinary skill in the art who are not familiar with patent or legal terms or phraseology, to quickly determine from a cursory inspection, the nature of the technical disclosure. The Abstract is neither intended to define the scope of this disclosure, nor is it intended to be limiting as to the scope of this disclosure in any way.

The structure, manufacture and use of the presently disclosed examples have been discussed above. The specific examples discussed are merely illustrative of specific ways to make and use the concepts disclosed herein, and do not limit the scope of the present disclosure. Rather, the general principles set forth herein are considered to be merely illustrative of the scope of the present disclosure.

It should be appreciated that the present disclosure, which is described by the claims and not by the implementation details provided, and which can be modified by varying, omitting, adding or replacing and/or in the absence of any element(s) and/or limitation(s) with alternatives and/or equivalent functional elements, whether or not specifically disclosed herein, will be apparent to those having ordinary skill in the relevant art, may be made to the examples disclosed herein, and may provide many applicable inventive concepts that may be embodied in a wide variety of specific contexts, without straying from the present disclosure.

In particular, features, techniques, systems, sub-systems and methods described and illustrated in one or more of the above-described examples, whether or not described an illustrated as discrete or separate, may be combined or integrated in another system without departing from the scope of the present disclosure, to create alternative examples comprised of a combination or sub-combination of features that may not be explicitly described above, or certain features may be omitted, or not implemented. Features suitable for such combinations and sub-combinations would be readily apparent to persons skilled in the art upon review of the present application as a whole. Other examples of changes, substitutions, and alterations are easily ascertainable and could be made without departing from the spirit and scope disclosed herein.

All statements herein reciting principles, aspects and examples of the disclosure, as well as specific examples thereof, are intended to encompass both structural and functional equivalents thereof and to cover and embrace all suitable changes in technology. Additionally, it is intended that such equivalents include both currently-known equivalents as well as equivalents developed in the future, i.e., any elements developed that perform the same function, regardless of structure.

Accordingly, the specification and the examples disclosed therein are to be considered illustrative only, with a true scope of the disclosure being disclosed by the following numbered claims:

What is claimed is:

1. An opto-electronic device comprising:

a nucleating inhibiting coating (NIC) disposed on a first layer surface of the device in a first portion of a lateral aspect thereof; and a conductive coating disposed on a second layer surface of the device in a second portion of the lateral aspect thereof;

wherein an initial sticking probability for forming the conductive coating onto a surface of the NIC in the first portion, is substantially less than the initial sticking probability for forming the conductive coating onto the surface in the second portion, such that the surface of the NIC in the first portion is substantially devoid of the conductive coating; and wherein the NIC comprises a compound of Formula (I), (II), (III), (IV), (V), (VI), (VII), (VIII), (IX), (X), (XI), (XII), (XIII), (XIV), (XV), (XVI), (XVII), (XVIII), (XIX) and/or (XX):

Formula (I)

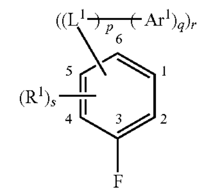

Formula (II)

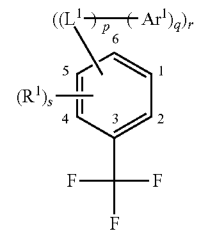

Formula (III)

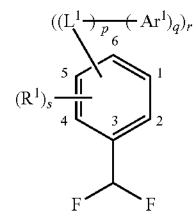

Formula (IV)

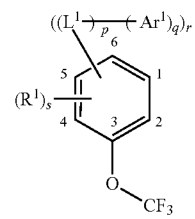

Formula (V)

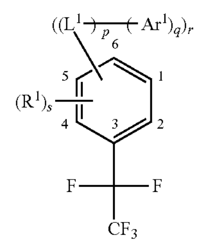

Formula (VI)

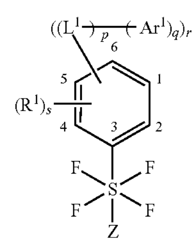

Formula (VII)

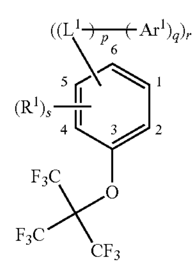

Formula (VIII)
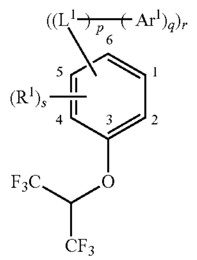
Formula (IX)
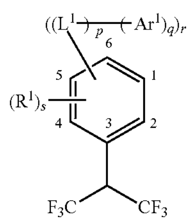
Formula (X)
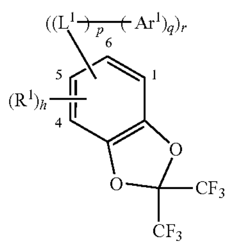
Formula (XI)
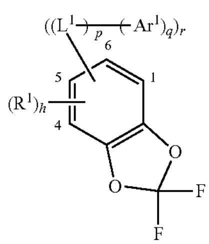
Formula (XII)
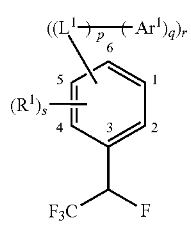
Formula (XIII)
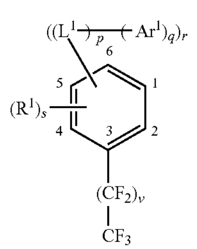
Formula (XIV)
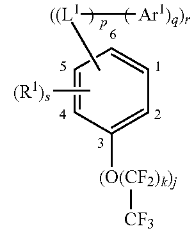
Formula (XV)
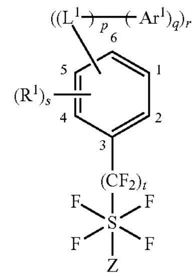
Formula (XVI)
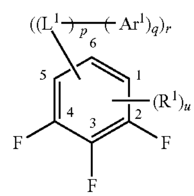
Formula (XVII)
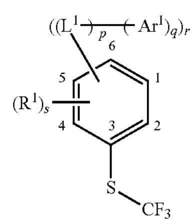
Formula (XVIII)
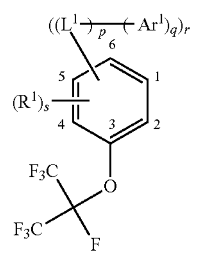
Formula (XIX)
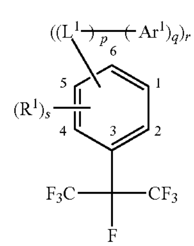

-continued

Formula (XX)

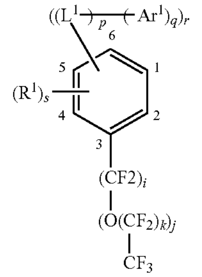

wherein:

$L^1$ independently represents C, $CR^2$, $CR^2R^3$, N, $NR^3$, S, O, substituted or unsubstituted cycloalkylene having 3-6 carbon atoms, substituted or unsubstituted arylene group having 5-60 carbon atoms, or a substituted or unsubstituted heteroarylene group having 4-60 carbon atoms;

$Ar^1$ independently represents a substituted or unsubstituted aryl group having 5 to 60 carbon atoms, a substituted or unsubstituted haloaryl group having 5 to 60 carbon atoms, or a substituted or unsubstituted heteroaryl group having 4 to 60 carbon atoms;

$R^1$, $R^2$, and $R^3$ independently represents H, D (deutero), F, Cl, alkyl including C1-C6 alkyl, cycloaklyl including C3-C6 cycloalkyl, alkoxy including C1-C6 alkoxy, fluoroalkyl, haloaryl, heteroaryl, haloalkoxy, fluoroaryl, fluoroalkoxy, fluoroalkylsulfanyl, fluoromethyl, difluoromethyl, trifluoromethyl, difluoromethoxy, trifluoromethoxy, fluoroethyl, polyfluoroethyl, 4-fluorophenyl, 3,4,5-trifluorophenyl, polyfluoroaryl, 4-(trifluoromethoxy)phenyl, $SF_4Cl$, $SF_5$, $(CF_2)_a$ $SF_5$, $(O(CF_2)_b)_dCF_3$, $(CF_2)_e(O(CF_2)_b)_d)CF_3$, or trifluoromethylsulfanyl;

Z independently represents F or Cl;

s represents an integer of 0 to 4, wherein the sum of r and s is 5;

r represents an integer of 1 to 3;

p represents an integer of 0 to 6;

q represents an integer of 1 to 8;

v represents an integer of 2 to 4;

j represents an integer of 1 to 3;

k represents an integer of 1 to 4;

t represents an integer of 2 to 6;

u represents an integer of 0 to 2, wherein the sum of r and u is 3;

h represents an integer of 0 to 4, wherein the sum of r and h is 4;

i represents an integer of 1 to 4;

a represents an integer of 2 to 6;

b represents an integer of 1 to 4;

d represents an integer of 1 to 3; and e represents an integer of 1 to 4.

2. The opto-electronic device of claim 1, wherein the first portion comprises at least one emissive region.

3. The opto-electronic device of claim 2, wherein a thickness of the NIC in the at least one emissive region of the first portion is modulated to adjust an optical microcavity effect thereof.

4. The opto-electronic device of claim 2, wherein at least a second part of the second portion overlaps at least a first part of the first portion, wherein a cross-sectional thickness of the conductive coating in the second part is less than a cross-sectional thickness of the conductive coating in a remaining part of the second portion.

5. The opto-electronic device of claim 4, wherein the conductive coating is disposed over the NIC along at least a section of the first portion proximate to the first part.

6. The opto-electronic device of claim 5, wherein the conductive coating is spaced apart from the NIC in a cross-sectional aspect.

7. The opto-electronic device of claim 4, wherein the conductive coating abuts the NIC at a boundary between the first part and the second portion.

8. The opto-electronic device of claim 7, wherein the conductive coating forms a contact angle with the NIC at the boundary.

9. The opto-electronic device of claim 8, wherein the contact angle exceeds 10 degrees.

10. The opto-electronic device of claim 8, wherein the contact angle exceeds 90 degrees.

11. The opto-electronic device of claim 2, wherein at least a first part of the first portion overlaps at least a second part of the second portion.

12. The opto-electronic device of claim 11, wherein the NIC is disposed on the surface of the device in the second part and the conductive coating is disposed over the NIC therein.

13. The opto-electronic device of claim 12, wherein the conductive coating is spaced apart from the NIC in a cross-sectional aspect.

14. The opto-electronic device of claim 2, wherein the second part extends between the first part and a third part of the second portion that includes the at least one emissive region.

15. The opto-electronic device of claim 14, wherein the at least one emissive region of the third part comprises a first electrode, a second electrode electrically coupled to the conductive coating and a semiconducting layer between the first electrode and the second electrode, wherein the second electrode extends between the NIC and the semiconducting layer in the third part.

16. The opto-electronic device of claim 2, wherein the conductive coating is electrically coupled to an auxiliary electrode.

17. The opto-electronic device of claim 16 wherein the conductive coating is in physical contact with the auxiliary electrode.

18. The opto-electronic device of claim 16, wherein the auxiliary electrode lies in the first part.

19. The opto-electronic device of claim 1, wherein the second portion comprises at least a part of a non-emissive region.

20. The opto-electronic device of claim 3, further comprising a first electrode, a second electrode and a semiconducting layer between the first electrode and the second electrode, wherein the second electrode extends between the NIC and the semiconducting layer in the first portion.

21. The opto-electronic device of claim 20, wherein the conductive coating is electrically coupled to the second electrode.

22. The opto-electronic device of claim 20, wherein the conductive coating coats at least a part of the second electrode in the second portion.

23. The opto-electronic device of claim 20, wherein the second portion comprises at least one additional emissive region.

24. The opto-electronic device of claim 23, wherein at least one of the additional emissive regions of the second portion of the device comprises a first electrode, a second electrode and a semiconducting layer between the first electrode and the second electrode, wherein the second electrode comprises the conductive coating.

25. The opto-electronic device of claim 23, wherein a wavelength of light emitted from the at least one additional emissive region of the second portion of the device differs from a wavelength of light emitted from the at least one emissive region of the first portion of the device.

26. The opto-electronic device of claim 20, wherein the conductive coating comprises an auxiliary electrode.

27. The opto-electronic device of claim 1, comprising at least one intermediate coating between the second electrode and the conductive coating along at least a part thereof.

28. The opto-electronic device of claim 27, wherein the intermediate coating comprises a nucleation promoting coating (NPC).

29. The opto-electronic device of claim 27, wherein the intermediate coating comprises an NIC that has been processed to substantially increase the initial sticking probability for forming the conductive coating onto the surface thereof.

30. The opto-electronic device of claim 29, wherein the intermediate coating has been processed by exposure to radiation.

31. The opto-electronic device of claim 1, wherein the second portion comprises a partition and a third electrode in a sheltered region of the partition; and wherein the conductive coating is electrically coupled to the second electrode and to the third electrode.

32. The opto-electronic device of claim 31, wherein the sheltered region is substantially devoid of the NIC.

33. The opto-electronic device of claim 31, wherein the sheltered region comprises a recess defined by the partition.

34. The opto-electronic device of claim 1, wherein the conductive coating is in physical contact with the third electrode.

35. The opto-electronic device of claim 1, wherein the conductive coating is electrically coupled to the second electrode in a coupling region (CR).

36. The opto-electronic device of claim 1, wherein the sheltered region comprises an aperture defined by the partition.

37. The opto-electronic device of claim 36, wherein the aperture is angled relative to an axis extending normally away from a surface of the device.

38. The opto-electronic device of claim 36, further comprising an undercut portion that overlaps a third layer surface of the third electrode in a cross-sectional aspect.

39. The opto-electronic device of claim 1 wherein the second portion comprises at least one emissive region.

40. The opto-electronic device of claim 39, wherein the first portion comprises at least a part of a non-emissive region.

41. The opto-electronic device of claim 39, wherein the first portion is substantially light-transmissive therethrough.

42. The opto-electronic device of claim 39, further comprising a first electrode, a second electrode and a semiconducting layer between the first electrode and the second electrode, wherein the second electrode extends between the NIC and the semiconducting layer in the first portion.

43. The opto-electronic device of claim 42, wherein the second electrode extends between the conductive coating and the semiconducting layer in the second portion.

44. The opto-electronic device of claim 39, further comprising a first electrode, a semiconducting layer between the first electrode and the conductive coating, wherein the conductive coating comprises a second electrode of the device.

45. The opto-electronic device of claim 1, wherein $Ar^1$ represents cyclopentadienyl; phenyl; 1-naphthyl; 2-naphthyl; 1-phenanthryl; 2-phenanthryl; 10-phenanthryl; 9-phenanthryl; 1-anthracenyl; 2-anthracenyl; 3-anthracenyl; 9-anthracenyl; benzanthracenyl; pyrenyl; chrysenyl; fluorenyl; pentacenyl; pyridine; quinoline; isoquinoline; pyrazine; quinoxaline; acridine; pyrimidine; quinazoline; pyridazine; cinnoline or phthalazine.

46. The opto-electronic device of claim 1, wherein each $R^1$, $R^2$ and $R^3$ individually represents H, D, F, Cl, methyl, methoxy, ethyl, t-butyl, fluoromethyl, difluoromethyl, trifluoromethyl, fluoromethoxy, difluoromethoxy, trifluoromethoxy, fluoroethyl, polyfluoroethyl, fluorophenyl, trifluorophenyl, trifluoromethoxyphenyl, $SF_4Cl$, or $SF_5$.

47. The opto-electronic device of claim 1, wherein $L^1$ represents cyclohexylene, phenylene, indenylene, naphthylene, fluorenylene, anthracylene, phenanthrylene, pyrylene, chrysenylene, cyclopentylene, or a heteroarylene group derived by replacing one, two, three, or four ring carbon atoms of an arylene group with a corresponding number of heteroatoms.

48. The opto-electronic device of claim 47, wherein the heteroarylene group contains one or more heteroatoms individually selected from: nitrogen, oxygen, sulphur, and silicon.

* * * * *